US007355290B2

(12) United States Patent
Shioga et al.

(10) Patent No.: US 7,355,290 B2
(45) Date of Patent: Apr. 8, 2008

(54) INTERPOSER AND METHOD FOR FABRICATING THE SAME

(75) Inventors: Takeshi Shioga, Kawasaki (JP); Yoshikatsu Ishizuki, Kawasaki (JP); Kanae Nakagawa, Kawasaki (JP); Taiji Sakai, Kawasaki (JP); Masataka Mizukoshi, Kawasaki (JP); John David Baniecki, Kawasaki (JP); Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/338,857

(22) Filed: Jan. 25, 2006

(65) Prior Publication Data

US 2007/0090546 A1 Apr. 26, 2007

(30) Foreign Application Priority Data

Sep. 30, 2005 (JP) ............................ 2005-286978

(51) Int. Cl.
*H01L 23/29* (2006.01)

(52) U.S. Cl. ...................................... 257/790; 257/774

(58) Field of Classification Search ................ 257/790, 257/774, 528
See application file for complete search history.

(56) References Cited

U.S. PATENT DOCUMENTS 6,376,909 B1 * 4/2002 Forbes et al. ............... 257/734
6,894,396 B2 * 5/2005 Shioga et al. ............... 257/777
6,961,230 B2 * 11/2005 Otsuka et al. ........... 361/306.2
7,016,392 B2 * 3/2006 Tandon et al. ................ 372/96

FOREIGN PATENT DOCUMENTS

| | | |
|---|---|---|
| JP | 4-211191 | 8/1992 |
| JP | 7-176453 | 7/1995 |
| JP | 2001-35990 | 2/2001 |
| JP | 2001-68583 | 3/2001 |
| JP | 2002-83892 | 3/2002 |
| JP | 3583396 | 8/2004 |
| JP | 2004-304159 | 10/2004 |

* cited by examiner

*Primary Examiner*—Roy Potter
(74) *Attorney, Agent, or Firm*—Kratz, Quintos & Hanson, LLP

(57) ABSTRACT

The interposer comprises a base 8 formed of a plurality of resin layers 68, 20, 32, 48; thin-film capacitors 18*a*, 18*b* buried between a first resin layer 68 of said plurality of resin layers and a second resin layer 20 of said plurality of resin layers, which include first capacitor electrodes 12*a*, 12*b*, second capacitor electrodes 16 opposed to the first capacitor electrode 12*a*, 12*b* and the second capacitor electrode 16, and a capacitor dielectric film 14 of a relative dielectric constant of 200 or above formed between the first capacitor electrode 12*a*, 12*b* and the second capacitor electrode 16; a first through-electrode 77*a* formed through the base 8 and electrically connected to the first capacitor electrode 12*a*, 12*b*; and a second through-electrode 77*b* formed through the base 8 and electrically connected to the second capacitor electrode 16.

9 Claims, 87 Drawing Sheets

INTERPOSER AND METHOD FOR FABRICATING THE SAME

CROSS-REFERENCE TO RELATED APPLICATION

This application is based upon and claims priority of Japanese Patent Application No. 2005-286978, filed on Sep. 30, 2005, the contents being incorporated herein by reference.

BACKGROUND OF THE INVENTION

The present invention relates to an interposer and a method for fabricating the interposer, more specifically an interposer including a capacitor dielectric film of very high relative dielectric constant formed in, and a method for fabricating the interposer.

Recently, for digital LSI's (Large Scale Integrated circuits), etc., typically microprocessors, etc., the operation speed is increased, and the electric power consumption is decreased.

To stably operate the LSI's in the GHz-band high-frequency range and furthermore at low voltage, it is very important to suppress the source voltage fluctuations due to abrupt changes of load impedance, etc. of the LSI's and to remove high-frequency noises of the power source.

Conventionally, the source voltage fluctuations is suppressed, and the high-frequency noises are removed by mounting decoupling capacitors near an LSI, etc. mounted on a circuit wiring board. The decoupling capacitors are formed on a board different from the circuit wiring board and are mounted suitably on the circuit wiring board.

However, in mounting the decoupling capacitors near the LSI mounted on a circuit wiring board, the LSI and the decoupling capacitors are electrically connected to each other via lines formed on the circuit wiring board, and accordingly large inductance due to the wiring of the lines is present. The inductance between the LSI and the decoupling capacitors makes it possible to sufficiently suppress the source voltage and sufficiently remove high-frequency noises. In order to sufficiently suppress the source voltage fluctuations and sufficiently remove the high-frequency noises, the equivalent serial resistance (ESR) and the equivalent serial inductance (ESL) are required to be decreased.

To this end, the technique of providing interposers including capacitors incorporated in between the LSI and the circuit wiring board is noted (Patent References 1 to 6).

Following references disclose the background art of the present invention.

[Patent Reference 1]

Specification of Japanese Patent Application Unexamined Publication No. Hei 4-211191

[Patent Reference 2]

Specification of Japanese Patent Application Unexamined Publication No. Hei 7-176453

[Patent Reference 3]

Specification of Japanese Patent Application Unexamined Publication No. 2001-68583

[Patent Reference 4]

Specification of Japanese Patent Application Unexamined Publication No. 2001-35990

[Patent Reference 5]

Specification of Japanese Patent Application Unexamined Publication No. 2004-304159

[Patent Reference 6]

Specification of Japanese Patent Application Unexamined Publication No. 2002-83892

[Patent Reference 7]

Specification of Japanese Patent No. 3583396

In the techniques described in Patent References 1 to 5, however, through-holes must be formed in the substrate, for burying through-electrodes in the substrate. It is not easy to form the through-holes in the substrate. Accordingly, it is very difficult to decrease the cost by the techniques described in Patent References 1 to 5.

In the technique described in Patent Reference 6, the capacitors are formed by forming films on an organic film (resin layer), which makes it impossible to form the dielectric film of good crystalline material. When a dielectric film is formed on a resin layer, whose heat resistance is not so high, the film forming process for the dielectric film is restricted to 400° C. or below. The relative dielectric constant of the dielectric film formed on a resin layer is generally about 20 and about 50 at highest. Thus, the capacitors cannot have high relative dielectric constant.

SUMMARY OF THE INVENTION

An object of the present invention is to provide an interposer including a capacitor dielectric film of very high relative dielectric constant formed without forming through-holes in the substrate, and a method for fabricating the interposer.

According to one aspect of the present invention, there is provided an interposer comprising: a base formed of a plurality of resin layers; a thin-film capacitor buried between a first resin layer of said plurality of resin layers and a second resin layer of said plurality of resin layers, the first thin-film capacitors including a first capacitor electrode, a second capacitor electrode opposed to the first capacitor electrode, and a capacitor dielectric film formed between the first capacitor electrode and the second capacitor electrode and having a relative dielectric constant of 200 or above; a first through-electrode formed through the base and electrically connected to the first capacitor electrode; and a second through-electrode formed through the base and electrically connected to the second capacitor electrode.

According to another aspect of the present invention, there is provided a method for fabricating an interposer comprising the steps of: forming on one primary surface of a first substrate a thin-film capacitor including a first capacitor electrode, a crystalline capacitor dielectric film formed on the first capacitor electrode and a second capacitor electrode formed on the capacitor dielectric film; forming on said one primary surface of the first substrate and the thin-film capacitor a first resin layer as semi-cured, and a first partial electrode to be a part of a through-electrode, buried in the first resin layer and electrically connected to the first capacitor electrode or the second capacitor electrode; cutting an upper part of the first partial electrode and an upper part of the first resin layer with a cutting tool; forming on one primary surface of a second substrate a second resin layer as semi-cured, and a second partial electrode to be a part of said through-electrode, buried in the second resin layer and disposed in alignment with the first partial electrode; cutting an upper part of the second partial electrode and an upper part of the second resin layer with a cutting tool; making thermal processing with the first resin layer and the second resin layer in close contact with each other to adhere the first resin and the second resin layer to each other while jointing the first partial electrode and the second partial electrode to each other; removing the first substrate; forming on said one primary surface of the second substrate a third resin layer, covering the thin-film capacitor; burying a third partial electrode to be a part of the through-electrode in the third resin layer; supporting the third resin layer by a supporting substrate; and removing the second substrate.

According to further another aspect of the present invention, there is provided a method for fabricating an interposer comprising the steps of: forming on one primary surface of a first substrate a first thin-film capacitor including a first capacitor electrode, a first crystalline capacitor dielectric film formed on the first capacitor dielectric electrode and a second capacitor electrode formed on the first capacitor dielectric film; forming on said one primary surface of the first substrate and the first thin-film capacitor a first resin layer as semi-cured, and a first partial electrode to be a part of a through-electrode, buried in the first resin layer and electrically connected to the first capacitor; cutting an upper part of the first partial electrode and an upper part of the first resin layer with a cutting tool; forming on one primary surface of a second substrate a second thin-film capacitor including a third capacitor electrode, a second crystalline capacitor dielectric film formed on the third capacitor electrode, and a fourth capacitor electrode formed on the second capacitor dielectric film; forming on said one primary surface of the second substrate and the second thin-film capacitor a second resin layer as semi-cured, and a second partial electrode to be a part of the through-electrode, buried in the second resin layer and electrically connected to the second capacitor; cutting an upper part of the second partial electrode and an upper part of the second resin layer with a cutting tool; making thermal processing with the first substrate and the second substrate opposed to each other with the first resin layer and the second resin layer in close contact with each other to adhere the first resin layer and the second resin layer to each other while jointing the first partial electrode and the second partial electrode to each other; removing the first substrate; forming on said one primary surface of the second substrate a third resin layer, covering the first thin-film capacitor; burying a third partial electrode to be a part of the through-electrode in the third resin layer; supporting the third resin layer by a first supporting substrate; removing the second substrate; forming on one primary surface of a third substrate a fourth resin layer, and a fourth partial electrode to be a part of the through-electrode, buried in the fourth resin layer; cutting an upper part of the fourth partial electrode and an upper part of the fourth resin layer with a cutting tool; making thermal processing with the first supporting substrate and the third substrate opposed to each other and with the fourth resin layer and the second thin-film capacitor in close contact with each other to adhere the fourth resin layer and the second thin-film capacitor to each other while electrically connecting the second partial electrode and the fourth partial electrode to each other; supporting the third resin layer by a second supporting substrate; and removing the third substrate.

According to the present invention, the thin-film capacitors are formed, using a highly heat-resistant semiconductor substrate, which permits the capacitor dielectric film to be well crystallized and have a high relative dielectric constant of 200 or above. Thus, according to the present invention, the thin-film capacitors having very good electric characteristics can be formed. Furthermore, according to the present invention, the semiconductor substrate, which is difficult to have through-holes formed in, is removed, which makes it unnecessary to form in the semiconductor substrate the through-holes for the through-electrodes to be buried in. Thus, the present invention can provide an interposer including thin-film capacitors of very high electrostatic capacitance at low costs.

DETAILED DESCRIPTION OF THE INVENTION

A First Embodiment

The interposer according to a first embodiment of the present invention and the method for fabricating the interposer, and an electronic device using the interposer and a method for fabricating the electronic device will be explained with references from FIGS. 1 to 30.

(Interposer and Electronic Device)

Figure 1:
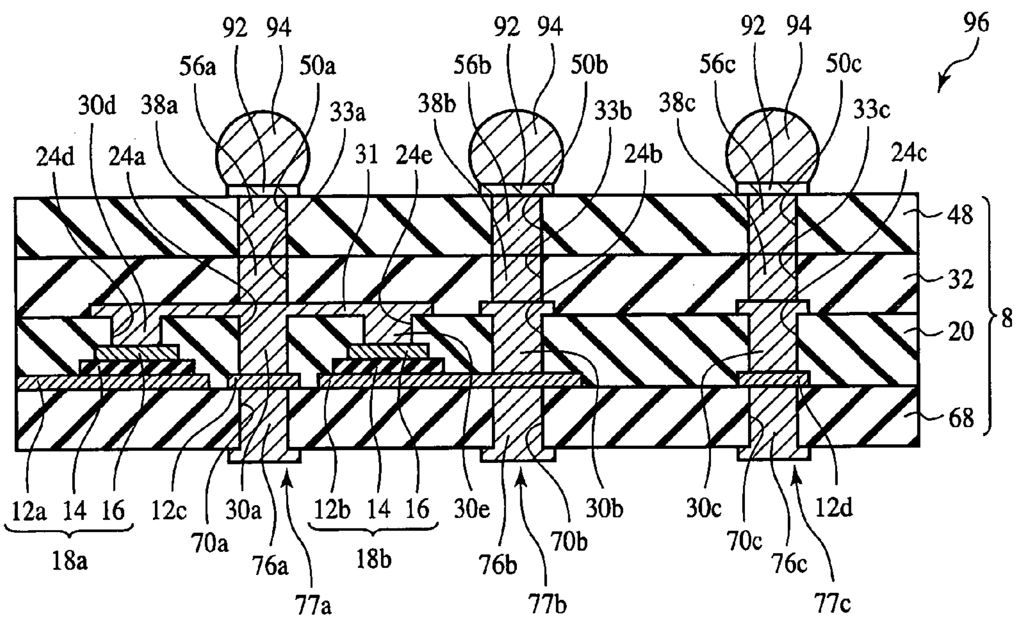
FIG. 1 is a sectional view of the interposer according to a first embodiment of the present invention (Part 1).
Figure 2:
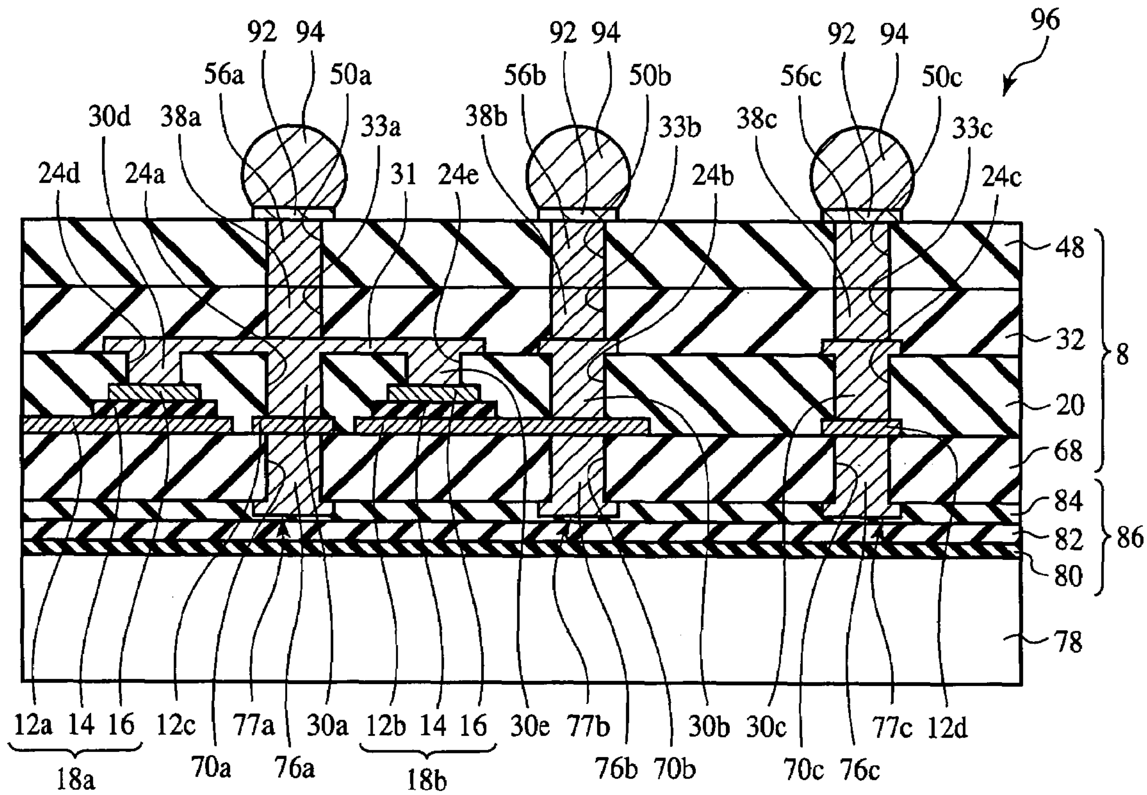
FIG. 2 is a sectional view of the interposer according to the first embodiment of the present invention (Part 2).
Figure 3:
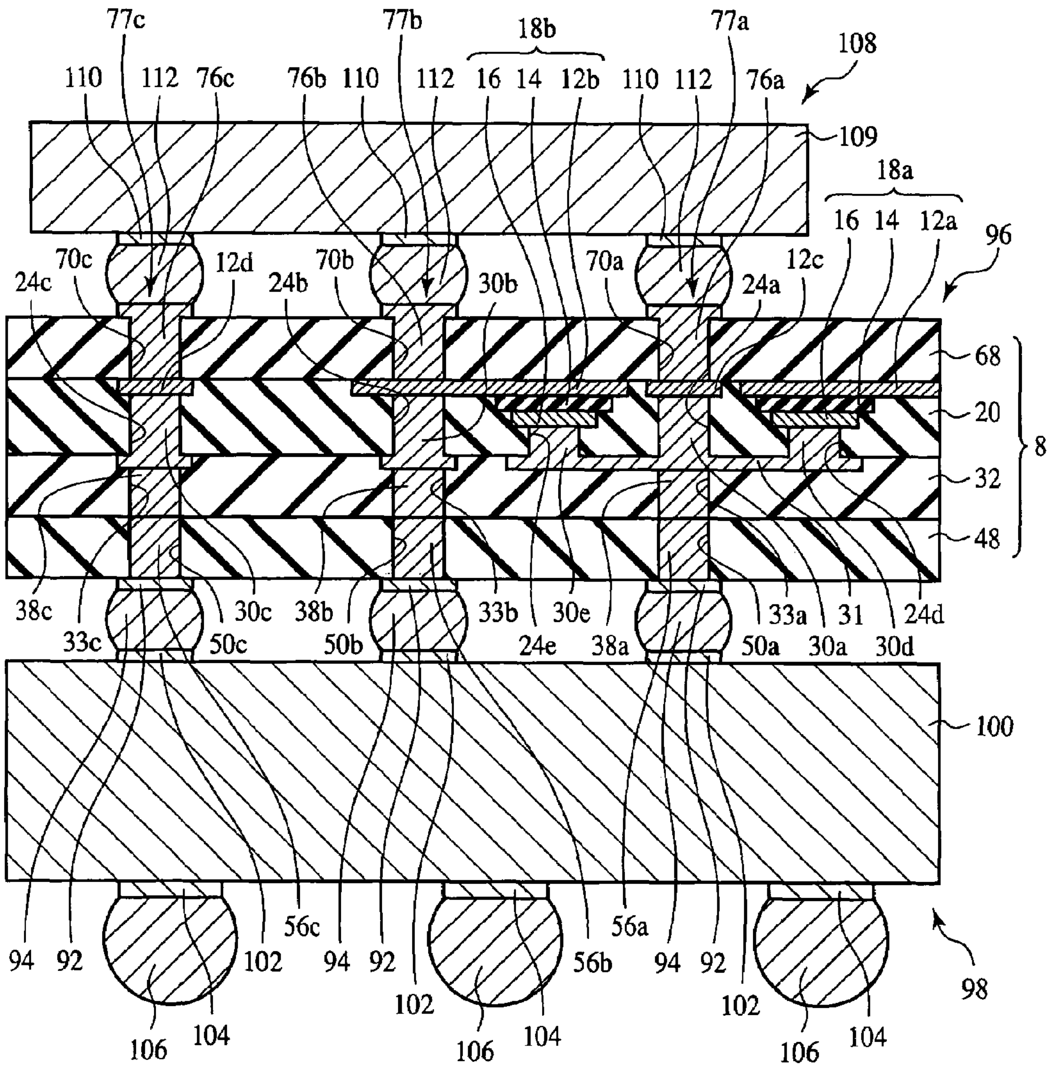
FIG. 3 is a sectional view of the electronic device according to the first embodiment of the present invention.

First, the interposer and the electronic device according to the present embodiment and the electronic device will be explained with reference to FIGS. 1 to 3. FIG. 1 is a sectional view of the interposer according to the present embodiment (Part 1). FIG. 2 is a sectional view of the interposer according to the present embodiment (Part 2). FIG. 3 is a sectional view of the electronic device according to the present embodiment.

As illustrated in FIG. 1, the interposer 96 according to the present embodiment comprises a base 8 of a plurality of resin layers 68, 20, 32, 48 laid the latter on the former, thin film capacitors 18*a*, 18*b* buried in the base 8, through-electrodes (vias) 77*a*, 77*b* electrically connected to the thin film capacitors 18*a*, 18*b*, and a through-electrode 77*c* formed through the base 8 and insulated from the thin film capacitors 18*a*, 18*b*.

Capacitor electrodes (lower electrodes) 12*a*, 12*b* are formed on one surface of the resin layer 68. The resin layer 68 is formed of, e.g., epoxy resin. The capacitor electrodes 12*a*, 12*b* are formed of the layer film of, e.g., a 20 nm-thickness titanium oxide ($TiO_2$) film and a 150 nm-thickness platinum (Pt) film laid one on the other. The capacitor electrode 12*a* of the thin film capacitor 18*a* and the capacitor electrode 12*b* of the thin film capacitor 18*b* are electrically connected to each other.

A polycrystalline capacitor dielectric film 14, i.e., a polycrystalline capacitor dielectric film 14 or an epitaxially grown capacitor dielectric film 14 is formed on one surfaces of the capacitor electrodes 12*a*, 12*b* (opposite to the surfaces contacting the resin layer 68). The capacitor dielectric film 14 is formed of a high dielectric material. Specifically, the capacitor dielectric film 14 is $Ba_xSr_{1-x}TiO_3$ film (hereinafter also called "BST film"). The thickness of the capacitor dielectric film 14 is, e.g., 100 nm. The capacitor dielectric film 14 is formed by a high-temperature process of, e.g., 500° C. or above. Accordingly, the capacitor dielectric film 14 is crystallized very well and has a very high relative dielectric constant. Specifically, the relative dielectric constant of the capacitor dielectric film 14 is 200 or above.

In forming such capacitor dielectric film 14, as will be described later, the capacitor dielectric film 14 is formed on a semiconductor substrate 10 which is durable to the high-temperature process (see FIG. 4B). As will be described alter, the base 8 of the resin layers 68, 20, 32, 48 with the thin film capacitors 18*a*, 18*b* buried in has not been subjected to the high-temperature process for forming the capacitor dielectric film 14, and no large deformation, etc. have taken place in the base 8.

On one surface of the capacitor dielectric film 14 (the surface opposite to the surface contacting the capacitor electrodes 12*a*, 12*b*), capacitor electrodes (upper electrodes) 16 are formed opposed to the capacitor electrodes 12*a*, 12*b*. The upper electrodes 16 are formed of, e.g., a 200 nm-thickness Pt film.

Thus, the thin film capacitor 18*a* including the capacitor electrode 12*a*, the capacitor dielectric film 14 and the capacitor electrode 16 is formed. The thin film capacitor 18*b* including the capacitor electrode 12*b*, the capacitor dielectric film 14 and the capacitor electrode 16 are formed.

On one surface of the resin layer 68 (contacted to the capacitor electrodes 12*a*, 12*b*), conduction films 12*c*, 12*d* formed of one and the same conduction film of the capacitor films 12*a*, 12*b* are formed. The conduction film 12*c* forms a part of the through-electrode 77*a*. The conduction film 12*d* forms a part of the through-electrode 77*c*. The conduction films 12*c*, 12*d* are electrically insulated from the capacitor electrodes 12*a*, 12*b*.

An opening 70*a*, an opening 70*b* and an opening 70*c* are formed in the resin layer 68 respectively down to the conduction film 12*c*, the capacitor electrode 12*b* and the conduction film 12*d*.

A partial electrode 76*a* forming a part of the through-electrode 77*a* is buried in the opening 70*a*. A partial electrode 76*b* forming a part of the through-electrode 77*b* is buried in the opening 70*b*. A partial electrode 76*c* forming a part of the through-electrode 77*c* is formed in the opening 70*c*.

The resin layer 20 is formed on one surface of the resin layer 68 (contacting the capacitor electrodes 12*a*, 12*b*), covering the thin-film capacitors 18*a*, 18*b* and the conduction films 12*c*, 12*d*. The resin layer 20 is formed of, e.g., epoxy resin.

An opening 24*a*, an opening 24*b*, an opening 24*c*, an opening 24*d* and an opening 24*e* are formed in the resin layer 20 respectively down to the conduction film 12*c*, the capacitor electrode 12*b* of the thin-film capacitor 18*b*, the conduction film 12*d*, the capacitor electrode 16 of the thin-film capacitor 18*a*, and the capacitor electrode 16 of the thin-film capacitor 18*b*.

A partial electrode 30*a* forming a part of the through-electrode 77*a* is buried in the opening 24*a*. The partial electrode 30*a* is connected to the partial electrode 70*a* via the conduction film 12*c*. A partial electrode 30*b* forming a part of the through-electrode 77*b* is buried in the opening 24*b*. The partial electrode 30*b* is connected to the capacitor electrode 12*b*. A partial electrode 30*c* forming a part of the through-electrode 77*c* is buried in the opening 24*c*. The partial electrode 30*c* is connected to the partial electrode 70*c* via the conduction film 12*d*.

A conductor plug 30*d* is buried in the opening 24*d*, connected to the capacitor electrode 16 of the thin-film capacitor 18*a*. A conductor plug 30*e* is buried in the opening 24*e*, connected to the capacitor electrode 16 of the thin-film capacitor 18*b*. The partial electrode 30*a*, the conductor plug 30*d* and the conductor plug 30*e* are electrically connected to one another by an interconnection 31. The partial electrode 30*a*, the conductor plug 30*d*, the conductor plug 30*e* and the interconnection 31 are integrally formed of one and the same conduction film.

The resin layer 32 is formed on one surface of the resin layer 20 (opposite to the surface contacting the resin layer 68), covering the interconnection 31. The resin layer 32 is formed of a thermosetting resin which is cured and shrunk without generating by-products, such as water, alcohol, organic acid, nitride, etc. Such thermosetting resin can be, e.g., a resin containing benzocyclobutene (BCB) as the main component (hereinafter also called "BCB"). The material of such BCB resin can be a BCB resin solution by, e.g., Dow Chemical Company (trade name: CYCLOTENE 4024-40), or others.

An opening 33*a*, an opening 33*b* and an opening 33*c* are formed in the resin layer 32 respectively down to the partial electrode 30*a*, the partial electrode 30*b* and the partial electrode 30*c*.

A partial electrode 38*a* forming a part of the through-electrode 77*a* is buried in the opening 33*a*. A partial electrode 38*b* forming a part of the through-electrode 77*b* is buried in the opening 33*b*. A partial electrode 38*c* forming a part of the through-electrode 77*c* is buried in the opening 33*c*.

One surfaces of the partial electrodes 38*a*-38*c* (opposite to the surfaces contacting the partial electrodes 30*a*-30*c*) and one surface of the resin layer 32 (opposite to the surface contacting the resin layer 20) are cut with a cutting tool 44 of diamond or others (see FIG. 8B), as will be described later, and said one surfaces of the partial electrodes 38*a*-38*c* (contacting the partial electrodes 56*a*-56*c*) and said one surface of the resin layer 32 (contacting the resin layer 48) are planarized.

The resin layer 48 is formed on one surface of the resin layer 32 (opposite to the surface contacting the resin layer 20). As is the resin layer 32, the resin layer 48 is formed of a thermosetting resin which is cured and shrunk without generating by-products, such as water, alcohol organic acid, nitride, etc. Such thermosetting resin is, e.g., BCB resin, as is the resin layer 32. The material of the BCB resin can be a BCB resin solution by, e.g., Dow Chemical Company (trade name: CYCLOTENE 4024-40), or others.

Openings 50*a*, 50*b*, 50*c* are formed in the resin layer 48, respectively in alignment with the openings 33*a*, 33*b*, 33*c*.

A partial electrode 56*a* forming a part of the through-electrode 77*a* is buried in the opening 50*a*. A partial electrode 56*b* forming a part of the through-electrode 77*b* is buried in the opening 50*b*. A partial electrode 56*c* forming a part of the through-electrode 77*c* is buried in the opening 50*c*.

One surfaces of the partial electrodes 56*a*-56*c* (contacting the partial electrodes 38*a*-38*c*) and one surface of the resin layer 48 (contacting the resin layer 32) are cut with the cutting tool 44 of diamond or others (see FIG. 13B), as will be described later, and said one surfaces of the partial electrodes 56*a*-56*c* (contacting the partial electrodes 38*a*-38*c*) and said one surface of the resin layer 48 (contacting the resin layer 32) are planarized.

The BCB resin is cured by the cyclobutene rings thermally opened and dienophile, which has unsaturated bonds, being bonded by Diels-Alder reaction. When thermally opened cyclobutene rings and dienophile having unsaturated bonds are bonded by Diels-Alder reaction, no polar functional groups are involved. Accordingly, BCB resin can be cured without generating by-products, such as water, alcohol, etc., and no voids are not formed in the BCB resin due to the evaporation of such by-products. The solvent remaining in the BCB resin is evaporated in advance by thermal processing, whereby no voids due to the evaporation of the solvent are formed. BCB resin, which can be cured without generating voids, can be surely cured and shrunk without the volume increase due to voids.

The resin layer 32 and the resin layer 48 are adhered to each other. The partial electrodes 38*a*-38*c* buried in the resin layer 32 and the partial electrodes 56*a*-56*c* are jointed respectively to each other. As will be described later, the resin layer 32 and the resin layer 48 are subjected to the thermal processing for shrinking the resin layer 32 and the resin layer 48. The resin 32 and the resin layer 48 which are surely adhered to each other are shrunk, whereby the shrinkage of the resin layer 32 and the resin layer 48 firmly joints said one surfaces of the partial electrodes 38*a*-38*c* (contacting the partial electrodes 56*a*-56*c*) and said one surfaces of the partial electrodes 56*a*-56*c* (contacting the partial electrodes 38*a*-38*c*).

Electrode pads 92 are formed on the other surfaces of the partial electrodes 56*a*-56*c* (opposite to the surfaces contacting the partial electrodes 38*a*-38*c*).

Solder bumps 94 of, e.g., Sn-based solder are formed on one surface of the electrode pads 92 (opposite to the surfaces contacting the partial electrodes 56*a*-56*c*).

The partial electrodes 76*a*, the conduction film 12*c*, the partial electrode 30*a*, the partial electrode 38*a* and the partial electrode 56*a* form the through-electrodes 77*a*. The partial electrode 76*b*, a part of the capacitor electrode 12*b*, the partial electrode 30*b*, the partial electrode 38*b* and the partial electrode 56*b* form the through-electrode 77*b*. The partial electrode 76*c*, the conduction film 12*d*, the partial electrode 30*c*, the partial electrode 38*c* and the partial electrode 56*c* form the through-electrode 77*c*.

Thus, interposer 96 according to the present embodiment is constituted.

As illustrated in FIG. 2, the interposer 96 is supported by the supporting substrate 78.

That is, the supporting substrate 78 is adhered to the other surface of the resin layer 68 (opposite to the surface contacting the resin layer 20) with a heat foaming type double-sided tape 86. The supporting substrate 78 is, e.g., a glass supporting substrate. The glass material forming the glass supporting substrate is preferably a highly heat resistant glass material. For example, it is preferable to use as the material of the supporting substrate 78 boron silicate glass containing boron oxide to lower the softening point of the quart glass and keep the thermal expansion coefficient thereof as small as possible. The boron silicate glass is a glass material which can ensure abrupt heating and abrupt cooling. The boron silicate glass can be exemplified by PYREX (registered trademark) glass.

The heat foaming type double-sided tape 86 includes a base 82 of, e.g., polyester film, a heat-releasable adhesive layer 84 formed on one surface of the base 82, and a pressure-sensitive adhesive layer 80 formed on the other surface of the base 82. The heat foaming type double-sided tape 86 has, at the room temperature, the heat-release adhesive layer 84 adhered to an object to be adhered to, as is the general pressure-sensitive adhesive layer and when heated, has the heat-releasable adhesive layer 84 expanded, decreasing the adhesion area and lowering the adhesion between the heat-releasable adhesive layer 84 and the object to be adhered to, and the heat-releasable adhesive layer 84 is released from the object to be adhered to.

The pressure-sensitive adhesive layer 80 of the heat foaming type double-sided tape 86 is adhered to the supporting substrate 78, and the heat-releasable adhesive layer 84 of the heat foaming type double-sided tape 86 is adhered to the resin layer 68.

In the present embodiment, the interposer 96 is supported by the supporting substrate 78, because the base 8 of the interposer 96 is formed only of the resin layers 68, 20, 32, 48, and unless the interposer 96 is supported by some solid means, the interposer 96 will be deformed.

As will be described later, after the interposer 96 is mounted on a substrate, etc., the interposer 96 is supported by the substrate, etc., and accordingly, the supporting substrate 78 which has supported the interposer 96 is unnecessary. The supporting substrate 78 is adhered to the interposer 96 by means of the heat foaming type double-sided tape 86 so that when it becomes unnecessary to support the interposer 96 by the supporting substrate 78, the supporting substrate 78 can be easily taken away from the interposer 96.

FIG. 3 is a sectional view of the electronic device using the interposer according to the present embodiment.

As illustrated in FIG. 3, the interposer 96 according to the present embodiment is disposed, e.g., between a package substrate 98 and a semiconductor integrated circuit device 108.

The package substrate 98 includes a substrate 100 with multi-layer interconnection (not illustrated), electrode pads 102 formed on one primary surface of the substrate 100 (opposite to the interposer 96), electrode pads 104 formed on the other primary surface of the substrate 100 (opposite to the surface opposed to the interposer 96), and solder bumps 106 formed on one surfaces of the electrode pads 104 (opposite to the surfaces contacting the substrate 10). The electrode pads 102 are electrically connected to ones of the multi-layer interconnection (not illustrated) buried in the substrate 10. The electrode pads 104 are electrically connected to ones of the multi-layer interconnection (not illustrated) buried in the substrate 100.

The electrode pads 92 of the interposer 96 and the electrode pads 102 of the package substrate 98 are electrically connected respectively to each other by solder bumps 94.

A semiconductor integrated circuit device 108 includes a semiconductor substrate 109, and electrode pads 110 formed on one primary surface of the semiconductor substrate 109 (opposed to the interposer 96). The semiconductor substrate 109 is, e.g., a silicon substrate. An integrated circuit (not illustrated) including electronic circuit devices (not illustrated) is formed on one primary surface of the semiconductor substrate 109 (opposed to the interposer 96). That is, active elements, such as transistors, etc. (not illustrated) and/or passive elements, such as capacitors, etc. (not illustrated) are disposed on one primary surface of the semiconductor substrate 109. A multi-layer interconnection structure (not illustrated) including a plurality of inter-layer insulation films (not illustrated) and interconnection layers (not illustrated) is formed on one primary surface of the semiconductor substrate 109 (opposed to the interposer 96) with the electronic elements formed on. The multi-layer interconnection structure electrically interconnects the electronic circuit devices (not illustrated). The electrode pads 110 are connected to ones of the interconnections formed in a plurality of layers.

The electrode pads 110 of the semiconductor integrated circuit device 108 and the through-electrodes 77*a*-77*c* of the interposer 96 are electrically connected respectively to each other by solder bumps 112.

Thus, the electronic device using the interposer according to the present embodiment is constituted.

The interposer according to the present embodiment is characterized mainly in that the base 8 is formed only of the resin layers 68, 20, 32, 48, and the thin-film capacitors 18*a*, 18*b* including the crystalline capacitor dielectric film 14 are buried in the base 8.

In the present embodiment, as will be described later, the thin-film capacitors 18*a*, 18*b* are formed by using the highly heat-resistant semiconductor substrate 10, which makes it possible to form well-crystallized capacitor dielectric film 14 of a relative dielectric constant of 200 or above. Thus, according to the present embodiment, the thin-film capacitors 18*a*, 18*b* can have very good electric characteristics. Furthermore, according to the present embodiment, as will be described later, the semiconductor substrate 10 in which it is difficult to form through-holes is removed, which makes it unnecessary to form in the semiconductor substrate 10 through-holes for the through-electrodes 70*a*-70*c* to be buried in. Thus, according to the present embodiment, the interposer including the thin-film capacitors 18*a*, 18*b* of very high electrostatic capacitance can be provided at low costs.

(Method for Fabricating Interposer and Electronic Device)

Then, the method for fabricating the interposer and the electronic device according to the present embodiment will be explained with reference to FIGS. 4A to 30. FIGS. 4A to 30 are views of the interposer and the electronic device according to the present embodiment in the steps of the method for fabricating the interposer and the electronic device. FIGS. 4A to 7C, FIGS. 8B to 12C, and FIGS. 13B to 30 are sectional views. FIGS. 8A to 13A are perspective views.

Figure 4A:
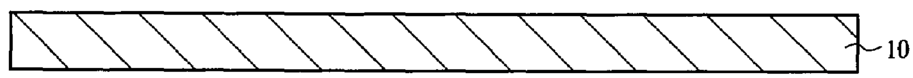
FIGS. 4A to 4E are views of the interposer and the electronic device according to the first embodiment of the present invention in the steps of the method for fabricating the interposer and the electronic device, which illustrate the method (Part 1).

As illustrated in FIG. 4A, the semiconductor substrate 10 is prepared. The semiconductor substrate 10 is prepared no cut in a chip size, i.e., in a wafer. The semiconductor substrate 10 is, e.g., a silicon substrate. The thickness of the semiconductor substrate 10 is, e.g., 0.6 mm.

Then, a silicon oxide film (not illustrated) is formed on the surface of the semiconductor substrate 10 by thermal oxidation. The film thickness of the silicon oxide film is, e.g., about 0.5 μm.

Figure 4B:
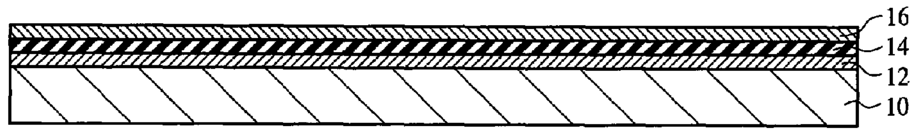
Figure 4C:
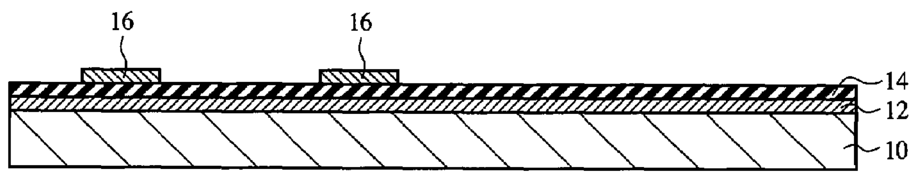

Then, as illustrated in FIG. 4B, a conduction film 12 of a titanium oxide ($TiO_2$) film and a platinum (Pt) film laid sequentially is formed on the semiconductor substrate 10 by, e.g., sputtering. The thin film 12 is to be the lower electrodes (capacitor electrodes) 12*a*, 12*b* of the thin-film capacitors 18*a*, 18*b*. The film thickness of the titanium oxide film is, e.g., 20 nm. The film thickness of the Pt film is, e.g., 150 nm.

Conditions for forming the titanium oxide film are as exemplified below. The substrate temperature is, e.g., 500° C. The applied electric power is, e.g., 200 W. The gas pressure inside the film forming chamber is, e.g., 0.1 Pa. The flow rate ratio of argon (Ar) gas and oxygen ($O_2$) gas is, e.g., 7:2.

Conditions for forming the Pt film are as exemplified below. The substrate temperature is, e.g., 400° C. The applied electric power is, e.g., 100 W. The pressure of the Ar gas is, e.g., 0.1 Pa.

Then, a crystalline capacitor dielectric film 14 is formed on the conduction film 12 by, e.g., sputtering. As the capacitor dielectric film 14, a $Ba_xSr_{1-x}TiO_3$ (BST) film 14, for example, is formed. More specifically, as the capacitor dielectric film 14, a polycrystalline BST film is formed. BST provides a relatively large relative dielectric constant (about 1500 in bulk) and is effective to realize capacitors of small size and large capacitance. The film thickness of the capacitor dielectric film 14 is, e.g. 100 nm.

Conditions for forming the capacitor dielectric film 14 of BST are as exemplified below. The substrate temperature is, e.g., 600° C. The gas pressure inside the film forming chamber is, e.g., 0.2 Pa. The flow rate ratio between the argon gas and the oxygen gas is, e.g., 8:1. The applied electric power is, e.g., 600 W. The film forming period of time is, e.g., 30 minutes. When the capacitor dielectric film 14 of BST is formed under these conditions, the capacitor dielectric film 14 can have good electrical characteristics of an about 400 relative dielectric constant and a dielectric loss of 1% or below.

BST film is formed as the capacitor dielectric film 14 here. However, the material of the capacitor dielectric film 14 is not essentially BST film. The capacitor dielectric film 14 may be formed suitably of a high dielectric material.

The polycrystalline capacitor dielectric film 14 is formed here. However, the capacitor dielectric film 14 may be epitaxially grown. The conduction film 12 to be the lower electrodes is epitaxially grown on the semiconductor substrate 10, and the dielectric film 14 is epitaxially grown on the conduction film 12, whereby the capacitor dielectric film 14 can have aligned crystal orientation.

The relative dielectric constant of the capacitor dielectric film 14 is not limited to about 400. However, to realize required electric characteristics, it is preferable that the relative dielectric constant of the capacitor dielectric film 14 is sufficiently large. In the present embodiment, in which the capacitor dielectric film 14 is formed on the semiconductor substrate 10 which is highly heat-resistant, the capacitor dielectric film 14 can be formed by high-temperature process of, e.g., 500° C. or above. The capacitor dielectric film 14 formed by such high-temperature process can have a relative dielectric constant of 200 or above.

The capacitor dielectric film 14 is formed by sputtering here. However, the capacitor dielectric film 14 may be formed by sol-gel process. The capacitor dielectric film 14 is formed by sol-gel process as exemplified below.

First, a starting solution consisting alkoxide is applied to the conduction film 12 by spin coating. The starting solution is for forming, e.g., BST film. Conditions for forming the film are, e.g., 2000 rpm and 30 seconds. Thus the capacitor dielectric film 14 of, e.g., an about 100 nm-thickness is formed.

Next, the capacitor dielectric film 14 is subjected to pre-bake. The pre-bake is for evaporating organic substances, water, etc. generated by the hydrolysis of the starting solution. Conditions for the pre-bake are, e.g., 400° C. and 10 minutes.

Then, the capacitor dielectric film 14 is subjected to main bake. The main bake is for sufficiently crystallizing the capacitor dielectric film 14. Conditions for the main bake are, e.g., 700° C. and 10 minutes. The film thickness of the capacitor dielectric film 14 subjected to the main bake is, e.g., about 100 nm.

The capacitor dielectric film 14 of BST thus formed under these conditions can have good electric characteristics of an about 300 relative dielectric constant and a dielectric loss of 2% or below.

The capacitor dielectric film 14 may be thus formed by sol-gel process.

Then, the conduction film 16 of, e.g., Pt is formed on the capacitor dielectric film 14 by, e.g., sputtering. The conduction film 16 is to be the upper electrodes (capacitor electrodes) of the capacitors 18*a*, 18*b*. The film thickness of the conduction film 16 is, e.g., 200 nm.

Next, the conduction film 16 is pattered into a prescribed configuration by photolithography. Thus, the upper electrodes (capacitor electrodes) 16 of the conduction film are formed (see FIG. 4C).

Figure 4D:
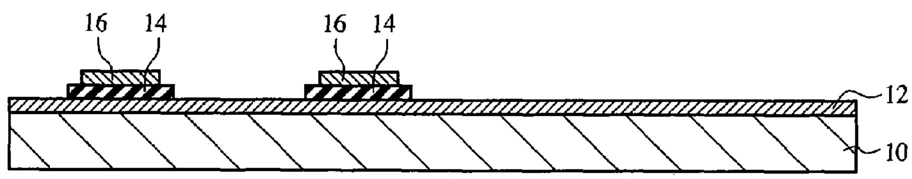
Figure 4E:
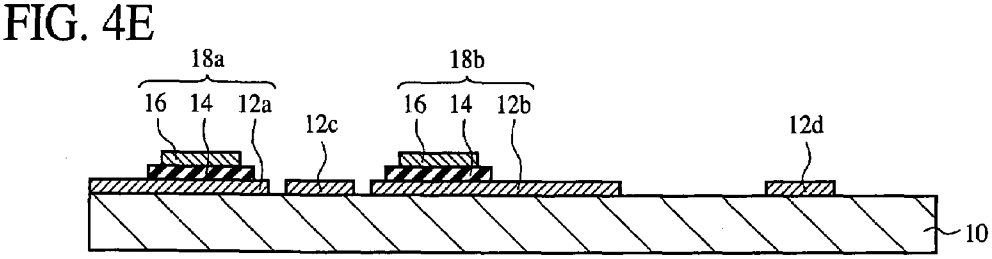

Next, the capacitor dielectric film 14 is patterned into a prescribed configuration by photolithography (see FIG. 4D).

Then, the conduction film 12 is patterned into a prescribed configuration by photolithography. Thus, the capacitor electrodes 12*a*, 12*b* and the conduction films 12*c*, 12*d* of the conduction film 12 are formed (see FIG. 4C). When the conduction film 12 is patterned, the conduction film 12 is so patterned that the capacitor electrode 12*a* and the capacitor electrode 12*b* are electrically connected to each other. When the conduction film 12 are patterned, the conduction film 12 is so patterned that the capacitor electrodes 12*c*, 12*d* are electrically separated from the capacitor electrodes 12*a*, 12*b*. Thus, the thin-film capacitor 18*a* including the capacitor electrode 12*a*, the capacitor dielectric film 14 and the capacitor electrode 16 is formed. The thin-film capacitor 18*b* including the capacitor electrode 12*b*, the capacitor dielectric film 14 and the capacitor electrode 16 is also thus formed.

Figure 5A:
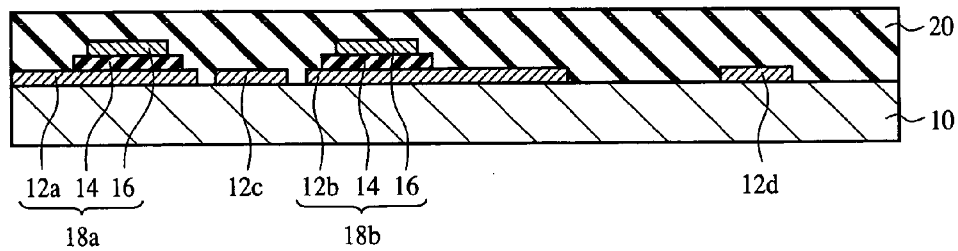
FIGS. 5A to 5D are views of the interposer and the electronic device according to the first embodiment of the present invention in the steps of the method for fabricating the interposer and the electronic device, which illustrate the method (Part 2).

Next, the resin film 20 is formed on the semiconductor substrate 10 with the thin-film capacitors 18*a*, 18*b* and the conduction films 12*a*, 12*b* formed on (see FIG. 5A). The resin layer 20 is formed of, e.g., photosensitive epoxy resin.

The resin layer 20 can be formed as exemplified below. First, a photosensitive epoxy resin solution is applied to the semiconductor substrate 10 by spin coating. Conditions for applying the epoxy resin solution are, e.g., 2000 rpm and 30 seconds. Thus, the resin layer 20 of, e.g., a 10 μm-thickness is formed. Then, heat processing (pre-bake) is made on the resin layer 10. The temperature of the heat processing is, e.g., 60° C.

Figure 5B:
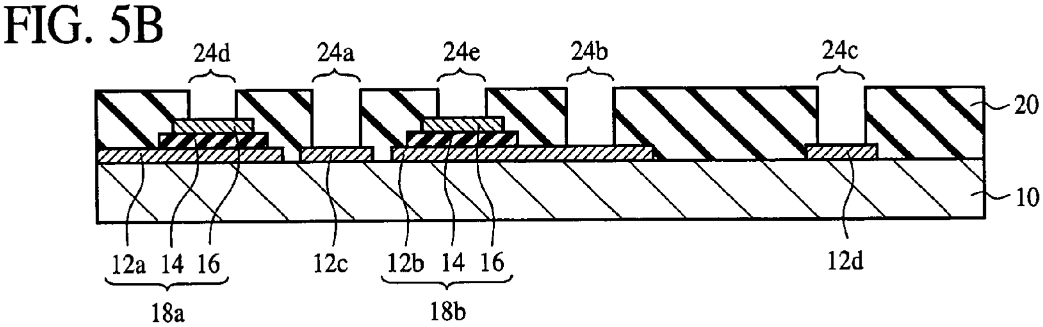

Then, the openings 24*a*-24*e* are formed in the resin layer 20 by photolithography (see FIG. 5B). In the opening 24*a*, the partial electrode 30*a* to be a part of the through-electrode 77*a* is to be buried in, and the opening 24*a* is formed down to the conduction film 12*c*. In the opening 24*b*, the partial electrode 30*b* to be a part of the through-electrode 77*b* is to be buried in, and the opening 24*b* is formed down to the capacitor electrode 12*b*. In the opening 24*c*, the partial electrode 30*c* to be a part of the through-electrode 77*c* is to be buried, and the opening 24*c* is formed down to the conduction film 12*d*. In the opening 24*d*, the conduction plug 30*d* is to be buried in, and the opening 24*d* is formed down to the capacitor electrode 16 of the capacitor 18*a*. In the opening 24*e*, the conduction plug 30*e* is to be buried in, and the opening 24*c* is formed down to the capacitor electrode 16 of the capacitor 18*b*.

Next, heat processing (main bake) is made on the resin layer 20. The heat processing temperature is, e.g., 200° C. The film thickness of the resin layer 20 subjected to the heat processing is, e.g., about 3 μm.

Next, a Cr film and a Cu film are sequentially laid on the entire surface by, e.g., sputtering to form a seed layer (not illustrated).

Next, a photoresist film 26 is formed on the entire surface by spin coating.

Figure 5C:
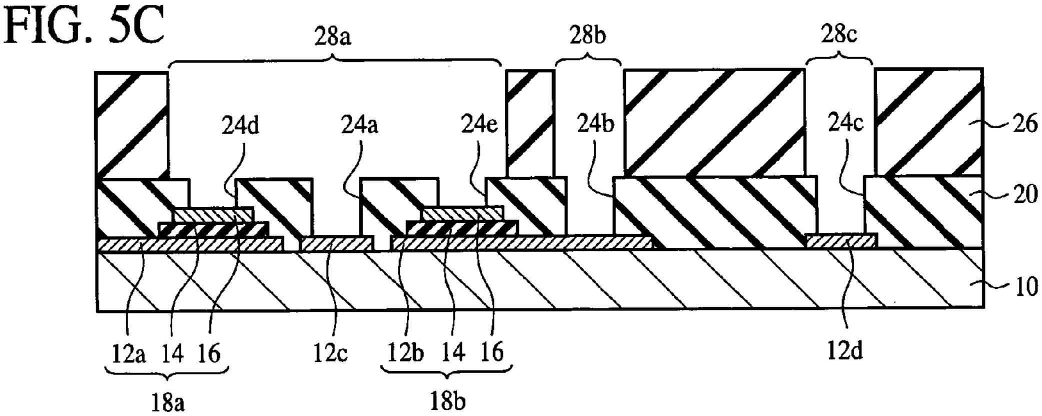
Figure 5D:
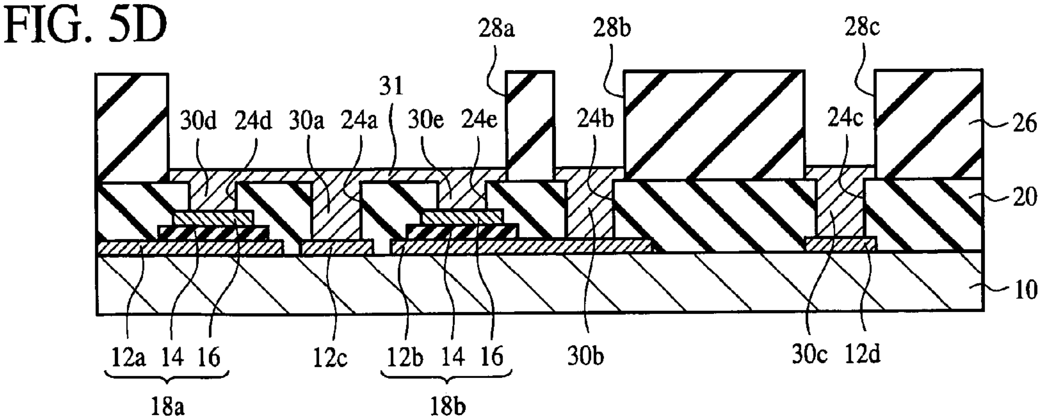

Next, the openings 28*a*-28*c* are formed in the photoresist film 26 by photolithography (see FIG. 5C). The opening 28*a* is for the partial electrode 30*a*, the conductor plug 30*d*, the conductor plug 30*e* and the interconnection 31 to be formed in. The opening 28*b* is for the partial electrode 30*b* to be formed in. The opening 28*c* is for the partial electrode 30*c* to be formed in.

Next, a plated film of, e.g., Cu is formed in the openings 24*a*-24*e* and the opening 28*a*-28*c* by an electroplating method. The thickness of the plated film is, e.g., about 3 μm. Thus, the partial electrode 30*a*, the conductor plugs 30*d*, 30*e* and the interconnection 31 are formed of the plated film in the openings 24*a*, 24*d*, 24*e* and the opening 28*a*. The partial electrode 30*b* is formed of the plated film in the opening 24*b* and the opening 28*b*. The partial electrode 30*c* is formed of the plated film in the opening 24*c* and the opening 28*c* (see FIG. 5D).

Figure 6A:
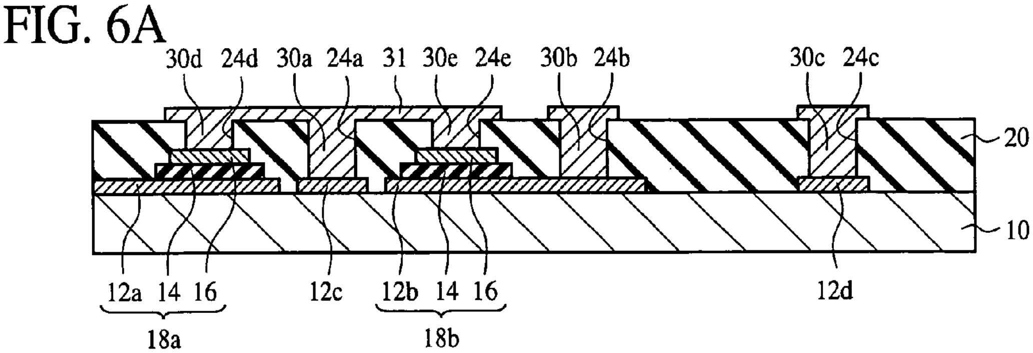
FIGS. 6A to 6D are views of the interposer and the electronic device according to the first embodiment of the present invention in the steps of the method for fabricating the interposer and the electronic device, which illustrate the method (Part 3).

Next, the photoresist film 26 is removed (see FIG. 6A).

Next, the exposed seed layer (not illustrated) is removed by wet etching. The etchant is, e.g., an about 1-10% ammonium persulfate aqueous solution. The etching period of time is, e.g., about 2 minutes. In etching off the seed layer, the surface of the partial electrodes 30*a*-30*c*, the conductor plugs 30*d*, 30*e* and the interconnection 31 are a little etched. However, the partial electrodes 30*a*-30*c*, the conductor plugs 30*d*, 30*e* and the interconnection 31 are not excessively etched, because the thickness of the seed layer is small enough in comparison with the sizes of the partial electrodes 30*a*-30*c*, the conductor plugs 30*d*, 30*e* and the interconnection 31 to be etched off in a short period of time.

Figure 6B:
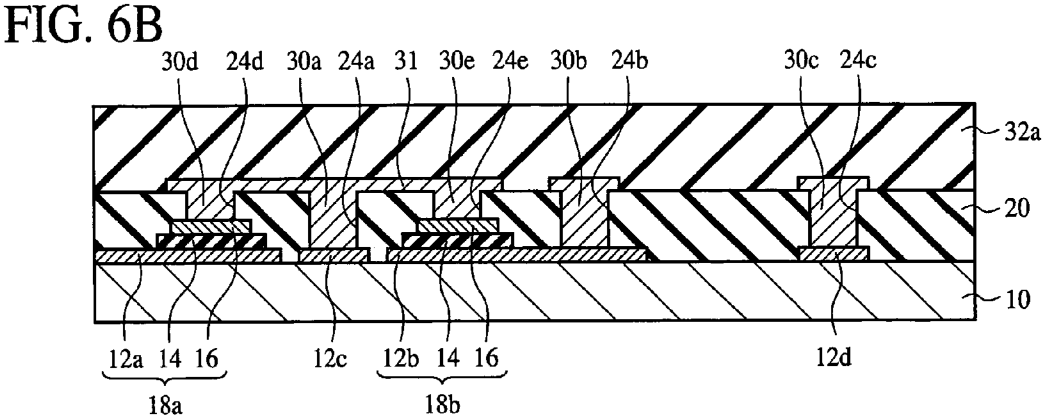

Then, the resin layer 32*a* is formed on the entire surface by, e.g., spin coating (see FIG. 6B). The film thickness of the resin layer 32*a* is, e.g., about 5 μm. The resin layer 32*a* is, e.g., photosensitive BCB (benzocyclobutene) resin. The material of the BCB resin can be a BCB resin solution by, e.g., Dow Chemical Company (Trade name: CYCLOTENE 4024-40), or others. The BCB resin is a thermosetting resin having the characteristic that the BCB resin is liquid before being subjected to heat processing, semi-cured as the cure by the heat processing goes on to some extent and completely cured as the cure further goes on by the heat processing. For the BCB resin, heat processing conditions for semi-curing the BCB resin are 180° C. and about 1 hour, and heat processing conditions for completely curing the BCB resin are 250° C. and about 1 hour. The viscosity of the BCB resin is about 350 cSt at 25° C. Conditions for applying the resin layer 32*a* of the BCB resin are, e.g., 2000 rpm and 30 seconds.

Thus, the resin 32*a* is formed on the resin layer 20 with the partial electrodes 30*a*-30*c*, the conductor plugs 30*d*, 30*e* and the interconnection 31. Immediately after the resin layer 32*a* has been applied, where the heat processing has not been made, the resin layer 32*a* is liquid.

Figure 6C:
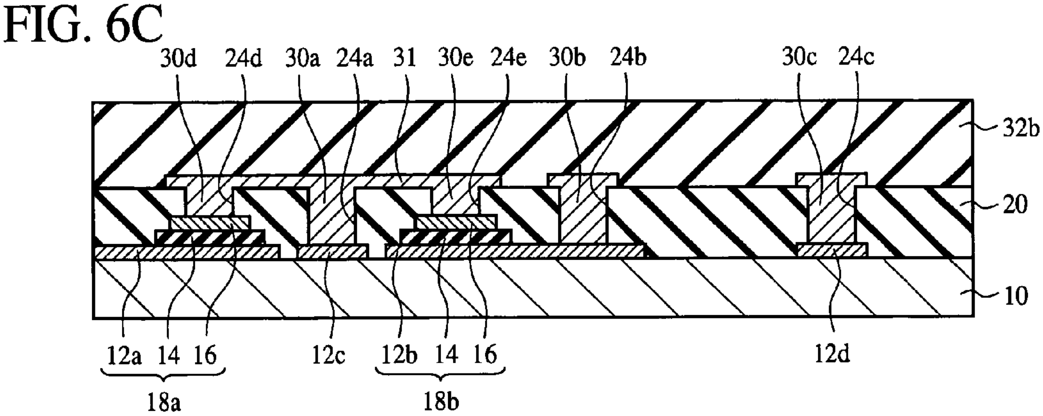

Then, the heat processing is conducted under the conditions for semi-curing the resin layer 32*a* to change the uncured resin layer 32*a* to the semi-cured resin layer. 32*b* (see FIG. 6C). The curing percentage of the resin layer 32*b* is preferably 40-80%. The curing percentage of the resin layer 32*b* is about 50-60% here. The heat processing temperature is, e.g., about 180° C., and the heat processing period of time is, e.g., about 1 hour. The atmosphere for the heat processing is, e.g., $N_2$ atmosphere.

The heat processing conditions are not essentially as described above and can be suitably set. For example when the heat processing temperature is set higher, the heating processing period of times may be set short. When the heat processing temperature is set low, the heat processing period of time is set long.

However, it is preferable to set the heat processing temperature at a temperature higher than the boiling point of the solvent of the BCB resin solution. That is, when the heat processing is conducted at a temperature lower than the boiling point of the solvent of the BCB resin solution, the solvent of the BCB resin solution remains in the resin layer 32*b*. In this case, the solvent remaining in the resin layer 32*b* evaporates in the heat processing to be conduced in a later step. In the heat processing in the later step, the heat processing is conduced with the resin layer 32*b* and the resin layer 48*b* stacked (see FIGS. 17A and 17B), and the evaporated solvent is confined in the resin layer 42*b*. When the evaporated solvent is confined in the resin layer 32*b*, voids are formed in the resin layer 32*b*. Accordingly, in order to prevent the generation of voids in the resin layer 32*b* in the heat processing in the later step, it is preferable to set the heat processing temperature higher than the boiling point of the solvent of the BCB resin solution.

Figure 6D:
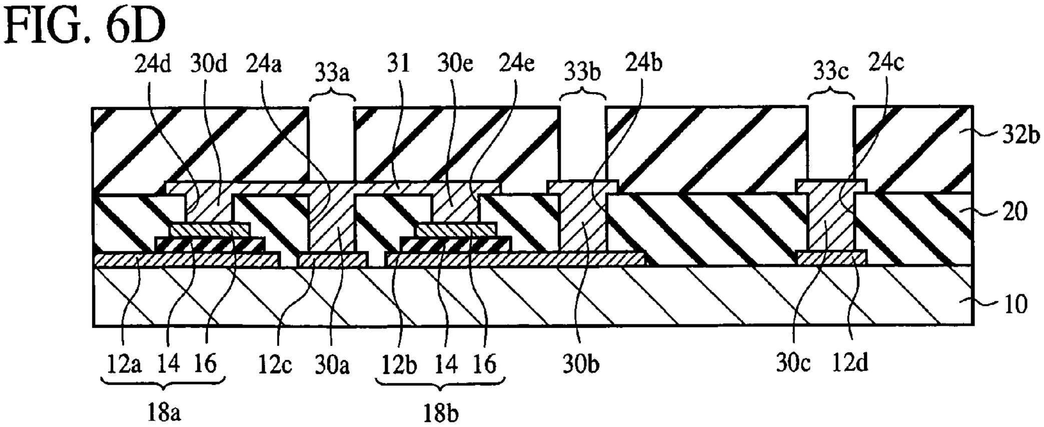

Then, the openings 33*a*-33*c* are formed in the resin layer 32*b* by photolithography (see FIG. 6D). In the opening 33*a*, the partial electrode 38*a* to be a part of the through-electrode 77*a* is to be buried in, and the opening 33*a* is formed down to the partial electrode 30*a*. In the opening 33*b*, the partial electrode 38*b* to be a part of the through-electrode 77*b* is to be buried in, and the opening 33*b* is formed down to the partial electrode 30*b*. In the opening 33*c*, the partial electrode 38*c* to be a part of the through-electrode 77*c* is to be buried in, and the opening 33*c* is formed down to the partial electrode 30*c*.

Then, a Cr film and a Cu film are sequentially laid on the entire surface by, e.g., sputtering to thereby form the seed layer (not illustrated).

Next, a photoresist film 34 is formed on the entire surface by spin coating.

Figure 7A:
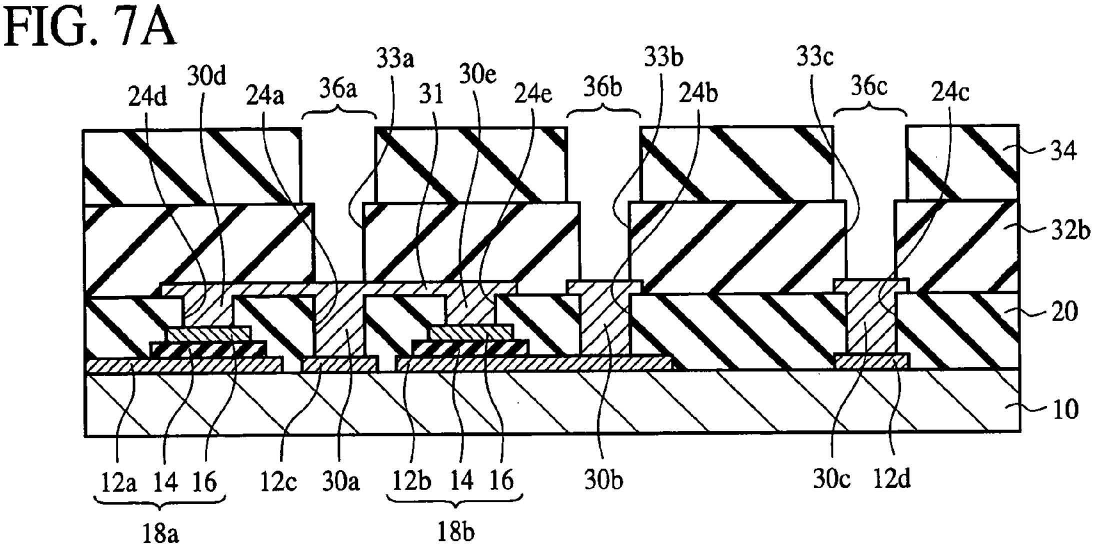
FIGS. 7A to 7C are views of the interposer and the electronic device according to the first embodiment of the present invention in the steps of the method for fabricating the interposer and the electronic device, which illustrate the method (Part 4).
Figure 7B:
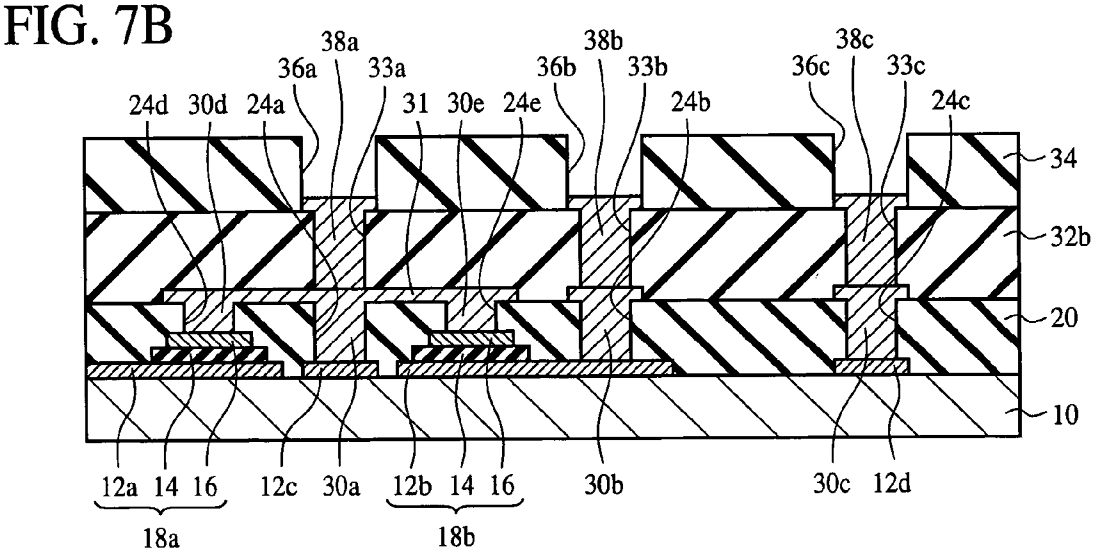

Next, the openings 36*a*-36*c* are formed in the photoresist film 34 by photolithography (see FIG. 7A). The opening 36*a* is for forming the partial electrode 38*a*. The opening 36*b* is for forming the partial electrode 38*b*. The opening 36*c* is for forming the partial electrode 38*c*.

Then, the plating film of, e.g., Cu is formed in the openings 33*a*-33*c* and the openings 36*a*-36*c* by electroplating. The thickness of the plated film is, e.g., about 6 μm. Thus, the partial electrodes 38*a*-38*c* of the plated film are formed in the openings 33*a*-33*c* and the opening 36*a*-36*c* (see FIG. 7B).

Figure 7C:
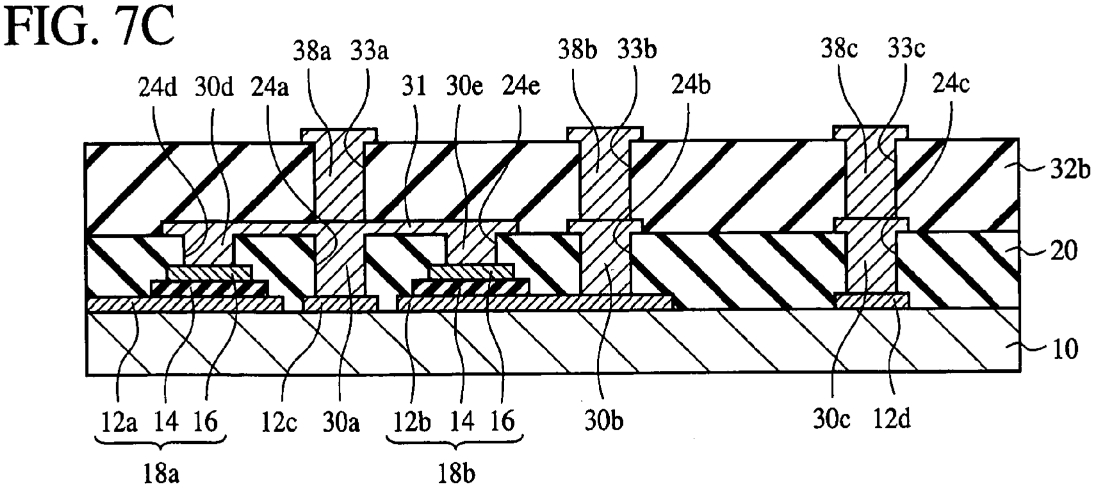

Next, the photolithography 34 is released (see FIG. 7C).

Then, the exposed seed layer (not illustrated) is removed by wet etching. The etchant is, e.g., an about 1-10% ammonium persulfate aqueous solution. The etching period of time is about 2 minutes. In etching the seed layer, the surfaces of the partial electrodes 38*a*-38*c* are also etched a little, but the seed layer, whose thickness is small enough in comparison with the size of the partial electrodes 38*a*-38*c* to be etched in a short period of time and keep the partial electrodes 38*a*-38*c* from being excessively etched.

Figure 8A:
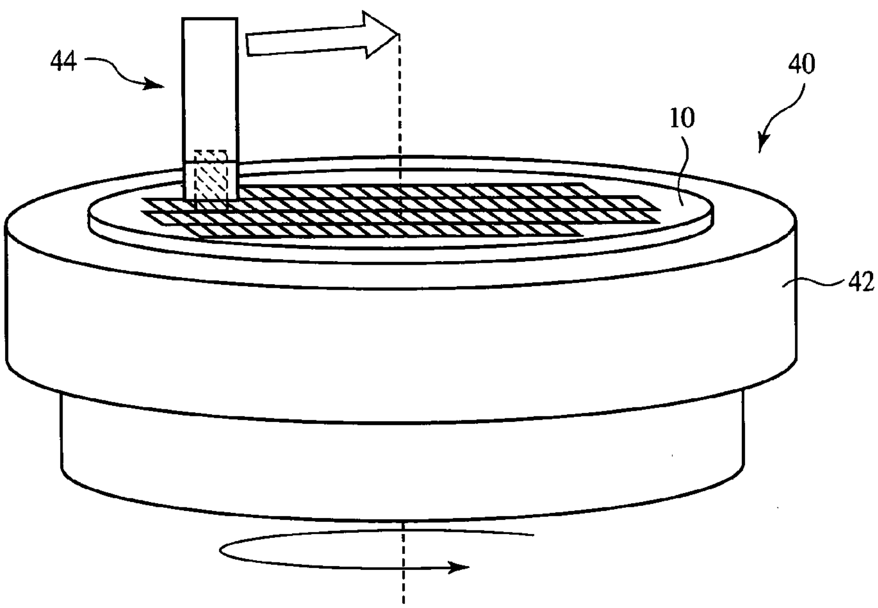
FIGS. 8A and 8B are views of the interposer and the electronic device according to the first embodiment of the present invention in the steps of the method for fabricating the interposer and the electronic device, which illustrate the method (Part 5).

Then, as illustrated in FIG. 8A, the semiconductor substrate 10 is secured to the chuck table 42 of an ultra-precision lathe 40 by vacuum suction.

FIG. 8A is a perspective view of the semiconductor substrate secured to the ultra-precision lathe. When the semiconductor substrate 10 is secured to the chuck table 42, the underside of the semiconductor substrate 10, i.e., the surface where the partial electrodes 38*a*-38*c*, etc. are not formed is secured to the chuck table 42.

The chuck table 42 is for securing an object to be processed, such as substrates or others, in processing the substrates, etc.

To secure the semiconductor substrate 10 to the chuck table 42, it is preferable to use a pin chuck.

Figure 8B:
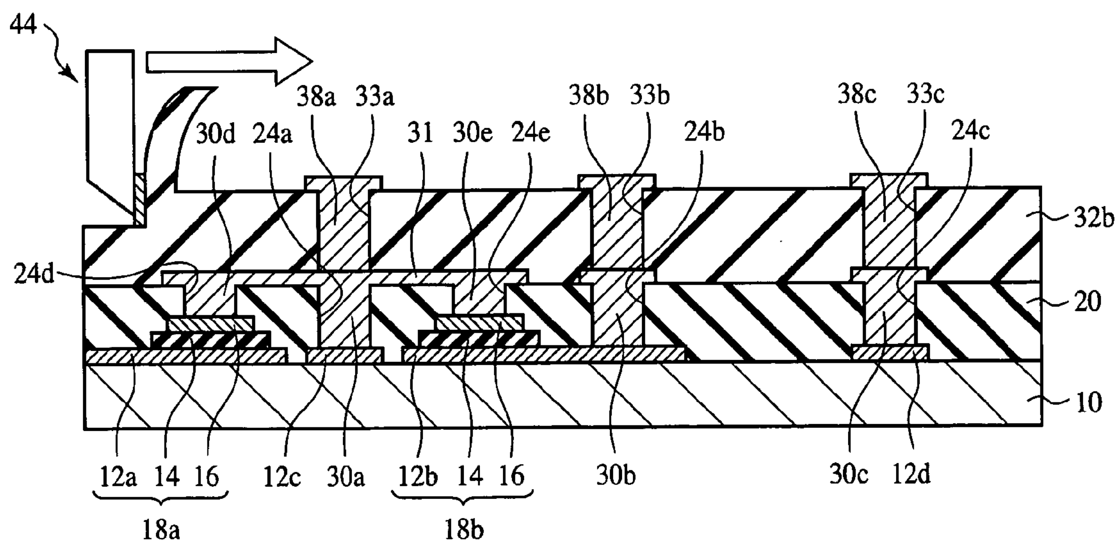

Next, while the semiconductor substrate 10 is being rotated, the upper parts of the partial electrodes 38*a*-38*c* and the upper part of the resin layer 32*b* are ground with a cutting tool 44 of diamond (see FIGS. 8A and 8B). At this time, the rough cut is conducted until the thickness of the resin layer 32*b* is reduced to about 3 μm.

Conditions for roughly cutting the upper parts of the partial electrodes 38*a*-38*c* and the upper part of the resin layer 32*b* are as exemplified below.

The rake angle of the cutting tool 44 is, e.g., 0 degree. The rake angle means an angle formed by a vertical plane to a cut surface of an object to be cut, and a front surface (face) of a cutting edge of the cutting tool in the forward direction. Generally, as the rake angle is larger, the cut is better, but there is a tendency that the cutting tool edge is more damaged, and the life of the edge is shorter.

The rotation number of the chuck table 42 is, e.g., about 2000 rpm. In this case, the cutting speed is, e.g., about 20 m/second.

The cut amount of the cutting tool 44 is, e.g., about 2-3 μm. The cut amount is a depth of cut of the cutting tool 44.

The feed of the cutting tool 44 is, e.g., 50-100 μm/rotation. The feed is a advance speed of the cutting tool in the radial direction of the chuck table 42 (i.e., the direction interconnecting one point of the outer edge of the chuck table 42 and the center of the rotation of the chuck table 42) in the cutting.

When the upper parts of the partial electrodes 38*a*-38*c* and the upper part of the resin layer 32*b* are cut with the cutting tool 44, some large force is exerted to the partial electrodes 38*a*-38*c* and the resin layer 32*b* by the cutting tool 44. While the upper part of the resin layer 32*b* is being cut, forces are exerted not only horizontally to one surface of the resin layer 32*b* (opposite to the surface contacting the resin layer 20), but also vertically to one surface of the resin layer 32*b* (opposite to the surface contacting the resin layer 20). Accordingly, the resin layer 32*b* is cut in a some-extent compression-deformed state. The resin layer 32*b*, which has been compression-deformed by the cutting tool in the cut, restores the shape to some extent after the cut. On the other hand, the partial electrodes 38*a*-38*c*, which are formed of metal, such as Cu or others, are not substantially compression-deformed in the cut. Accordingly, the height of said one surface of the resin layer 32*b* (surface opposite to the surface contacting the resin layer 20) after the cutting is larger than the height of said one surface of the partial electrodes 38*a*-38*c* (opposite to the surface contacting the partial electrodes 30*a*-30*c*) after the cut.

Figure 9A:
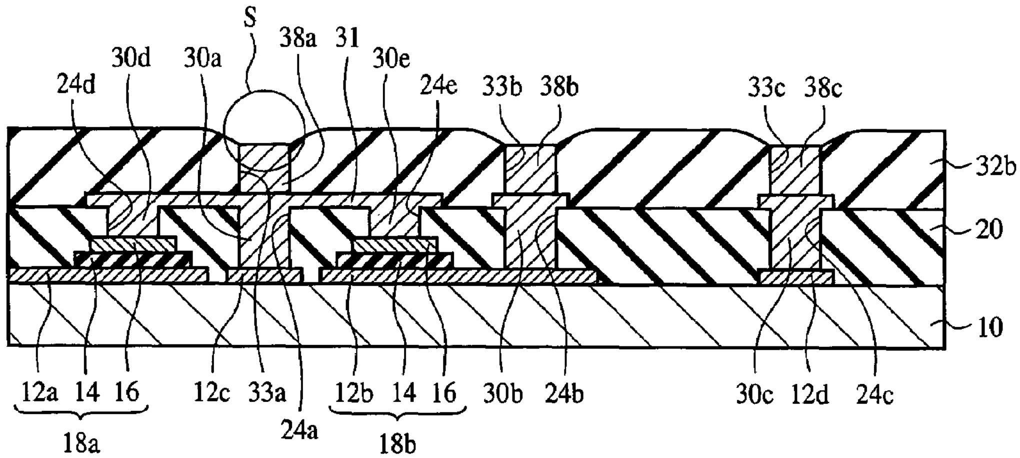
FIGS. 9A to 9C are views of the interposer and the electronic device according to the first embodiment of the present invention in the steps of the method for fabricating the interposer and the electronic device, which illustrate the method (Part 6).
Figure 9B:
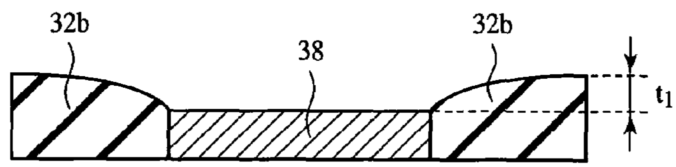

Immediately after the rough cut, as illustrated in FIGS. 9A and 9B, the different $t_1$ between the height of one surface of the resin layer 32 (opposite to the surface contacting the resin layer 20) and the height of one surfaces of the partial electrodes 38*a*-38*c* (opposite to the surfaces contacting the partial electrodes 30*a*-30*c*) is about several hundred nanometer, which is relatively large. FIG. 9B is an enlarged sectional view of the part in the circle S in FIG. 9A.

When the difference $t_1$ between the height of one surface of the resin layer 32*b* (opposite to the surface contacting the resin layer 20) and the height of one surfaces of the partial electrodes 38*a*-38*c* (opposite to the surfaces contacting the partial electrode 30*a*-30*c*) is so relatively large, the partial electrodes 38*a*-38*c* and the partial electrodes 56*a*-56*c* cannot be often connected respectively to each other, because even when the resin layer 42*b* is cured and shrunk by heat processing in a later step, the height of one surface of the resin layer 32*b* (opposite to the surface contacting the resin layer 20) remains larger than the height of one surfaces of the partial electrodes 38*a*-38*c* (opposite to the surfaces of the partial electrodes 30*a*-30*c*).

Figure 9C:
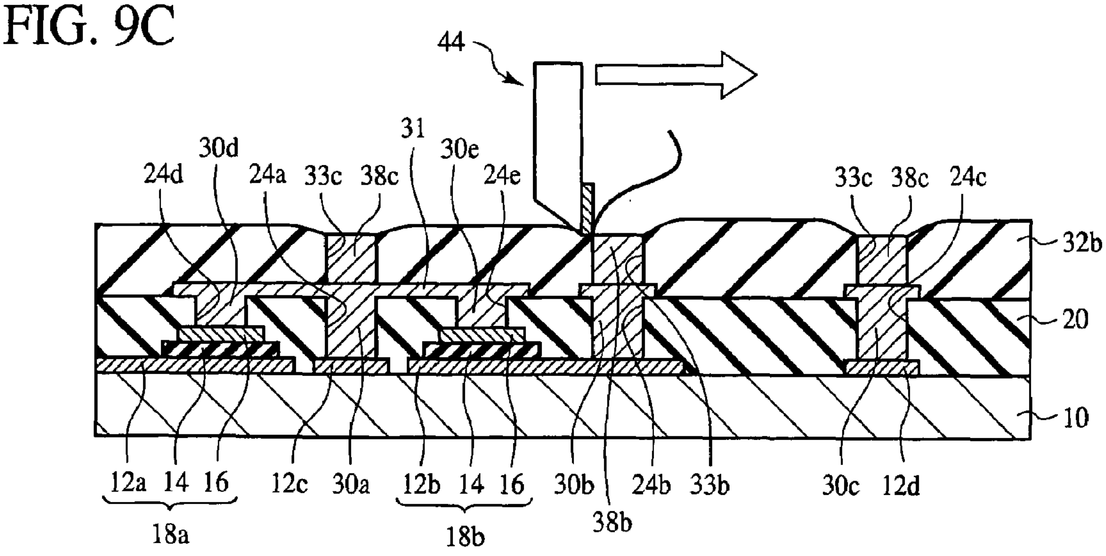

Thus, the rough cut is followed by a finish cut, so that the difference $t_1$ between the height of one surface of the resin layer 32*b* (opposite to the surface contacting the resin layer 20) and the height of one surfaces of the partial electrodes 38*a*-38*c* (opposite to the surfaces contacting the partial electrodes 30*a*-30*c*) becomes a suitable value (see FIG. 9C).

Conditions for finish-cutting the upper parts of the partial electrodes 38*a*-38*c* and the upper part of the resin layer 32*b* are as exemplified below.

The rake angle of the cutting tool 44 and the rotation number of the chuck table 42 in the finish polish are the same as those for the rough cut of the resin layer 32*b*. The feed of the cutting tool 44 in the finish-polish is, e.g., 20 μm/rotation.

The cut amount of the cutting tool 44 is, e.g., 500 nm. The cut amount of the cutting tool 44 is set so small that the difference between the height of one surface of the resin layer 32*b* (opposite to the surface contacting the resin layer 20) and the height of one surfaces of the partial electrodes 38*a*-38*c* (opposite to the surfaces contacting the partial electrodes 30*a*-30*c*) is made suitably small.

The cut amount of the cutting tool 44 is not essentially 500 nm. The cut amount of the cutting tool 44 may be set at, e.g., about 10-100 nm.

Figure 10A:
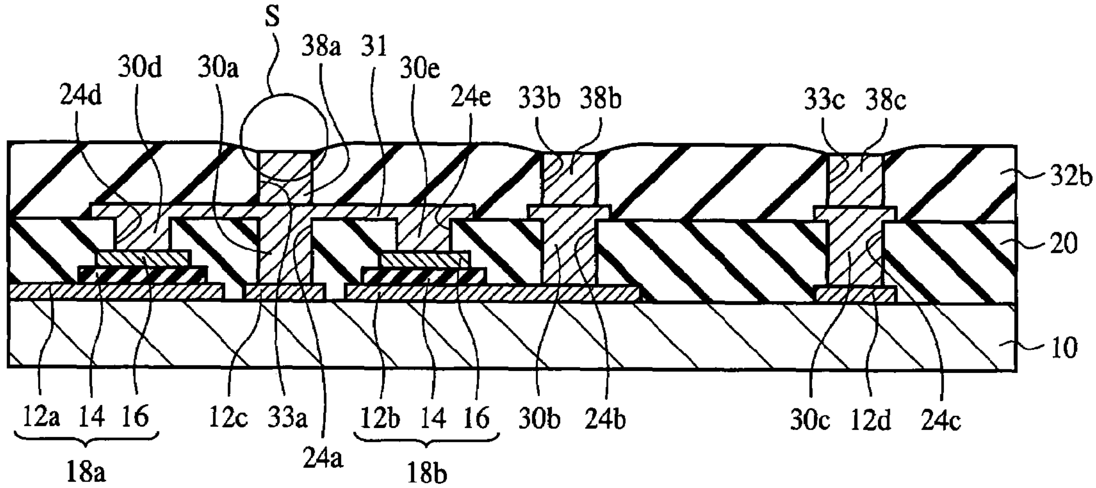
FIGS. 10A and 10B are views of the interposer and the electronic device according to the first embodiment of the present invention in the steps of the method for fabricating the interposer and the electronic device, which illustrate the method (Part 7).
Figure 10B:
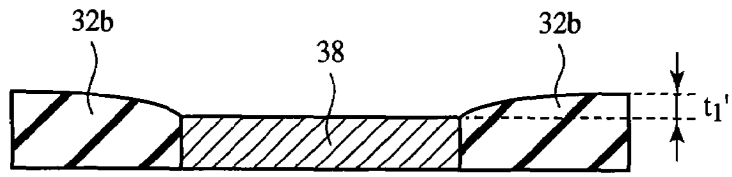

Even with the finish-polish, as illustrated in FIG. 10A and 10B, the difference $t_1$' between the height of one surface of the resin layer 32*b* (opposite to the surface contacting the resin layer 20) and the height of one surfaces of the partial electrodes 30*a*-30*c* (opposite to the surfaces contacting the partial electrodes 30*a*-30*c*) does not become zero. This is because in the finish-cut as well, the resin layer 32*b* is compression deformed to some extent, and the resin layer 32*b*, which has been compression-deformed in the finish cut, restores to some extent after the cut. FIG. 10B is an enlarged sectional views of the part in the circle S in FIG. 10A.

It is preferable that the finish cut is so conducted that the difference $t_1$' between the height of one surface of the resin layer 32*b* (opposite to the surface contacting the resin layer 20) and the height of one surfaces of the partial electrodes 38*a*-38*c* (opposite tot the surfaces contacting the partial electrodes 30*a*-30*c*) becomes about 0-100 nm.

The different $t_1$' between the height of one surface of the resin layer 32*b* (opposite to the surface contacting the resin layer 20) and the height of one surfaces of the partial electrodes 38*a*-38*c* (opposite to the surfaces contacting the partial electrodes 30*a*-30*c*) is set at 0-100 nm for the following reason.

That is, when the difference $t_1$' between the height of one surface of the resin layer 32*b* (opposite to the surface contacting the resin layer 20) and the height of one surfaces of the partial electrodes 38*a*-38*c* (opposite to the surfaces contacting the partial electrodes 30*a*-30*c*) is larger than 100 nm, as described above, one surface of the resin layer 32*b* (opposite to the surface contacting the resin layer 20) remains higher than one surfaces of the partial electrodes 38*a*-38*c* (opposite to the surfaces contacting the partial electrodes 30*a*-30*c*) even if the resin layer 32*b* is cured and shrunk by the heat processing in a later step. The partial electrodes 38*a*-38*c* and the partial electrodes 56*a*-56*c* cannot be often connected respectively to each other.

On the other hand, when one surface of the resin layer 32*b* (opposite to the surface contacting the resin layer 20) is smaller than the height of one surfaces of the partial electrodes 38*a*-38*c* (opposite to the surfaces contacting the partial electrodes 30*a*-30*c*), in the heat processing in a later step, the resin layer 32*b* and the resin layer 48*b* are shrunk without being surely adhered to each other. It is difficult to adhere the resin layer 32*b* and the resin layer 48*b* to each other.

For this reason, it is preferable to set the difference $t_1$' between the height of one surface of the resin layer 32*b* (opposite to the surface contacting the resin layer 20) and the height of one surfaces of the partial electrodes 38*a*-38*c* (opposite to the surfaces contacting the partial electrodes 30*a*-30*c*) at 0-100 nm.

If fins are formed between the partial electrodes 38*a*-38*c* in the cut, there is a risk that the adjacent partial electrodes 38*a*-38*c* might be short-circuited with each other. Accordingly, it is preferable to set cutting conditions suitably not to form fins on the partial electrodes 38*a*-38*c* in the cut.

Thus, the upper parts of the partial electrodes 38*a*-38*c* and the upper part of the resin layer 32*b* are cut (see FIGS. 10A and 10B).

The cut can be conducted with the semiconductor substrate 10 fixed and the wheel (not illustrated) with the cutting tool 44 mounted on being rotated (not illustrated).

Figure 11A:
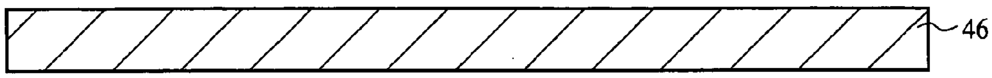
FIGS. 11A to 11D are views of the interposer and the electronic device according to the first embodiment of the present invention in the steps of the method for fabricating the interposer and the electronic device, which illustrate the method (Part 8).

On the other hand, as illustrated in FIG. 11A, the semiconductor substrate 46 is prepared. The semiconductor substrate 46 is a semiconductor substrate which is not cut in a chip size, i.e., in a wafer. The semiconductor substrate 46 is, e.g., a silicon substrate. The thickness of the semiconductor substrate 46 is, e.g., 0.6 mm.

Figure 11B:
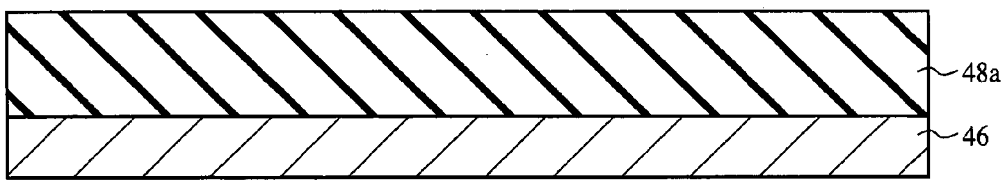

Then, as illustrated in FIG. 11B, the resin layer 48*a* is formed on the entire surface by, e.g., spin coating. The resin layer 48*a* can be, e.g., BCB (benzocyclobutene) resin. The material of the BCB resin can be a BCB resin solution by, e.g., Dow Chemical Company (trade name: CYCLOTENE 4024-40) or others. As described above, the BCB resin is a thermosetting resin having the characteristic that the BCB resin is liquid before being subjected to heat processing, semi-cured as the cure by the heat processing goes on to some extent and completely cured as the cure further goes on by the heat processing. For the BCB resin, as described above, heat processing conditions for semi-curing the BCB resin are 180° C. and about 1 hour, and heat processing conditions for completely curing the BCB resin are 250° C. and about 1 hour. The film thickness of the resin layer 48*a* is, e.g., about 5 μm. Immediately after the resin layer 48*a* has been applied, without heat processing so far conducted, the resin layer 48*a* is liquid.

Figure 11C:
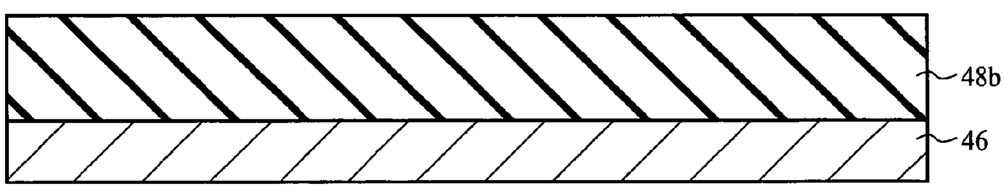

Then, heat processing is conducted under conditions which semi-cure the resin layer 48*a* to thereby change the uncured resin layer 48*a* to the semi-cured resin layer 48*b* (see FIG. 11C). The curing percentage of the resin layer 48*b* is preferably 40-80%. The curing percentage of the resin layer 48*b* is about 50-60% here. The heat processing temperature is, e.g., about 180° C., and the heat processing period of time is, e.g., about 1 hour. As described above, it is preferable to set the heat processing temperature higher than the boiling point of the BCB resin solution.

Figure 11D:
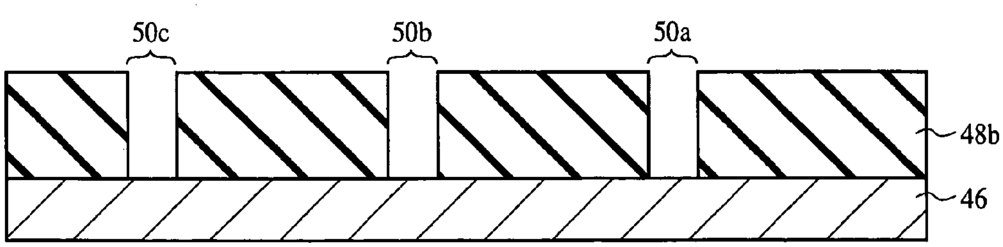

Next, the openings 50*a*-50*c* are formed in the resin layer 48*b* down to the semiconductor substrate 46 by photolithography (see FIG. 11D). In the opening 50*a*, the partial electrode 56*a* to be a part of the through-electrode 77*a* is to be buried, and the opening 50*a* is formed so as to correspond to the partial electrode 38*c*. In the opening 50*b*, the partial electrode 38*b* to be a part of the through-electrode 77*b* is to be buried in, and the opening 50*b* is formed so as to correspond to the partial electrode 38*b*. In the opening 50*c*, the partial electrode 56*c* to be a part of the through-electrode 77*c* is to be buried in, and the opening 50*c* is formed so as to correspond to the partial electrode 38*c*.

Next, a Cr film and a Cu film are sequentially laid on the entire surface by, e.g., sputtering to form a seed layer (not illustrated).

Next, a photoresist film 52 is formed on the entire surface by spin coating.

Figure 12A:
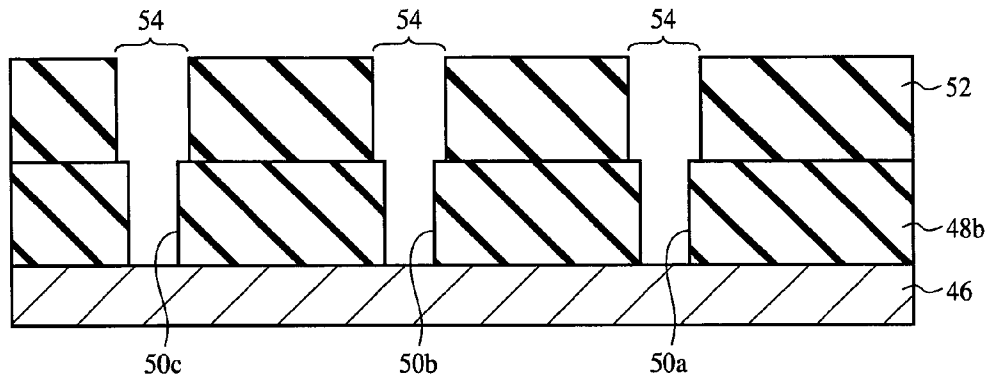
FIGS. 12A to 12C are views of the interposer and the electronic device according to the first embodiment of the present invention in the steps of the method for fabricating the interposer and the electronic device, which illustrate the method (Part 9).
Figure 12B:
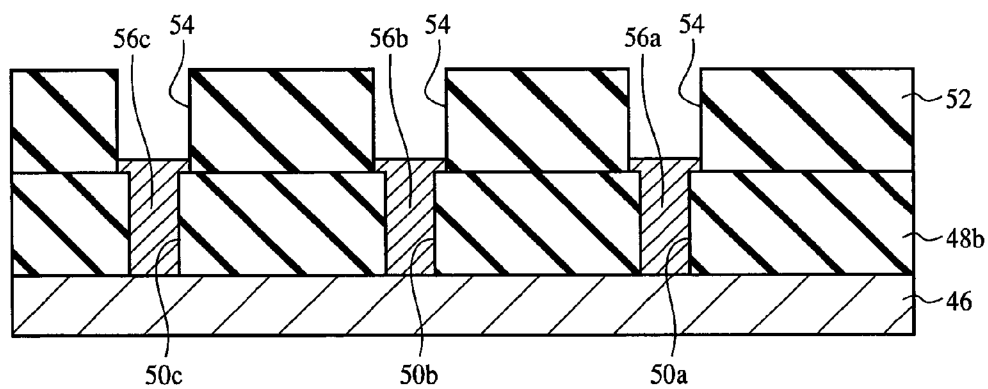

Next, openings 54 are formed in the photoresist film 52 by photolithography (see FIG. 12A). The opening 54 is for forming the partial electrodes 56*a*-56*c*.

Then, a plated film of, e.g., Cu is formed in the openings 50*a*-50*c* and the openings 54 by an electroplating method. The thickness of the plated film is, e.g., about 6 μm. Thus, the partial electrodes 56*a*-56*c* of the plated film are formed in the openings 50*a*-50*c* and the openings 54. The partial electrodes 56*a*-56*c* are formed so as to correspond to the partial electrodes 38*a*-38*c* formed on the semiconductor substrate 10 (see FIG. 12B).

Figure 12C:
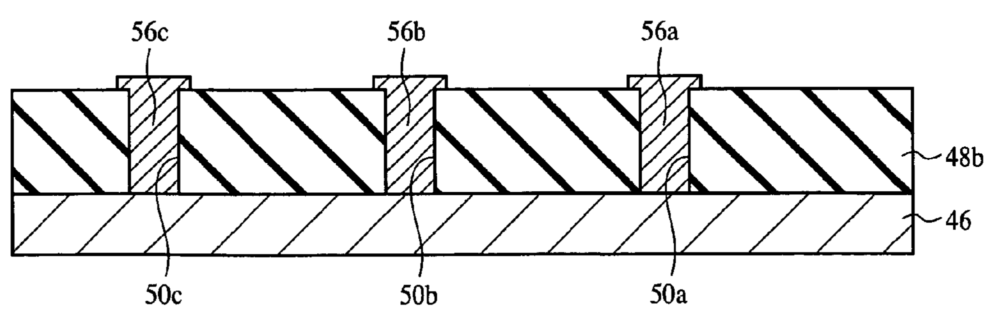

Next, the photoresist film 52 is removed (see FIG. 12C).

Then, the exposed seed layer (not illustrated) is removed by wet etching. The etchant is, e.g., an about 1-10% ammonium persulfate aqueous solution. The etching period of time is, e.g., about 2 minutes. In etching the seed layer, the surfaces of the partial electrodes 56*a*-56*c* are a little etched, but the seed layer, whose thickness is sufficiently smaller in comparison with the size of the partial electrodes 56*a*-56*c*, can be etched in a short period of time, and the partial electrodes 56*a*-56*c* are kept from being excessively etched.

Figure 13A:
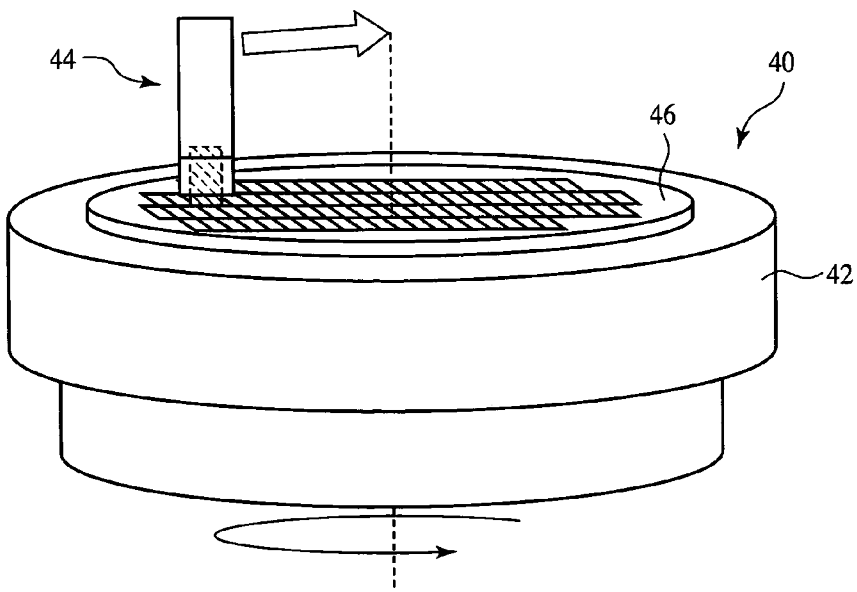
FIGS. 13A and 13B are views of the interposer and the electronic device according to the first embodiment of the present invention in the steps of the method for fabricating the interposer and the electronic device, which illustrate the method (Part 10).

Next, as illustrated in FIG. 13A, the semiconductor substrate 46 is secured to the chuck table 42 of an ultra-precision lathe 40 by vacuum suction. FIG. 13A is a perspective view of the semiconductor substrate secured to the ultra-precision lathe.

When the semiconductor substrate 46 is secured to the chuck table 42, the underside of the semiconductor substrate 46, i.e., the surface where the partial electrodes 56*a*-56*c*, etc. are not formed is secure to the chuck table 42. To secure the semiconductor substrate 46 to the chuck table 56, it is preferable to use a pin chuck (not illustrated).

Figure 13B:
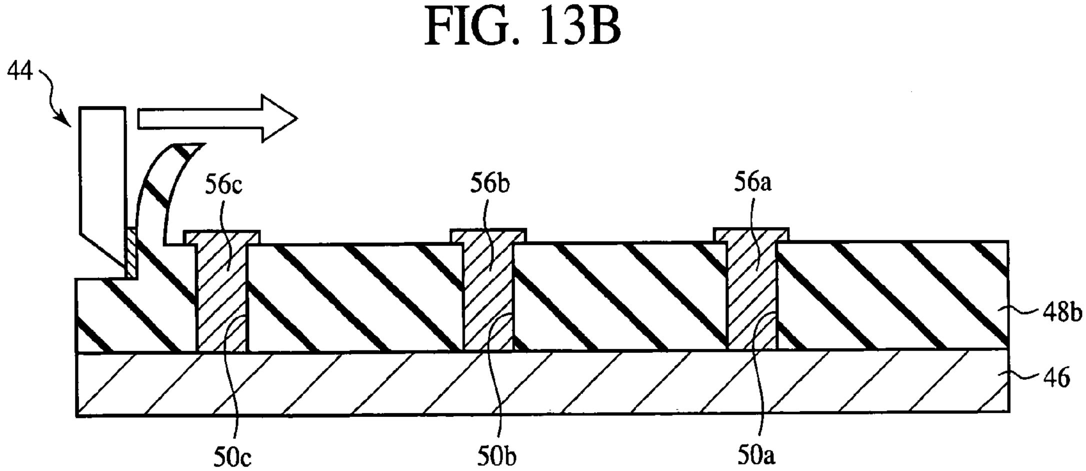

Next, as illustrated in FIG. 13B, with the semiconductor substrate 46 set on rotation, the upper parts of the partial electrodes 56*a*-56*c* and the upper part of the resin layer 48*b* are cut with the cutting tool 44 of diamond (see FIG. 13B). At this time, the rough cut is conducted until the thickness of the resin layer 48*b* becomes about 3 μm.

Conditions for rough-cutting the upper parts of the partial electrodes 56*a*-56*c* and the upper part of the resin layer 48*b* are as exemplified below.

The rake angle of the cutting tool 44 is, e.g., 0 degree.

The rotation number of the chuck table 42 is, e.g., about 3000 rpm. In this case, the cutting speed is, e.g., about 30 m/second.

The cut amount of the cutting tool 44 is, e.g., about 2-3 μm.

Then, the feed of the cutting tool 44 is, e.g., 50 μm/rotation.

The thickness of the resin layer 48*b* before cut is, e.g., about 5 μm while the cut amount of the cutting tool 44 is, e.g., about 2-3 μm. When the cut is conducted until the thickness of the resin layer 48*b* becomes about 3 μm, the thickness of the part of the resin layer 48*b* to be cut is larger than the cut amount of the cutting tool 44. Accordingly, the upper part of the resin layer 48*b* is cut several times to thereby make the thickness of the resin layer 48*b* about 3 μm.

In cutting the upper parts of the partial electrodes 56*a*-56*c* and the upper part of the resin layer 48*b* with the cutting tool 44, some large force is exerted to the partial electrodes 56*a*-56*c* and the resin layer 48*b* by the cutting tool 44. In cutting the upper part of the resin layer 48*b*, forces are exerted not only horizontally to one surface of the resin layer 48*b* (opposite to the surface contacting the semiconductor substrate 46), but also vertically to one surface of the resin layer 48*b* (opposite to the surface contacting the semiconductor substrate 46). Accordingly, the resin layer 48*b* is cut, compression-deformed to some extent. The resin layer 48*b*, which has been compression-deformed by the cutting tool in the cut, restores to some extent after the cut. On the other hand, the partial electrodes 56*a*-56*c*, which are formed of metal, such as Cu, or others, are not substantially compression-deformed in the cut. Accordingly, the height of one surface of the resin layer 48*b* (opposite to the surface contacting the semiconductor substrate 46) after cut is larger than the height of one surface of the electrode 24 (opposite to the surfaces contacting the semiconductor substrate 46) after cut.

Figure 14A:
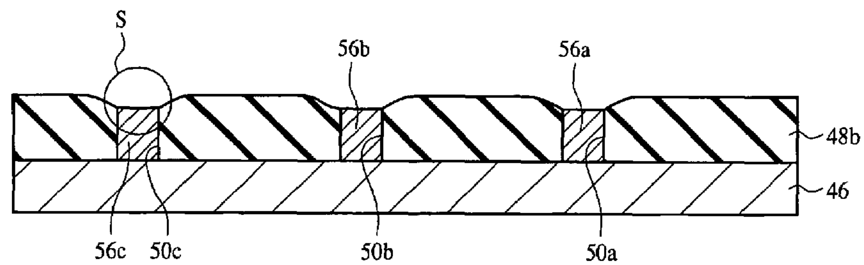
FIGS. 14A to 14C are views of the interposer and the electronic device according to the first embodiment of the present invention in the steps of the method for fabricating the interposer and the electronic device, which illustrate the method (Part 11).
Figure 14B:
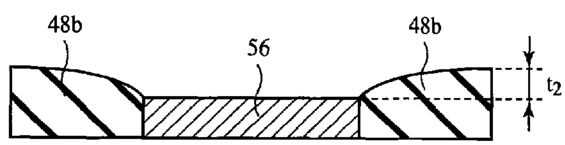

Immediately after the rough cut, as illustrated in FIGS. 14A and 14B, the difference $t_2$ between the height of one surface of the resin layer 48*b* (opposite to the surface contacting the semiconductor substrate 46) and the height of one surfaces of the partial electrodes 56*a*-56*c* (opposite to the surface contacting the semiconductor substrate 46) is about several hundred nanometer, which is relatively large. FIG. 14B is an enlarged sectional view of the part in the circle S in FIG. 14A.

When the difference $t_2$ between the height of one surface of the resin layer 48*b* (opposite to the surface contacting the semiconductor substrate 46) and the height of one surfaces of the partial electrodes 56*a*-56*c* (opposite to the surfaces contacting the semiconductor substrate 46) is thus relatively large, the height of one surface of the resin layer 48*b* (opposite to the surface contacting the semiconductor substrate 46) remains larger than the height of one surfaces of the partial electrodes 56*a*-56*c* (opposite to the surfaces contacting the semiconductor substrate 46) even when the resin layer 48*b* is cured and shrunk by heat processing in a later step, and the partial electrodes 38*a*-38*c* and the partial electrodes 56*a*-56*c* cannot be often connected respectively to each other.

Figure 14C:
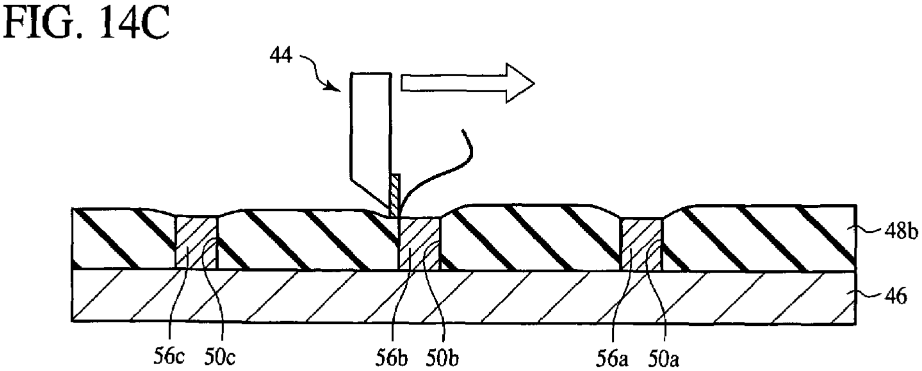

The rough cut is followed by finish cut so that the difference $t_2$ between the height of one surface of the resin layer 48*b* (opposite to the surface contacting the semiconductor substrate 46) and the height of one surfaces of the partial electrodes 56*a*-56*c* (opposite to the surfaces contacting the semiconductor substrate 46) becomes a suitable value (see FIG. 14C).

Conditions for finish-cutting the upper parts of the partial electrodes 56*a*-56*c* and the upper part of the resin layer 48*b* are as exemplified below.

The rake angle of the cutting tool 44, the rotation number of the chuck table 42 and the feed of the cutting tool 44 in the finish polish are the same as those for the rough-cut of the resin layer 48*b*. The finish cut follows the rough cut, and it is not necessary to intentionally change the setting.

The cut amount of the cutting tool 44 is, e.g., 500 nm. The cut amount of the cutting tool 44 is set so small, that the difference $t_2$ between the height of one surface of the resin layer 48*b* (opposite to the surface contacting the semiconductor substrate 46) and the height of one surfaces of the partial electrodes 56*a*-56*c* (opposite to the surfaces contacting the semiconductor substrate 46) can be suitable small.

The cut amount of the cutting tool 44 is not essentially 500 nm. For example, the cut amount of the cutting tool 44 may be set at, e.g., about 10-100 nm.

Even the finish cut cannot make the different t2' between the height of one surface of the resin layer 48*b* (opposite to the surface contacting the semiconductor substrate 46) and the height of one surfaces of the partial electrodes 56*a*-56*c* (opposite to the surfaces contacting the semiconductor substrate 46) zero. This is because, the resin layer 48*b* is compression-deformed to some extent in the finish cut, and the resin layer 48, which has been compression-deformed to some extent in the finish cut, restores to some extent after cut. FIG. 15B is an enlarged sectional view of the part in the circle S in FIG. 15A.

In the finish cut, it is preferable that the finish cut is so conducted that the difference $t_2$' between the height of one surface of the resin layer 48*b* (opposite to the surface contacting the semiconductor substrate 46) and the height of one surfaces of the partial electrodes 56*a*-56*c* (opposite to the surfaces contacting the semiconductor substrate 46) becomes about 0-100 nm.

The difference $t_2$' between the height of one surface of the resin layer 48*b* (opposite to the surface contacting the semiconductor substrate 46) and the height of one surfaces of the partial electrodes 56*a*-56*c* (opposite to the surfaces contacting the semiconductor substrate 46) is set at 0-100 nm for the following reason.

That is, when the difference $t_2$' between the height of one surface of the resin layer 48*b* (opposite to the surface contacting the semiconductor substrate 46) and the height of one surfaces of the partial electrodes 56*a*-56*c* (opposite to the surfaces contacting the semiconductor substrate 46) is larger than 100 nm, as described above, the height of one surface of the resin layer 48*b* (opposite to the surface contacting the semiconductor substrate 46) remains larger than the height of one surfaces of the partial electrodes 56*a*-56*c* (opposite to the surfaces contacting the semiconductor substrate 46) even when the resin layer 48*b* is cured and shrunk by the heat processing in a later step, and the partial electrodes 38*a*-38*c* and the partial electrodes 56*a*-56*c* cannot be often connected respectively to each other.

On the other hand, when the height of one surface of the resin layer 48*b* (opposite to the surface contacting the semiconductor substrate 46) is smaller than the height of one surfaces of the partial electrodes 56*a*-56*b* (opposite to the surfaces contacting the semiconductor substrate 46), in the heat processing in the later step, the resin layer 32*b* and the resin layer 48*b* are shrunk before the resin layer 32*b* and the resin layer 48*b* are adhered to each other, and it is difficult to adhere the resin layer 32*b* the resin layer 48*b* to each other.

For this reason, it is important to set the difference $t_2$' between the height of one surface of the resin layer 48*b* (opposite to the surface contacting the semiconductor substrate 46) and the height of one surfaces of the partial electrodes 56*a*-56*c* (opposite to the surfaces contacting the semiconductor substrate 46) at 0-100 nm.

When fins are formed on the partial electrodes 56*a*-56*c* in the cut, there is a risk that adjacent or neighboring partial electrodes 56*a*-56*c* might short-circuit with each other. Accordingly, it is preferable to set the cutting conditions so that no fins are formed on the electrodes 24 in the cut.

Figure 15A:
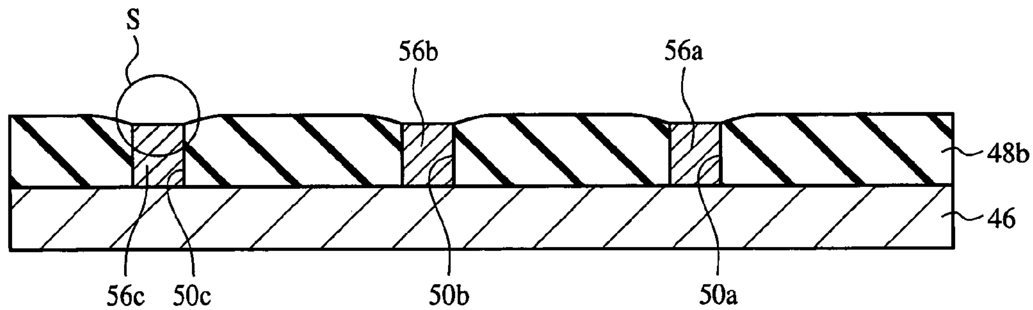
FIGS. 15A and 15B are views of the interposer and the electronic device according to the first embodiment of the present invention in the steps of the method for fabricating the interposer and the electronic device, which illustrate the method (Part 12).
Figure 15B:
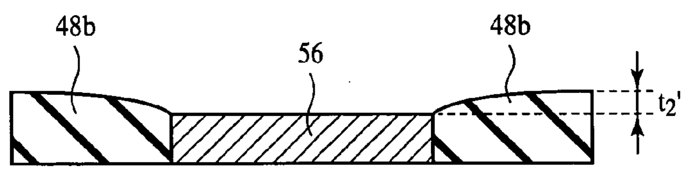

Thus, the upper part of the partial electrodes 56*a*-56*c* and the upper part of the resin layer 48*b* are cut (see FIGS. 15A and 15B).

The cut can be conducted by securing the semiconductor substrate 46 and rotating a wheel (not illustrated) with the cutting tool 44 mounted on.

Then, the semiconductor substrate 10 is cut in a prescribed size with a thin blade of diamond particles combined with a binder (not illustrated).

Similarly, the semiconductor substrate 46 is cut in a prescribed size with the thin blade (not illustrated).

Figure 16A:
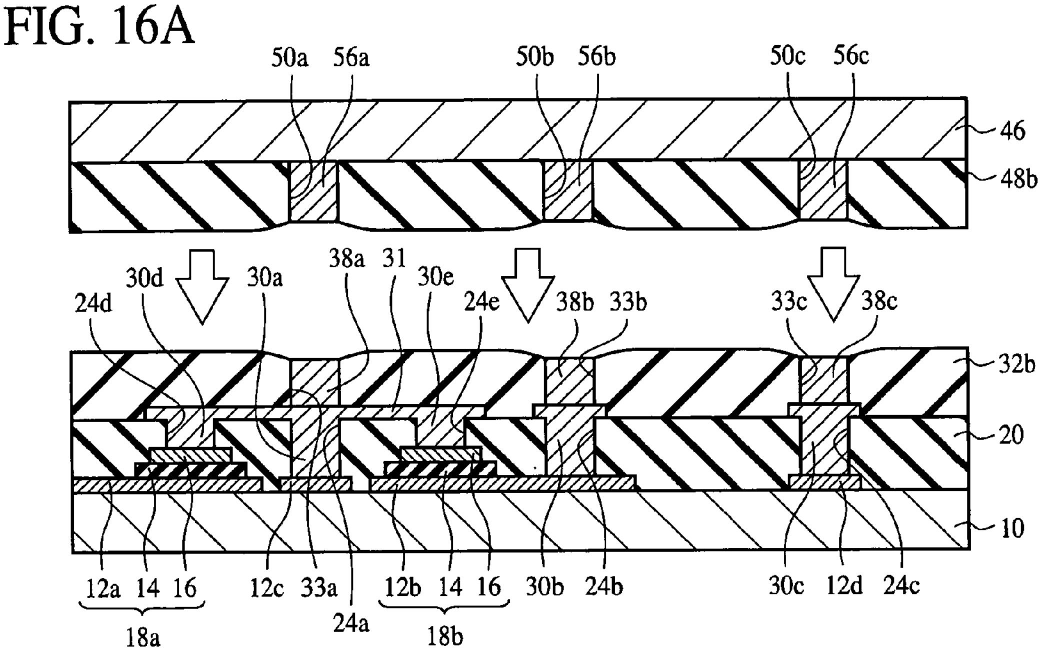
FIGS. 16A to 16C are views of the interposer and the electronic device according to the first embodiment of the present invention in the steps of the method for fabricating the interposer and the electronic device, which illustrate the method (Part 13).

Next, as illustrated in FIG. 16A, the semiconductor substrate 10 and the semiconductor substrate 46 are opposed to each other. At this time, the semiconductor substrate 10 and the semiconductor substrate 46 are opposed to each other with the partial electrodes 38*a*-38*c* on the semiconductor substrate 10 and the partial electrodes 56*a*-56*c* on the semiconductor substrate 46 located near respectively to each other.

Figure 16B:
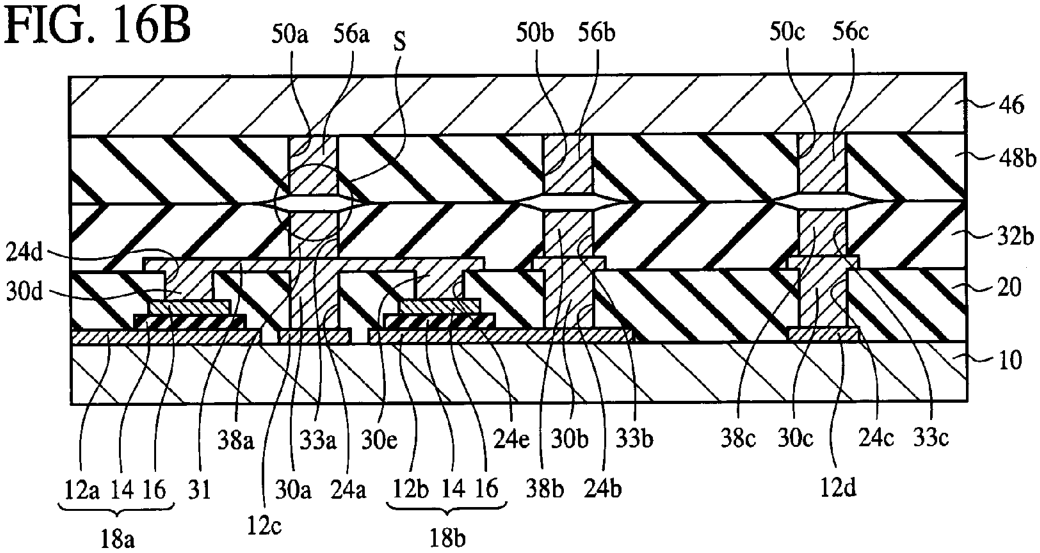
Figure 16C:
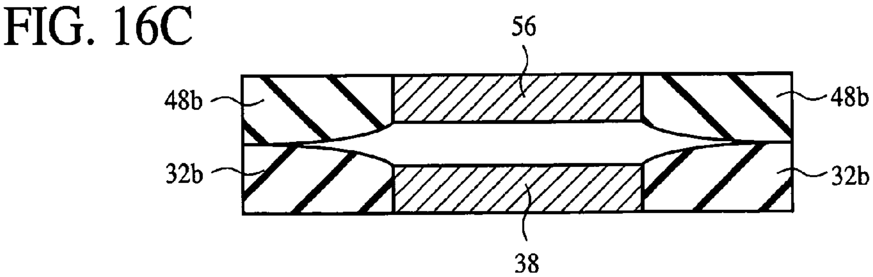

Then, the semiconductor substrate 10 and the semiconductor substrate 46 are brought nearer to each other. FIG. 16B is a sectional view of the resin layer 32*b* formed on the semiconductor substrate 10 and the resin layer 48*b* formed on the semiconductor substrate 46 contacted with each other. FIG. 16C is an enlarged sectional view of the part in the circle S in FIG. 16B.

Figure 17A:
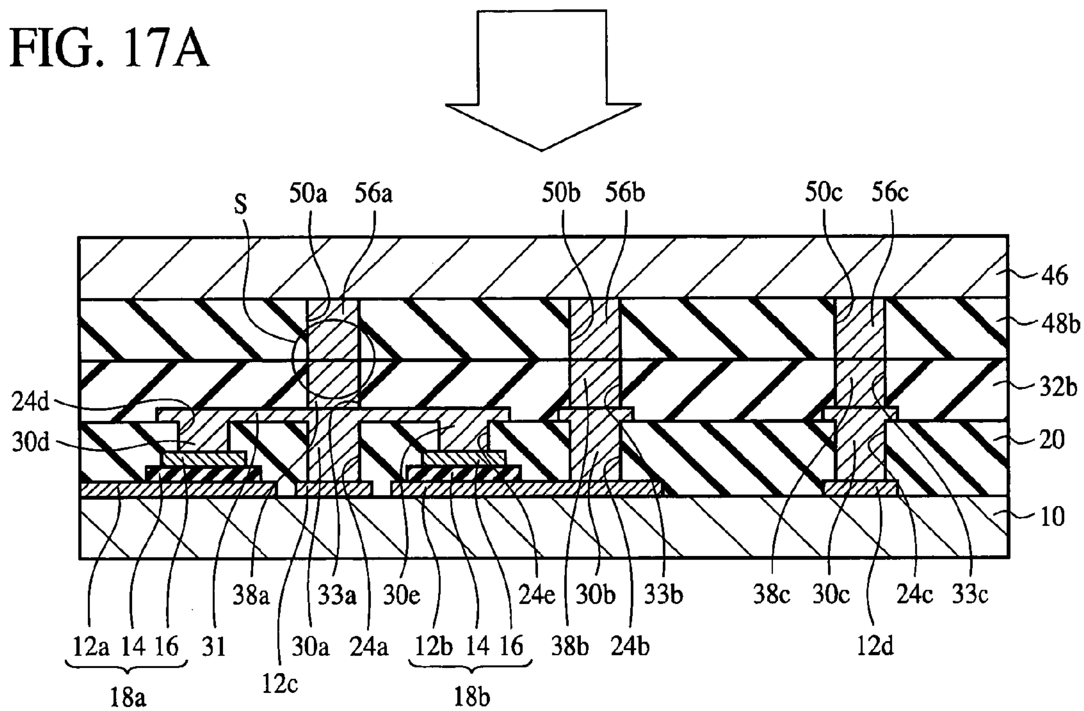
FIGS. 17A and 17B are views of the interposer and the electronic device according to the first embodiment of the present invention in the steps of the method for fabricating the interposer and the electronic device, which illustrate the method (Part 14).
Figure 17B:
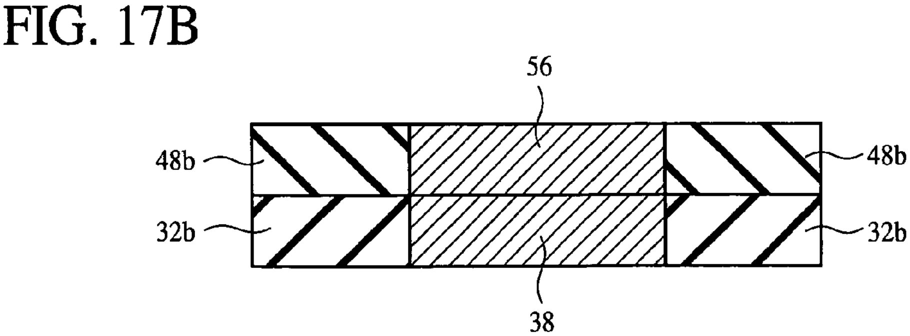

Next, heat processing is conduced with the partial electrodes 38*a*-38*c* on the semiconductor substrate 10 and the partial electrodes 56*a*-56*b* on the semiconductor substrate 46 being in close contact respectively with each other and with the resin layer 32*b* on the semiconductor substrate 10 and the resin layer 48*b* on the semiconductor substrate 46 being in close contact with each other with a pressure applied from the outside to the semiconductor substrate 10 and to the semiconductor substrate 46 (see FIGS. 17A and 17B). FIG. 17B is an enlarged sectional view of the part in the circle S in FIG. 17A.

An oven (heat processing apparatus), for example, is used for the heat processing. The heat processing temperature is, e.g., 250° C. The heat processing period of time is, e.g., about 1 hour. The pressure is, e.g., about 10 kPa. The heat processing under these conditions surely adheres the resin layer 32*a* and the resin layer 48*b* to each other. The resin layer 32*b* and the resin layer 48*b* respectively shrink. The resin layer 32*a* and the resin layer 48*b* are adhered to each other while the resin layer 32*b* and the resin layer 48*b* respectively shrink, and due to shrinkage of the resin layer 32*b* and the resin layer 48*b*, the partial electrodes 38*a*-38*c* and the partial electrodes 56*a*-56*c* are jointed respectively to each other. The partial electrodes 38*a*-38*c* and the partial electrodes 56*a*-56*c* are jointed respectively to each other due to the shrinkage of the resin layer 32*b* and the resin layer 48*b*, which makes it unnecessary to apply a high pressure from the outside to the semiconductor substrate 10 and to the semiconductor substrate 46.

Figure 18A:
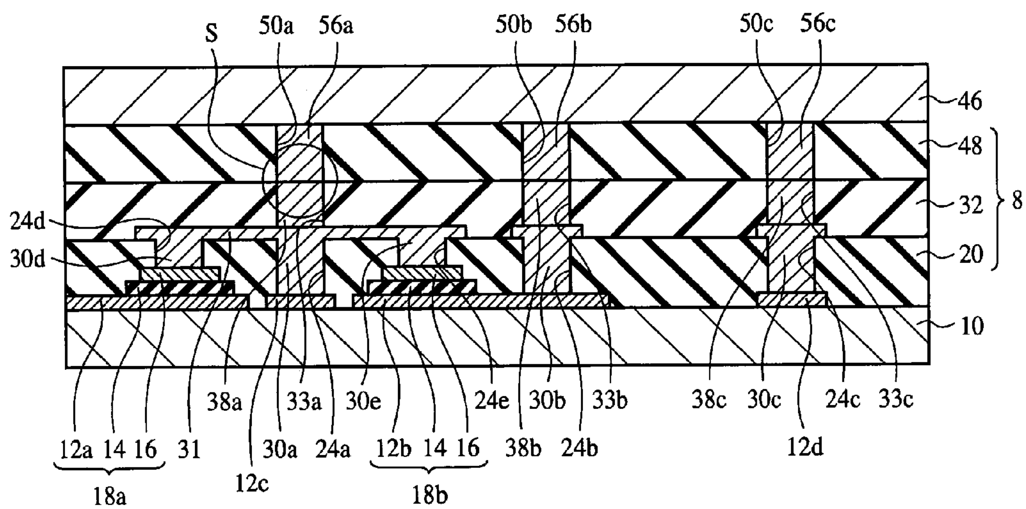
FIGS. 18A and 18B are views of the interposer and the electronic device according to the first embodiment of the present invention in the steps of the method for fabricating the interposer and the electronic device, which illustrate the method (Part 15).
Figure 18B:
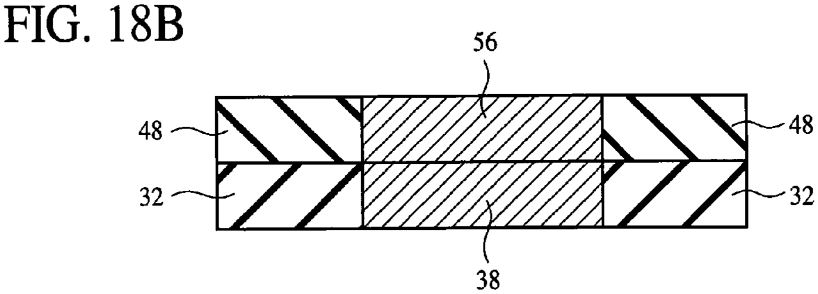

Then, the semi-cured resin layers 32*b*, 48*b* become the completely cured resin layers 32, 48 (see FIGS. 18A and 18B). FIG. 18B is an enlarged sectional view of the part in the circle S in FIG. 18A. The completely cured resin layers 32, 48 have been sufficiently shrunk, whereby the partial electrodes 38*a*-38*c* and the partial electrodes 56*a*-56*c* never part respectively from each other.

The heat processing temperature is set at 250° C., and the heat processing period of time is set at 1 hour here. The heat processing temperature and the heat proceeding period of time are not limited to them. With the heat processing temperature set higher, the heat processing period time may be shorter. For example, when the heat processing temperature is set at about 300° C., the heat processing period of time may be about 3 minutes. When the heat processing period of time is set lower, the heat processing period of time may be set longer. For example, when the heat processing temperature is set at about 200° C., the heat processing period of time may be set at about 7-8 hours.

However, when the heat processing temperature is set higher, it is often that the film quality of the resin layers 32, 42 does not become good. When the heat processing temperature is set lower, the heat processing period of time becomes longer. In view of the film quality of the resin layers 32, 48, the throughput, etc. It is preferable that the heat processing temperature is set about 250° C., and the heat processing period of time is about 1 hour.

The pressure applied to the semiconductor substrate 10 and to the semiconductor substrate 46 is about 10 kPa here. However, the pressure to be applied to the semiconductor substrate 10 and to the semiconductor substrate 46 is limited to about 10 kPa. For example, the pressure may be set suitably in the range of, 1-100 kPa.

Figure 19A:
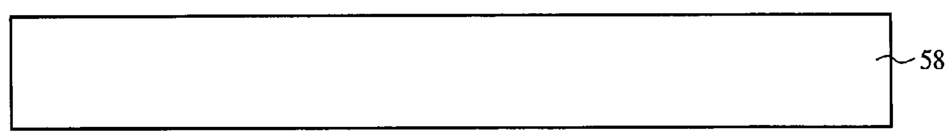
FIGS. 19A to 19C are views of the interposer and the electronic device according to the first embodiment of the present invention in the steps of the method for fabricating the interposer and the electronic device, which illustrate the method (Part 16).

Next, as illustrated in FIG. 19A, the supporting substrate 58 is prepared. The supporting substrate 58 is, e.g., glass supporting substrate. The supporting substrate 58 is for supporting the semiconductor substrate 46, etc. in removing the semiconductor substrate 10 by polishing or others in a later step.

Figure 19B:
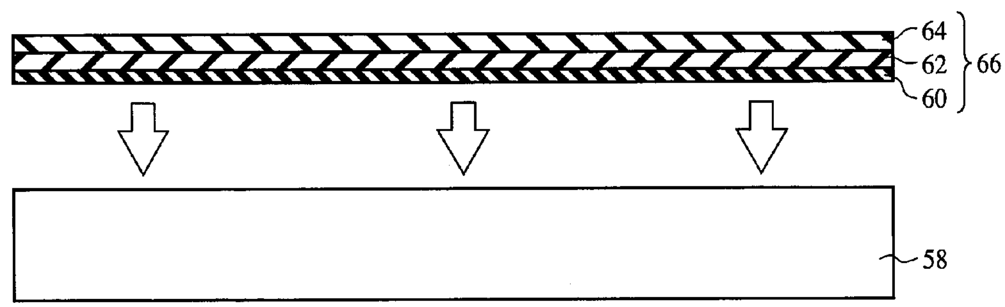
Figure 19C:
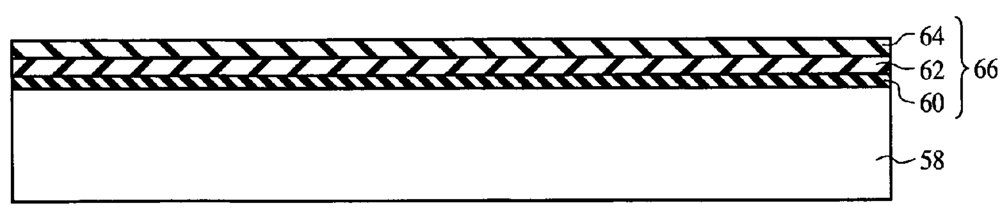

Then, as illustrated in FIGS. 19B and 19C, a heat foaming type double-sided tape 66 is adhered to the supporting substrate 58. As described above, the heat foaming type double-sided tape 66 includes a base 62 of, e.g., polyester film, a heat-releasable adhesive layer 64 formed on one primary surface of the base 62, and a pressure-sensitive adhesive layer 60 formed on the other primary surface of the base 62. As described above, the heat foaming type double-sided tape 66 has the heat-releasable adhesive layer 64 adhered to an object-to be adhered to at the room temperature, as is the general pressure-sensitive, and has the heat-releasable adhesive layer 64 expanded and exfoliated when heated, decreasing the adhesion area to thereby reduce the adhesive force between the heat-releasable adhesive layer 64 and the object to be adhered, and the heat-releasable adhesive layer 64 is released from the object to be adhered. The heat foaming type double-sided tape can be a heat foaming type double-sided tape by, e.g., NITTO DENKO CORPORATION (trade name; RIVA ALPHA) or others. When the heat foaming type double-sided tape 66 is adhered to the supporting substrate 58, the pressure-sensitive adhesive layer 60 of the heat foaming type double-sided tape 66 is adhered to the supporting substrate 58.

Figure 20A:
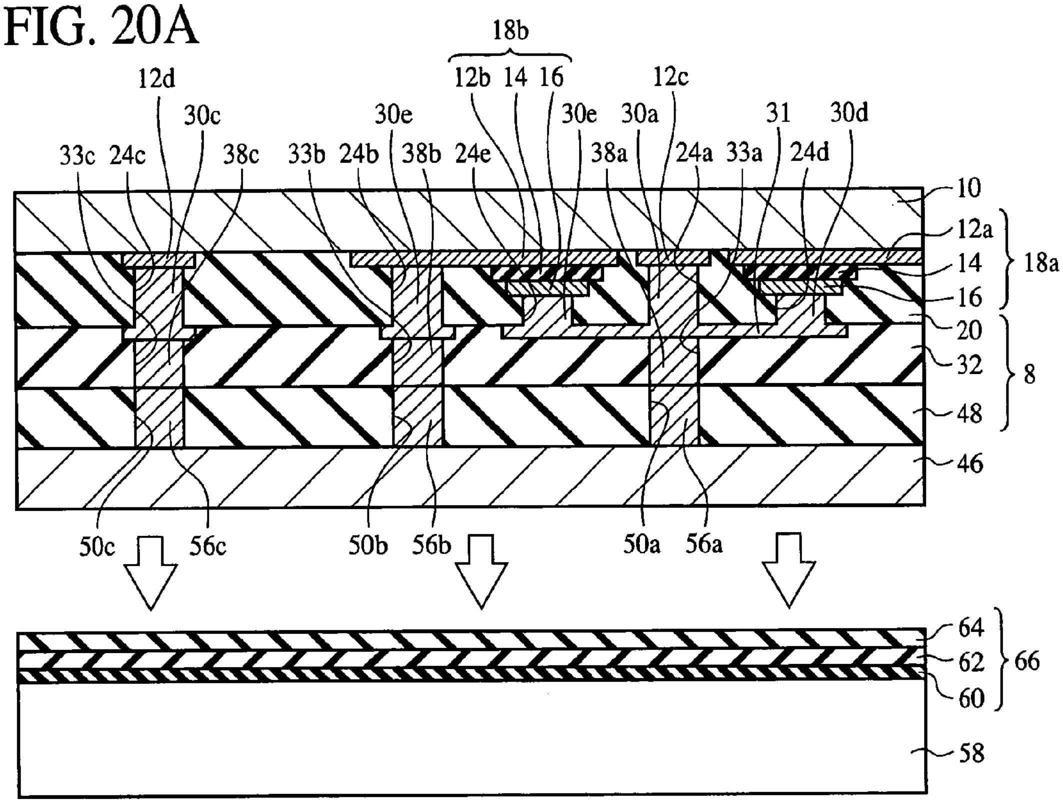
FIGS. 20A and 20B are views of the interposer and the electronic device according to the first embodiment of the present invention in the steps of the method for fabricating the interposer and the electronic device, which illustrate the method (Part 17).

Then, the semiconductor substrates 10, 46 adhered to each other is reversed to oppose the semiconductor substrate 46 and the supporting substrate 58 to each other as illustrated in FIG. 20A. At this time, the semiconductor substrate 46 and the supporting substrate 58 are opposed to each other with one surface of the semiconductor substrate 48 (opposite to the surface contacting the resin layer 48) and the one surface of the heat-releasable adhesive layer 64 of the heat foaming type double-sided tape 66 (opposite to the surface contacting the base 62) located near each other.

Figure 20B:
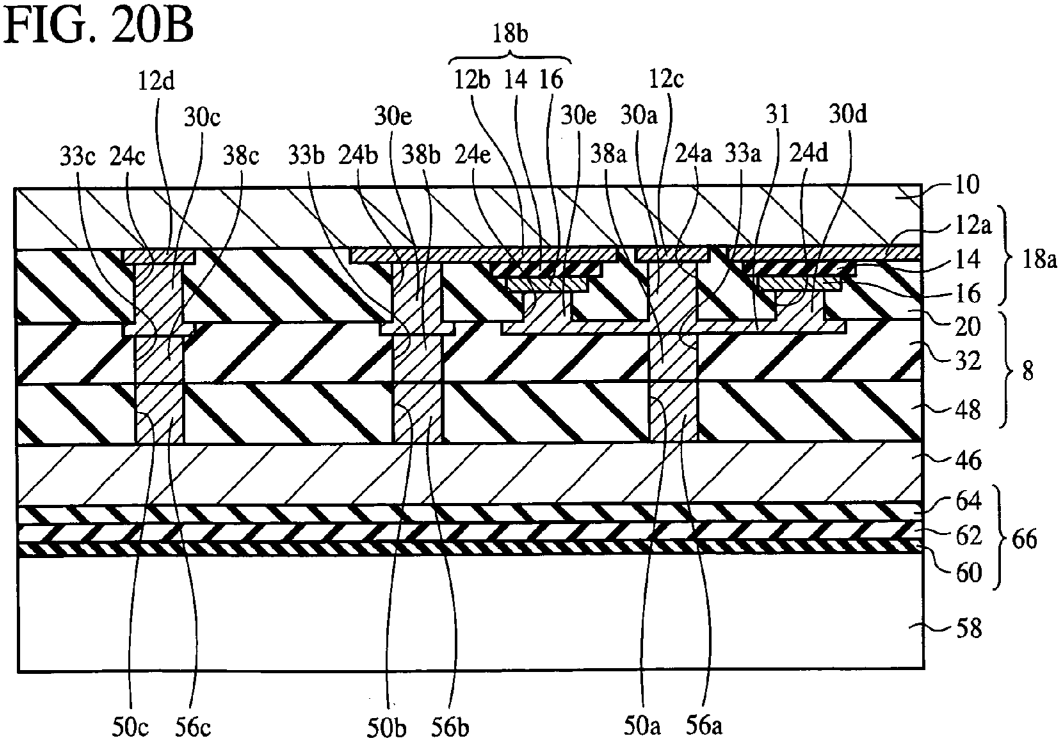

Then, as illustrated in FIG. 20B, one surface of the semiconductor substrate 46 (opposite to the surface contacting the resin layer 48) and one surface of the heat-releasable adhesive layer 64 of the heat foaming type double-sided tape 66 (opposite to the surface contacting the base 62) are adhered to each other.

Then, the semiconductor substrate 10 is polished by, e.g., CMP until the thickness of the semiconductor substrate 10 becomes, e.g., about 100 μm. At this time, all the semiconductor substrate 10 is not removed for the purpose of keeping the capacitor electrodes 12*a*, 12*b*, the conduction films 12*c*, 12*d* and the resin layer 20 from being damaged by the polish.

Next, the semiconductor substrate 10 remaining on one surface of the resin layer 20 (opposite to the surface contacting the resin layer 32) is etched off by using, e.g., hydrofluoric acid.

Figure 21A:
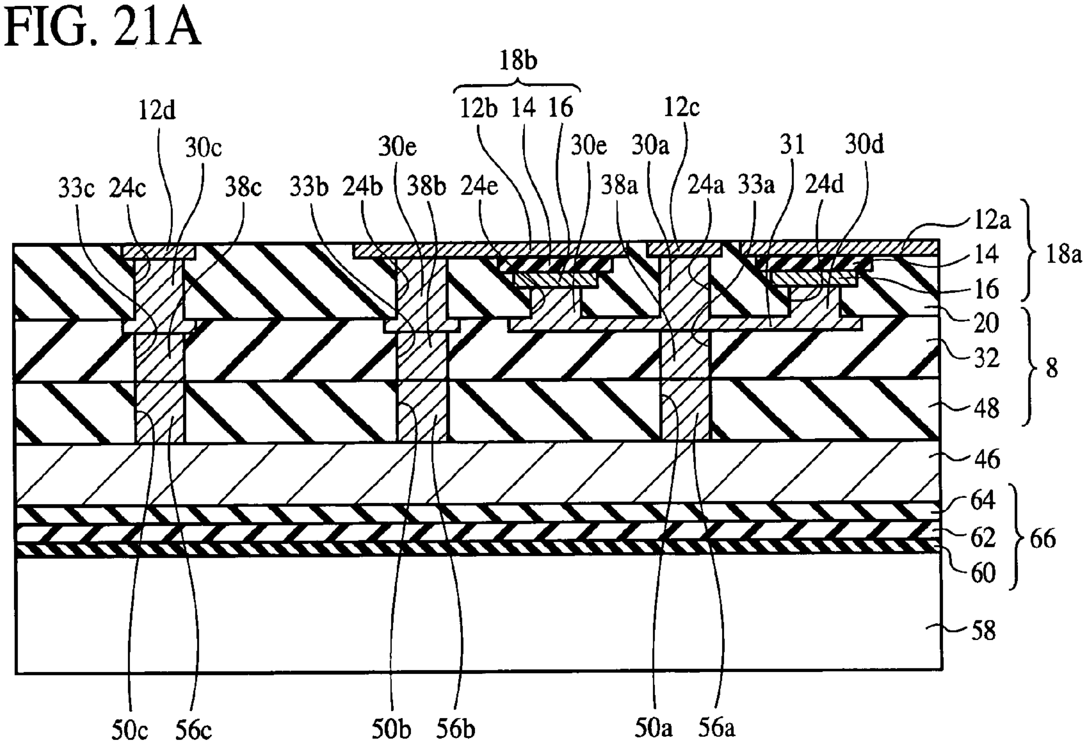
FIGS. 21A and 21B are views of the interposer and the electronic device according to the first embodiment of the present invention in the steps of the method for fabricating the interposer and the electronic device, which illustrate the method (Part 18).

Thus, the semiconductor substrate 10 is removed with the capacitor electrodes 12*a*, 12*b* and the conduction films 12*c*, 12*d* kept from being excessively damaged (see FIG. 21A).

Figure 21B:
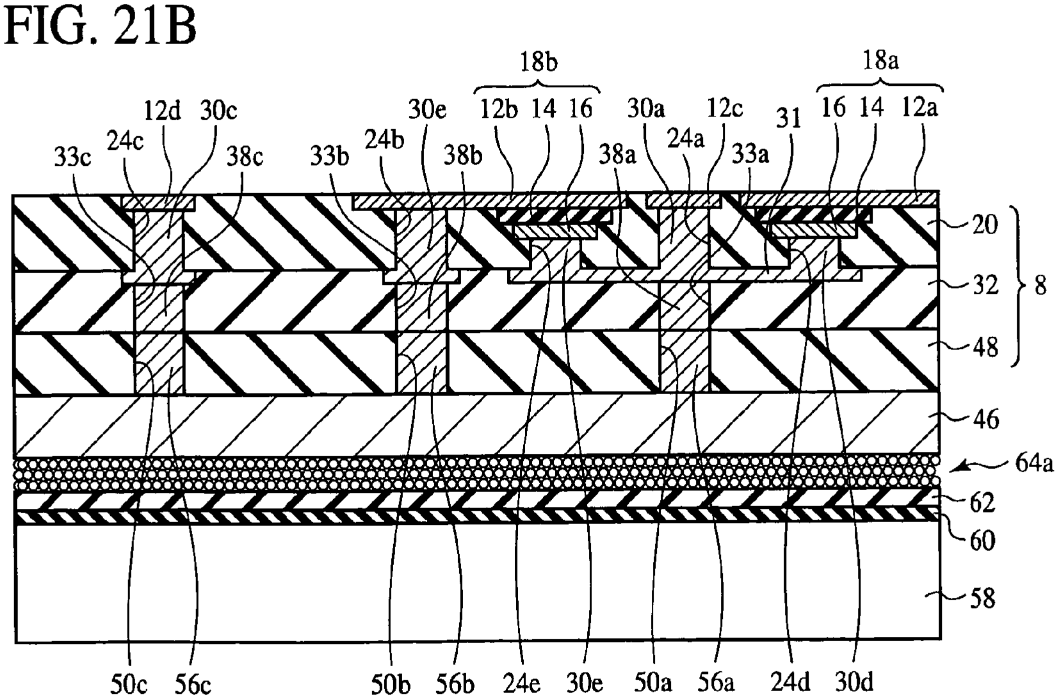

Then, the heat-releasable adhesive layer 64 of the heat foaming type double-sided tape 66 is expanded by heat processing (see FIG. 21B). The heat processing temperature is, e.g., 200° C. When the heat-releasable adhesive layer 64 is expanded, the adhesion area between the expanded heat-releasable adhesive layer 64*a* and the semiconductor substrate 46 is decreased, whereby the adhesion between the heat-releasable adhesive layer 64*a* and the semiconductor substrate 46 is reduced. Accordingly, the heat-releasable adhesive layer 64*a* and the semiconductor substrate 46 can be easily released from each other.

Figure 22A:
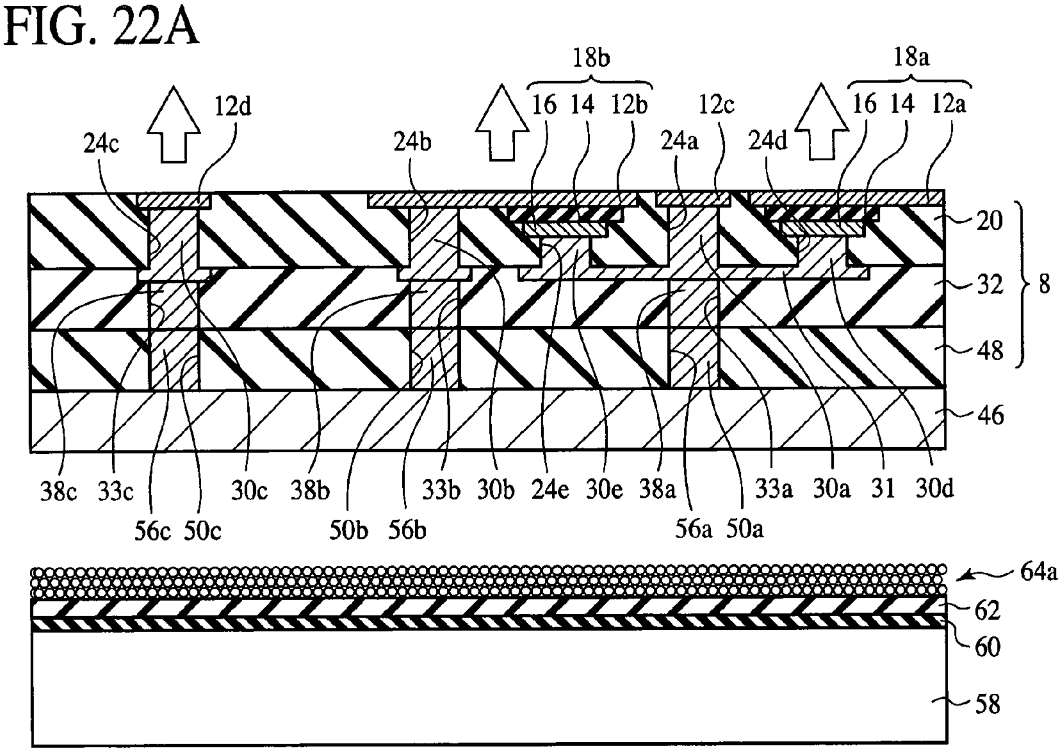
FIGS. 22A and 22B are views of the interposer and the electronic device according to the first embodiment of the present invention in the steps of the method for fabricating the interposer and the electronic device, which illustrate the method (Part 19).

Then, the semiconductor substrate 46 supported by the supporting substrate 58 is removed from the supporting substrate 58 (see FIG. 22A). The heat foaming type double-sided tape 66 having the pressure-sensitive adhesive layer 60 adhered to the supporting substrate 58 can be removed from the semiconductor substrate 46 together with the supporting substrate 58.

The semiconductor substrate 46 is supported by the supporting substrate 58 here when the semiconductor substrate 10 is removed by the polish or others. However, the semiconductor substrate 46 may not be essentially supported by the supporting substrate 58. In the stage of removing the semiconductor substrate 10 by the polish or others, the base 8 formed of the resin layers 20, 32, 48 is supported by the semiconductor substrate 46. When the thickness of the semiconductor substrate 46 is considerably thick, the semiconductor substrate 46 is not deformed in removing the semiconductor substrate 10 by the polish, etc. Thus, even without the supporting substrate 58, the deformation of the base 8 can be prevented by the semiconductor substrate 46. Accordingly, in removing the semiconductor substrate 10 by the polish or others, the semiconductor substrate 46 may not be supported by the supporting substrate 58. However, in view of keeping the thin-film capacitors 18*a*, 18*b*, etc. from undesirable stresses to thereby improve the fabrication yield, it is preferable to support the semiconductor substrate 46 by the supporting substrate 58.

Figure 22B:
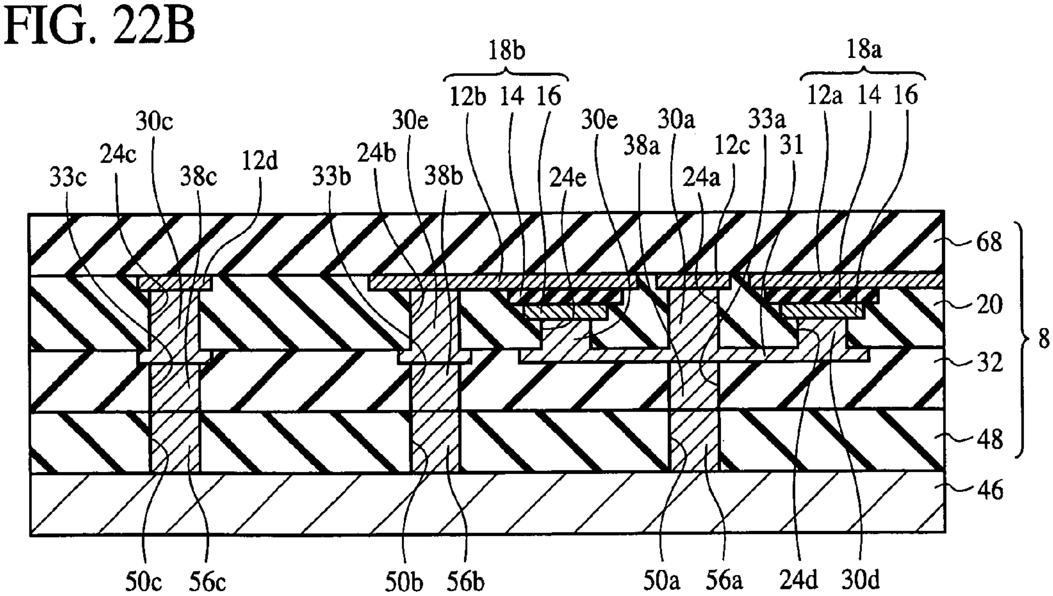

Then, the resin layer 68 is formed on one surface of the resin layer 20 (opposite to the surface contacting the resin layer 32) (see FIG. 22B). The resin layer 68 is formed of, e.g., photosensitive epoxy resin.

The resin layer 68 can be formed as exemplified below. First, a photosensitive epoxy resin solution is applied to one surface of the resin layer 68 (opposite to the surface contacting the resin layer 32) by spin coating. Conditions for applying the epoxy resin solution are, e.g., 2000 rpm and 30 seconds. Thus, the resin layer 68 of, e.g., a 7 μm-thickness is formed. Then, heat processing (pre-bake) is conducted on the resin layer 68. The heat processing temperature is, e.g., 60° C.

Figure 23A:
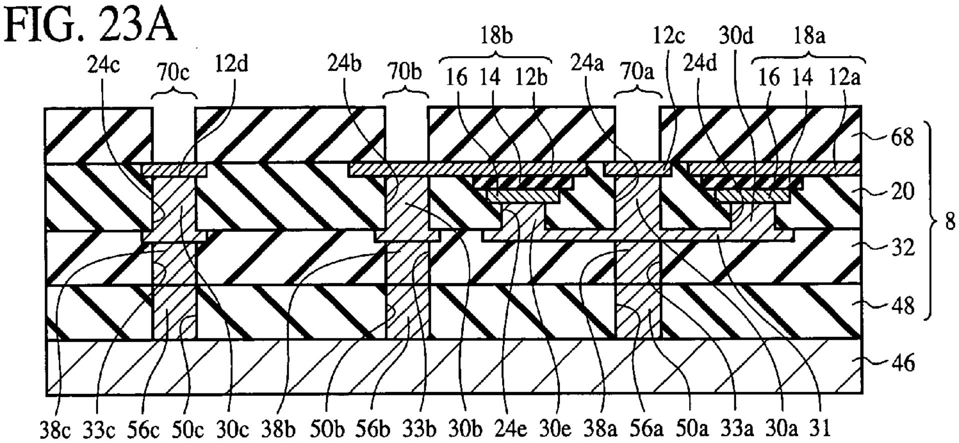
FIGS. 23A to 23C are views of the interposer and the electronic device according to the first embodiment of the present invention in the steps of the method for fabricating the interposer and the electronic device, which illustrate the method (Part 20).

Next, the openings 70*a*-70*c* are formed in the resin layer 68 by photolithography (see FIG. 23A). In the opening 70*a*, the partial electrode 76*a* to be a part of the through-electrode 77*a* is to be buried in, and the opening 70*a* is formed down to the conduction film 12*c*. In the opening 70*b*, the partial electrode 76*b* to be a part of the through-electrode 77*b* is to be buried in, and the opening 70*a* is formed down to the capacitor electrode 12*b*. In the opening 70*c*, the partial electrode 76*c* to be a part of the through-electrode 77*c* is to be buried in, and the opening 70*c* is formed down to the conduction film 12*d*.

Next, heat processing (main bake) is conducted on the resin layer 68. The heat processing temperature is, e.g., 200° C. The film thickness of the resin layer 68 after the heat processing becomes, e.g., about 5 μm.

Next, a Cr film and a Cu film are sequentially laid on the entire surface by e.g., sputtering to form a seed layer (not illustrated).

Next, a photoresist film 72 is formed on the entire surface by spin coating.

Figure 23B:
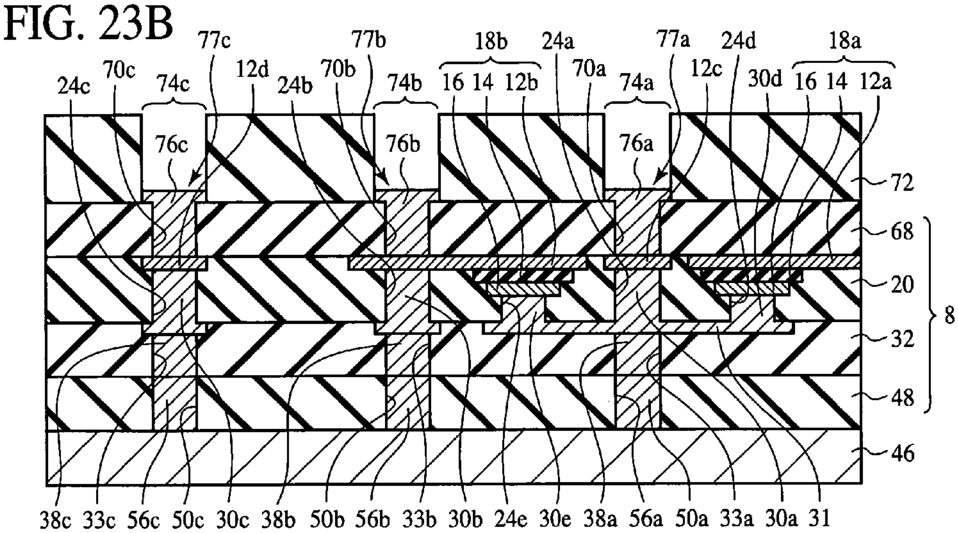

Then, the openings 74*a*-74*c* are formed in the photoresist film 72 by photolithography (see FIG. 23B). The openings 74*a*-74*c* are for forming respectively the partial electrodes 76*a*-76*c*.

Next, a plated film of, e.g., Cu is formed in the openings 74*a*-74*c* and the openings 70*a*-70*c* by electroplating. The thickness of the plated film is, e.g., about 6 μm. Thus, the partial electrodes 76*a*-76*c* of the plated film are formed respectively in the openings 74*a*-74*c* and the openings 70*a*-70*c*.

Figure 23C:
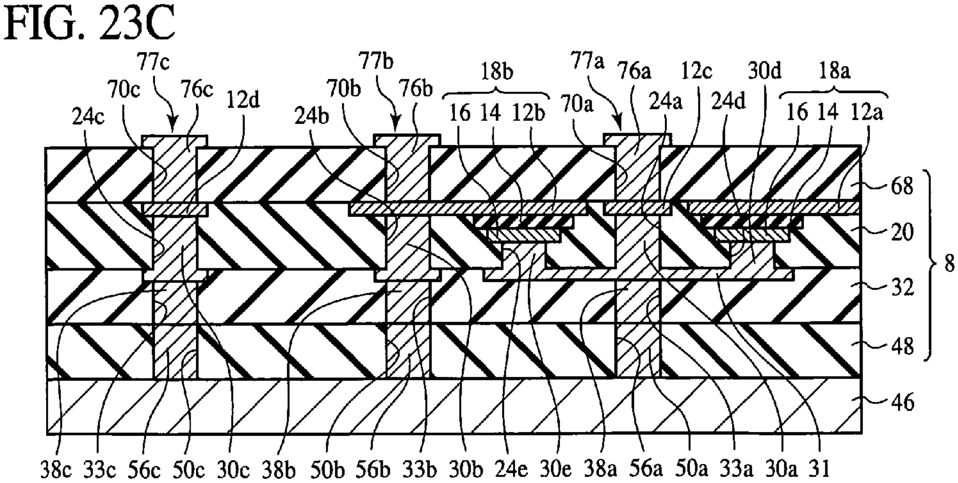

Next, the photoresist film 72 is removed (see FIG. 23C).

Then, the exposed seed layer (not illustrated) is removed by wet etching. The etchant is, e.g., 1-10% ammonium persulfate aqueous solution. The etching period of time is, e.g., about 2 minutes. In etching off the seed layer, the surfaces of the partial electrodes 76*a*-76*c* are also a little etched, but the seed layer whose thickness is sufficiently smaller in comparison with the size of the partial electrodes 76*a*-76*c*, can be etched in a short period of time, and the partial electrodes 76*a*-76*c* are kept from being excessively etched.

Next, the supporting substrate 78 is prepared. The supporting substrate 78 is, e.g., a glass supporting substrate. The supporting substrate 78 is for supporting the base 8, etc. with the capacitors 18*a*, 18*b*, etc. buried in when the semiconductor substrate 46 is removed by polish or others in a later step.

Next, the heat foaming type double-sided tape 86 is adhered to the supporting substrate 78. As does the heat foaming type double-sided tape 66, the heat foaming type double-sided tape 86 includes a base 82 of, e.g., polyester film, a heat-releasable adhesive layer 84 formed on one primary surface of the base 82, and a pressure-sensitive adhesive layer 80 formed on the other primary surface of the base 82. As is the heat foaming type double-sided tape 66 described above, the heat foaming type double-sided tape 86 can be a heat foaming type double-sided tape by, e.g., NITTO DENKO CORPORATION (trade name; RIVA ALPHA) or others. When the heat foaming type double-sided tape 86 is adhered to the supporting substrate 78, the pressure-sensitive adhesive layer 80 of the heat foaming type double-sided tape 86 is adhered to the supporting substrate 78.

Figure 24A:
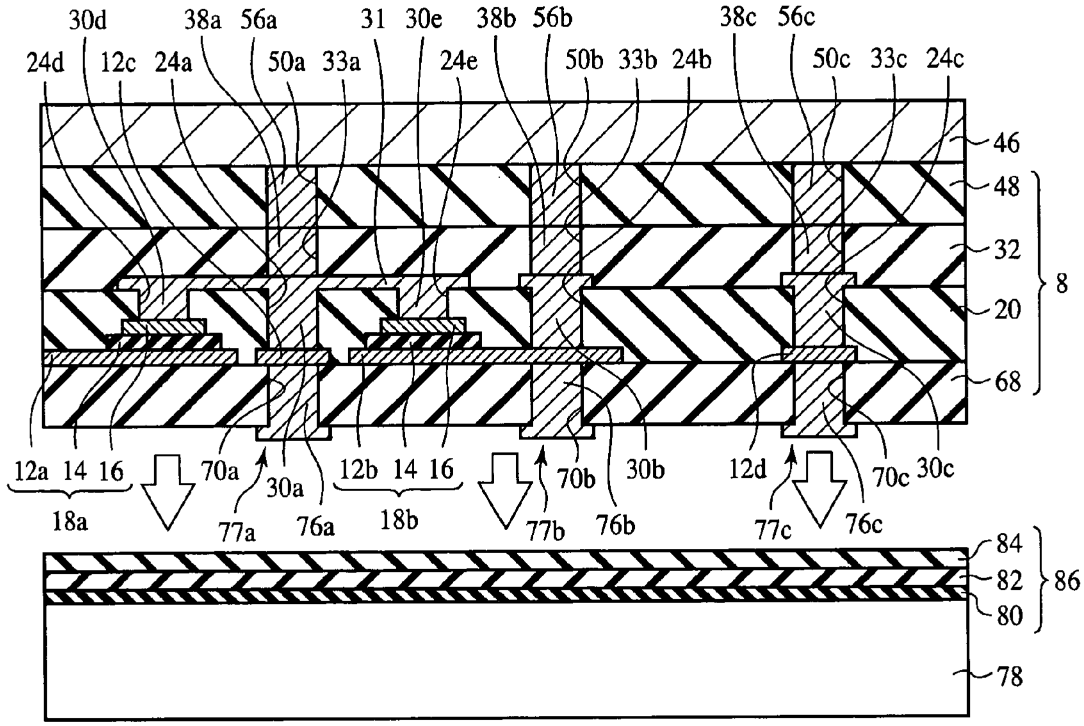
FIGS. 24A and 24B are views of the interposer and the electronic device according to the first embodiment of the present invention in the steps of the method for fabricating the interposer and the electronic device, which illustrate the method (Part 21).

Next, the semiconductor substrate 46 is reversed to oppose the resin layer 68 and the supporting substrate 78 to each other as illustrated in FIG. 24A. At this time, the resin layer 68 and the supporting substrate 78 are opposed to each other with one surface of the resin layer 58 (opposite to the surface contacting the resin layer 20) and the one surface of the heat-releasable adhesive layer 84 of the heat foaming type double-sided tape 86 (opposite to the surface contacting the base 82) located near each other.

Figure 24B:
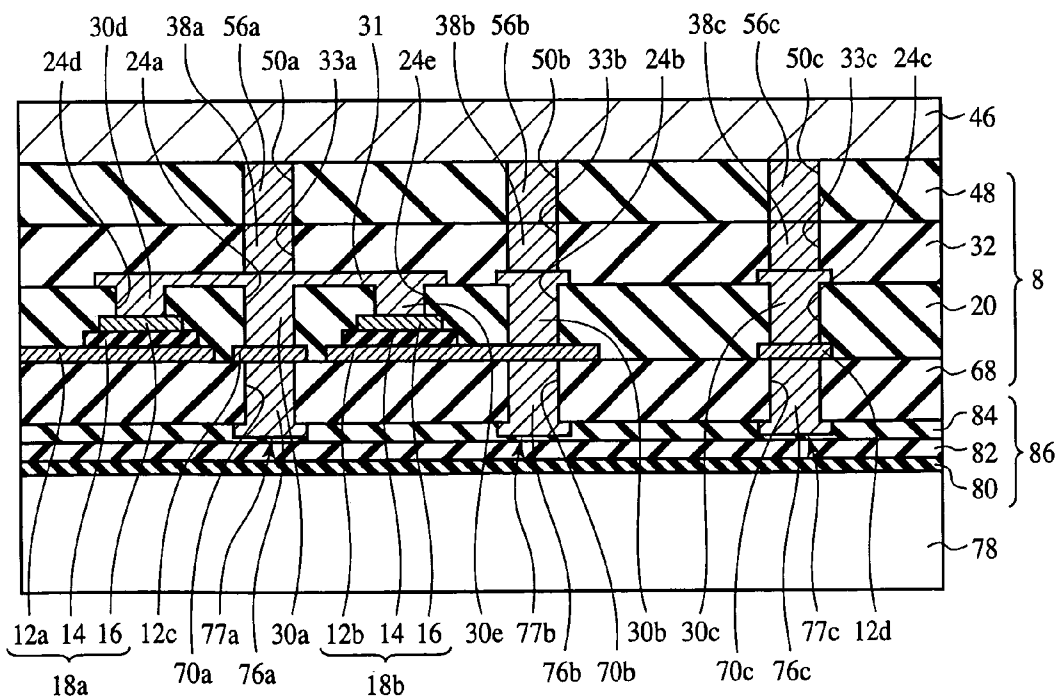

Then, as illustrated in FIG. 24B, one surface of the resin layer 68 (opposite to the surface contacting the resin layer 20) and the one surface of the heat-releasable adhesive layer 84 of the heat foaming type double-sided tape 86 (opposite to the surface contacting the base 82) are adhered to each other.

Next, the semiconductor substrate 48 is polished by, e.g., CMP until the thickness of the semiconductor substrate 46 becomes, e.g., about 100 μm. At this time, all the semiconductor substrate 46 is not removed, so that the resin layer 48, etc. are kept from being damaged by the polished.

Next, the semiconductor substrate 46 remaining on one surface of the resin layer 48 (opposite to the surface contacting the resin layer 32) is etched off by, e.g., hydrofluoric acid.

Figure 25A:
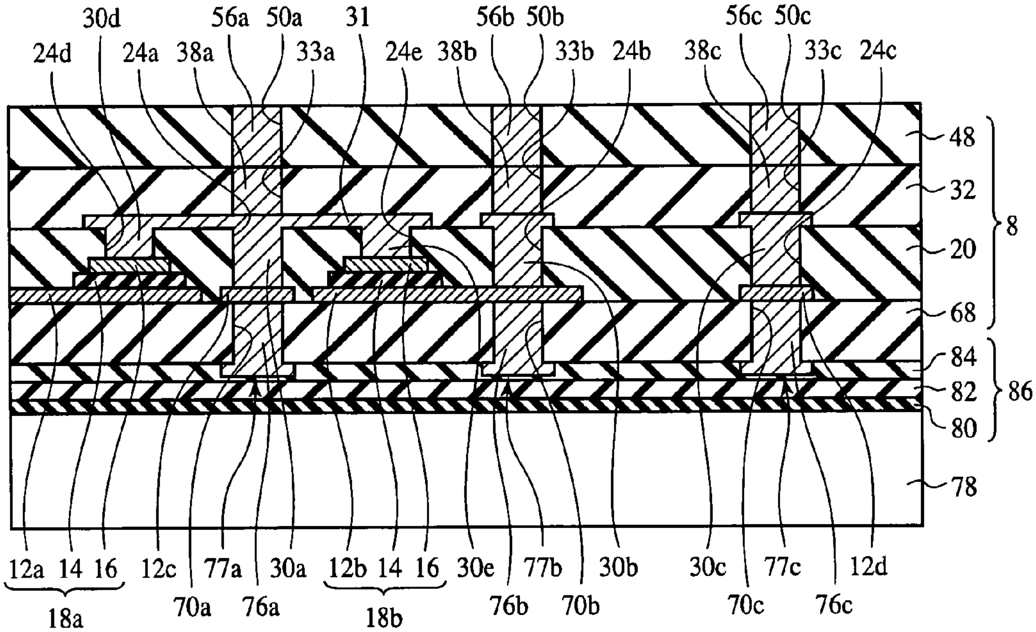
FIGS. 25A and 25B are views of the interposer and the electronic device according to the first embodiment of the present invention in the steps of the method for fabricating the interposer and the electronic device, which illustrate the method (Part 22).

Thus, the semiconductor substrate 46 is removed while the resin layer 48, etc. are kept from being excessively damaged (see FIG. 25A).

Next, a Ni film and a Cu film are sequentially laid on the entire surface by, e.g., sputtering to form a seed layer (not illustrated).

Next, a photoresist film 88 is formed on the entire surface by, e.g., spin coating.

Figure 25B:
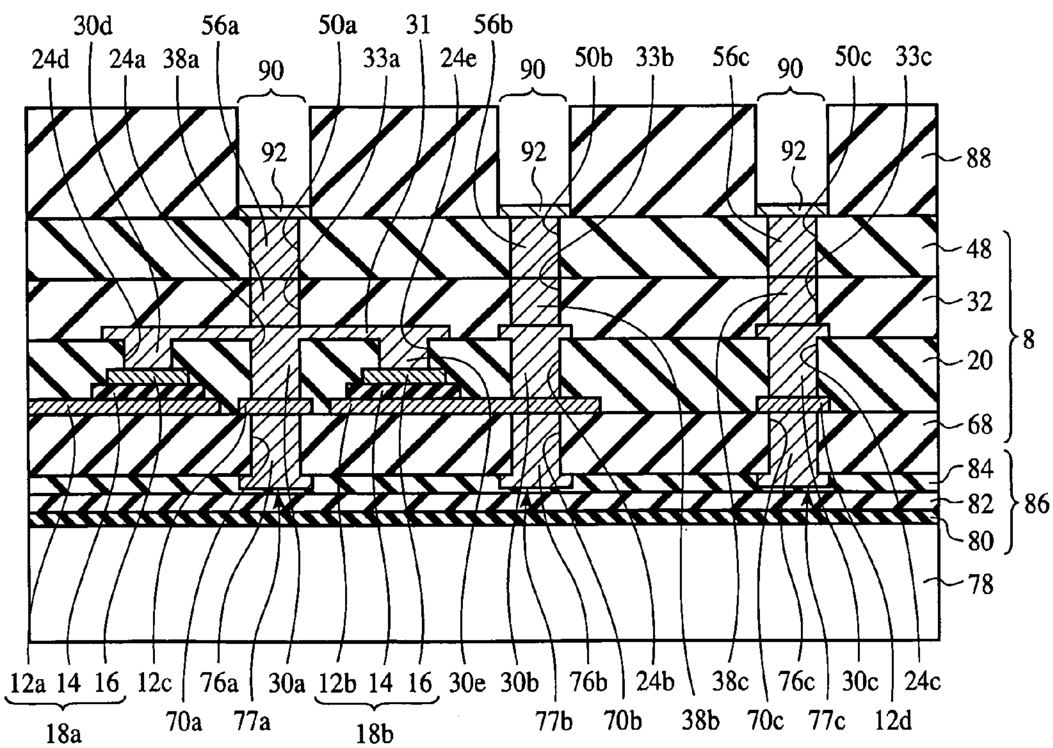

Next, the openings 90 are formed in the photoresist film 88 by photolithography (see FIG. 25B). The openings 90 are for forming the electrode pads 92.

Then, a plated film of, e.g., Ni is formed in the openings 90 by electroplating. The thickness of the plated film is, e.g., about 4 μm. Thus, the electrode pads 92 of the plated film are formed respectively in the openings 90.

Figure 26A:
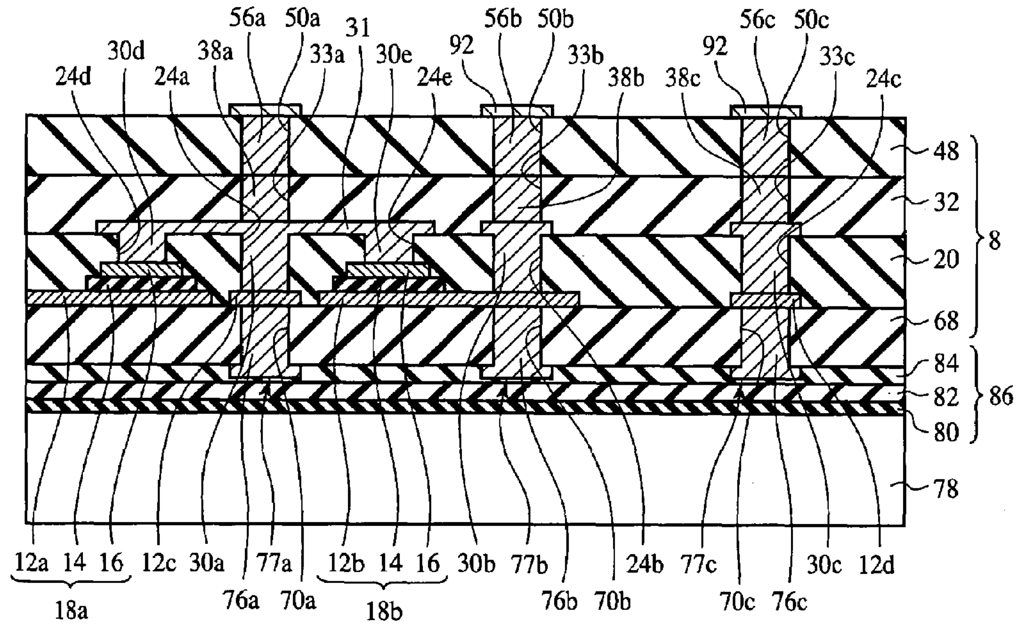
FIGS. 26A and 26B are sectional views of the interposer and the electronic device according to the first embodiment of the present invention in the steps of the method for fabricating the interposer and the electronic device, which illustrate the method (Part 23).

Next, the photoresist film 88 is removed (see FIG. 26A).

Then, the exposed seed layer (not illustrated) is removed by wet etching. The etchant is, e.g., an about 1-10% ammonium persulfate aqueous solution. The etching period of time is, e.g., about 2 minutes. In etching off the seed layer, the surfaces of the electrode pads 92 are a little etched, but the seed layer whose thickness is sufficiently smaller in comparison with the size of the electrode pads 92 can be etched in a short period of time, and the electrode pads 92 are never excessively etched.

Figure 26B:
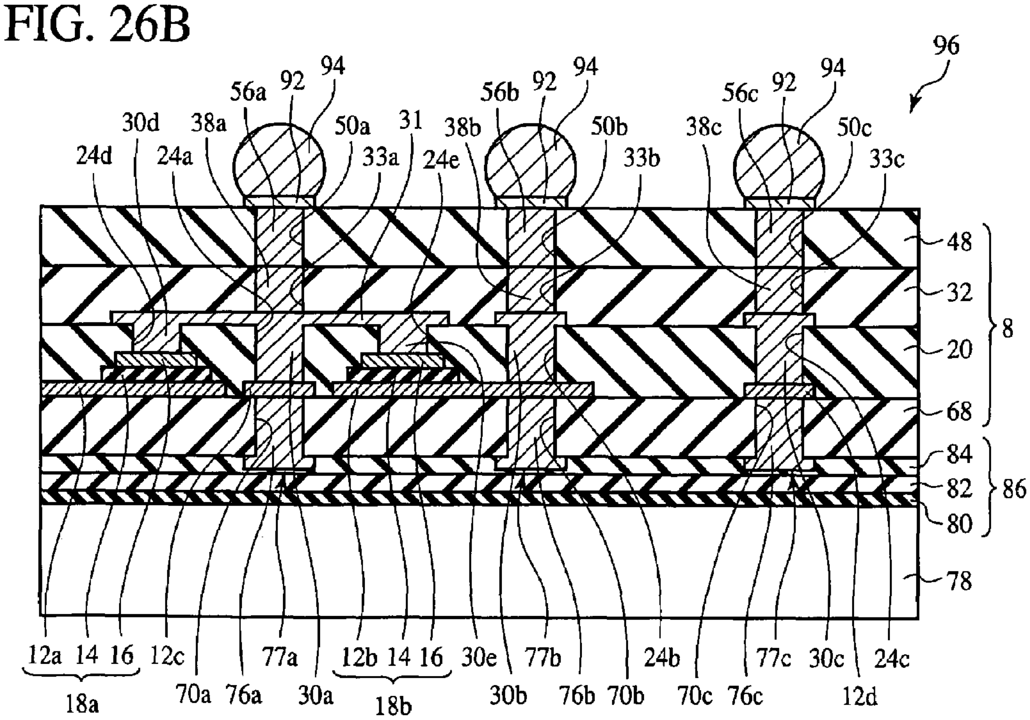

Next, the solder bumps 94 of, e.g., Sn-based solder are formed on one surfaces of the electrodes pads 92 (opposite to the surfaces contacting the partial electrodes 56*a*-56*c*) by electroplating (see FIG. 26B).

Thus, the interposer 96 according to the present embodiment is fabricated.

Figure 27:
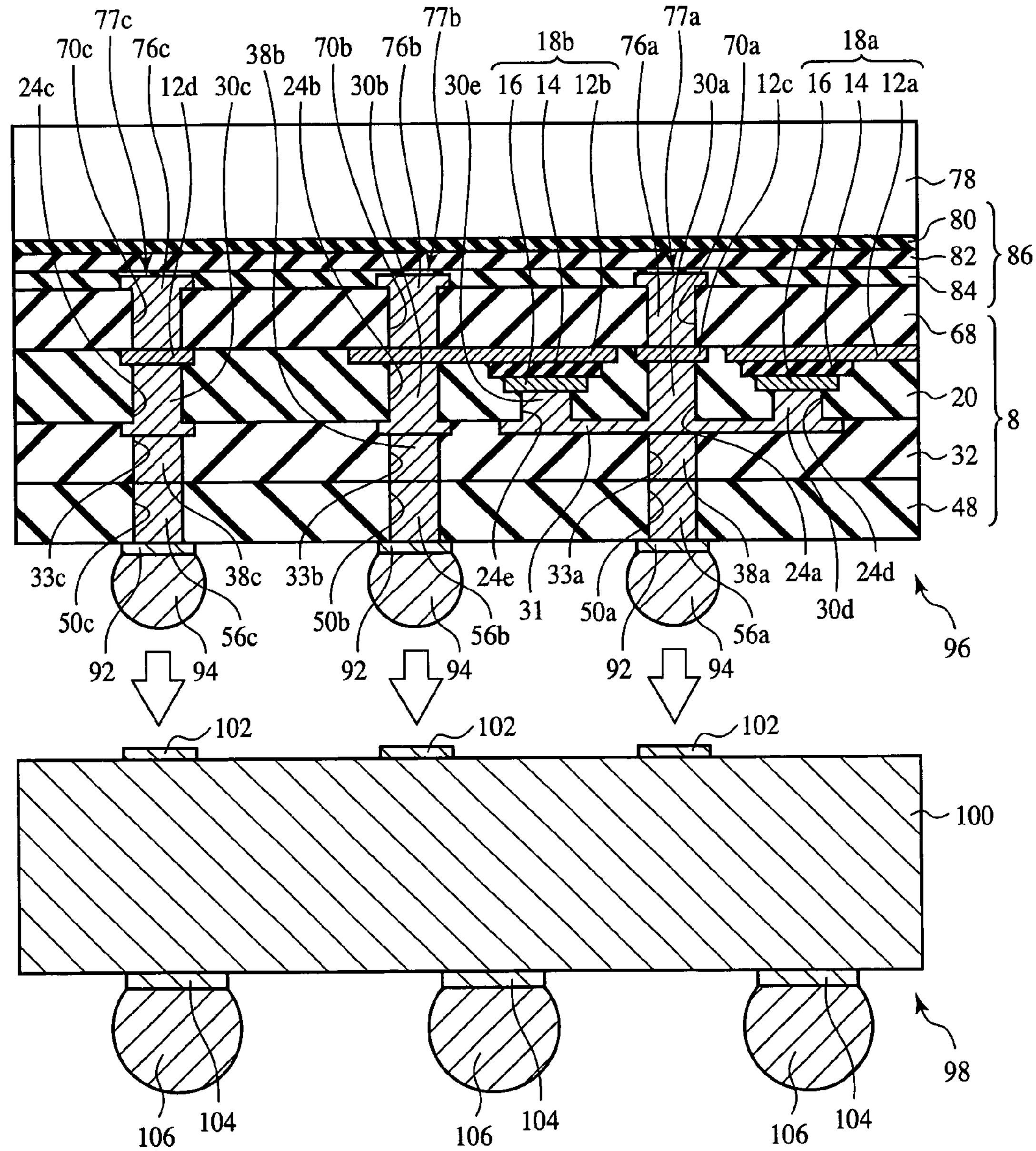
FIG. 27 is a view of the interposer and the electronic device according to the first embodiment of the present invention in the steps of the method for fabricating the interposer and the electronic device, which illustrates the method (Part 24).

Then, as illustrated in FIG. 27, the package substrate 98 is prepared. The package substrate 98 includes the substrate 100 with the multi-layer interconnection (not illustrated) buried in, the electrode pads 102 formed on one primary surface of the substrate 100 (opposed to the interposer 96), the electrode pads 104 formed on the other primary surface of the substrate 100 (opposite to the surface opposed to the interposer 96), and the solder bumps 106 formed on one surfaces of the electrode pads 104 (opposite to the surfaces contacting the substrate 100). The electrode pads 102 are electrically connected to those of the interconnections (not illustrated) of the multi-layer interconnection. The electrodes pads 104 are electrically connected to those of the interconnections (not illustrated) of the multi-layer interconnection buried in the substrate 100.

Next, the supporting substrate 78 supporting the interposer 96 is reversed to oppose the interposer 96 supported by the supporting substrate 78 and the package substrate 98 to each other. At this time, the interposer 96 and the package substrate 98 are opposed to each other with the solder bumps 94 of the interposer 96 and the electrode pads 102 of the package substrate 98 located near each other.

Figure 28:
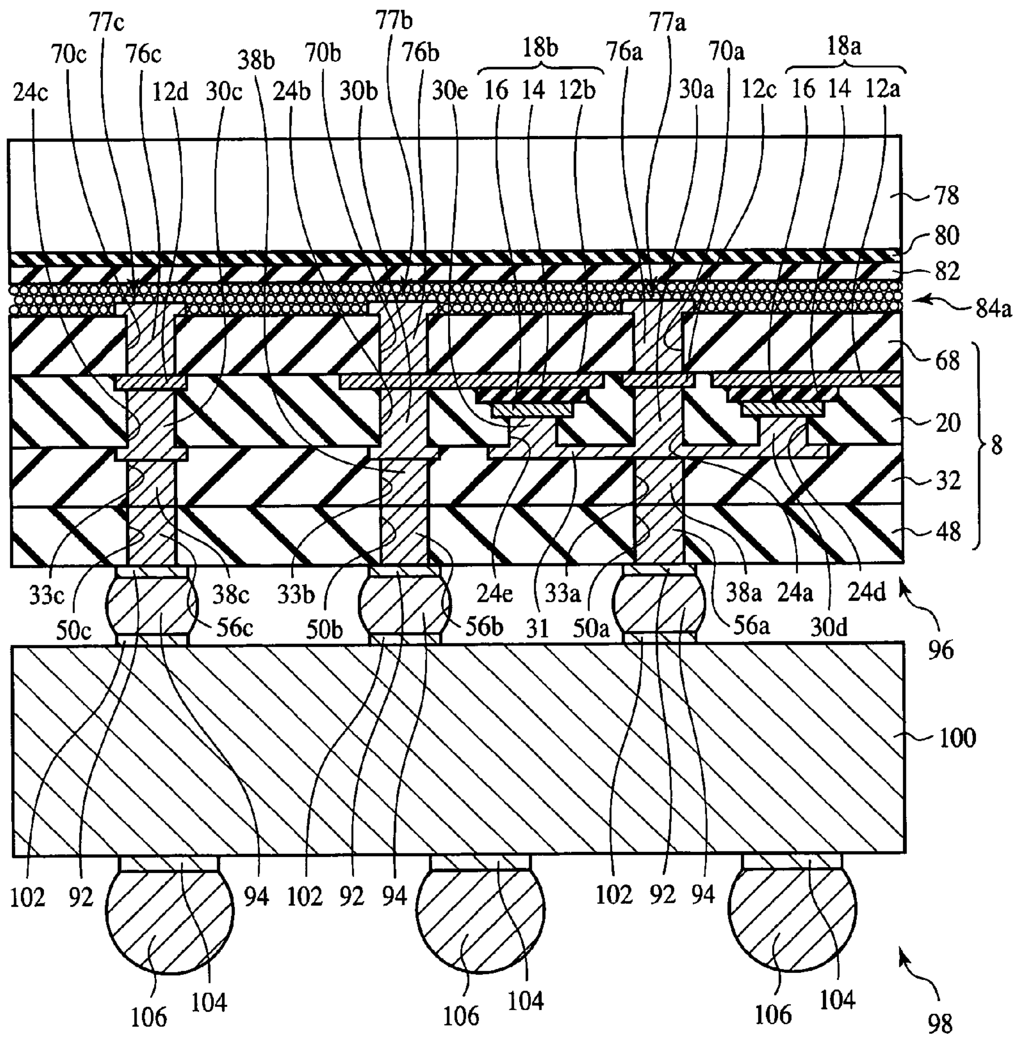
FIG. 28 is a view of the interposer and the electronic device according to the first embodiment of the present invention in the steps of the method for fabricating the interposer and the electronic device, which illustrates the method (Part 25).

Then, the solder bumps 94 of the interposer 96 are jointed to the electrode pads 102 of the package substrate 98 by flip-chip bonding (see FIG. 28). The interposer 96 is thus mounted on the package substrate 98. When the solder bumps 94 are jointed to the electrode pads 102, heat processing for solving the solder bumps 94 is conducted. Accordingly, in the flip-chip bonding, the heat-releasable adhesive layer 84 of the heat foaming type double-sided tape

86 is expanded. When the heat-releasable adhesive layer 84 is expanded and exfoliated, the adhesion area between the expanded heat-releasable adhesive layer 84*a* and the resin layer 68 is decreased, which lowers the adhesion between the heat-releasable adhesive layer 84*a* and the resin layer 68. Thus, the heat-releasable adhesive layer 84*a* and the resin layer 68 can be easily released from each other.

Figure 29:
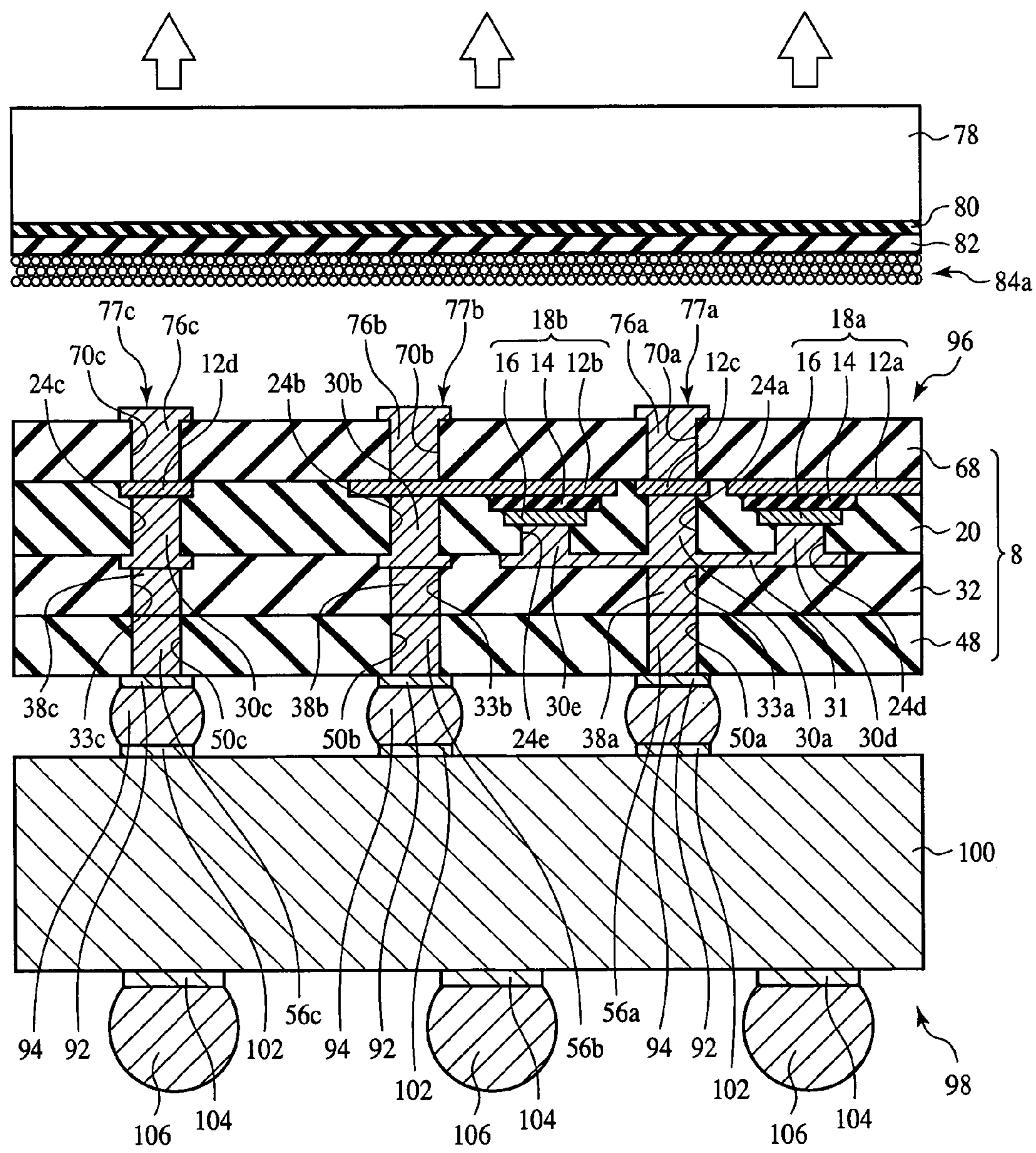
FIG. 29 is a view of the interposer and the electronic device according to the first embodiment of the present invention in the steps of the method for fabricating the interposer and the electronic device, which illustrates the method (Part 26).

Next, the supporting substrate 78 is removed from the interposer 96 (see FIG. 29). The heat foaming type double-sided tape 86, which has the pressure-sensitive adhesive layer 80 adhered to the supporting substrate 78, is removed together with the supporting substrate 78 from the interposer 96.

Figure 30:
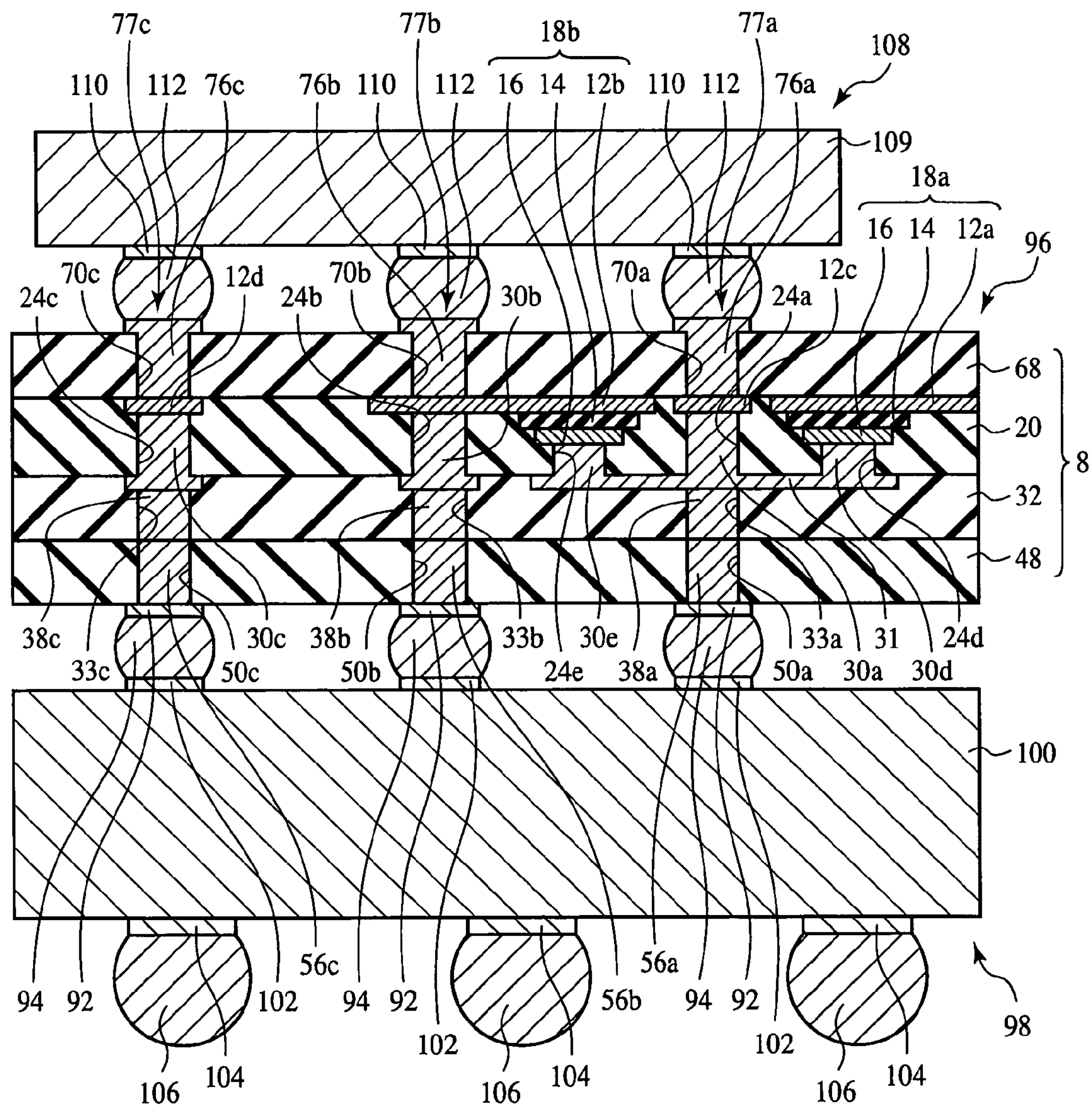
FIG. 30 is a view of the interposer and the electronic device according to the first embodiment of the present invention in the steps of the method for fabricating the interposer and the electronic device, which illustrates the method (Part 27).

Then, the semiconductor integrated circuit devices 108 are prepared (see FIG. 30). The semiconductor integrated circuit devices 108 include the semiconductor substrate 109, and the electrodes pad 110 formed on one primary surface of the semiconductor substrate 109 (opposed to the interposer 96). The semiconductor substrate 109 is, e.g., a silicon substrate. On one primary surface of the semiconductor substrate 109 (opposed to the interposer 96), the integrated circuit (not illustrated) including the electronic circuit elements (not illustrated) is formed. That is, on one primary surface of the semiconductor substrate 109 (opposed to the interposer 96), there are provided the electronic circuit elements, such as active elements, e.g., transistors, etc. (not illustrated) and/or passive elements, e.g., capacitors, etc. (not illustrated). On one primary surface of the semiconductor substrate 109 with these electronic circuit elements formed on (opposed to the interposer 96), there is formed a multi-layer interconnection structure (not illustrated) including a plurality of inter-layer insulation films (not illustrated) and interconnection layers (not illustrated). The multi-layer interconnection structure electrically connects the electronic circuit elements (not illustrated). Those of the interconnections formed in a plurality of layers are connected to the electrode pads 110.

Then, the solder bumps 112 of the semiconductor integrated circuit devices 108 are jointed to the partial electrodes 76*a*-76*c* by flip-chip bonding (see FIG. 30). Thus, the semiconductor integrated circuit devices 108 are mounted on the interposer.

Thus, the electronic device using the interposer according to the present embodiment is fabricated.

The method for fabricating the interposer and the electronic device according to the present embodiment is characterized mainly in that the thin-film capacitors 18*a*, 18*b* including the crystalline capacitor dielectric film 14 on the highly heat-resistant semiconductor substrate 10, and the semiconductor substrate 10 is removed in a later step to thereby form bury the thin-film capacitors 18*a*, 18*b* in the base 8 of the resin layers alone.

According to the present embodiment, when the thin-film capacitors 18*a*, 18*b* are formed, the capacitors 18*a*, 18*b* are formed on the highly-heat-resistant semiconductor substrate 10 which allows the crystalline capacitor dielectric film 14 to be formed on, whereby the thin-film capacitors 18*a*, 18*b* including the capacitor dielectric film 14 of high electrostatic capacitance can be formed. Furthermore, according to the present embodiment, the semiconductor substrate 10, in which it is difficult to form the through-holes, is removed after the thin-film capacitors 18*a*, 18*b* have been formed, which makes it unnecessary to form the through-holes in the semiconductor substrate 10 for the through-electrodes 70*a*-70*c* to be buried in. Thus, according to the present embodiment, the interposer including the thin-film capacitors 18*a*, 18*b* of very high electrostatic capacitance can be provided at low costs.

(Modification 1)

Figure 31:
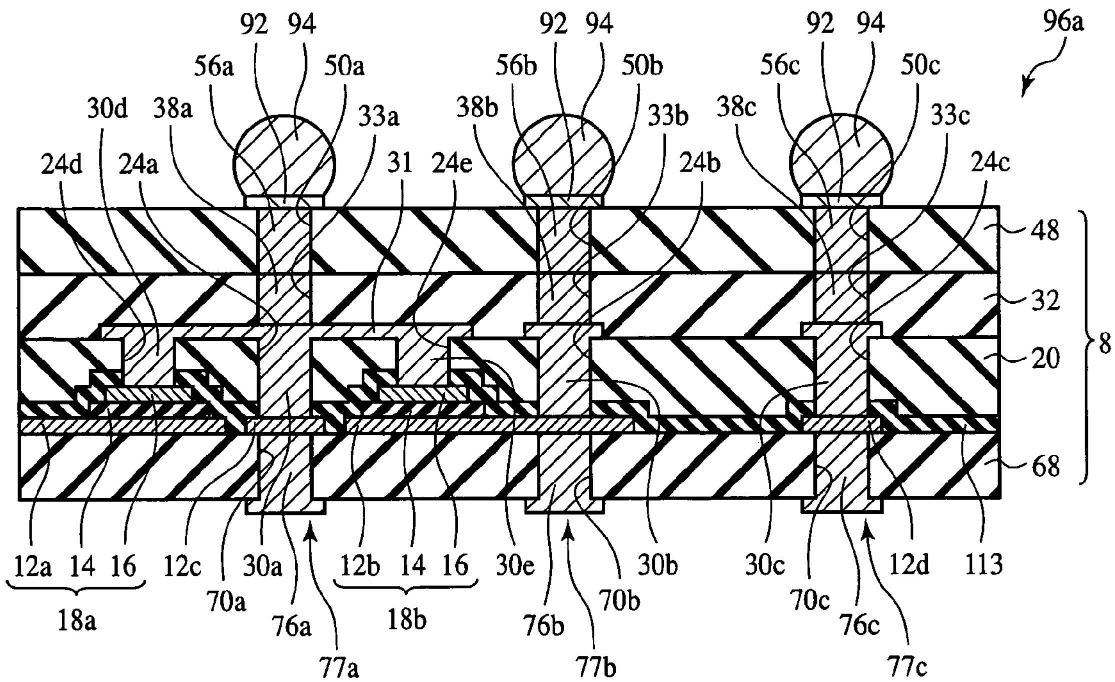
FIG. 31 is a view of the interposer according to Modification 1 of the first embodiment of the present invention, which illustrates the interposer and the electronic device.

Next, the interposer according to Modification 1 of the present embodiment and the method for fabricating the interposer will be explained with reference to FIGS. 31 and 32. FIG. 31 is a sectional view of the interposer according to the present modification.

The interposer according to the present modification is characterized mainly in that a passivation film 113 is formed, covering the thin-film capacitors 18*a*, 18*b*.

When the resin layer 20 is formed of, e.g., polyimide film, water and gas are often emitted from the resin layer 20 when thermal processing is made on the resin layer. In such case, the water and gas reduce the capacitor dielectric film 14, and resultantly there is a risk of the electric degradation for the thin-film capacitors 18*a*, 18*b*.

In the present modification, however, for the prevention of the reduction, etc. of the capacitor dielectric film 14, the passivation film (barrier film) 113 of an inorganic material is formed, covering the thin-film capacitors 18*a*, 18*b* (see FIG. 31). The passivation film 113 is formed of, e.g., aluminum oxide (alumina, $Al_2O_3$) film.

The passivation film 113 is formed of aluminum oxide film here. However, the passivation film 113 is not essentially aluminum oxide film. The passivation film 113 may be formed suitably of any inorganic material which can barrier water, gas, etc.

As described above, it is possible that the passivation film 113 is formed, covering the thin-film capacitors 18*a*, 18*b*, and the resin layer 20 may be formed on the passivation film 113. According to the present modification, the reduction, etc. of the capacitor dielectric film 14 can be prevented by the passivation film 113, whereby even in forming the resin layer 20 of a material which emits water, etc. in heat processing, the interposer including the thin-film capacitors 18*a*, 18*b* having good electric characteristics can be provided.

Next, the method for fabricating the interposer according to the present modification will be explained with reference to FIG. 32A to 32D. FIGS. 32A to 32D are sectional views of the interposer according to the present modification in the steps of the method for fabricating the interposer, which illustrate the method.

Figure 32A:
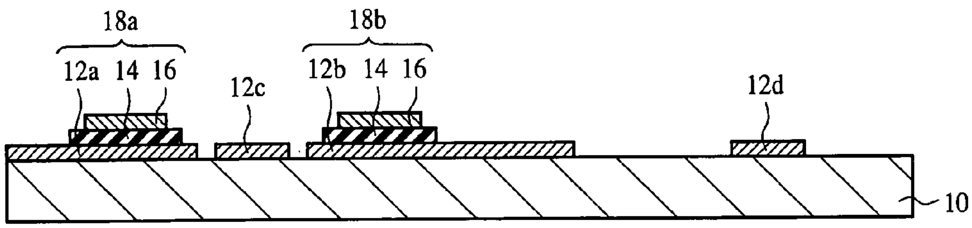
FIGS. 32A to 32D are sectional views of the interposer according to Modification 1 of the first embodiment of the present invention in the steps of the method for fabricating the interposer and the electronic device, which illustrate the method.
Figure 32B:
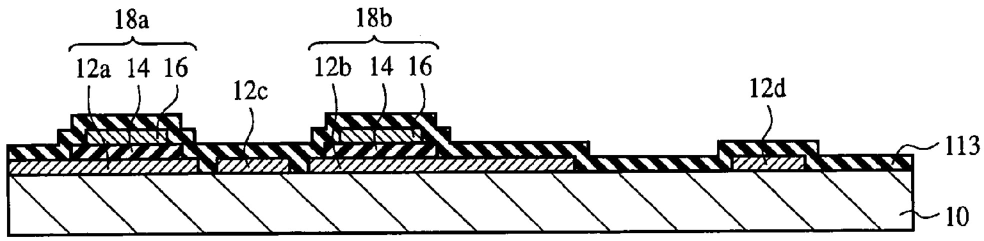

First, in the same way as in the method for fabricating the interposer described above with reference to FIG. 4A, the semiconductor substrate 10 is prepared (see FIG. 32A).

First, as in the method for fabricating the interposer described above with reference to FIG. 4A, silicon oxide film (not illustrated) is formed on the surface of the semiconductor substrate 10 by thermal oxidation.

Next, in the same way as in the method for fabricating the interposer described above with reference to FIG. 4B, titanium oxide ($TiO_2$) film and platinum (Pt) film, for example, are sequentially laid on the semiconductor substrate 10 by, e.g., sputtering to form the conduction film 12.

Then, in the same way as in the method for fabricating the interposer described above with reference to FIG. 4B, the crystalline capacitor dielectric film 14 is formed on the conduction film 12 by, e.g., sputtering. Specifically, the crystalline $Ba_xSr_{1-x}TiO_3$ (BST) film 14, for example is formed.

Then, iridium oxide ($IrO_2$) film and gold. (Au) film, for example, are sequentially formed on the capacitor dielectric film 14 by, e.g., sputtering. The conduction film 16 is to be the upper electrodes (capacitor electrodes) of the capacitors 18*a*, 18*b*. The film thickness of the iridium oxide film is, e.g., 50 nm. The film thickness of the Au film is, e.g., 100 nm.

Next, in the same way as in the method for fabricating the interposer described above with reference to FIGS. 4C to 4E, the conduction film 16, the capacitor dielectric film 14 and the conduction film 12 are sequentially patterned into prescribed configurations by photolithography.

Thus, the thin-film capacitor 18*a* including the capacitor electrode 12*a*, the capacitor dielectric film 14 and the capacitor electrode 16 is formed. The thin-film capacitor 18*b* including the capacitor electrode 12*b*, the capacitor dielectric film 14 and the capacitor electrode 16 is formed.

Then, the passivation film 113 is formed by, e.g., sputtering, covering the capacitors 18*a*, 18*b*. The passivation film 113 is formed of, e.g., aluminum oxide film. It is preferable that the density of the passivation film 113 of aluminum is, e.g., 2.6 g/cm$^3$ or above. The passivation film 113 has such relatively high density, so that the water, gas, etc. emitted from the resin layer 20 can be surely protected by the passivation film 113. The film thickness of the passivation film 113 is, e.g., about 100 nm.

Conditions for forming the passivation film 113 of aluminum oxide are as exemplified below. The substrate temperature is, e.g., 80° C. The applied electric power is, e.g., 500 W. The gas pressure inside film forming chamber is, e.g., 0.1 Pa. The flow rate ratio between argon gas and oxygen gas is, e.g., 5:1.

Thus, the passivation film 113 is formed, covering the thin-film capacitors 18*a*, 18*b*.

Figure 32C:
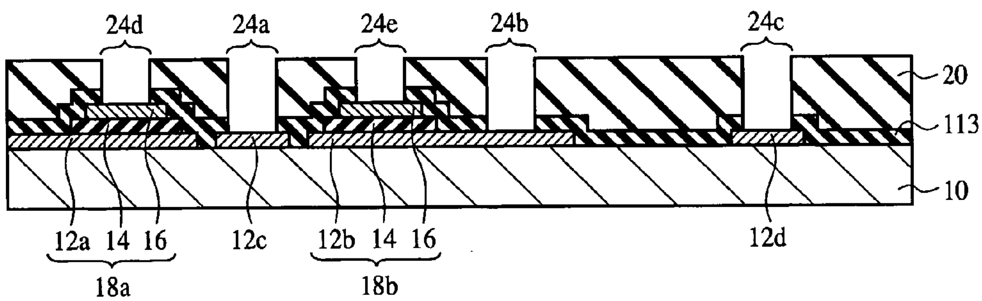
Figure 32D:
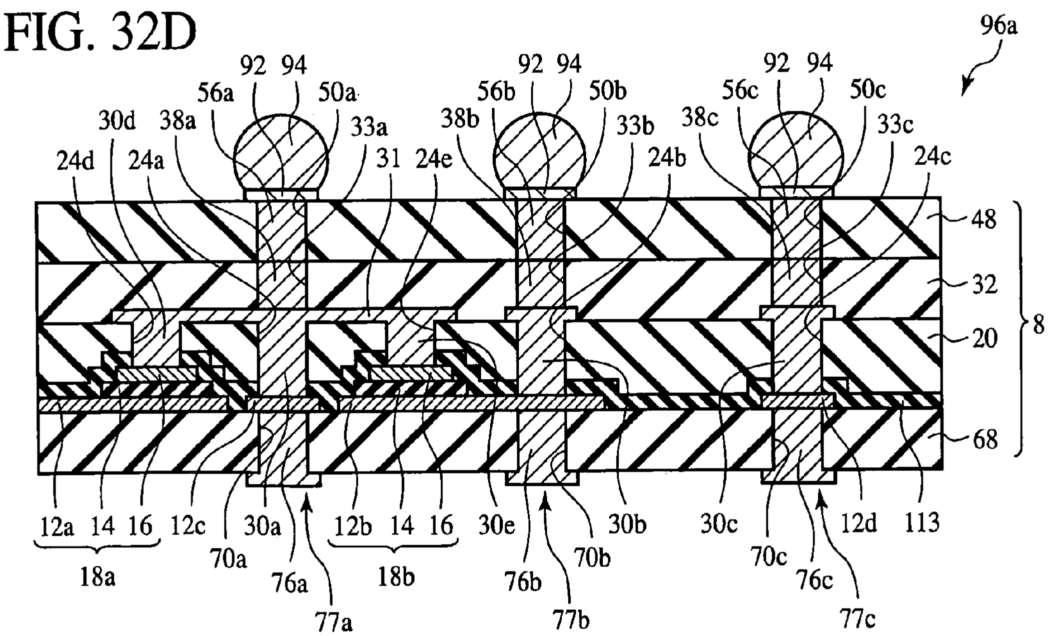

Next, the resin layer 20 is formed on the semiconductor substrate 10 with the capacitors 18*a*, 18*b* and the conduction films 12*a*, 12*b* formed on (see FIG. 32C). The resin layer 20 is formed of, e.g., photosensitive polyimide resin.

The resin layer can be formed as exemplified below. First, a photosensitive polyimide resin solution is applied to the semiconductor substrate 10 by spin coating. Conditions for applying the polyimide resin solution are, e.g., 2000 rpm and 30 seconds. Thus, the resin layer 20 is formed in, e.g., an 8 μm-thickness. Then, the thermal processing (pre-bake) is made on the resin layer 20. The thermal processing temperature is, e.g., 200° C.

Next, the openings 24*a*-24*e* are formed in the resin layer 20 down to the passivation film 113 by photolithography.

Next, the thermal processing (main bake) is made on the resin layer 20. The thermal processing temperature is, e.g., 400° C. The film thickness of the resin layer 20 after the thermal processing is about, e.g., 5 μm.

Next, the passivation film 113 exposed in the openings 24*a*-24*e* is removed by etching. Thus, the openings 24*a*, the openings 24*b*, the opening 24*c*, the opening 24*d* and the openings 24*e* are formed in the resin layer 20 respectively down to the conduction film 12*c*, the capacitor electrode 12*b*, the conduction film 12*d*, the capacitor electrode 16 of the capacitor 18*a* and the capacitor electrode 16 of the capacitor 18*b*.

The process of the method for fabricating the interposer, which follows the above-described step is the same as that of the method for fabricating the interposer according to the first embodiment illustrated in FIGS. 5C to 26B, and the explanation will not be repeated. Thus, the interposer according to the present modification is fabricated (see FIG. 32D).

As described above, it is possible that the passivation film 113 is formed, covering the thin-film capacitors 18*a*, 18*b*, and the resin layer 20 is formed on the passivation film 113. According to the present modification, the reduction, etc. of the capacitor dielectric film 14 can be prevented by the passivation film 113, and accordingly, even when the resin layer 20 is formed of a material which emits water, etc. in the thermal processing, the interposer including the thin-film capacitors 18*a*, 18*b* of good electric characteristics can be provided.

(Modification 2)

Figure 33:
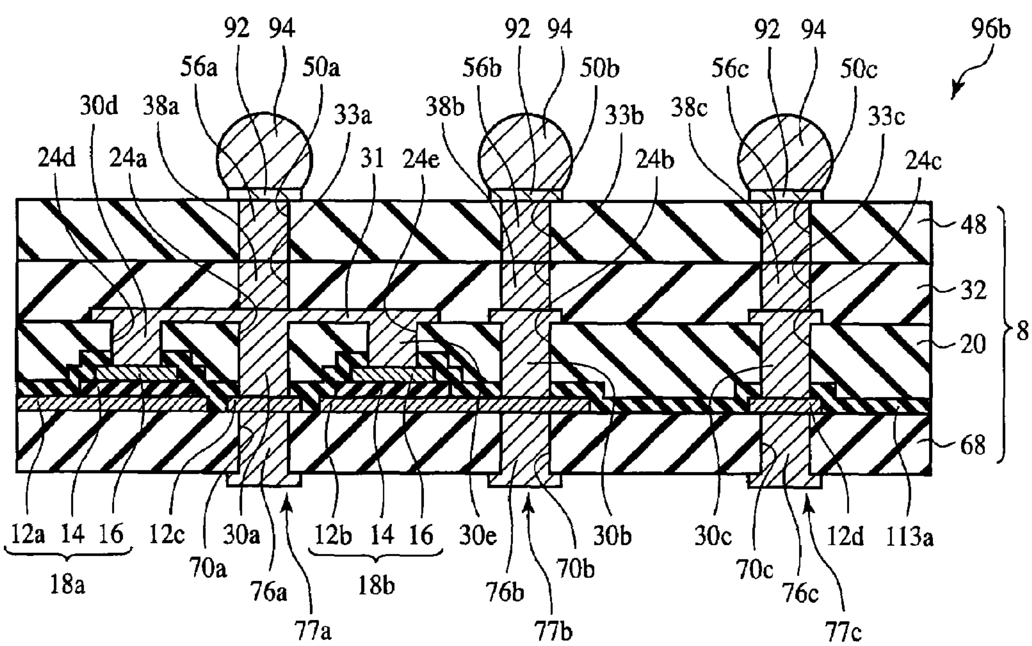
FIG. 33 is a sectional view of the interposer according to Modification 2 of the first embodiment of the present invention, which illustrates the interposer and the electronic device.

Then, the interposer according to Modification 2 of the present embodiment and the method for fabricating the interposer will be explained with reference to FIGS. 33 and 34. FIG. 33 is a sectional view of the interposer according to the present modification.

The interposer according to the present modification is characterized mainly in that a passivation film 113*a*covering the thin-film capacitors 18*a*, 18*b* is formed of an amorphous film of one and the same material as the capacitor dielectric film 14.

As illustrated in FIG. 33, in the present modification, the passivation film 113*a* is formed, covering the thin-film capacitors 18*a*, 18*b*, and the resin layer 14 is formed on the passivation film 113*a*. The passivation film 113*a* is formed of one and the same amorphous film as the capacitor dielectric film 14. The passivation film 113*a* is formed of an amorphous film, because the polycrystalline film admits water, gas, etc. along the grain boundaries and cannot sufficiently barrier the water, gas, etc.

As in the present modification, the passivation film 113*a* covering the thin-film capacitors 18*a*, 18*b* is formed of one and the same amorphous film as the capacitor dielectric film 14, whereby because the same thermal expansion coefficient of the capacitor dielectric film 14 and the passivation film 113*a*, the application of undesired mechanical stress to the thin-film capacitors 18*a*, 18*b* can be prevented. Furthermore, the BST film forming the capacitor dielectric film 14 has good adhesion. Thus, according to the present modification, the interposer can have higher reliability.

Next, the method for fabricating the interposer according to the present modification will be explained with reference to FIGS. 34A to 34D. FIGS. 34A to 34D are sectional views of the interposer according to the present modification in the steps of the method for fabricating the interposer, which illustrate the method.

Figure 34A:
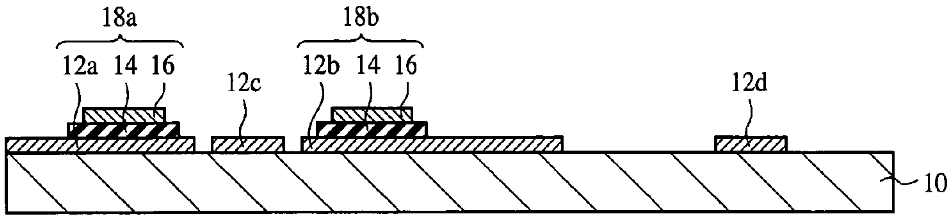
FIGS. 34A to 34D are sectional views of the interposer according to Modification 2 of the first embodiment of the present invention in the steps of the method for fabricating the interposer and the electronic device, which illustrate the method.
Figure 34B:
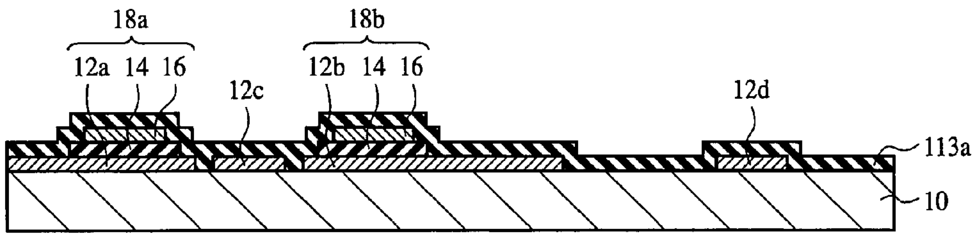

First, in the same way as in the method for fabricating the interposer described above with reference to FIG. 4A, the semiconductor substrate 10 is prepared (see FIG. 34A).

Next, in the same way as in the method for fabricating the interposer described above with reference to FIG. 4A, silicon oxide film (not illustrated) is formed on the surface of the semiconductor substrate 10 by thermal oxidation.

Next, in the same way as in the method for fabricating the interposer described above with reference to FIG. 4B, titanium oxide ($TiO_2$) film and platinum (Pt) film, for example, are sequentially laid on the semiconductor substrate 10 by, e.g., sputtering to form the conduction film 12.

Then, in the same way as in the method for fabricating the interposer described above with reference to FIG. 4B, the crystalline capacitor dielectric film 14 is formed on the conduction film 12 by, e.g., sputtering. Specifically, crystalline $Ba_xSr_{1-x}TiO_3$ (BST) film 14, for example, is formed.

Then, the conduction film 16 of, e.g., iridium oxide ($IrO_2$) film and gold (Au) film for example, are sequentially laid on the capacitor dielectric film 14 by, e.g., sputtering to form the conduction film 16. The conduction film 16 is to be the upper electrodes (capacitor electrodes) of the capacitors 18*a*, 18*b*. The film thickness of the iridium oxide film is, e.g., 50 nm. The film thickness of the Au film is, e.g., 100 nm.

Next, as described above with reference to FIGS. 4C to 4E, in the same way as in the method for fabricating the interposer described above with reference to FIGS. 4C to 4E, the conduction film 16, the capacitor dielectric film 14 and the conduction film 12 are sequentially patterned into prescribed configurations by photolithography.

Thus, the thin-film capacitor 18*a* including the capacitor electrode 12*a*, the capacitor dielectric film 14 and the capacitor electrode 16 is formed. The thin-film capacitor 18*b* including the capacitor electrode 12*b*, the capacitor dielectric film 14 and the capacitor electrode 16 is formed.

Next, the passivation film 113*a* is formed by, e.g., sputtering, covering the capacitors 18*a*, 18*b*. The passivation film 113*a* is formed of, e.g., amorphous BST film. The film thickness of the passivation film 113*a* is, e.g., about 100 nm.

Conditions for forming the passivation film 113*a* of the amorphous BST film are as exemplified below. The substrate temperature is, e.g., 50° C. The applied electric power is, e.g., 600 W. The gas pressure inside the film forming chamber is, e.g., 0.2 Pa. The flow rate ratio between the argon gas and the oxygen gas is, e.g., 8:1.

Thus, the passivation film 113*a* is formed, covering the thin-film capacitors 18*a*, 18*b*.

Figure 34C:
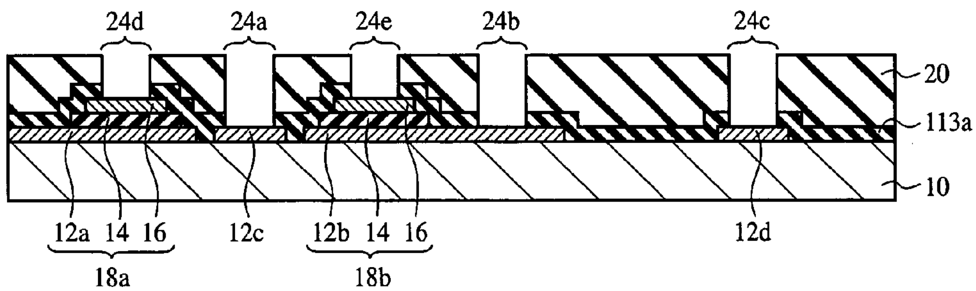
Figure 34D:
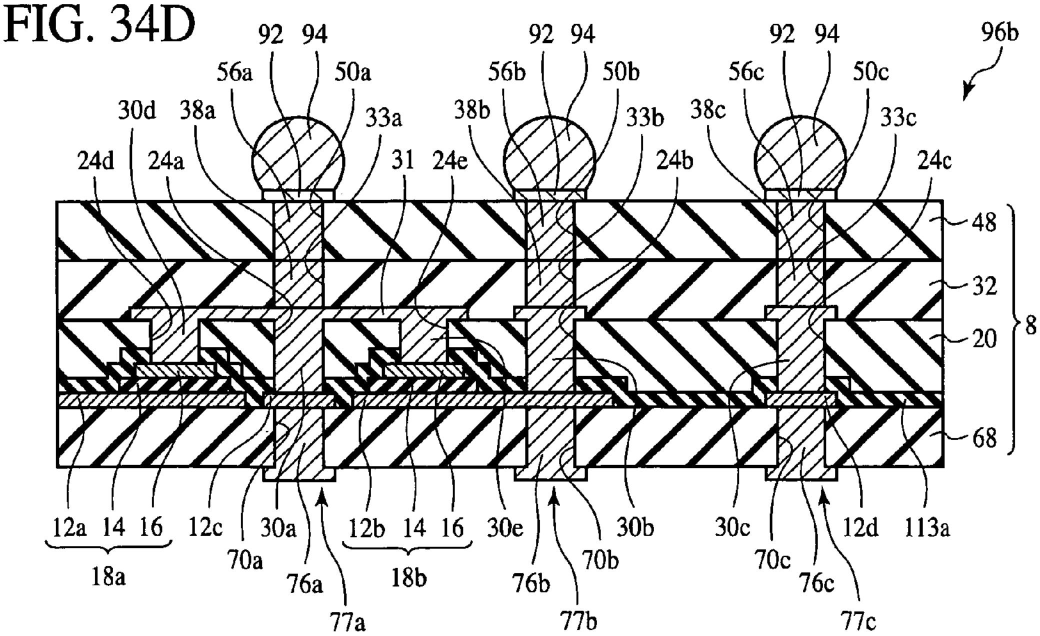

Next, the resin layer 20 is formed on the semiconductor substrate 10 with the capacitors 18*a*, 18*b* and the conduction films 12*a*, 12*b* formed on (see FIG. 34C). The resin layer 20 is formed of, e.g., photosensitive polyimide resin.

The resin layer 20 can be formed as exemplified below. That is, a photosensitive polyimide solution is applied to the semiconductor substrate 10 by spin coating. Conditions for applying the polyimide resin solution are, e.g., 2000 rpm and 30 seconds. Thus, the resin layer 20 is formed in, e.g., a 8 μm-thickness. Then, the thermal processing (pre-bake) is made on the resin layer 20. The thermal processing temperature is, e.g., 200° C.

Next, the openings 24*a*-24*e* are formed in the resin layer 20 down to the passivation film 113*a* by photolithography.

Next, the thermal processing (main bake) is made on the resin layer 20. The thermal processing temperature is, e.g., 400° C. The film thickness of the resin layer 20 after the thermal processing is, e.g., about 5 μm.

Then, the passivation film 113*a* exposed in the openings 24*a*-24*e* is removed. Thus, the openings 24*a*, the openings 24*b*, the openings 24*c*, the opening 24*d* and the opening 24*e* are formed in the resin layer 20 respectively down to the conduction film 12*c*, the capacitor electrode 12*b*, the conduction film 12*d*, the capacitor electrode 16 of the capacitor 18*a* and the capacitor electrode 16 of the capacitor 18*b*.

The process of the method for fabricating the interposer, which follows the above-described step is the same as that of the method for fabricating the interposer according to the first embodiment illustrated in FIG. 5C to 26B and will not be explained. Thus, the interposer according to the present modification is fabricated (see FIG. 34D).

As in the present modification, it is possible that the amorphous film formed of one and the same material as the capacitor dielectric film 14 is formed as the passivation film 113*a* covering the thin-film capacitors 18*a*, 18*b*, and the resin layer 20 is formed on the passivation film 113*a*. Because of the same thermal expansion coefficient of the capacitor dielectric film 14 and the passivation film 113*a*, the application of undesired mechanical stresses to the thin-film capacitors 18*a*, 18*b* can be prevented. Accordingly, according to the present modification, the interposer can be highly reliable.

(Modification 3)

Figure 35A:
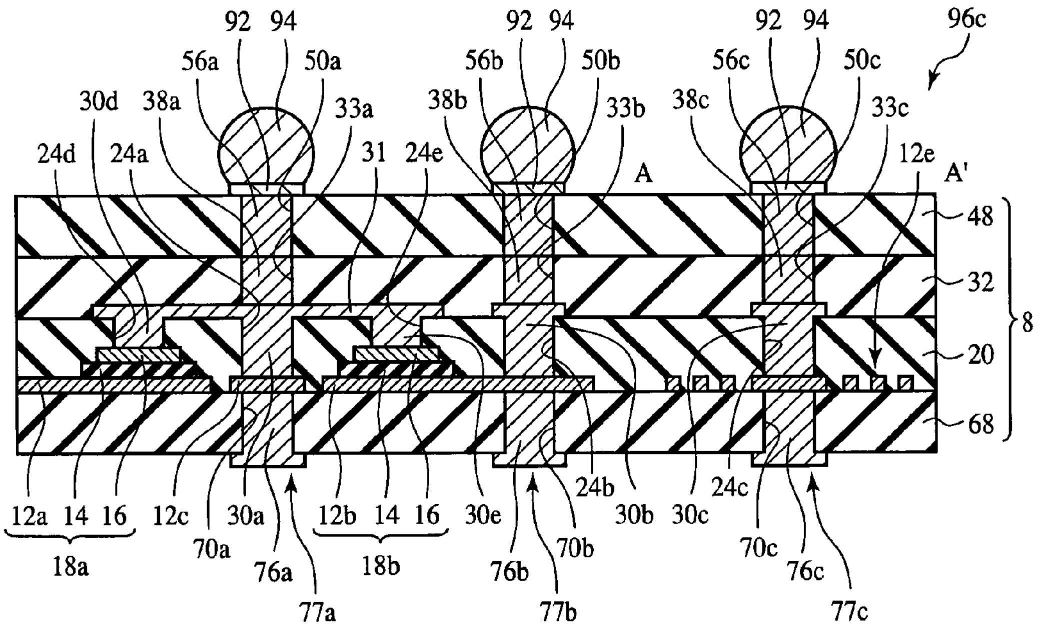
FIGS. 35A and 35B are a sectional view and a plan view of the interposer according to Modification 3 of the first embodiment of the present invention, which illustrate the interposer.
Figure 35B:
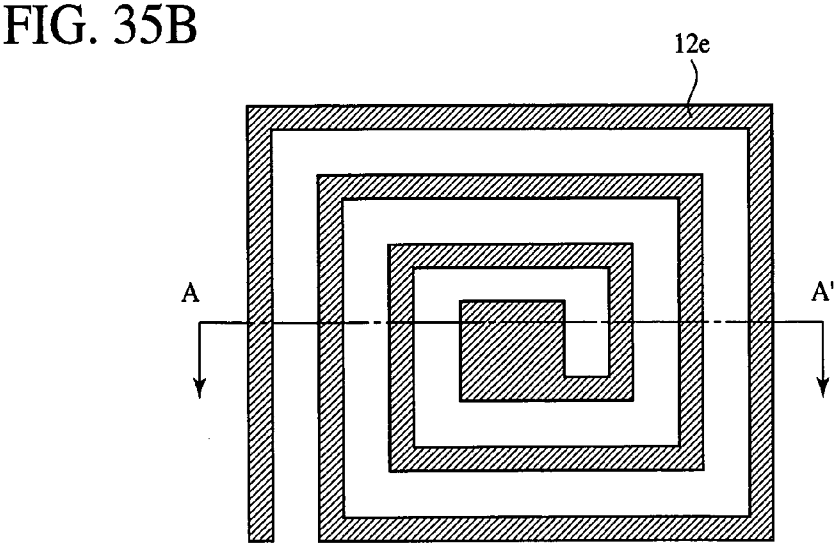

Next, the interposer according to Modification 3 of the present embodiment and the method for fabricating the interposer will be explained with reference to FIGS. 35A and 35B. FIGS. 35A and 35B are a sectional view and a plan view of the interposer according to the present embodiment.

The interposer according to the present modification is further characterized by including an inductor 12*e* in addition to the capacitor 18*a*, 18*b*.

As illustrated in FIGS. 35A and 35B, an inductor 12*e* formed in a coil is formed on one surface of the resin layer 68 (contacting the resin layer 20). The inductor 12*e* is formed of one and the same conduction film as the capacitor electrodes 12*a*, 12*b* and the conduction film 12*c*. The inner end of the inductor 12*e* forms a part of the through-electrode 77*c*. The outer end of the inductor 12*e* is electrically connected to, e.g., the capacitor electrodes 12*a*, 12*b*.

The inductor 12*e* is formed of one and the same conduction film as the capacitor electrodes (lower electrodes) 12*a*, 12*b* here but may be formed of one and the same conduction film as the capacitor electrode (upper electrode) 16.

Thus, the interposer 96*c* according to the present modification is constituted.

As in the present modification, not only the capacitors 18*a*, 18*b*, but also the inductor 12*e* may be further buried in.

A Second Embodiment

The interposer according to a second embodiment of the present invention and the method for fabricating the interposer, the electronic device using the interposer and the method for fabricating the electronic device will be explained with references from to FIGS. 36 to 62. The same members of the present embodiment as those of the interposer according to the first embodiment and the method for fabricating the interposer, etc. are represented by the same reference numbers not to repeat or to simplify their explanation.

(Interposer and Electronic Device)

Figure 36:
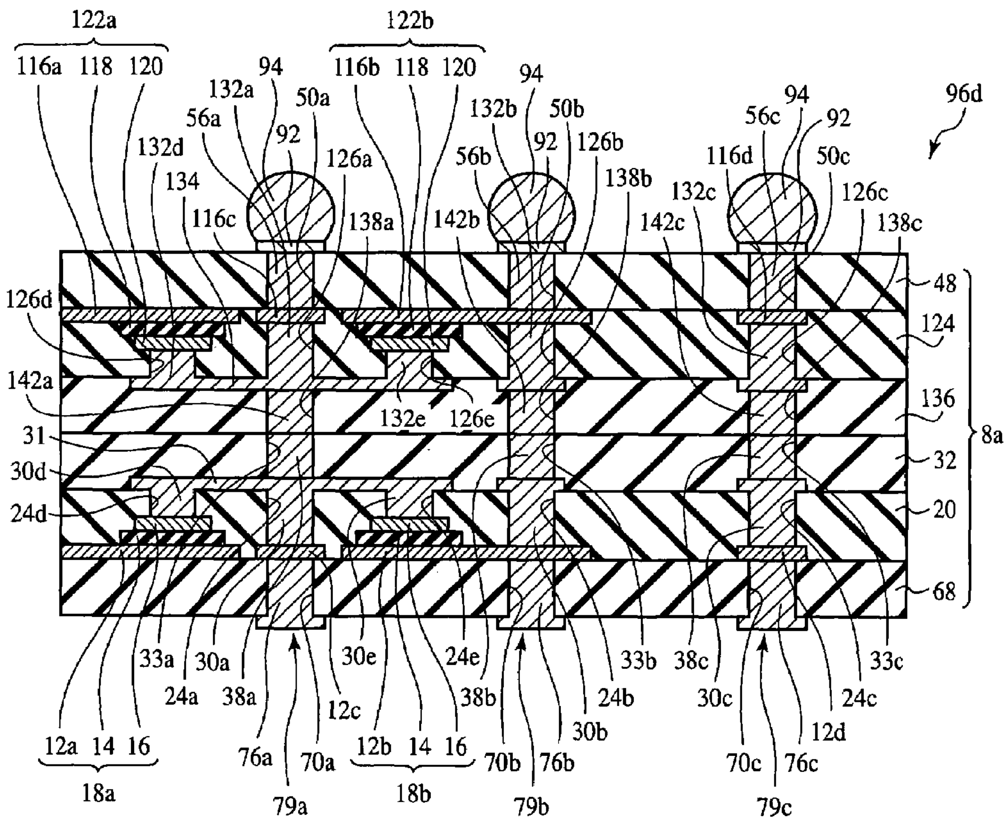
FIG. 36 is a sectional view of the interposer according to a second embodiment of the present invention, which illustrates the interposer (Part 1).
Figure 37:
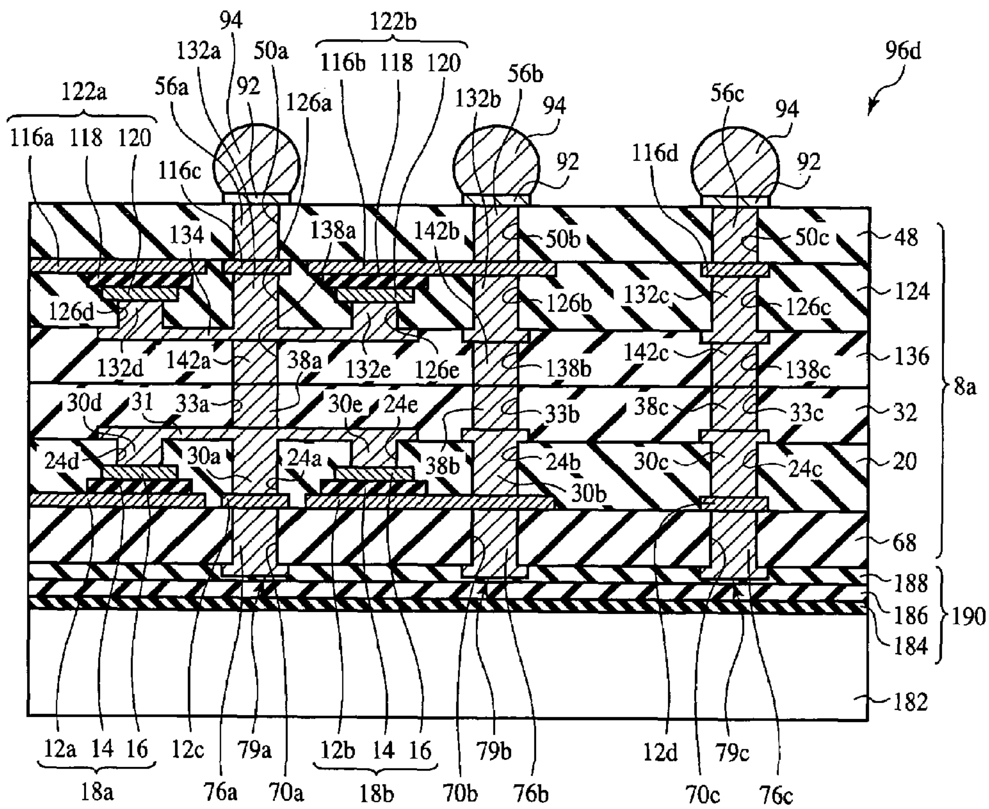
FIG. 37 is a sectional view of the interposer according to the second embodiment of the present invention, which illustrates the interposer (Part 2).
Figure 38:
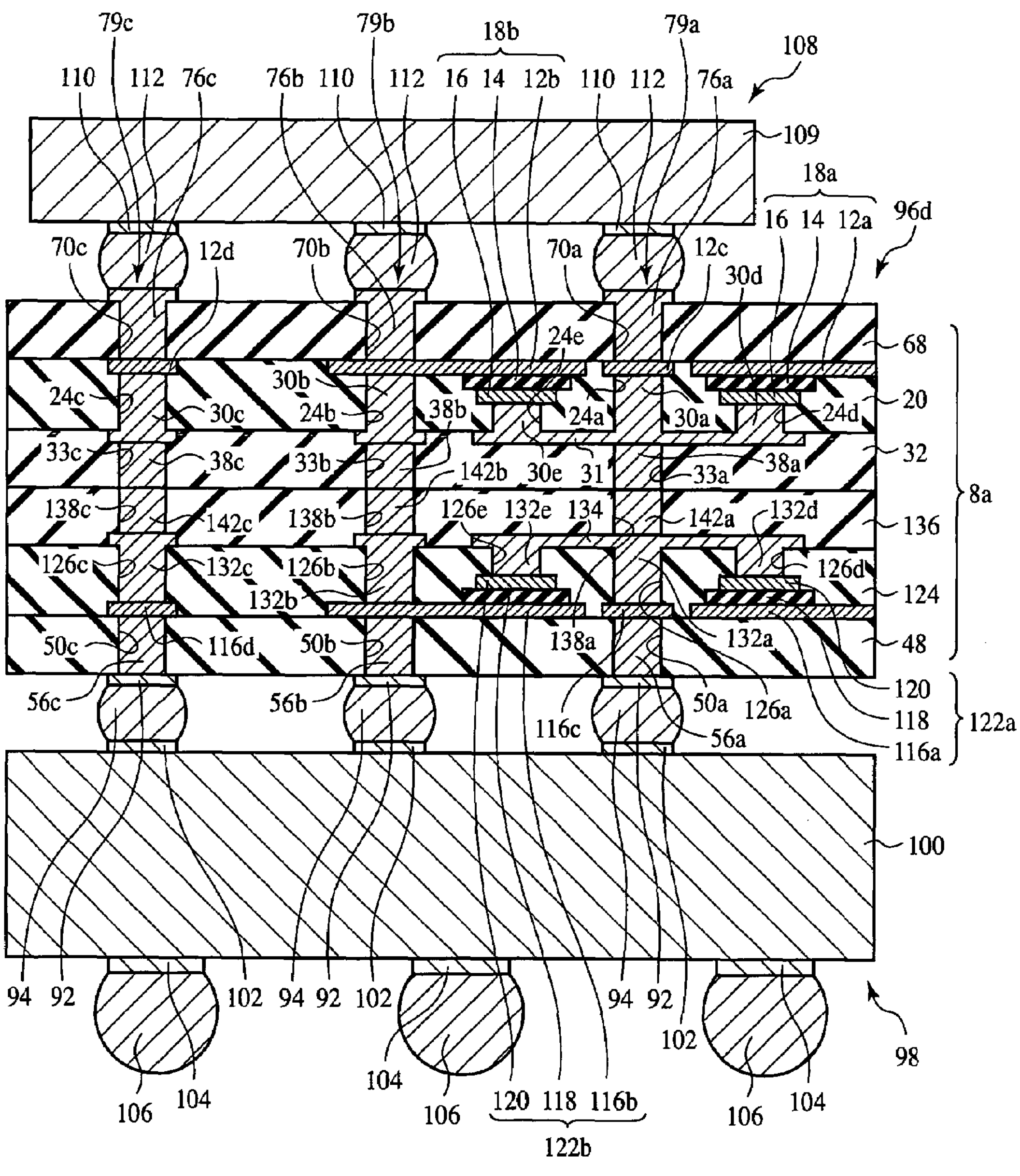
FIG. 38 is a sectional view of the electronic device according to the second embodiment of the present invention, which illustrates the electronic device.

First, the interposer according to the present embodiment, and the electronic device using the interposer will be explained with reference to FIGS. 36 to 38. FIG. 36 is a sectional view (Part 1) of the interposer according to the present embodiment. FIG. 37 is a sectional view (Part 2) of the interposer according to the present embodiment. FIG. 38 is a sectional view of the electronic device according to the present embodiment.

The interposer 96*d* according to the present embodiment is characterized mainly in that the interposer comprises a base 8*a* of a plurality of resin layers 68, 20, 32, 136, 124, 48 laid the latter on the former, thin-film capacitors 18*a*, 18*b* buried between the resin layer 68 and the resin layer 20, thin-film capacitors 122*a*, 122*b* buried between the resin layer 48 and the resin layer 124, a through-electrode 79*a* formed through the base 8*a* and electrically connected to the capacitor electrodes 16 of the thin-film capacitors 18*a*, 18*b* and the capacitor electrodes 120 of the thin-film capacitors 122*a*, 122*b*, a through-electrode 79*b* formed through the base 8*a* and electrically connected to the capacitor electrodes 12*a*, 12*b* of the thin-film capacitors 18*a*, 18*b* and the capacitor electrodes 116*a*, 116*b* of the thin-film capacitors 122*a*, 122*b*, and a through-electrode 79*c* formed through the base 8*a* and insulated from the thin-film capacitors 18*a*, 18*b* and the thin-film capacitors 122, 122*b*.

That is, the interposer 96*d* according to the present embodiment is characterized mainly in that the thin-film capacitors 122*a*, 122*b* are buried between the resin layer 48 and the resin layer 124 in addition to the thin-film capacitors 18*a*, 18*b* buried between the resin layer 68 and the resin layer 20, and the thin-film capacitors 18*a*, 18*b* and the thin-film capacitors 122*a*, 122*b* are electrically connected in parallel with to each other.

The capacitor electrodes (lower electrodes) 116*a*, 116*b* are formed on one surface of the resin layer 48 (opposite to the surface with electrode pads 92 formed on). The resin layer 48 is formed of, e.g., BCB resin, as described above. The capacitor electrodes 116*a*, 116*b* are formed of, e.g., a 20 nm-thickness titanium oxide ($TiO_2$) film and a 150 nm-thickness platinum (Pt) film. The capacitor electrode 116*a* of the thin-film capacitor 122*a* and the capacitor electrode 116*b* of the thin-film capacitor 122*b* are electrically connected to each other.

A crystalline capacitor dielectric film 118 is formed on one surfaces of the capacitor electrodes 116*a*, 116*b* (opposite to the surfaces contacting the resin layer 48). That is, the polycrystalline capacitor dielectric film 118 or the epitaxially grown capacitor dielectric film 118 is formed. The capacitor dielectric film 118 is formed of a high relative dielectric constant material. Specifically, the capacitor dielectric film 118 is formed of BST film. The film thickness of the capacitor dielectric film 118 is, e.g., 100 nm. The capacitor dielectric film 118 is formed by the high-temperature process of, e.g., 500° C. or above. Accordingly, the capacitor dielectric film 118 is very well crystallized and has very high relative dielectric constant. Specifically, the relative dielectric constant of the capacitor dielectric film 118 is 200 or above.

In forming the capacitor dielectric film 118, as will be described below, the capacitor dielectric film 118 is formed on a semiconductor substrate 114 which is durable to high-temperature process (see FIG. 39B). As will be described below, the base 8*a* formed of the resin layers 68, 20, 32, 136, 124, 48 with the thin-film capacitors 18*a*, 18*b*, 122*a*, 122*b* buried in has not been subjected to the high-temperature process for forming the capacitor dielectric film 118, and no large deformation, etc. have been generated in the base 8*a*.

Capacitor electrodes (upper electrodes) 120 are formed, opposed to the capacitor electrodes 116*a*, 116*b* on one surface of the capacitor dielectric film 118 (opposite to the surface contacting the capacitor electrodes 116*a*, 116*b*). The capacitor electrodes 120 are formed of, e.g., a 200 nm-thickness Pt film.

Thus, the thin-film capacitor 122*a* including the capacitor electrode 116*a*, the capacitor dielectric film 118 and the capacitor electrode 120 is formed. The thin-film capacitor 116*b* including the capacitor electrode 116*b*, the capacitor dielectric film 118 and the capacitor electrode 120 is formed.

Conduction films 116*c*, 116*d* of one and the same conduction film as the capacitor electrodes 116*a*, 116*b* are formed on one surface of the resin layer 48 (contacting the capacitor electrodes 116*a*, 116*b*). The conduction film 116*c* forms a part of the through electrode 79*a*. The conduction film 116*d* forms a part of the through electrode 79*c*. The conduction films 116*c*, 116*d* are electrically insulated from the capacitor electrodes 116*a*, 116*b*.

A resin layer 124 is formed on one surface of the resin layer 48 (contacting the capacitor electrode 116*a*, 116*b*), covering the thin-film capacitors 122*a*, 122*b* and the conduction films 116*c*, 116*d*. The resin layer 124 is formed of, e.g., epoxy resin.

An opening 126*a*, an opening 126*b*, an opening 126*c* and an opening 126*d* are formed in the resin layer 124 respectively down to the conduction film 116*c*, the capacitor electrode 116*b* of the thin-film capacitor 122*b*, the conduction film 116*d*, the capacitor electrode 120 of the capacitor 122*a* and the capacitor electrode 120 of the capacitor 122*b*.

A partial electrode 132*a* forming a part of the through electrode 79*a* is buried in the opening 126*a*. The partial electrode 132*a* is connected to the partial electrode 56*a* via the conduction film 116*c*. A partial electrode 132*b* forming a part of the through electrode 79*b* is buried in the opening 126*b*. The partial electrode 132*b*is connected to the capacitor electrode 116*b*. A partial electrode 132*c* forming a part of the through electrode 79*c* is buried in the opening 126*c*. The partial electrode 132*c* is connected to the partial electrode 56*c* via the conduction film 116*d*.

A conductor plug 132*d* is buried in the opening 126*d*, connected to the capacitor electrode 120 of the thin-film capacitor 122*a*. A conductor plug 132*e* is buried in the opening 126*e*, connected to the capacitor electrode 120 of the thin-film capacitor 122*b*. The partial electrode 132*a*, the conduction plug 132*d* and the conduction plug 132*e* are electrically interconnected to each other by an interconnection 134. The partial electrode 132*a*, the conductor plug 132*d* the conductor plug 132*e* and the interconnection 134 are integrally formed of one and the same conduction film.

A resin layer 136 is formed on one surface of the resin layer 124 (opposite to the surface contacting the resin layer 48), covering the interconnection 134. The resin layer 136 is formed of a thermosetting resin, which is cured and shrunk without generating by-products, such as water, alcohol, organic acid, nitride, etc. Such thermosetting resin is, e.g., BCB resin. The material of the BCB resin can be a BCB resin solution by, e.g., Dow Chemical Company (trade name: CYCLOTENE 4024-40) or others.

An opening 138*a*, an opening 138*b* and an opening 138*c* are formed in the resin layer 136 respectively down to the partial electrode 132*a*, the partial electrode 132*b* and the partial electrode 132*c*.

A partial electrode 142*a* forming a part of the through electrode 79*a* is buried in the opening 138*a*. A partial electrode 142*b* forming a part of the through electrode 79*b* is buried in the opening 138*b*. A partial electrode 142*c* forming a part of the through electrode 79*c* is buried in the opening 138*c*.

One surfaces of the partial electrodes 142*a*-142*c* (opposite to the surfaces contacting the partial electrodes 132*a*-132*c*) and one surface of the resin layer 136 (opposite to the surface contacting the resin layer 124) are cut with a cutting tool 44 of diamond or others as will be described later (see FIG. 42A). Said one surfaces of the partial electrodes 142*a*-142*c* (contacting the partial electrodes 38*a*-38*c*) and said one surface of the resin layer 136 (contacting the resin layer 32), which are cut with the cutting tool 44 of diamond or others, are flat.

The resin layer 32 and the resin layer 136 are adhered to each other. The partial electrodes buried in the resin layer 32 and the partial electrodes 142*a*-142*c* buried in the resin layer 136 are respectively jointed to each other. As will be described later, the resin layer 32 and the resin layer 136 are subjected to thermal processing to be shrunk. The resin layer 32 and the resin layer 136, which are surely adhered to each other, are shrunk, whereby due to the shrinkage of the resin layer 32 and the resin layer 136, one surfaces of the partial electrodes 38*a*-38*c* (contacting the partial electrodes 142*a*-142*c*) and one surfaces of the partial electrodes 142*a*-142*c* (contacting the partial electrodes 38*a*-38*c*) are surely jointed to each other.

As described with reference to FIGS. 13A to 15B, one surfaces of the partial electrodes 56*a*-56*c* (contacting the capacitor electrode 116*b* or the conduction films 116*c*, 116*d*) and one surface of the resin layer 48 (contacting the resin layer 124) are cut with the cutting tool 44 of diamond. Said one surfaces of the partial electrodes 56*a*-56*c* (contacting the capacitor electrode 116*b* or the conduction films 116*c*, 116*d*) and one surface of the resin layer 48 (contacting the resin layer 124), which are cut with the cutting tool 44 of diamond or others, are flat.

The resin layer 48 is adhered to the resin layer 124. The partial electrodes 56*a* buried in the resin layer 48 and the conduction film 116*c* buried in the resin layer 124 are jointed to each other. The partial electrodes 56*b* buried in the resin layer 48 and the capacitor electrode 116*b* buried in the resin layer 124 are jointed to each other. The partial electrodes 56*c* buried in the resin layer 48 and the conduction film 116*d* buried in the resin layer 124 are jointed to each other. As will be described later, the resin layer 48 is subjected to thermal processing to be shrunk. The resin layer 48, which is surely adhered to the resin layer 124, is shrunk, whereby due to the shrinkage of the resin layer 48, the partial electrodes 56*a* and the conduction film 116*c* are firmly adhered to each other, the partial electrode 56*b* and the capacitor electrode 116*b* are firmly adhered to each other, and the partial electrode 56*c* and the conduction film 116*d* are firmly adhered to each other.

The partial electrode 76*a*, the conduction film 12*c*, the partial electrode 30*a*, the partial electrode 38*a*, the partial electrode 142*a*, the partial electrode 132*a*, the conduction film 116*c* and the partial electrode 56*a* form the through electrode 79*a*. The partial electrode 76*b*, a part of the capacitor electrode 12*b*, the partial electrode 30*b*, the partial electrode 38*b*, the partial electrode 142*b*, the partial electrode 132*b*, a part of the capacitor electrode 116*b* and the partial electrode 56*b* form the through electrode 79*b*. The partial electrode 76*c*, the conduction film 12*d*, the partial electrode 30*c*, the partial electrode 38*c*, the partial electrode 142*c*, the partial electrode 132*c*, the conduction film 116*d* and the partial electrode 56*c* form the through electrode 79*c*.

Thus, the interposer 96*d* according to the present embodiment is constituted.

As illustrated in FIG. 37, the interposer 96*d* is supported by a supporting substrate 182.

That is, a supporting substrate 182 is adhered to the other surface of he resin layer 68 (opposite to surface contacting the resin layer 20) with a heat foaming type double-sided tape 190. The supporting substrate 182 is, e.g., a glass supporting substrate. As is the heat foaming type double-sided tape 86 described above with reference to FIG. 2, the heat foaming type double-sided tape 190 includes a base 186 of, e.g., polyester film, a heat-releasable adhesive layer 188 formed on one surface of the base 186 and a pressure sensitive adhesive layer 188 formed on the other surface of the base 186. The pressure sensitive adhesive layer 184 of the heat foaming type double-sided tape 190 is adhered to the resin layer 68, and the heat-releasable adhesive layer 188 of the heat foaming type double-sided tape 190 is adhered to the resin layer 68.

In the present embodiment, the interposer 96*d* is supported by the supporting substrate 182, because the base 8*a* of the interposer 96*d* is formed only of the resin layers 68, 20, 32, 136, 124, 48, and unless the interposer 96*d* is supported by some solid means, the interposer 96*d* will be deformed as will be the interposer 96 according to the first embodiment.

As will be described later, when the interposer 96*d* is mounted on a substrate or others, the interposer 96*d* is supported by the substrate or others, and the supporting substrate 182 becomes unnecessary. The supporting substrate 182 is adhered to the interposer 96*d* with the heat foaming type double-sided tape 190 so that when it becomes unnecessary to support the interposer 96*d* by the supporting substrate 182, the interposer 96*d* can be easily removed from the supporting substrate 182.

FIG. 38 is a sectional view of the electronic device using the interposer according to the present embodiment.

As illustrated in FIG. 38, the interposer 96*d* according to the present embodiment is disposed, e.g., between the package substrate 98 and the semiconductor integrated circuit devices 108, as is the interposer 96 according to the first embodiment.

The electrode pads 92 of the interposer 96*d* and the electrode pads 102 of the package substrate 98 are electrically connected respectively to each other by solder bumps 94.

The electrode pads 110 of the semiconductor integrated circuit devices 10 and the through electrodes 79*a*-79*c* are electrically connected respectively to each other by solder bumps 112.

Thus, the electronic device using the interposer according to the present embodiment is constituted.

As described above, the interposer according to the present embodiment is mainly characterized in that the thin-film capacitors 122*a*, 122*b* are buried between the resin layer 48 and the resin layer 124 in addition to the thin-film capacitors 18*a*, 18*b* buried between the resin layer 68 and the resin layer 20, and the thin-film capacitors 18*a*, 18*b* and the thin-film capacitors 122*a*, 122*b* are connected in parallel with each other.

According to the present embodiment, the thin-film capacitors 18*a*, 18*b* and the thin-film capacitors 122*a*, 122*b* are connected in parallel with each other, whereby the interposer including the thin-film capacitors of larger dielectric capacitance can be provided.

(Method for Fabricating Interposer and Electronic Device)

Then, the method for fabricating the interposer and the electronic device according to the present embodiment will be explained with reference to FIGS. 39A to 62. FIGS. 39A to 62 are sectional views of the interposer and the electronic device according to the present embodiment in the steps of the method for fabricating the interposer and the electronic device, which illustrate the method.

First, the step of preparing the semiconductor substrate 10 up to the step of cutting the upper parts of the partial electrodes 38*a*-38*c* and the upper part of the resin layer 32*b* including this step are the same as those of the method for fabricating the interposer according to the first embodiment illustrated in FIGS. 4A to 10B, and their explanation will not be repeated.

Figure 39A:
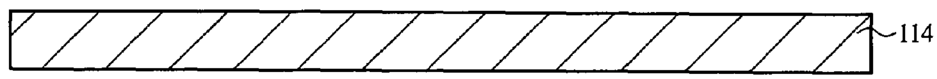
FIGS. 39A to 39E are sectional views of the interposer and the electronic device according to the second embodiment of the present invention in the steps of the method for fabricating the interposer and the electronic device, which illustrate the method (Part 1).

As illustrated in FIG. 39A, the semiconductor substrate 114 is prepared. The semiconductor substrate 114 is a semiconductor substrate which is not cut in a chip size, i.e., a semiconductor substrate in a wafer. The semiconductor substrate 114 is, e.g., a silicon substrate. The thickness of the semiconductor substrate 114 is, e.g., 0.6 mm.

Then, silicon oxide film (not illustrated) is formed on the surface of the semiconductor substrate 114 by thermal oxidation. The film thickness of the silicon oxide film is, e.g., about 0.5 μm.

Figure 39B:
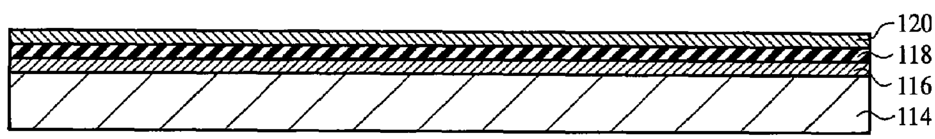
Figure 39C:
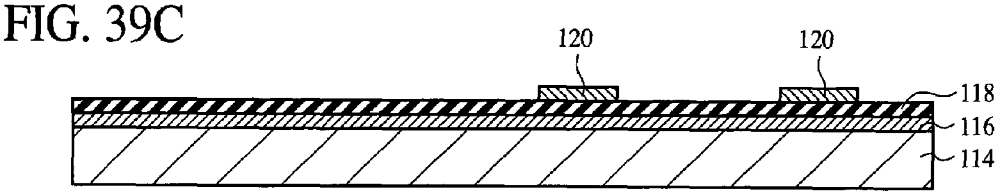

Next, as illustrated in FIG. 39B, titanium oxide ($TiO_2$) film and platinum (Pt) film are sequentially laid on the semiconductor substrate 10 by, e.g., sputtering to form the conduction film 116. The conduction film 116 is to be the lower electrodes (capacitor electrodes) 116*a*, 116*b* of the thin-film capacitors 122*a*, 122*b*. The film thickness of the titanium oxide film is, e.g., 20 nm. The film thickness of the Pt film is, e.g., 150 nm.

Next, the crystalline capacitor dielectric film 118 is formed on the conduction film 116 by, e.g., sputtering. The capacitor dielectric film 118 is, e.g., a BST film 118. More specifically, a polycrystalline BST film is formed as the capacitor dielectric film 118. The film thickness of the capacitor dielectric film 118 is, e.g., 100 nm.

Conditions for forming the capacitor dielectric film 118 are the same as those for forming the capacitor dielectric film 14 described above with reference to FIG. 4B. Thus, the dielectric film having good electric characteristics of an about 400 relative dielectric constant and a dielectric loss of 1% or below is obtained.

The capacitor dielectric film 118 is formed of BST film here. However, the material of the capacitor dielectric film 118 is not essentially BST film. The capacitor dielectric film 118 of a high relative dielectric constant material is suitably formed.

The polycrystalline capacitor dielectric film 118 is formed here. However, the capacitor dielectric film 118 may be epitaxially grown.

The relative dielectric constant of the capacitor dielectric film 118 is not limited to about 400. However, to realize required electrical characteristics, it is preferable that the relative dielectric constant of the capacitor dielectric film 118 is sufficiently large. In the present embodiment, the capacitor dielectric film 118 is formed on the highly heat-resistant semiconductor substrate 114, which allows the capacitor dielectric film 118 to be formed by high-temperature process of, e.g., 500° C. or above. The capacitor dielectric film 118 formed by such high-temperature process can have a relative dielectric constant of 200 or above.

The capacitor dielectric film 118 is formed by sputtering here. However, the capacitor dielectric film 118 may be formed by sol-gel process. When the capacitor dielectric film 118 is formed by sol-gel process, the capacitor dielectric film 118 is formed as exemplified below.

That is, first, a starting solution consisting alkoxide is applied to the conduction film 116 by spin coating. The starting solution is for forming, e.g., BST film. Conditions for forming the film are, e.g., 2000 rpm and 30 seconds. Thus the capacitor dielectric film 118 of, e.g., an about 150 nm-thickness is formed.

Next, the capacitor dielectric film 118 is pre-baked. Conditions for the pre-bake are, e.g., 400° C. and 10 minutes.

Next, the capacitor dielectric film 118 is subjected to main-bake. Conditions for the main bake are, e.g., 700° C. and 10 minutes. The film thickness of the dielectric film 118 after the main bake is, e.g., about 100 nm.

The capacitor dielectric film of BST formed under these conditions have good electric characteristics of an about 300 relative dielectric constant and a dielectric loss of 2% or below.

Next, the conduction film 120 of, e.g., Pt is formed on the capacitor dielectric film 118 by, e.g., sputtering. The conduction film 120 is to be the upper electrodes (capacitor electrodes) of the capacitors 18*a*, 18*b*. The film thickness of the conduction film 120 is, e.g., 200 nm.

Next, the conduction film 120 is patterned into a prescribed configuration by photolithography. Thus, the upper electrodes (capacitor electrodes) 120 of the conduction film are formed (see FIG. 39C).

Figure 39D:
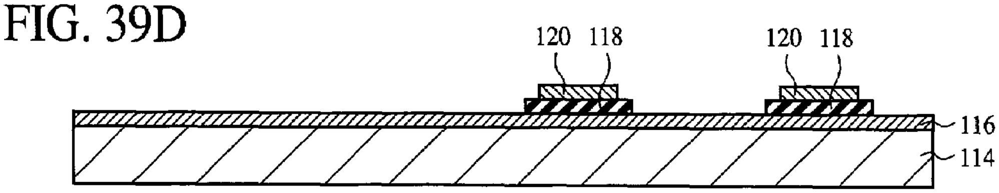
Figure 39E:
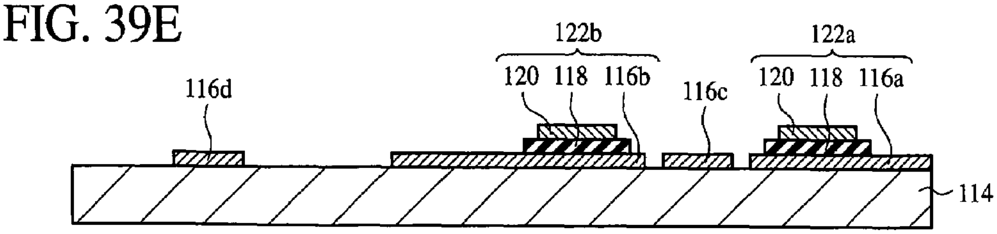

Then, the capacitor dielectric film 118 is patterned into a prescribed configuration by photolithography (see FIG. 39D).

Next, the conduction film 116 is patterned into a prescribed configuration by photolithography. Thus, the capacitor electrodes 116*a*, 116*b* and the conduction films 116*c*, 116*d* are formed of the conduction film 116 (see FIG. 39E). In patterning the conduction film 116, the conduction film 116 is so patterned that the capacitor electrode 116*a* and the capacitor electrode 116*b* are electrically connected to each other. In patterning the conduction film 116, the conduction film 116 is also so patterned that the conduction films 116*c*, 116*d* are electrically disconnected from the capacitor electrodes 116*a*, 116*b*. Thus, the thin-film capacitor 122*a* including the capacitor electrodes 116*a*, the capacitor dielectric film 118 and the capacitor electrode 120 is formed. The thin-film capacitor 122*b* including the capacitor electrode 116*b*, the capacitor dielectric film 118 and the capacitor electrode 120 is formed.

Figure 40A:
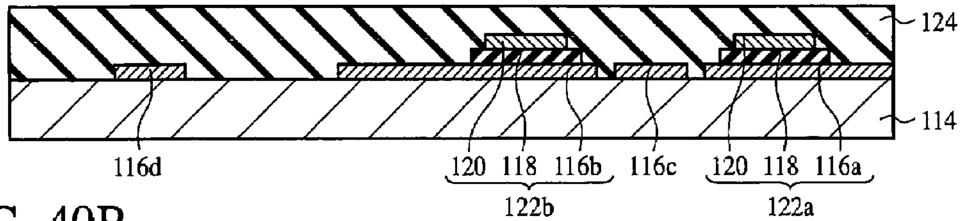
FIGS. 40A to 40E are sectional views of the interposer and the electronic device according to the second embodiment of the present invention in the steps of the method for fabricating the interposer and the electronic device, which illustrate the method (Part 2).

Then, the resin layer 124 is formed on the semiconductor substrate 114 with the thin-film capacitors 122*a*, 122*b* and the conduction films 12*a*, 12*b* formed on (see FIG. 40A). The resin layer 124 is formed of, e.g., photosensitive epoxy resin.

The resin layer 124 can be formed as exemplified below. A photosensitive epoxy resin solution is applied to the semiconductor substrate 114 by spin coating. Conditions for applying the epoxy resin solution are, e.g., 2000 rpm and 30 seconds. Thus, the, the resin layer 124 of, e.g., a 7 μm-thickness is formed. Thermal processing (pre-bake) is made on the resin layer 124. The thermal processing temperature is, e.g., 60° C.

Figure 40B:
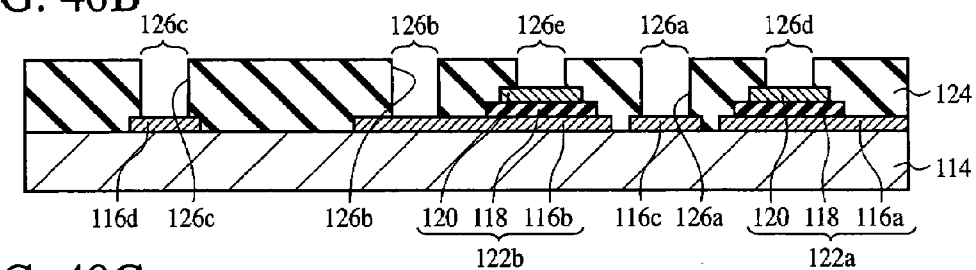

Then, the openings 126*a*-126*e* are formed in the resin layer 124 by photolithography (see FIG. 40B). In the opening 126*a*, the partial electrode 132*a* to be a part of the through electrode 79*a* is to be buried in, and the opening 126*a* is formed down to the conduction film 116*c*. In the opening 126*b*, the partial electrode 132*b* to be a part of the through electrode 79*b* is to be buried in, and the opening 126*b* is formed down to the capacitor electrode 126*b*. In the opening 126*c*, the partial electrode 132*c* to be a part of the through electrode 79*c* is to be buried in, and the openings 126*c* is formed down to the conduction film 116*d*. The opening 126*d* is for the conductor plug 132*d* to be buried in, and is formed down to the capacitor electrode 120 of the capacitor 122*a*. The opening 126*e* is for the conductor plug 132*e* to be buried in and is formed down to the capacitor electrode 120 of the capacitor 122*b*.

Then, thermal processing (main bake) is made on the resin layer 124. The thermal processing temperature is, e.g., 200° C. The film thickness of the resin layer 124 after the main bake) is, e.g., about 5 μm.

Next, Cr film and Cu film are sequentially laid on the entire surface by, e.g., sputtering to form a seed layer (not illustrated).

Next, a photoresist film 128 is formed on the entire surface by spin coating.

Figure 40C:
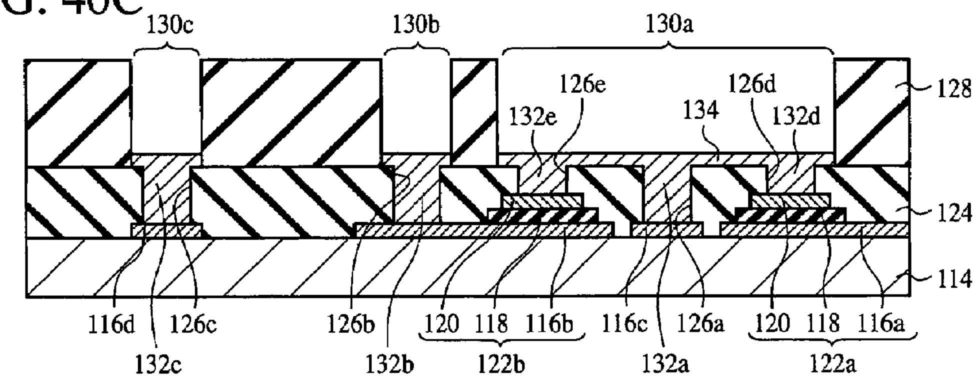

Next, the openings 130*a*-130*c* are formed in the photoresist film 128 by photolithography (see FIG. 40C). The openings 130*a* are for forming the partial electrode 132*a*, the conductor plug 132*d*, the conductor plug 132*e* and the interconnection 134. The opening 130*b* is for forming the partial electrode 132*b*. The opening 130*c* is for forming the partial electrode 132*c*.

Next, a plated film of, e.g., Cu is formed in the openings 126*a*-126*e* and the openings 130*a*-130*c* by electroplating. The thickness of the plated film is, e.g., about 6 μm. Thus, the partial electrode 132*a*, the conduction plugs 132*d*, 132*e* and the interconnection 134 are formed of the plated film in the openings 126*a*, 126*d*, 126*e* and in the opening 130*a*. In the openings 126*b* and the openings 130*b*, the partial electrode 132*b* of the plated film is formed. In the opening 126*c* and the opening 130*c*, the partial electrode 132*c* of the plated film is formed (see FIG. 40C).

Figure 40D:
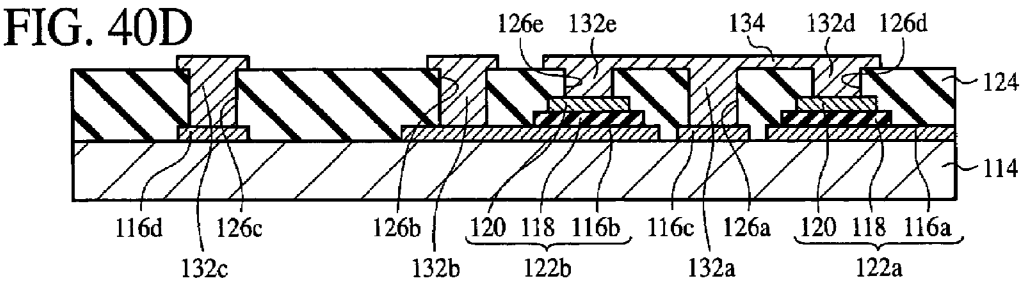

Then, the photoresist film 128 is removed (see FIG. 40D).

Next, the exposed seed layer (not illustrated) is removed by wet etching. The etchant is, e.g., a 1-10% ammonium persulfate aqueous solution. The etching period of time is, e.g., about 2 minutes. In etching off the seed layer, the surfaces of the partial electrode 132*a*, the conductor plug 132*d*, 132*e* and the interconnection 134 are a little etched, but because of the thickness of the seed layer which is sufficiently smaller in comparison with the sizes of the partial electrodes 132*a*, the conductor plugs 132*d*, 132*e* and the interconnection 134, the seed layer can be etched in a short period of time, and the partial electrodes 56*a*-56*c* are never excessively etched.

Figure 40E:
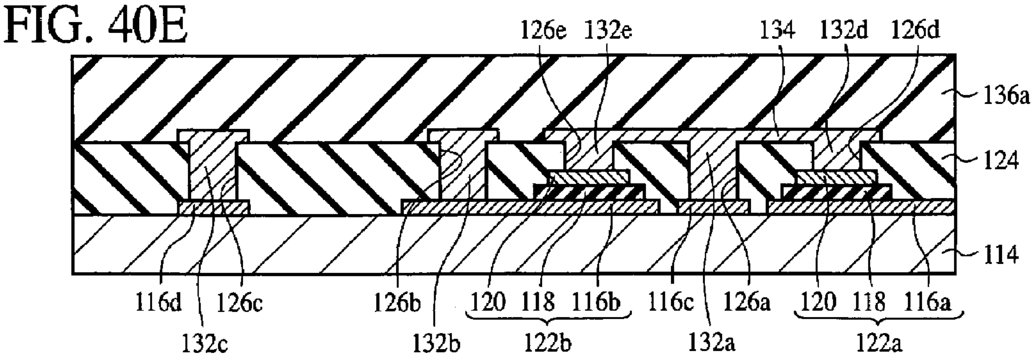

Next, the resin layer 136*a* is formed on the entire surface by, e.g., spin coating (see FIG. 40E). The film thickness of the resin layer 136*a* is, e.g., about 5 μm. The resin layer 136*a* is, e.g., photosensitive BCB resin. The BCB resin is a BCB resin solution by, e.g., Dow Chemical Company (trade name; CYCLOTENE 4024-40), or others. As described above, the BCB resin is a thermosetting resin having the characteristic that the BCB resin is liquid before being subjected to heat processing, semi-cured as the cure by the heat processing goes on to some extent and completely cured as the cure further goes on by the heat processing. For the BCB resin, as described above, heat processing conditions for semi-curing the BCB resin are 180° C. and about 1 hour, and heat processing conditions for completely curing the BCB resin are 250° C. and about 1 hour. Conditions for applying the resin layer 32*a* of the BCB resin are, e.g., 2000 rpm and 30 seconds.

Thus, the resin layer 136*a* is formed on the resin layer 124 with the partial electrodes 132*a*-132*c*, the conductor plugs 132*d*, 132*e* and the interconnection 134 formed on. Immediately after the resin layer 136*a* has been applied, at which the thermal processing has not been yet made, the resin layer 136*a* is liquid.

Figure 41A:
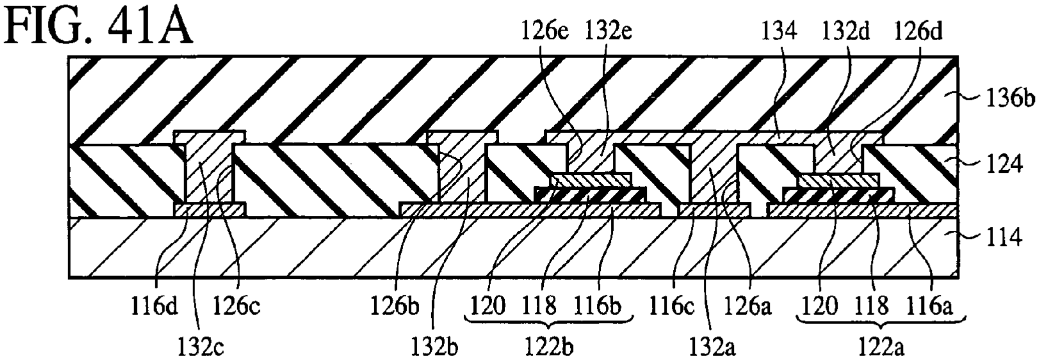
FIGS. 41A to 41D are sectional views of the interposer and the electronic device according to the second embodiment of the present invention in the steps of the method for fabricating the interposer and the electronic device, which illustrate the method (Part 3).

Next, the thermal processing is conducted under conditions which semi-cure the resin layer 136*a* to change the non-cured resin layer 136*a* into the semi-cured resin layer 136*b* (see FIG. 41A). The curing percentage of the resin layer 32*b* is preferably 40-80%. The curing percentage of the resin layer 32*b* is about 50-60% here. The heat processing temperature is, e.g., about 180° C., and the heat processing period of time is, e.g., about 1 hour. The atmosphere for the heat processing is, e.g., $N_2$ atmosphere.

The conditions for the thermal processing are not limited to the above and can be suitably set. The thermal processing temperature is preferably set at a temperature higher than the boiling point of the solvent of the BCB resin solution.

Figure 41B:
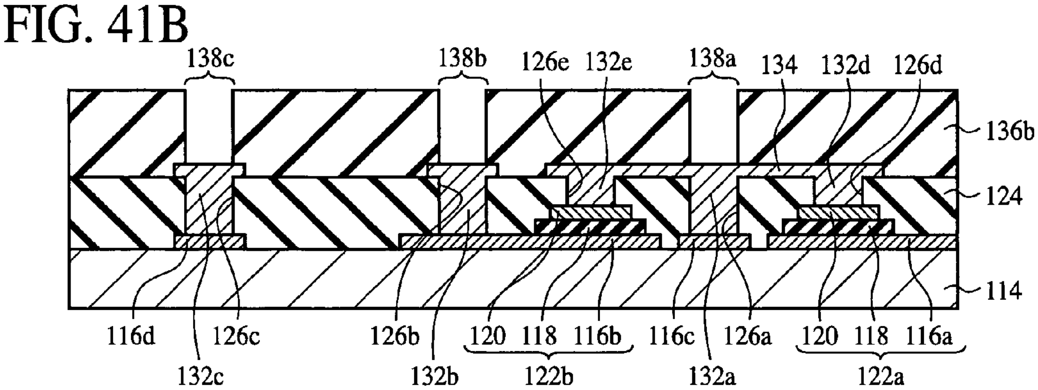

Then, the openings 138*a*-138*c* are formed in the resin layer 136*b* by photolithography (see FIG. 41B). In the opening 128*a*, the partial electrode 142*a* to be a part of the through electrode 79*a* is to be buried in, and the opening 138*a* is formed down to the partial electrode 132*a*. In the opening 138*b*, the partial electrode 142*b* to be a part of the through electrode 79*b* is to be buried in, and the opening 138*b* is formed down to the partial electrode 132*b*. In the opening 138*c*, the partial electrode 142*c* to be a part of the through electrode 79*c* is to be buried in, and the opening 138*c* is formed down to the partial electrode 132*c*.

Next, Cr film and Cu film are sequentially laid on the entire surface by, e.g., sputtering to form a seed layer (not illustrated).

Next, a photoresist film 140 is formed on the entire surface by spin coating.

Figure 41C:
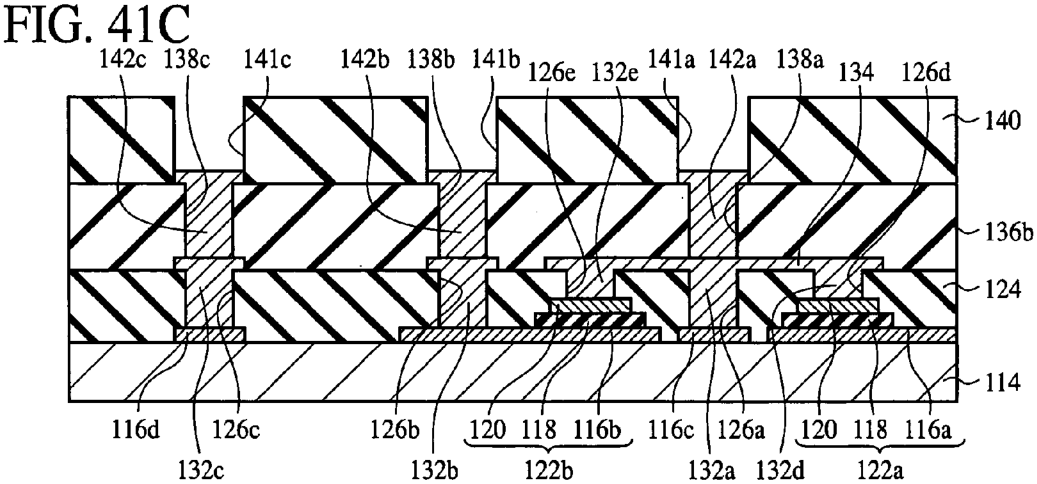

Then, the openings 141*a*-141*c* are formed in the photoresist film 140 by photolithography (see FIG. 41C). The openings 141*a* are for forming the partial electrodes 142*a*. The opening 141*b* is for forming the partial electrode 142*b*. The opening 141*c* is for forming the partial electrode 142*c*.

Next, a plated film of, e.g., Cu is formed in the openings 138*a*-138*c* and the openings 141*a*-141*c* by electroplating. The thickness of the plated film is, e.g., about 6 μm. Thus the partial electrodes 142*a*-142*c* of the plated film are formed in the openings 138*a*-138*c* and the openings 141*a*-141*c* (see FIG. 41C).

Figure 41D:
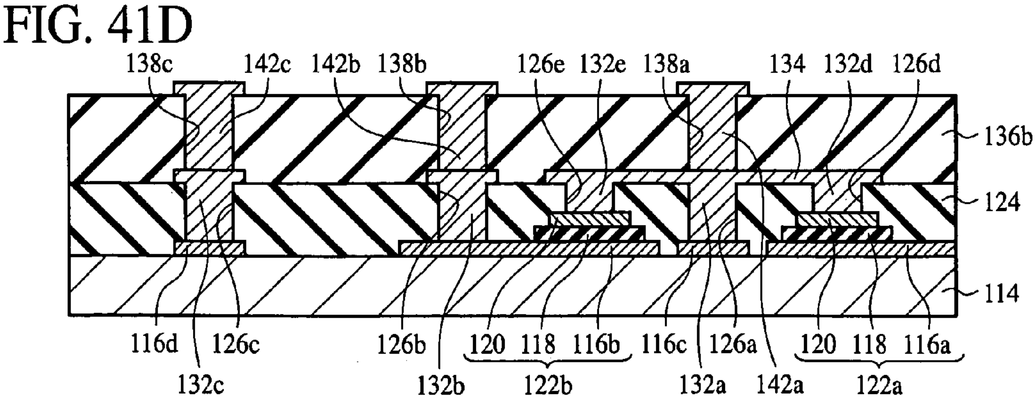

Next, the photoresist film 140 is removed (see FIG. 41D)

Next, the exposed seed layer (not illustrated) is removed by wet etching. The etchant is, e.g., a 1-10% ammonium perfulfate aqueous solution. The etching period of time is, e.g., about 2 minutes. In etching the seed layer, the surfaces of the partial electrodes 142*a*-142*c* are a little etched, but because of the thickness of the seed layer which is sufficiently smaller in comparison with the size of the partial electrodes 142*a*-142*c*, the seed layer can be etched in a short period time, and the partial electrodes 142*a*-142*c* are never excessively etched.

Next, the semiconductor substrate 114 is secured to the chuck table 42 of an ultra-precision lathe 40 (see FIG. 8A) by vacuum suction. When the semiconductor substrate 114 is secured to the chuck table 42, the underside of the semiconductor substrate 114, i.e., the surface where the partial electrodes 142*a*-142*c*, etc. are not formed is secured to the chuck table 42.

Figure 42A:
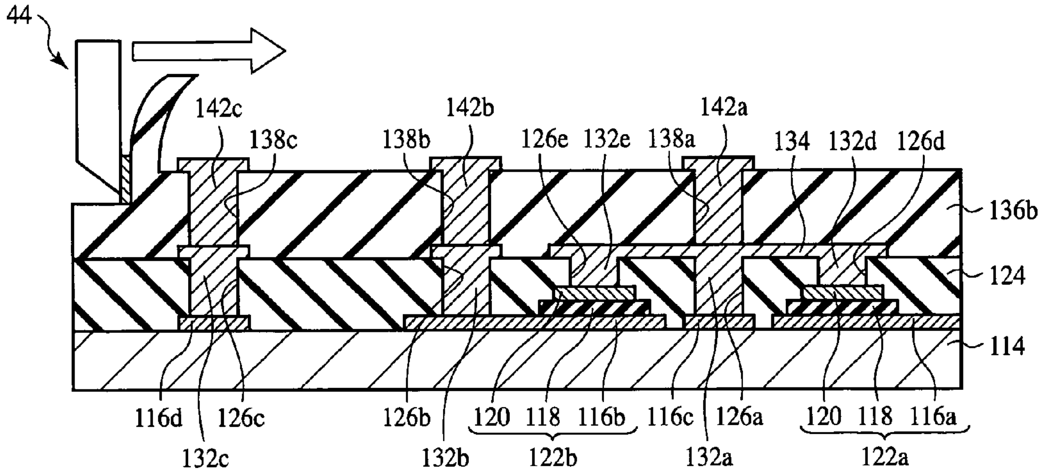
FIGS. 42A to 42C are sectional views of the interposer and the electronic device according to the second embodiment of the present invention in the steps of the method for fabricating the interposer and the electronic device, which illustrate the method (Part 4).

Next, while the semiconductor substrate 114 is being rotated, the upper parts of the partial electrodes 142*a*-142*c* and the upper part of the resin layer 136*b* are cut with the cutting tool 44 of diamond (see FIG. 42A). At this time, the rough cut is conducted until the thickness of the resin layer 136*b* becomes about 3 μm.

Conditions for the rough cut of the upper parts of the partial electrodes 142*a*-142*c* and the upper part of the resin layer 136*b* are as exemplified below. The rake angle of the cutting tool 44 is, e.g., 0 degree. The rotation number of the chuck table 42 is, e.g., about 2000 rpm. In this case, the cutting speed is, e.g., about 20 m/second. The cut amount of the cutting tool 44 is, e.g., about 2-3 μm. The feed of the cutting tool 44 is, e.g., 50 μm/rotation.

The resin layer 136*b*, which has been compression-deformed by the cutting tool 44 in the cut, restores to some extent after the cut. On the other hand, the partial electrodes 142*a*-142*c*, which are formed of metal, such as Cu or others, are not substantially deformed in the cut. Accordingly, the height of one surface of the resin layer 136*b* (opposite to the surface contacting the resin layer 124) after the cut is larger than the height of one surfaces of the partial electrodes 142*a*-142*c* (opposite to the surface contacting the partial electrodes 132*a*-132*c*) after the cut.

Figure 42B:
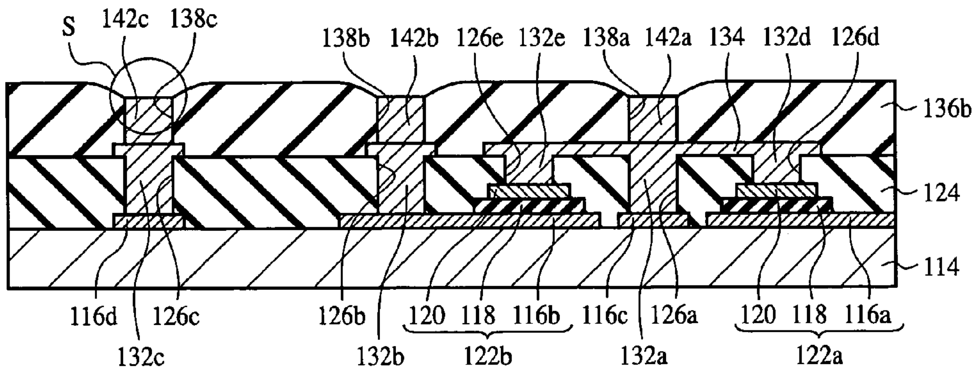
Figure 42C:
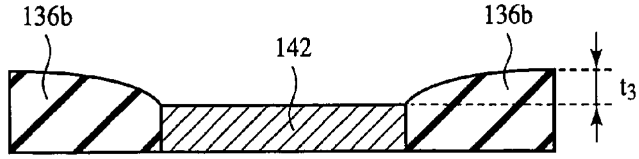

Immediately after the rough cut, as illustrated in FIGS. 42B and 42C, the difference $t_3$ between the height of one surface of the resin layer 136*b* (opposite to the surface contacting the resin layer 124) and the height of one surfaces of the partial electrodes 142*a*-142*c* (opposite to the surfaces contacting the partial electrodes 132*a*-132*c*) is about several hundred nanometer, which is relatively large. FIG. 42C is an enlarged sectional view of the part in the Circle S in FIG. 42B.

When the difference $t_3$ between the height of one surface of the resin layer 126 (opposite to the surface contacting the resin layer 124) and the height of one surfaces of the partial electrodes 142a-142c (opposite to the surfaces contacting the partial electrodes 132a-132c) is such relatively large, even if the resin layer 136b is cured and shrunk in thermal processing in a later step, the height of one surface of the resin layer 136b (opposite to the surface contacting the resin layer 124) remains larger than the height of one surfaces of the partial electrodes 142a-142c (opposite to the surfaces contacting the partial electrodes 132a-132c). It is often impossible to connect the partial electrodes 38a-38c and the partial electrodes 142a-142c respectively to each other.

Figure 43A:
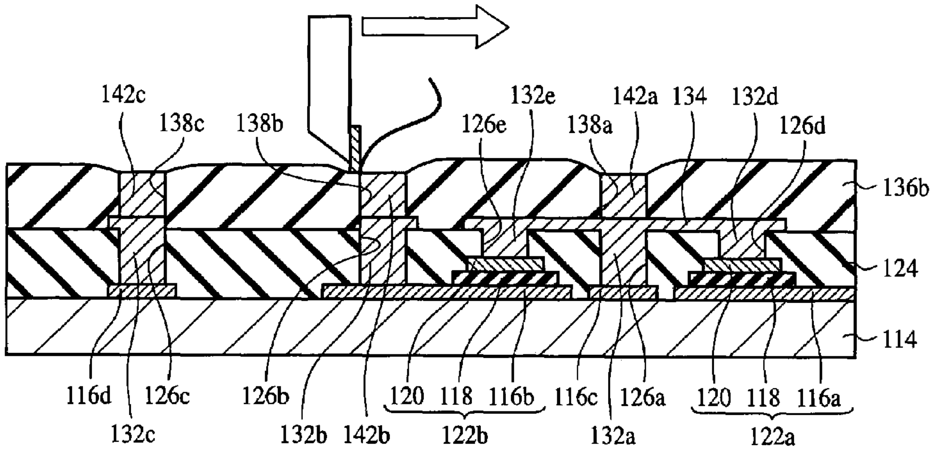
FIGS. 43A to 43C are sectional views of the interposer and the electronic device according to the second embodiment of the present invention in the steps of the method for fabricating the interposer and the electronic device, which illustrate the method (Part 5).

Accordingly, the rough cut is followed by finish cut so that the difference $t_3$ between the height of the one surface of the resin layer 136b (opposite to the surface contacting the resin layer 124) and the height of one surfaces of the partial electrodes 142a-142c (opposite to the surfaces contacting the partial electrodes 132a-132c) becomes a suitable value (see FIG. 43A).

Conditions for finish-cutting the upper parts of the partial electrodes 142a-142c and the upper part of the resin layer 136b are as exemplified below.

The rake angle of the cutting tool 44, the rotation number of the chuck table 42 and the feed of the cutting tool 44 in the finish cut are the same as those for the rough cut of the resin layer 136b. The finish cut follows the rough cut, and it is not necessary to intentionally change the setting.

The cut amount of the cutting tool 44 is, e.g., 500 nm. The cut amount of the bit 44 is set so small, so that the difference $t_3$ between the height of one surface of the resin layer 136b (opposite to the surface contacting the resin layer 132) and the height of one surfaces of the partial electrodes 142a-142c (opposite to the surfaces of the partial electrodes 132a-132c) can be suitably small.

The cut amount of the cutting tool 44 is not limited to 500 nm. For example, the cut amount of the cutting tool 44 may be set at about 10-100 nm.

Figure 43B:
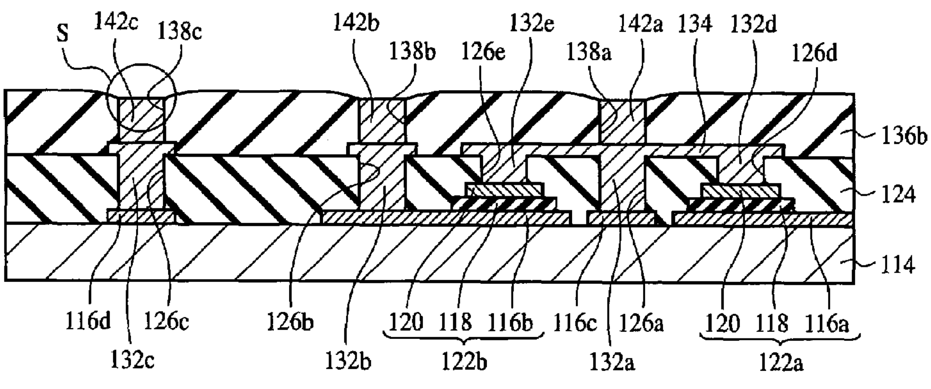
Figure 43C:
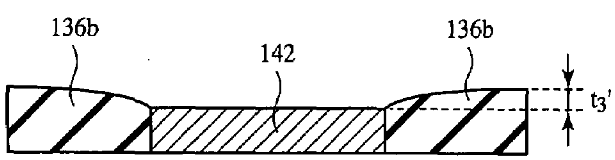

Even the finish cut cannot make the difference $t_3'$ between one surface of the resin layer 136b (opposite to the surface contacting the resin layer 124) and the height of one surfaces of the partial electrodes 142a-142c (opposite to the surfaces contacting the partial electrodes 132a-132c) zero as illustrated in FIGS. 43B and 43C. This is because the resin layer 136b is compression deformed to some extent also in the finish cut, and the compression deformed resin layer 136b restores in the finish cut. FIG. 43C is an enlarged sectional view of the part in the circle S in FIG. 43B.

It is preferable that the finish cut is so made that the difference $t_3'$ between the height of one surface of the resin layer 136b (opposite to the surface contacting the resin layer 124) and the height of one surfaces of the partial electrodes 142a-142c (opposite to the surfaces contacting the partial electrodes 132a-132c) become about 0-100 nm.

The difference $t_3'$ between the height of one surface of the resin layer 136b (opposite to the surface contacting the resin layer 124) and the height of one surfaces of the partial electrodes 142a-142c (opposite to the surfaces contacting the partial electrodes 132a-132c) is set at 0-100 nm for the following reason.

That is, when the difference $t_3'$ between the height of one surface of the resin layer 136b (opposite to the surface contacting the resin layer 124) and the height of one surfaces of the partial electrodes 142a-142c (opposite to the surfaces contacting the partial electrodes 132a-132c) is larger above 100 nm, as described above, even if the resin layer 136b is cured and shrunk by the thermal processing in the later step, the height of one surface of the resin layer 136b (opposite to the surface contacting the resin layer 124) remains larger than the height of one surfaces of the partial electrodes 142a-142c (opposite to the surfaces contacting the partial electrodes 132a-132c), and the partial electrodes 38a-38c and the partial electrodes 142a-142c cannot be often connected respectively to each other.

On the other hand, when the height of one surface of the resin layer 136b (opposite to the surface contacting the resin layer 124) is smaller than the height of one surfaces of the partial electrodes 38a-38c (opposite to the surfaces of the partial electrodes 30a-30c), the resin layer 32b and the resin layer 136b are shrunk without being surely adhered to each other by the thermal processing in the later step. It is difficult to adhere the resin layer 32b and the resin layer 136 to each other.

For this reason, it is preferable that the difference $t_3'$ between the height of one surface of the resin layer 136b (opposite to the surface contacting the resin layer 124) and the height of one surfaces of the partial electrodes 142a-142c (opposite to the surfaces contacting the partial electrodes 132a-132c) is 0-100 nm.

When fins are formed on the partial electrodes 142a-142c in the cut, there is a risk that adjacent or neighboring ones of the partial electrodes 142a-142c might be short-circuit with each other. Accordingly, it is preferable set the cutting conditions suitably to form fins on the partial electrodes 142a-142c in the cut.

Thus, the upper part of the partial electrodes 142a-142c and the upper part of the resin layer 136b are cut (see FIGS. 43B and 43C).

The cut can be made with the semiconductor substrate 114 secured and with the wheel (not illustrated) with the cutting tool 44 mounted on being rotated (not illustrated).

Next, the semiconductor substrate 10 is cut in a prescribed size with a thin blade formed of diamonds particles combined with a binder (not illustrated).

Similarly, the semiconductor substrate 114 is cut in a prescribe size with the thin blade (not illustrated).

Figure 44A:
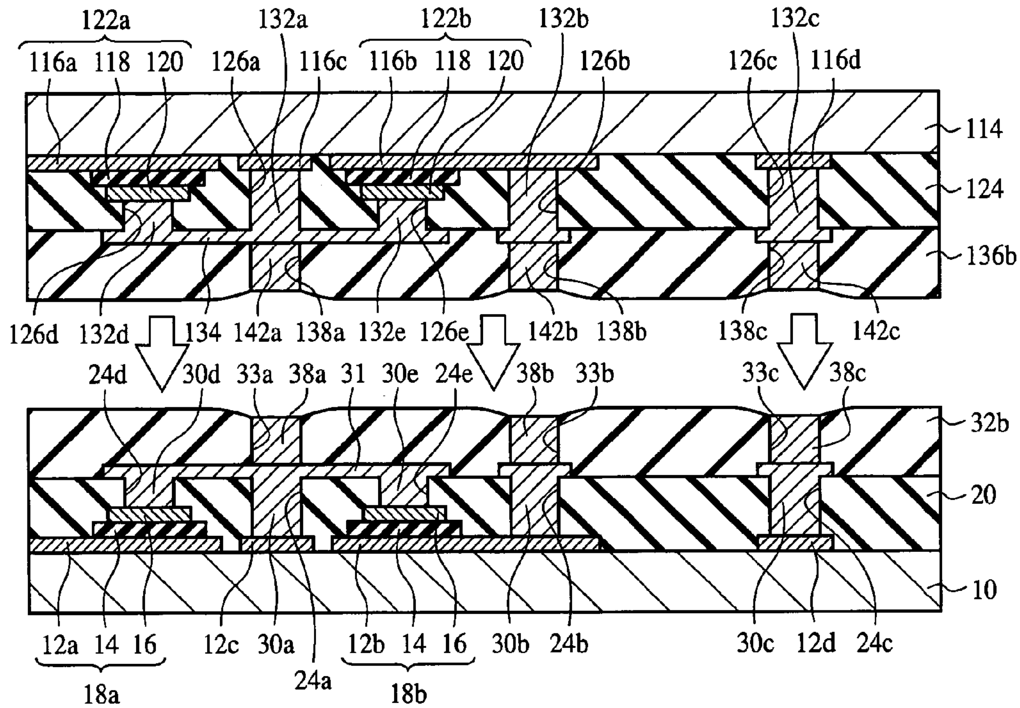
FIGS. 44A to 44C are sectional views of the interposer and the electronic device according to the second embodiment of the present invention in the steps of the method for fabricating the interposer and the electronic device, which illustrate the method (Part 6).

Then, as illustrated in FIG. 44A, the semiconductor substrate 10 and the semiconductor substrate 114 are opposed to each other. At this time, the semiconductor substrate 10 and the semiconductor substrate 114 are opposed with the partial electrodes 38a-38c of the semiconductor substrate 10 and the partial electrodes 142a-142c of the semiconductor substrate 114 opposed respectively to each other.

Figure 44B:
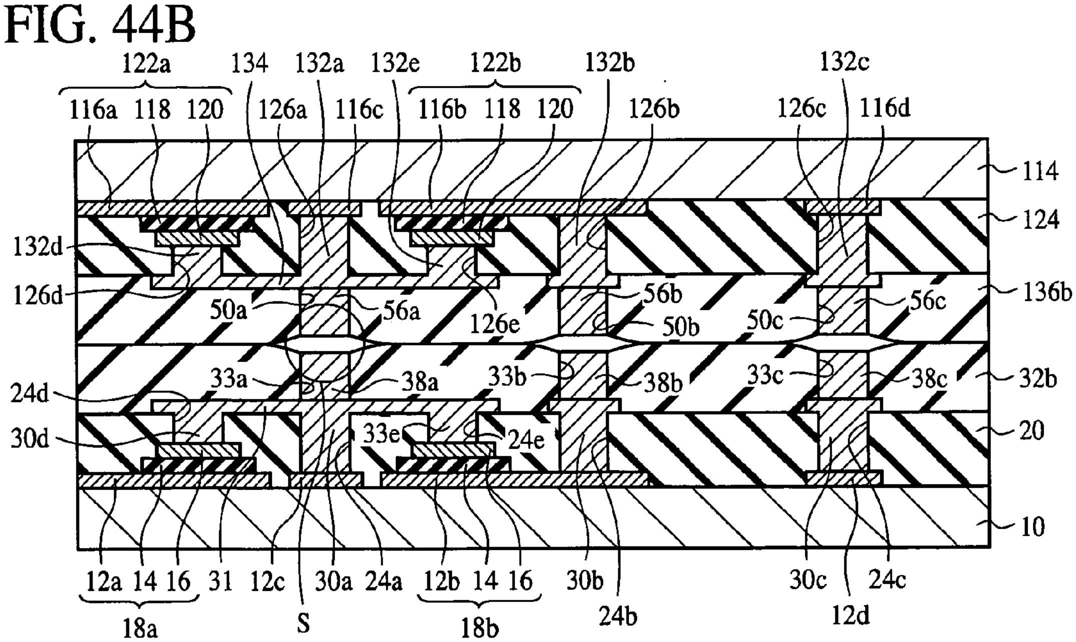
Figure 44C:
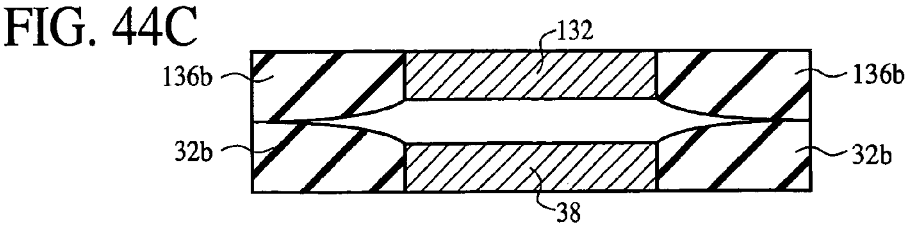

Then, the semiconductor substrate 10 and the semiconductor substrate 114 are brought adjacent to each other. FIG. 44B is a sectional view of the resin layer 32b formed on the semiconductor substrate 10 and the resin layer 136b formed on the semiconductor substrate 114 contacted each other. FIG. 44C is an enlarged sectional view of the part in the circle S in FIG. 44B.

Figure 45A:
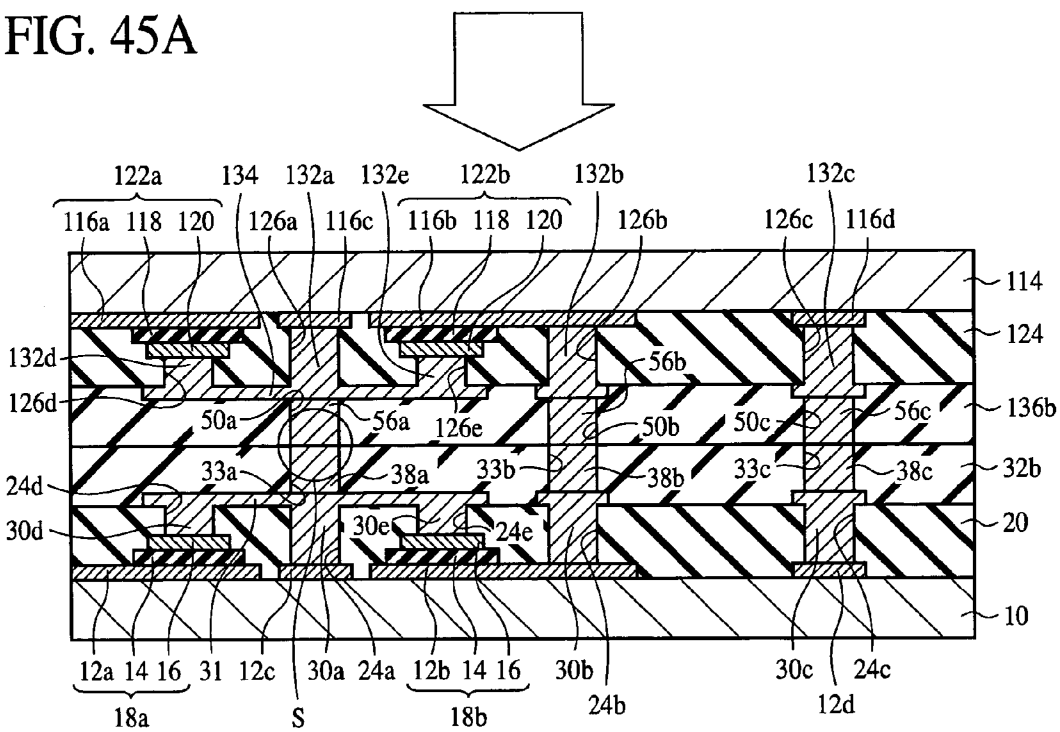
FIGS. 45A and 45B are sectional views of the interposer and the electronic device according to the second embodiment of the present invention in the steps of the method for fabricating the interposer and the electronic device, which illustrate the method (Part 7).
Figure 45B:
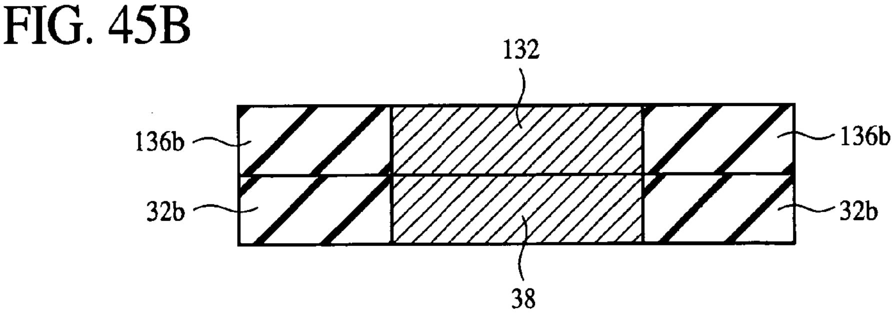

Next, a pressure is applied from the outside to the semiconductor substrate 10 and to the semiconductor substrate 114 to bring the partial electrodes 38a-38c of the semiconductor substrate 10 and the partial electrodes 142a-142c of the semiconductor substrate 114 into close contact respectively with each other. Thermal processing is conducted with the resin layer 32b on the semiconductor substrate 10 and the resin layer 136b on the semiconductor substrate 114 in close contact with each other (see FIGS. 45A and 45B). FIG. 45B is an enlarged sectional view of the part in the circle S in FIG. 45A.

An oven (thermal processing system), for example, is used for the thermal processing. The thermal processing temperature is, e.g., 250° C. The thermal processing period of time is, e.g., about 1 hour. The pressure is, e.g., about 10 kPa. The thermal processing under these conditions adhere the resin layer 32*b* and the resin layer 136*b* to each other without failure. The resin layer 32*b* and the resin layer 136*b* are respectively shrunk. The resin layer 32*b* and the resin layer 136*b* are adhered to each other while the resin layer 32*b* and the resin layer 136*b* are respectively shrunk, whereby due to the shrinkage of the resin layer 32*b* and of the resin layer 136*b*, the partial electrodes 38*a*-38*c* and the partial electrodes 142*a*-142*c* are jointed respectively to each other. The partial electrodes 38*a*-38*c* and the partial electrodes 142*a*-142*c* are jointed respectively to each other due to the shrinkage of the resin layer 32 and of the resin layer 136, which makes it unnecessary to apply a high pressure from the outside to the semiconductor substrate 10 and the semiconductor substrate 114.

Figure 46A:
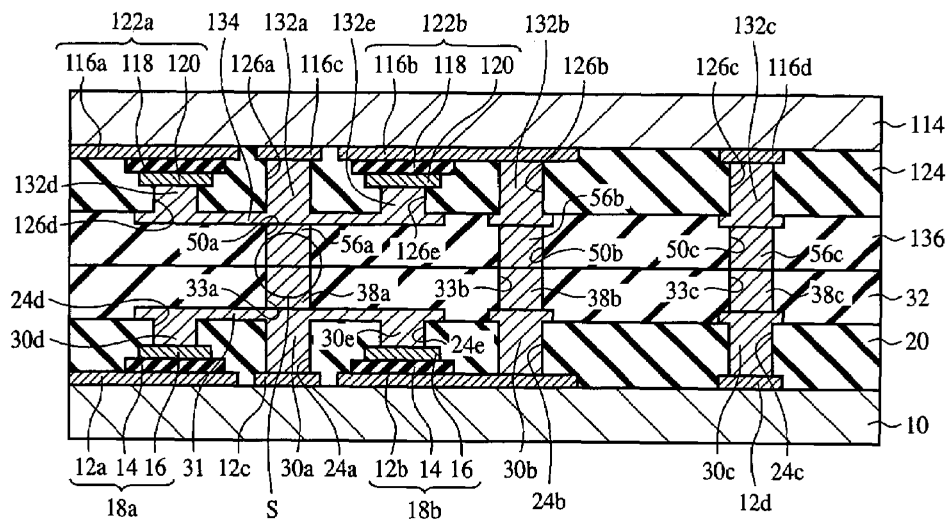
FIGS. 46A and 46B are sectional views of the interposer and the electronic device according to the second embodiment of the present invention in the steps of the method for fabricating the interposer and the electronic device, which illustrate the method (Part 8).
Figure 46B:
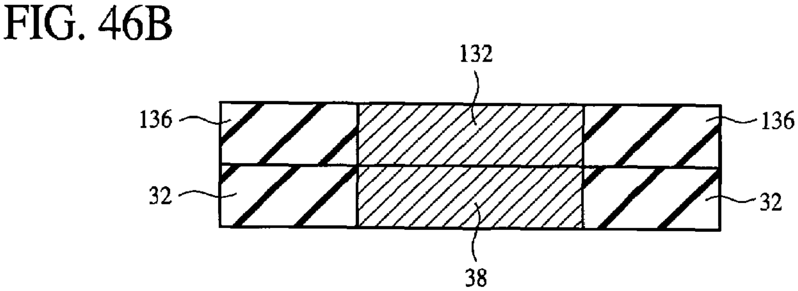

Then, the semi-cured resin layers 32*b*, 136*b* becomes the completely cured resin layers 32, 136 (see FIGS. 46A and 46B). FIG. 46B is an enlarged sectional view of the part in the circle S in FIG. 46A. Because of the completely cured resin layers 32, 136, which have been completely cured, the partial electrodes 38*a*-38*c* and the partial electrodes 142*a*-142*c* never part from each other even after the application of the pressure is stopped.

The thermal processing temperature is 250° C., and the thermal processing period of time is 1 hour here. The thermal processing temperature and the thermal processing period of time are not limited to the above. When the thermal processing temperature is set higher, the thermal processing period time may be shorter. For example, when the thermal processing temperature is set about 300° C., the thermal processing period of time may be about 3 minutes. When the thermal processing temperature is set lower, the thermal processing period of time is set longer. For example, when the thermal processing period is set at about 200° C., the thermal processing period of time may be set at about 7-8 hours.

However, with the thermal processing temperature set higher, the film quality of the resin layers 32, 136 is often poor. With the thermal processing temperature set lower, the thermal processing takes more time. In view of the film quality of the resin layers 32, 136, the throughput, etc., it is preferable to set the thermal processing temperature at about 250° C., and the thermal processing period of time is set at about 1 hour.

The pressure to be applied to the semiconductor substrate 10 and the semiconductor substrate 114 is set at about 10 kPa here. The pressure to be applied to the semiconductor substrate 10 and the semiconductor substrate 114 is not limited to about 10 kPa. The pressure may be set in a range of, e.g., about 1 kPa-100 kPa.

Then, a supporting substrate 144 is prepared. The supporting substrate 144 is, e.g., a glass supporting substrate. The supporting substrate 144 is for supporting the semiconductor substrate 144, etc. in removing the semiconductor substrate 10 by polish, etc. in a later step.

Next, a heat foaming type double-sided tape 152 is adhered to the supporting substrate 144. As does the heat foaming type double-sided tape 66 described above, the heat foaming double-sided tape 152 includes a base 148 of, e.g., polyester film, a heat-releasable adhesive layer 150 formed on one primary surface of the base 148, and a pressure-sensitive adhesive layer 146 formed on the other primary surface of the base 148. As is the heat foaming type double-sided tape 66 described above, the heat foaming type double-sided tape 152 can be a heat foaming type double-sided tape by, e.g., NITTO DENKO CORPORATION (trade name: RIVAALPHA) or others. When the heat foaming type double-sided tape 152 is adhered to the supporting substrate 144, the pressure-sensitive adhesive layer 146 of the heat foaming type double-sided tape 152 is adhered to the supporting substrate 144.

Figure 47A:
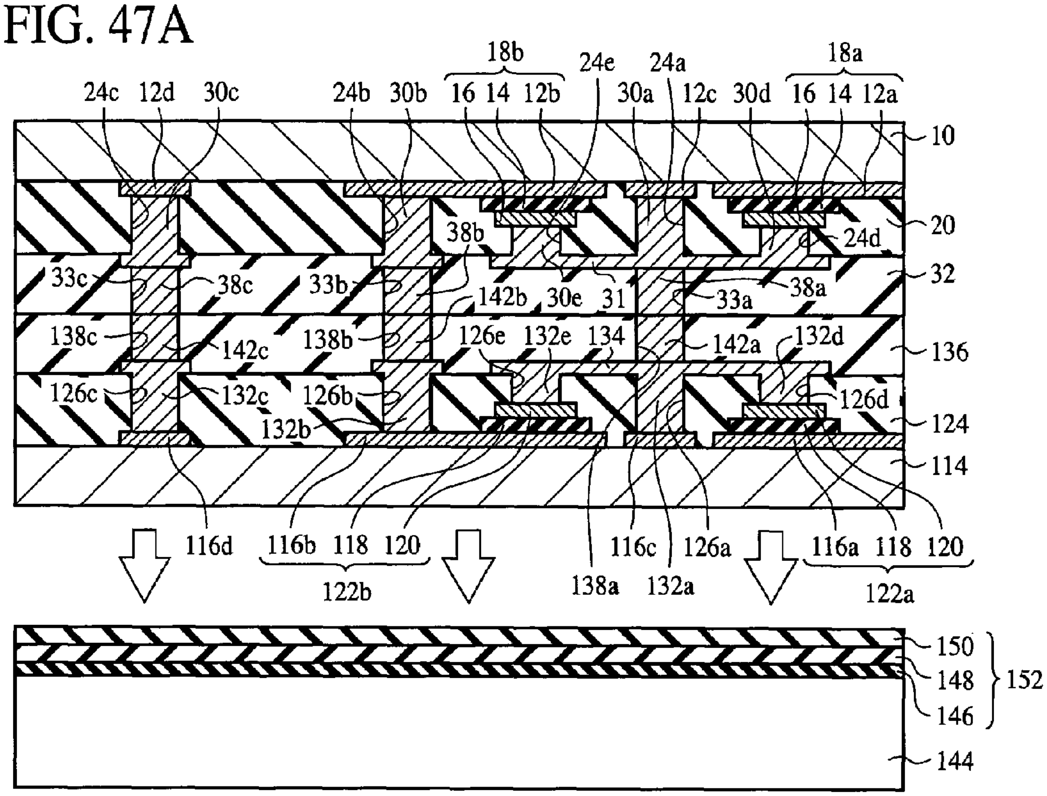
FIGS. 47A and 47B are sectional views of the interposer and the electronic device according to the second embodiment of the present invention in the steps of the method for fabricating the interposer and the electronic device, which illustrate the method (Part 9).

Then, the semiconductor substrates 10, 114 adhered to each other as illustrated in FIG. 46A is reversed to oppose the semiconductor substrate 114 and the supporting substrate 144 to each other as illustrated in FIG. 47A. At this time, the semiconductor substrate 114 and the supporting substrate 58 are opposed to each other with the one surface of the semiconductor substrate 114 (opposite to the surface contacting the resin layer 124) and one surface of the heat-releasable adhesive layer 150 of the heat foaming type double-sided tape 152 (opposite to the surface contacting the base 148) positioned adjacent to each other.

Figure 47B:
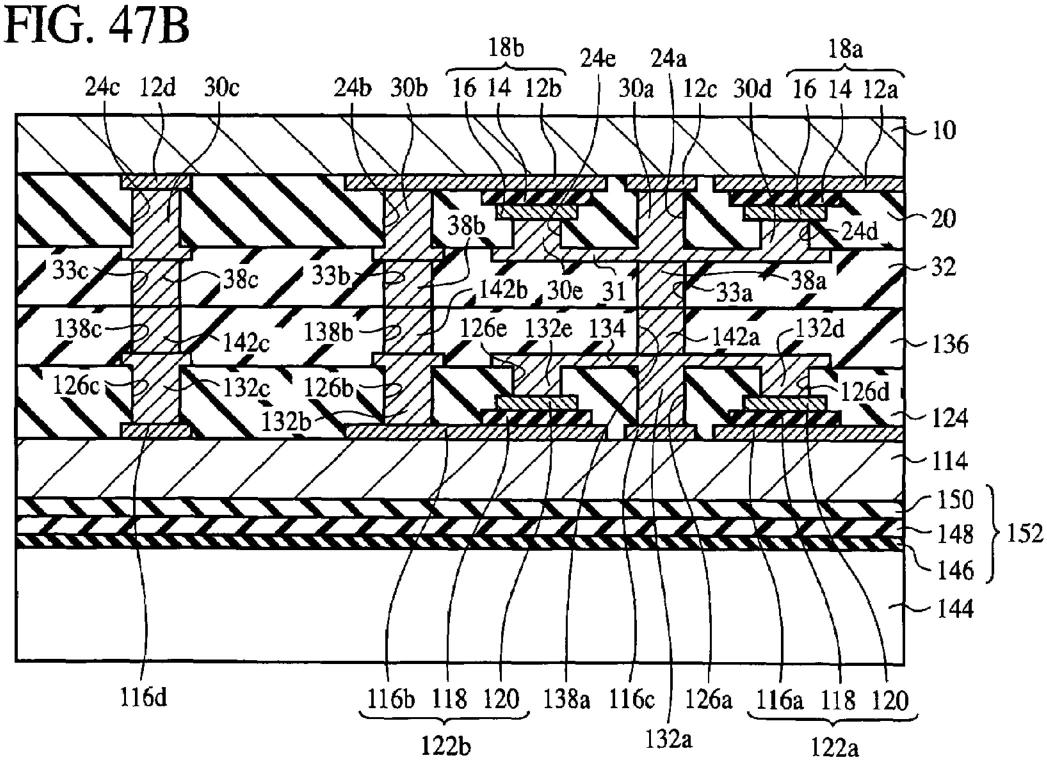

Then, as illustrated in FIG. 47B, one surface of the semiconductor substrate 114 (opposite to the surface contacting the resin layer 124) and one surface of the heat-releasable adhesive layer 150 of the heat foaming type double-sided tape 152 (opposite to the surface contacting the base 148) are adhered to each other.

Next, the semiconductor substrate 10 is polished by, e.g., CMP until the thickness of the semiconductor substrate 10 becomes, e.g., about 100 μm. At this time, all the semiconductor substrate 10 is not removed, so that, as described above, the capacitor electrodes 12*a*, 12*b*, the conduction films 12*c*, 12*d* and the resin layer 20 are kept from the damage by the polish.

Next, the semiconductor substrate 10 remaining on one surface of the resin layer 20 (opposite to the surface contacting the resin layer 32) is etched off by, e.g., hydrofluoric acid.

Figure 48A:
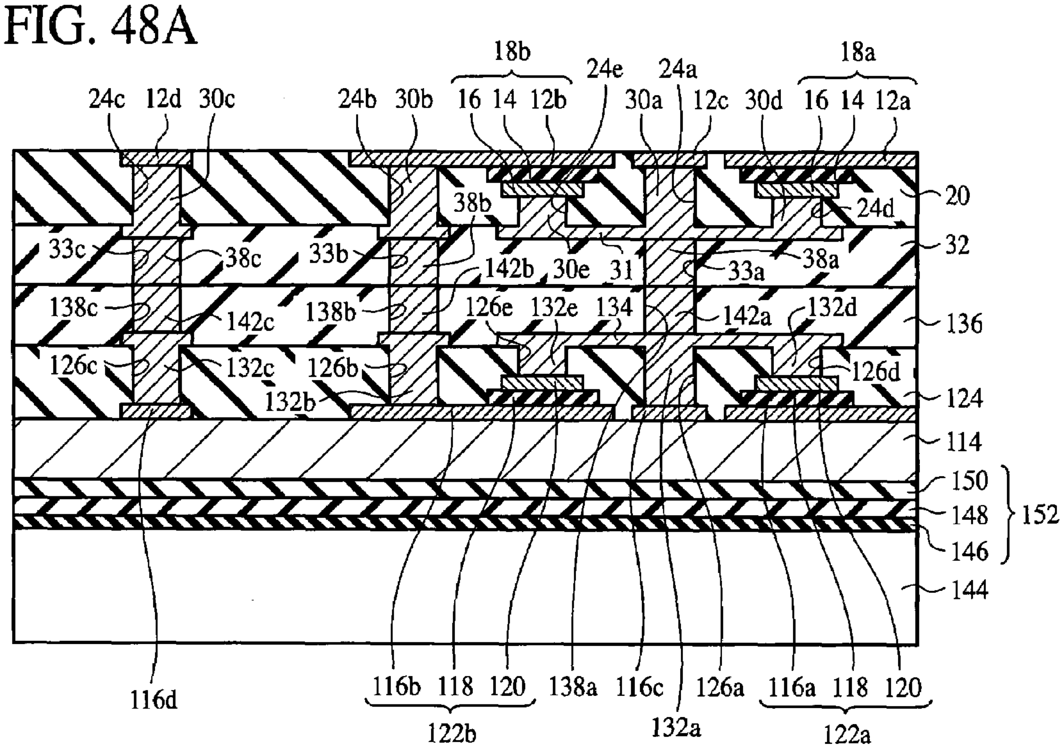
FIGS. 48A and 48B are sectional views of the interposer and the electronic device according to the second embodiment of the present invention in the steps of the method for fabricating the interposer and the electronic device, which illustrate the method (Part 10).

Thus, the semiconductor substrate 10 is removed while the capacitor electrodes 12*a*, 12*b* and the conduction films 12*c*, 12*d* are kept form being excessively damaged (see FIG. 48A).

Figure 48B:
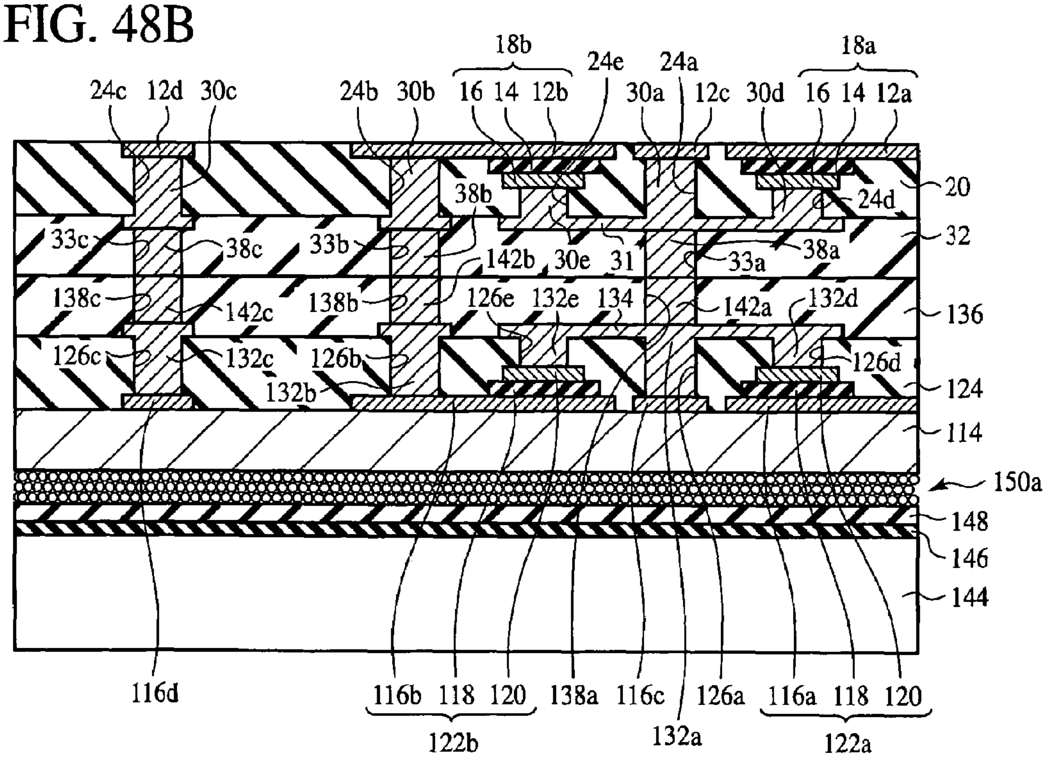

Then, the heat-releasable adhesive layer 150 of the heat foaming type double-sided tape 152 is expanded by thermal processing (see FIG. 48B). The thermal processing temperature is, e.g., 200° C. When the heat-releasable adhesive layer 150 is expanded, the adhesion area between the expanded heat-releasable adhesive layer 150*a* and the resin layer 114 is decreased, and the adhesion between the heat-releasable adhesive layer 64*a* and the semiconductor substrate 114 is lowered. Accordingly, the heat-releasable adhesive layer 64*a* and the semiconductor substrate 114 can be easily released from each other.

Figure 49A:
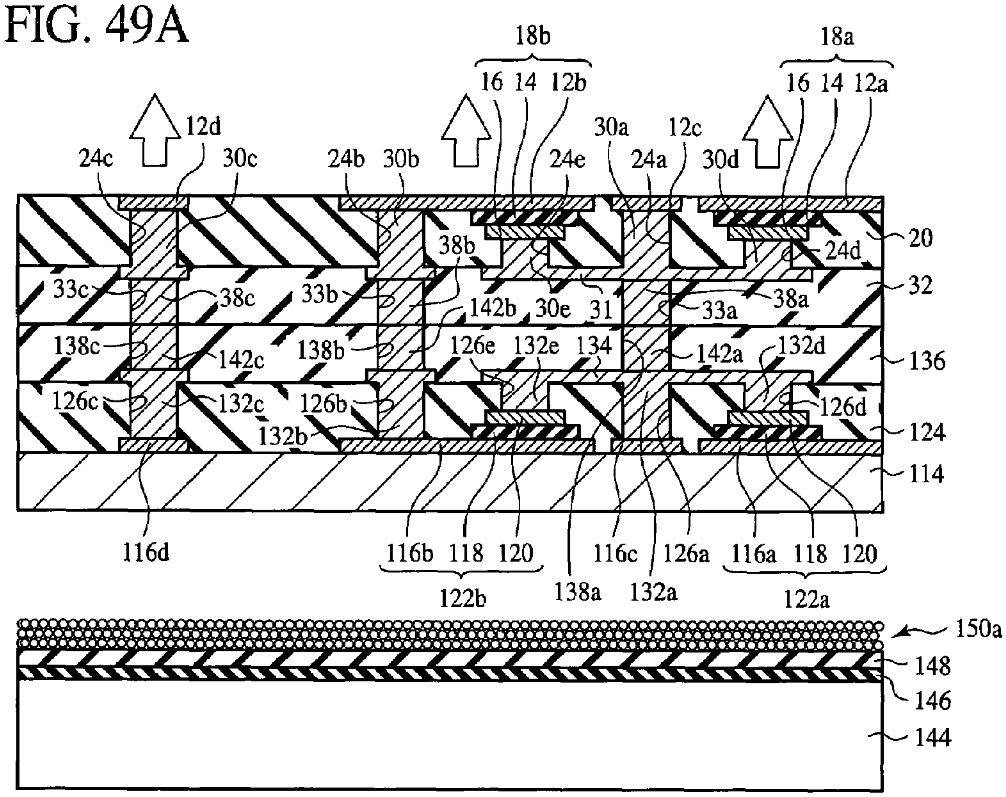
FIGS. 49A and 49B are sectional views of the interposer and the electronic device according to the second embodiment of the present invention in the steps of the method for fabricating the interposer and the electronic device, which illustrate the method (Part 11).

Then, the semiconductor substrate 114 supported by the supporting substrate 144 is dismounted (see FIG. 49A). The heat foaming type double-sided tape 152 having the pressure-sensitive adhesive layer 146 adhered to the supporting substrate 144 can be removed from the semiconductor substrate 46 together with the supporting substrate 144.

When the semiconductor substrate 10 is removed by polish or others, the semiconductor substrate 114 is supported by the supporting substrate 144 here. However, the semiconductor substrate 114 may not be supported by the supporting substrate 144. When the semiconductor substrate 10 is removed by polish or others, the base 8*a* of the resin layers 20, 32, 136, 124 is supported by the semiconductor substrate 114. When the semiconductor substrate 114 is some thick, the semiconductor substrate 114 is never deformed in removing the semiconductor substrate 10 by polish or others. Accordingly, even without the supporting substrate 144, the deformation of the base 8*a* can be prevented by the semiconductor substrate 114. Accordingly, when the semiconductor substrate 10 is removed by polish or others, the semiconductor substrate 114 may not be supported by the supporting substrate 144. In view of preventing the application of unnecessary stresses to the thin-film capacitors 18*a*, 18*b*, 122*a*, 122*b*, etc. to thereby improve the production yield, it is preferable to support the semiconductor substrate 114 by the supporting substrate 144.

Figure 49B:
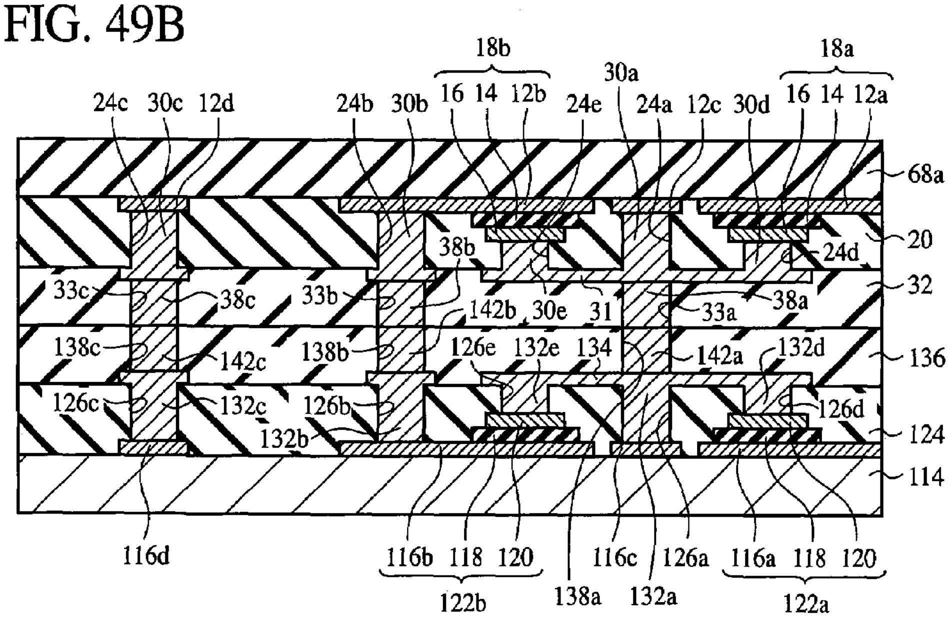

Then, the resin layer 68 is formed on one surface of the resin layer 20 (opposite to the surface contacting the resin layer 32) (see FIG. 49B). The resin layer 68 is formed of, e.g., a photosensitive epoxy resin. The resin layer 68 can be formed as exemplified below. First, a photosensitive epoxy resin solution is applied to one surface of the resin layer 68 (opposite to the surface contacting the resin layer 32). Conditions for applying the epoxy resin solution are, e.g., 2000 rpm and 30 seconds. Thus, the resin layer 68 is formed in, e.g., a 7 μm-thickness. Then, thermal processing (pre-bake) is made on the resin layer 68. The thermal processing temperature is, e.g., 60° C.

Figure 50A:
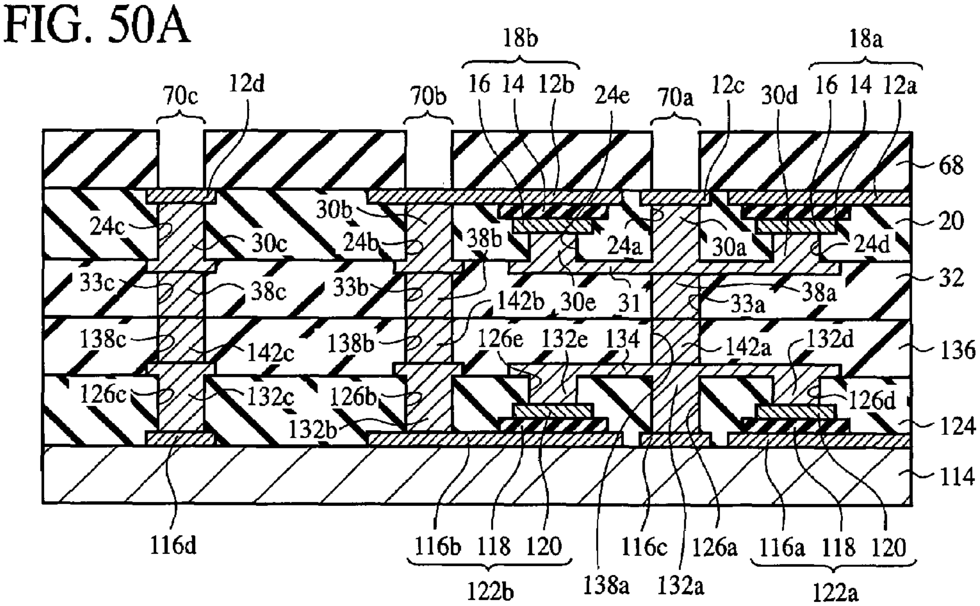
FIGS. 50A and 50B are sectional views of the interposer and the electronic device according to the second embodiment of the present invention in the steps of the method for fabricating the interposer and the electronic device, which illustrate the method (Part 12).

Next, the openings 70*a*-70*c* are formed in the resin layer 68 by photolithography (see FIG. 50A).

Next, thermal processing (main bake) is made on the resin layer 68. The thermal processing temperature is, e.g., 200° C. The film thickness of the resin layer 68 after the thermal processing has been made is, e.g., about 5 μm.

Next, a seed layer (not illustrated) of Cr film and Cu film sequentially laid is formed on the entire surface by, e.g., sputtering.

Next, a photoresist film 72 is formed on the entire surface by spin coating.

Figure 50B:
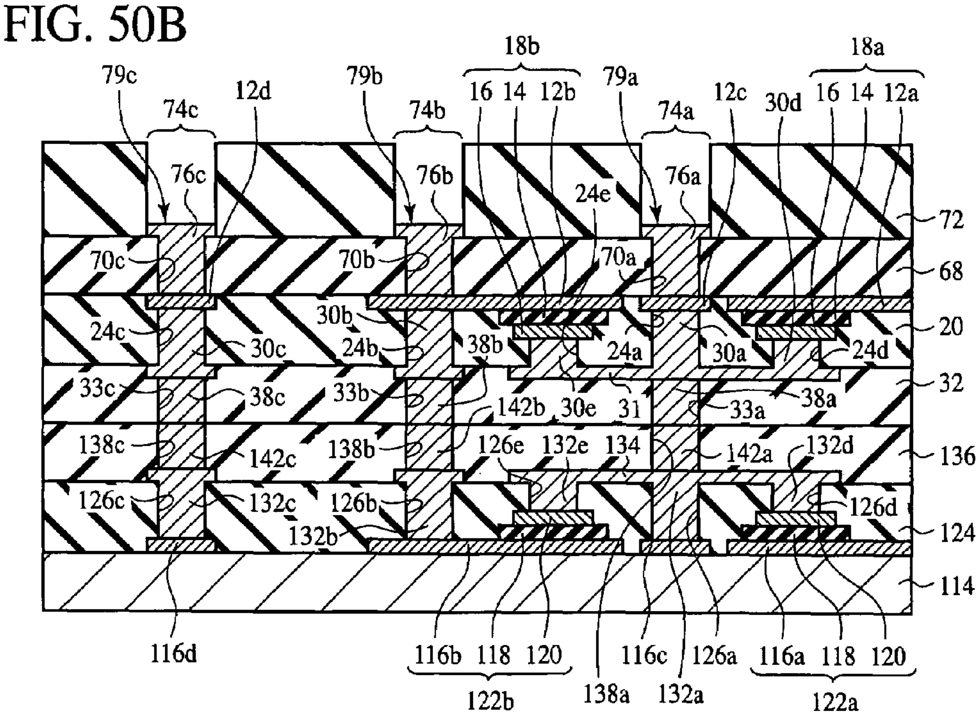

Next, the openings 74*a*-74*c* are formed in the photoresist film 72 by photolithography (see FIG. 50B).

Next, a plated film of, e.g., Cu is formed in the openings 74*a*-74*c* and the openings 70*a*-70*c* by electroplating. The thickness of the plated film is, about 6 μm. Thus, the partial electrodes 76*a*-76*c* of the plated film are formed in the openings 74*a*-74*c* and the openings 70*a*-70*c*.

Next, the photoresist film 72 is removed (see FIG. 50A).

Next, the exposed seed layer (not illustrated) is removed by wet etching. The etchant is, e.g., an about 1-10% ammonium persulfate aqueous solution. The etching period of time is, e.g., about 2 minutes. In etching off the seed layer, the surfaces of the partial electrodes 76*a*-76*c* are a little etched, but because of the thickness of the seed layer which is sufficiently smaller than the size of the partial electrodes 76*a*-76*c*, the seed layer can be etched in a short period of time, and the partial electrodes 76*a*-76*c* are never excessively etched.

Figure 51A:
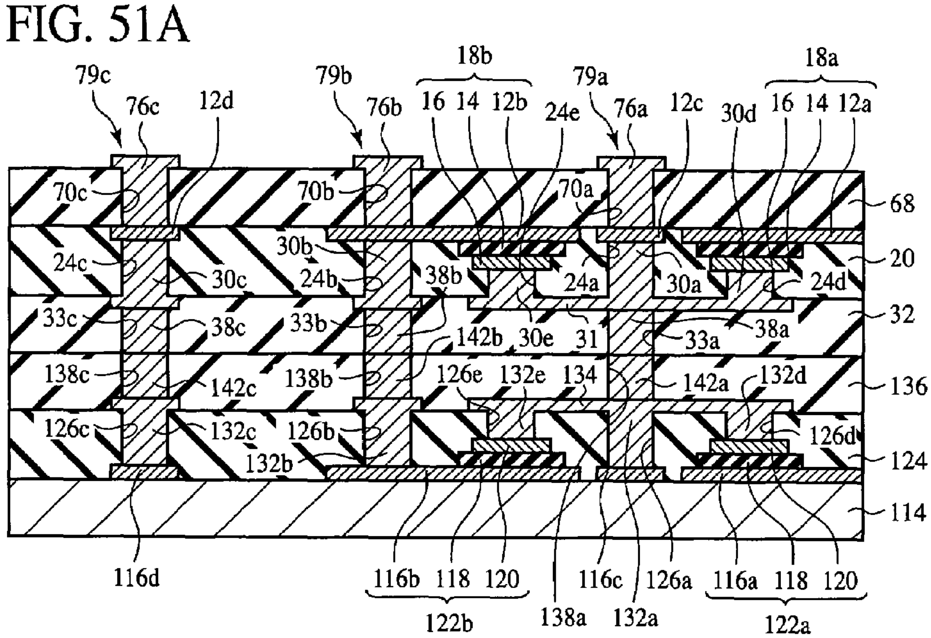
FIGS. 51A and 51B are sectional views of the interposer and the electronic device according to the second embodiment of the present invention in the steps of the method for fabricating the interposer and the electronic device, which illustrate the method (Part 13).
Figure 51B:
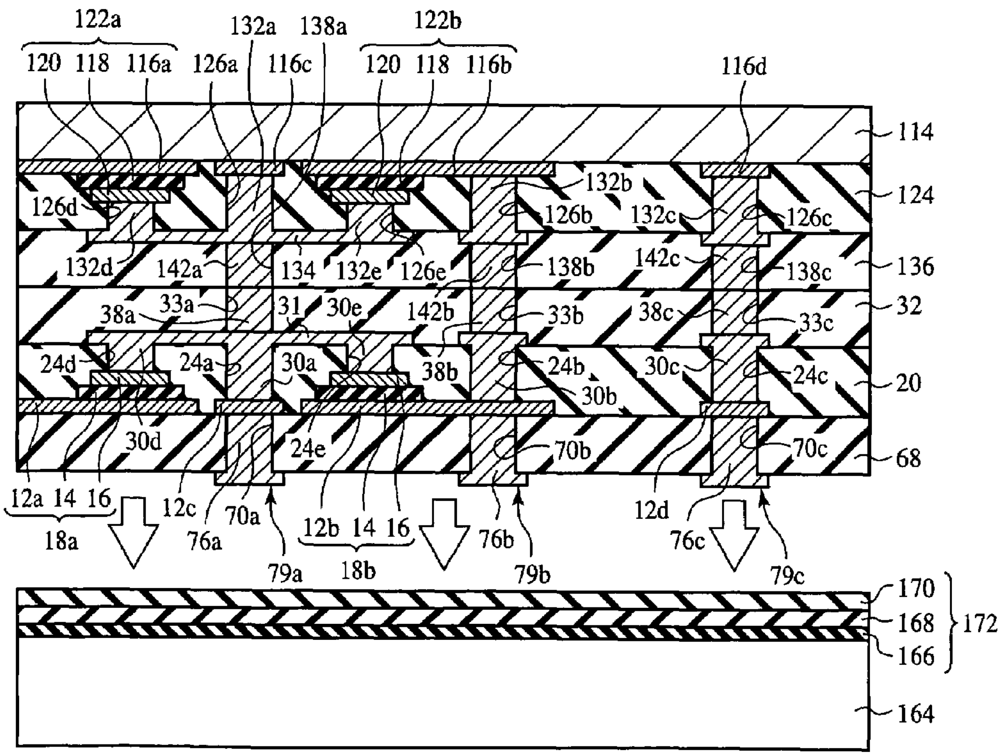

Next, the supporting substrate 164 is prepared (see FIG. 51B). The supporting substrate 164 is, e.g., a glass supporting substrate. The supporting substrate 164 is for supporting the base 8*a* with the capacitors 18*a*, 18*b*, 122*a*, 122*b*, etc. buried in and others in removing the semiconductor substrate 114 by polish or others in a later step.

Next, a heat foaming type double-sided tape 172 is adhered to the supporting substrate 164. As does the heat foaming type double-sided tape 66 described above, the heat foaming type double-sided tape 172 includes a base 168 of, e.g., polyester film, a heat-releasable adhesive layer 170 formed on one primary surface of the base 168, and a pressure-sensitive adhesive layer 166 formed on the other primary surface of the base 168. The heat foaming type double-sided tape 172 can be a heat foaming type double-sided tape by, e.g., NITTO DENKO CORPORATION (trade name: RIVA ALPHA) or others as is the heat foaming type double-sided tape 66 described above. When the heat foaming type double-sided tape 172 is adhered to the supporting substrate 164, the pressure-sensitive adhesive layer 166 of the heat foaming type double-sided tape 172 is adhered to the supporting substrate 164.

Next, the semiconductor substrate 114 is reversed to oppose the resin layer 68 and the supporting substrate 164 to each other as illustrated in FIG. 51A. At this time, the resin layer 68 and the supporting substrate 164 are opposed to each other with one surface of the resin layer 68 (opposite to the surface contacting the resin layer 20) and one surface of the heat-releasable adhesive layer 170 of the heat foaming type double-sided tape 172 (opposite to the surface contacting the base 168) positioned adjacent to each other.

Figure 52A:
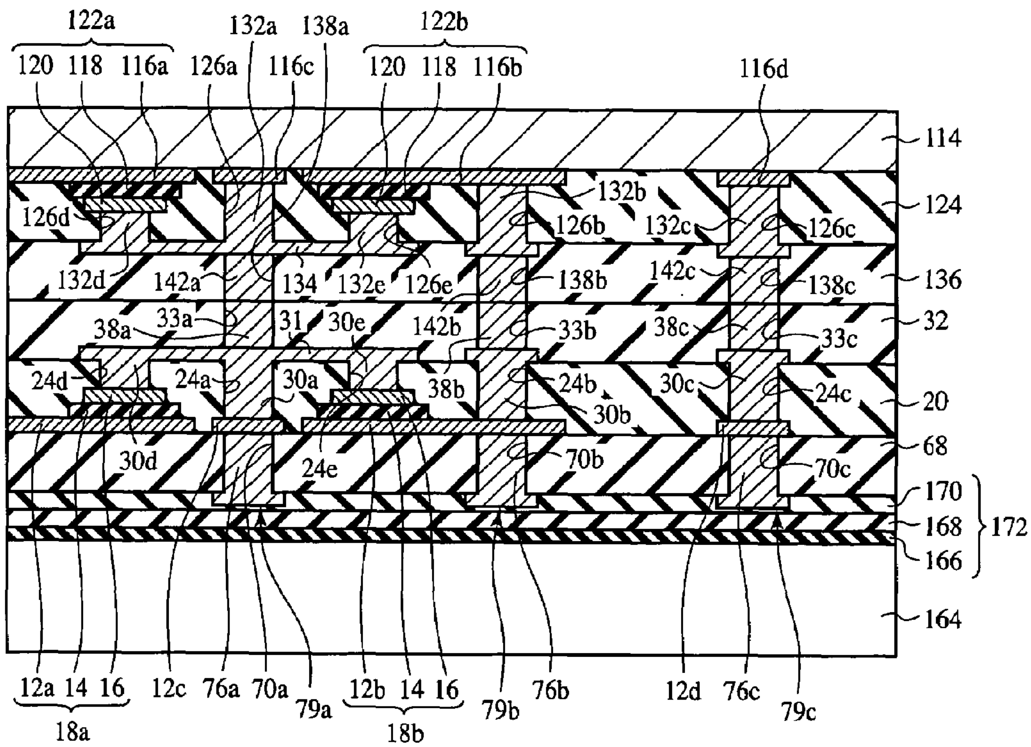
FIGS. 52A and 52B are sectional views of the interposer and the electronic device according to the second embodiment of the present invention in the steps of the method for fabricating the interposer and the electronic device, which illustrate the method (Part 14).
Figure 52B:
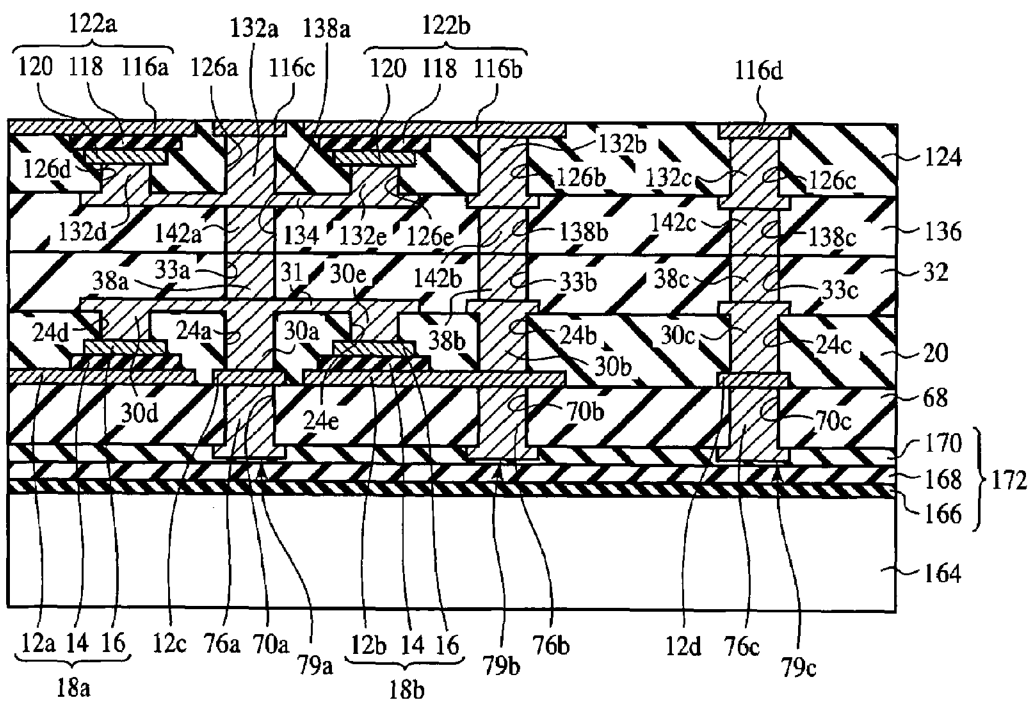

Then, as illustrated in FIG. 52A, one surface of the resin layer 68 (opposite to the surface contacting the resin layer 20) and one surface of the heat-releasable adhesive layer 170 of the heat foaming type double-sided tape 172 (opposite to the surface contacting the base 168) are adhered to each other.

Next, the semiconductor substrate 114 is polished by, e.g., CMP until the thickness of the semiconductor substrate 114 becomes, e.g., about 100 μm. At this time, all the semiconductor substrate 114 is not polished, so that the capacitor electrodes 116*a*, 116*b* and the conduction films 116*c*, 116*d* are kept from the dame by the polish.

Next, the semiconductor substrate 114 remaining on one surface of the resin layer 124 (opposite to the surface contacting the resin layer 136) is etched off by, e.g., hydrofluoric acid.

Thus, the semiconductor substrate 114 is removed while the capacitor electrodes 116*a*, 116*b*, the conduction films 116*c*, 116*d*, the resin layer 124, etc. are kept from excessively damaged (see FIG. 52A).

On the other hand, the semiconductor substrate 46 is prepared (see FIG. 11A).

The following steps up to the step of cutting the upper parts of the partial electrodes 56*a*-56*c* and the upper part of the resin layer 48*b* including this step are the same as those of the method for fabricating the interposer according to the first embodiment illustrated in FIGS. 11B to 15B, and their explanation will not be repeated.

Figure 53:
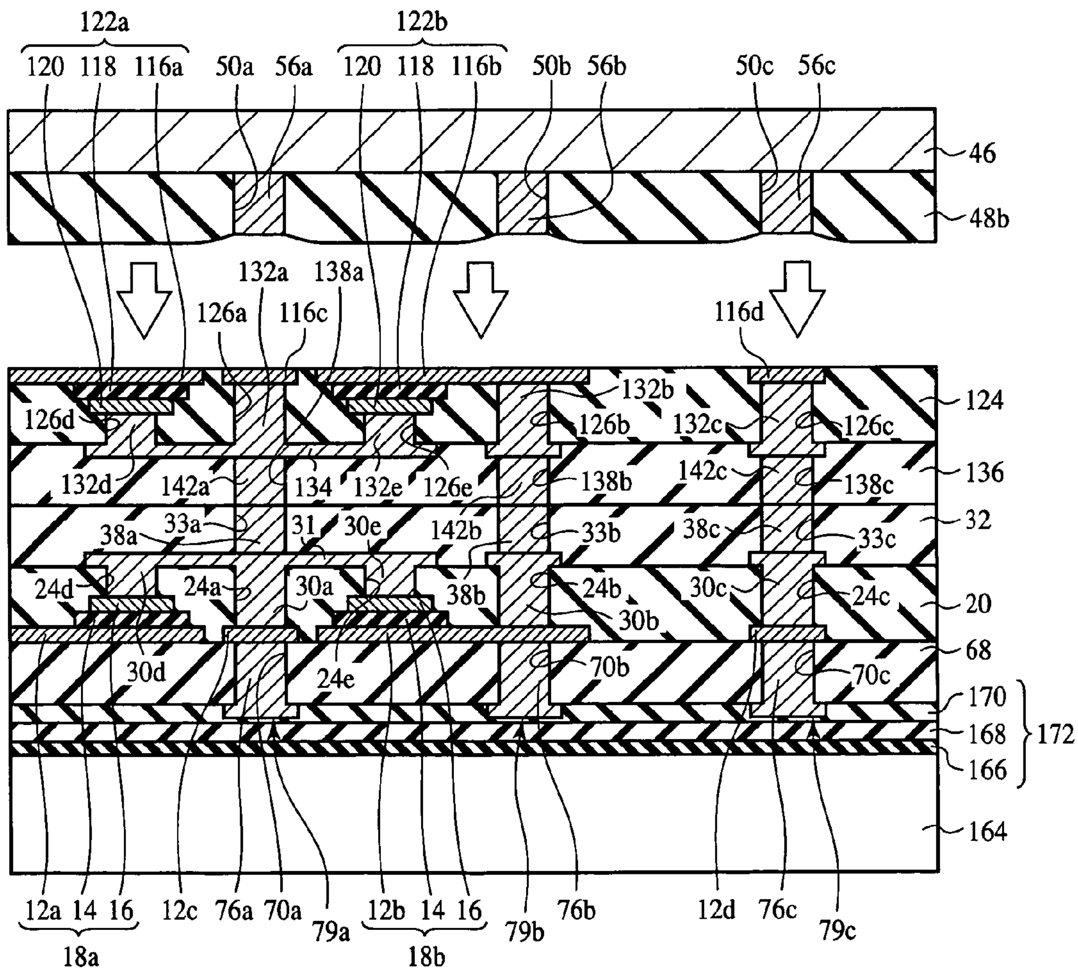
FIG. 53 is a sectional view of the interposer and the electronic device according to the second embodiment of the present invention in the steps of the method for fabricating the interposer and the electronic device, which illustrates the method (Part 15).

Next, as illustrated in FIG. 53, the supporting substrate 164 and the semiconductor substrate 46 are opposed to each other. At this time, the supporting substrate 164 and the semiconductor substrate 46 are opposed to each other with the resin layer 124 and the resin layer 48*b* positioned adjacent to each other and with the partial electrodes 132*a*-132*c* and the partial electrodes 56*a*-56*c* being in alignment respectively with each other.

Figure 54A:
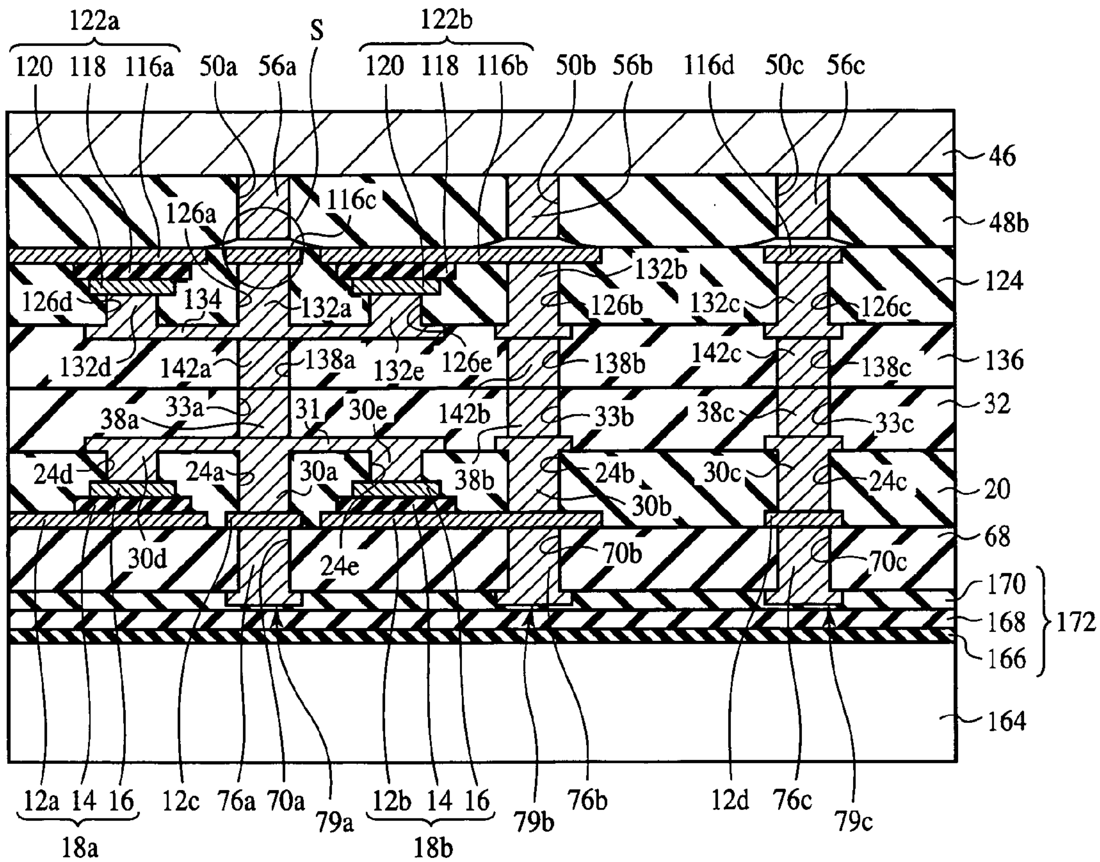
FIGS. 54A and 54B are sectional views of the interposer and the electronic device according to the second embodiment of the present invention in the steps of the method for fabricating the interposer and the electronic device, which illustrate the method (Part 16).
Figure 54B:
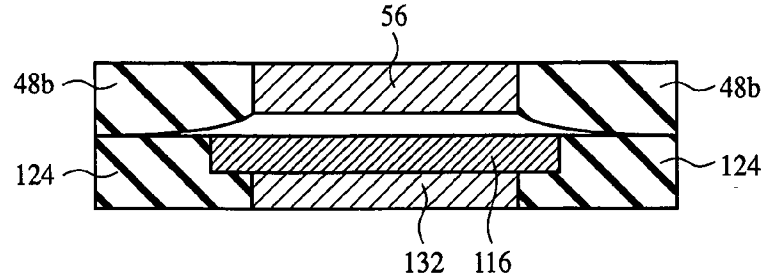

Next, as illustrated in FIGS. 54A and 54B, the semiconductor substrate 10 and the supporting substrate 164 are brought adjacent to each other. FIG. 54B is a sectional view of the resin layer 124 and the resin layer 48*b* contacted with each other. FIG. 54B is an enlarged sectional view of the part in the circle S in FIG. 54A.

Figure 55A:
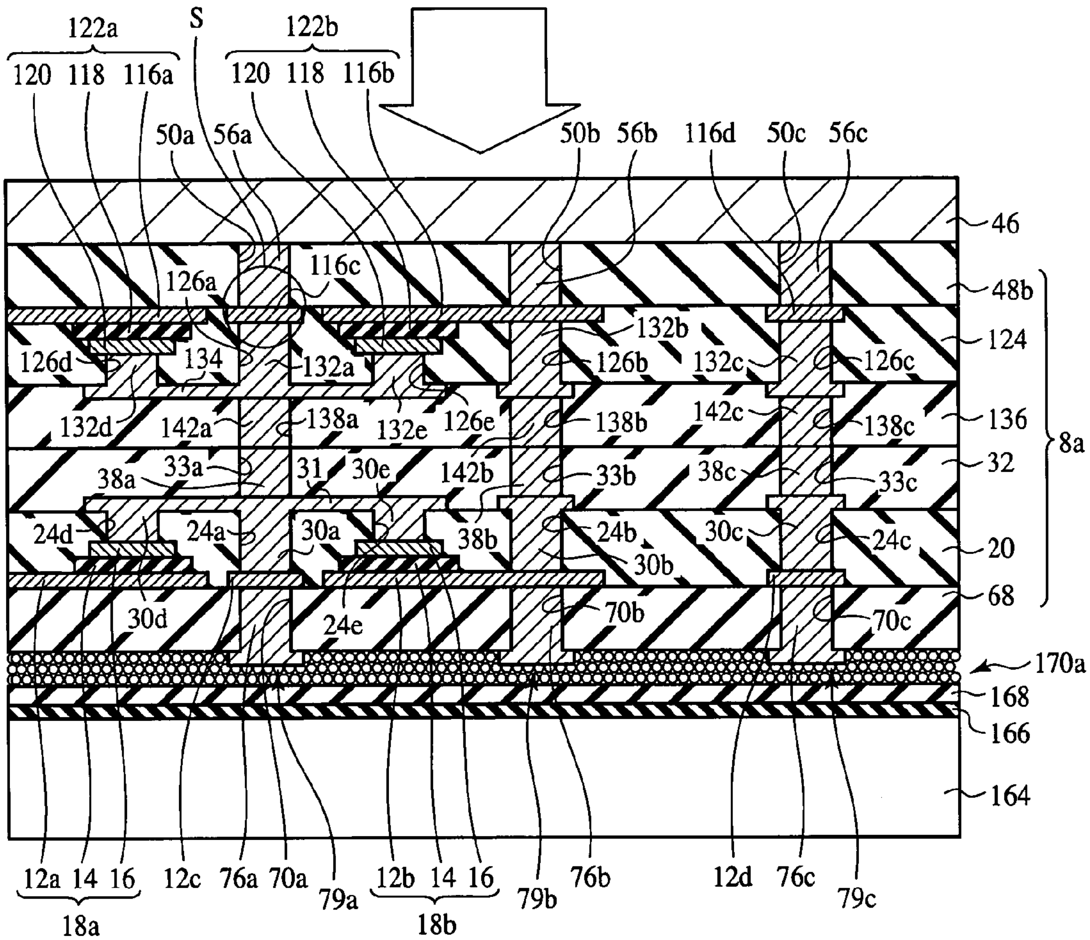
FIGS. 55A and 55B are sectional views of the interposer and the electronic device according to the second embodiment of the present invention in the steps of the method for fabricating the interposer and the electronic device, which illustrate the method (Part 17).
Figure 55B:
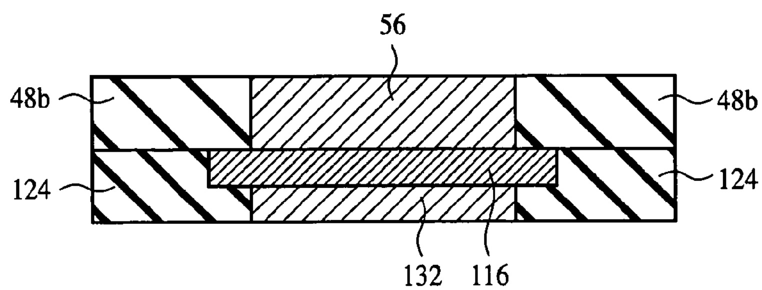

Next, thermal processing is conducted while a pressure is being applied from the outside to the supporting substrate 164 and the semiconductor substrate 46 to keep the conduction film 116*c* and the partial electrode 56*a* in close contact with each other, the capacitor electrode 116*b* and the partial electrode 56*b* in close contact with each other, and the conduction film 116*d* and the partial electrode 56*c* in close contact with each other (see FIG. 55). FIG. 55B is an enlarged sectional view of the part in the circle S in FIG. 55A.

For the thermal processing, an oven (heat processing system) is used. The thermal process temperature is, e.g., 250° C. The thermal processing period of time is, e.g., about 1 hour. The pressure is, e.g., about 10 kPa. The thermal process under these conditions adheres the resin layer 48*b* and the resin layer 124 to each other without failure. The resin layer 48 is shrunk by the thermal process. The resin layer 42*b* and the resin layer 124 are adhered to each other while the resin layer 48*b* is shrunk, and due to the shrinkage of the resin layer 48*b*, the partial electrode 56*a* and the conduction film 116*c* are jointed to each other, the partial electrode 56*b* and the capacitor electrode 116*b* are jointed to each other, and the partial electrode 56*c* and the conduction film 116*d* are jointed to each other. Due to the shrinkage of the resin layer 48*b*, the partial electrode 56*a* and the conduction film 116*c* are jointed to each other, the partial electrode 56*b* and the capacitor electrode 116*b* are jointed to each other, and the partial electrode 56*c* and the conduction film 116*d* are jointed to each other, which makes it unnecessary to apply a pressure from the outside to the semiconductor substrate 46 and the supporting substrate 164.

Figure 56A:
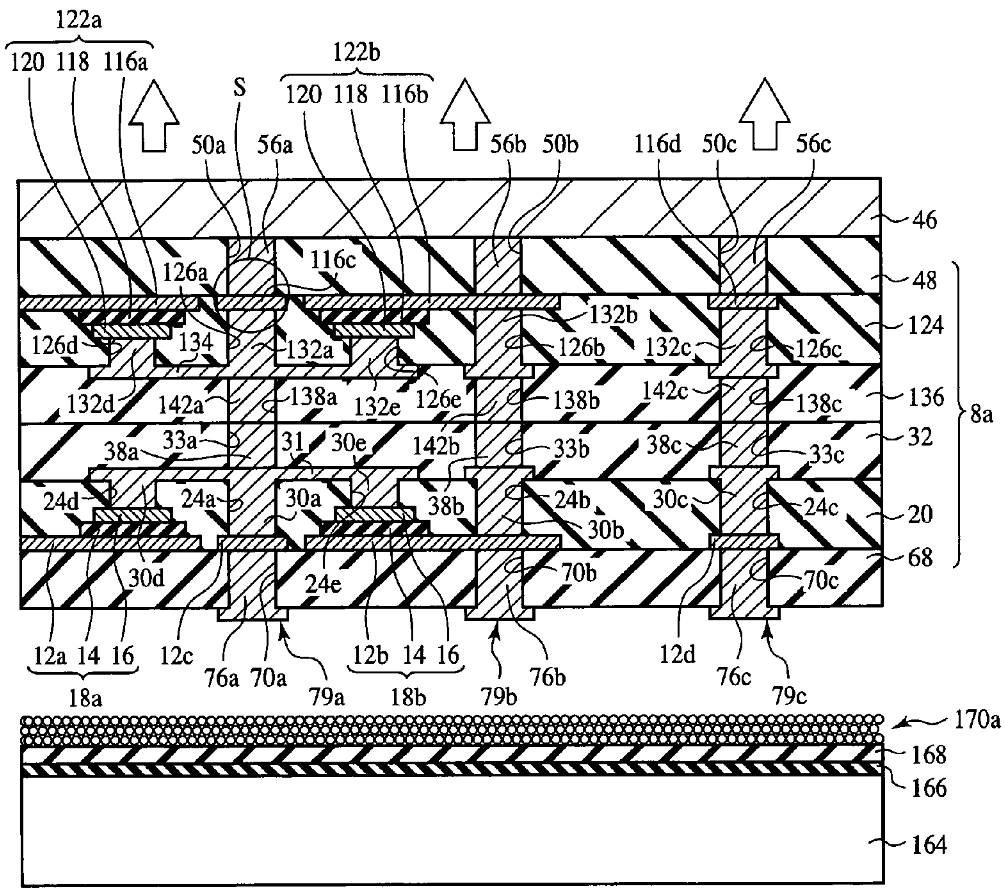
FIGS. 56A and 56B are sectional views of the interposer and the electronic device according to the second embodiment of the present invention in the steps of the method for fabricating the interposer and the electronic device, which illustrate the method (Part 18).
Figure 56B:
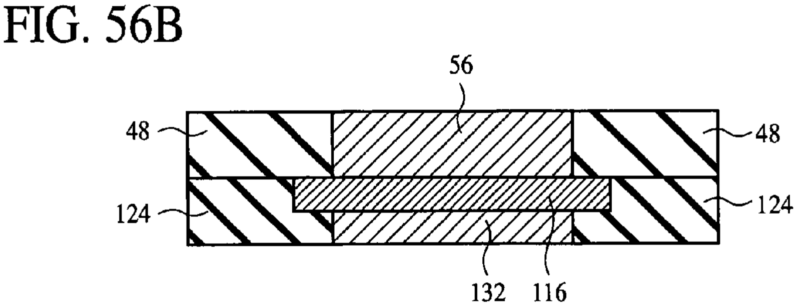

Thus, the semi-cured resin layer 48*b* becomes the completely cured resin layer 48 (see FIGS. 56A and 56B) FIG. 56B is an enlarged sectional view of the part in the circle S in FIG. 56A. Because of the completely cured resin layer 48, which has been sufficiently shrunk, even when the application of the pressure is stopped, the partial electrodes 56*a* and the conduction film 116*c* never part from each other, the partial electrodes 56*b* and the capacitor electrode 116*b* never part from each other, and the partial electrode 56*c* and the conduction film 116*d* never part from each other.

In the thermal process, the heat-releasable adhesive layer 170 of the heat foaming type double-sided tape 172 is expanded. The expansion of the heat-releasable adhesive layer 170 decreases the adhesion are between the expanded heat-releasable adhesive layer 170*a* and the resin layer 68, and the adhesion between the heat-releasable adhesive layer 170*a* and the resin layer 68 is decreased.

Next, the semiconductor substrate 46 supported by the supporting substrate 164 is removed from the supporting substrate 164. The heat foaming type double-sided tape 172 having the pressure-sensitive adhesive layer 116 adhered to the supporting substrate 164 is removed from the resin layer 68 together with the supporting substrate 164.

Figure 57A:
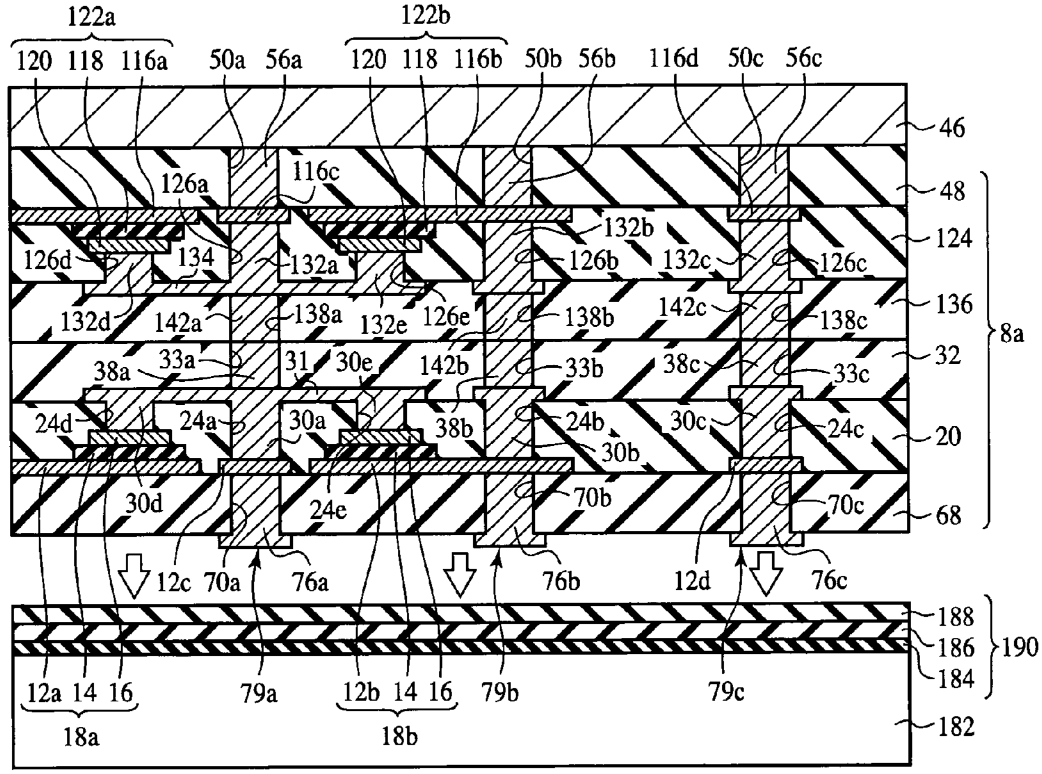
FIGS. 57A and 57B are sectional views of the interposer and the electronic device according to the second embodiment of the present invention in the steps of the method for fabricating the interposer and the electronic device, which illustrate the method (Part 19).

Next, the supporting substrate 182 is prepared (see FIG. 57A). The supporting substrate 182 is, e.g., a glass supporting substrate. The supporting substrate 182 is for supporting the base 8*a* with the capacitors 18*a*, 18*b*, 122*a*, 122*b*, etc. buried in removing the semiconductor substrate 46 by polish or others in a later step.

Next, a heat foaming type double-sided tape 190 is adhered to the supporting substrate 182. As does the heat foaming type double-sided tape 66 described above, the heat foaming type double-sided tape 190 includes a base 186 of e.g., polyester film, a heat-releasable adhesive layer 188 formed on one primary surface of the base 186, and a pressure-sensitive adhesive layer 184 formed on the other primary surface of the base 186. The heat foaming type double-sided tape 190 can be a heat foaming type double-sided tape by, NITTO DENKO CORPORATION (trade name: RIVAALPHA) or others. When the heat foaming type double-sided tape 190 is adhered to the supporting substrate 182, the pressure-sensitive adhesive layer 184 of the heat foaming type double-sided tape 190 is adhered to the supporting substrate 182.

Next, then, the semiconductor substrate 46 and the supporting substrate 182 are opposed to each other. At this time, the supporting substrate 182 and the semiconductor substrate 46 are opposed to each other with one surface of the resin layer 68 (opposite to the surface contacting the resin layer 20) and one surface the heat-releasable adhesive layer 188 of the heat foaming type double-sided tape 190 (opposite to the surface contacting the base 186) positioned near each other.

Figure 57B:
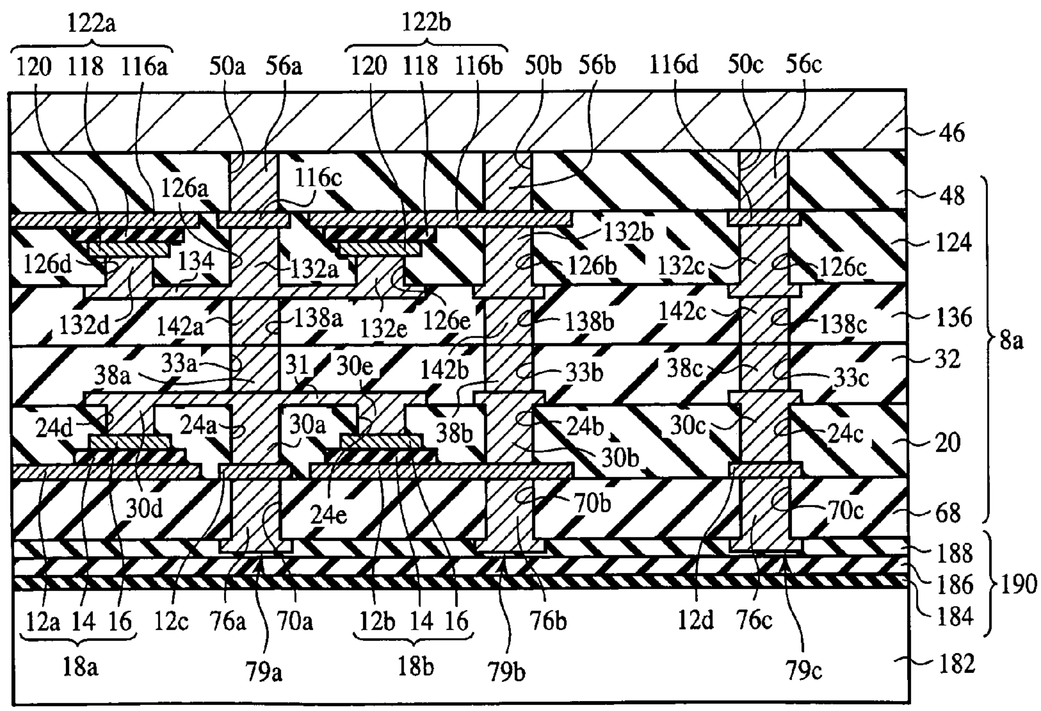

Then, as illustrated in FIG. 57B, one surface of the resin layer 68 (opposite to the surface contacting the resin layer 20) and one surface of the heat-releasable adhesive layer 188 of the heat foaming type double-sided tape 190 (opposite to the surface contacting the base 186) are adhered to each other.

Next, the semiconductor substrate 46 is polished by, e.g., CMP until the thickness of the semiconductor substrate 46 becomes, e.g., about 100 μm. At this time, all the semiconductor substrate 46 is not removed, so that the resin layer 48, etc. are kept from being damaged by the polish.

Next, the semiconductor substrate 46 remaining on one surface of the resin layer 48 (opposite to the surface contacting the resin layer 124) is etched off by, e.g., hydrofluoric acid.

Figure 58A:
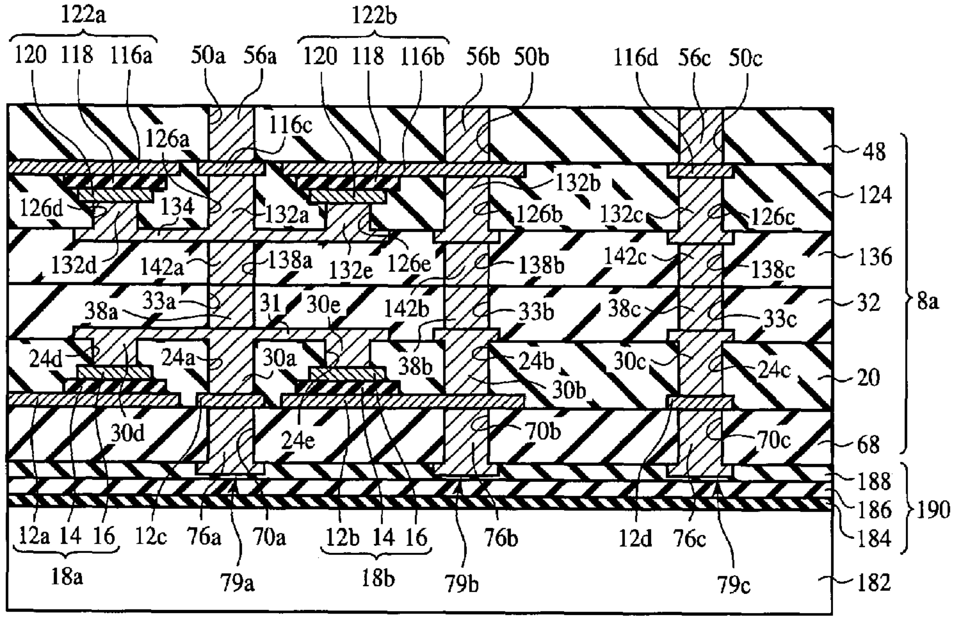
FIGS. 58A and 58B are sectional views of the interposer and the electronic device according to the second embodiment of the present invention in the steps of the method for fabricating the interposer and the electronic device, which illustrate the method (Part 20).

Thus, while the resin layer 48, etc. are kept from being excessively damaged, the semiconductor substrate 46 is removed (see FIG. 58A).

Figure 58B:
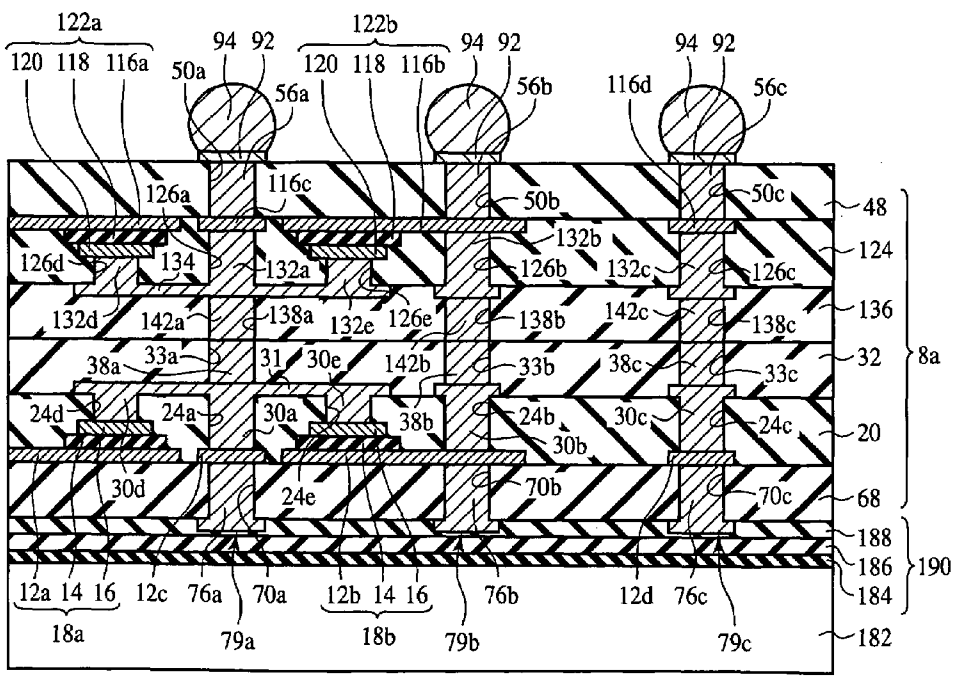

Then, in the same way as in the method for fabricating the interposer described above with reference to FIGS. 25B to 26B, the electrode pads 92 and the solder bumps 94 are formed (see FIG. 58B).

Thus, the interposer 96*d* according to the present embodiment is fabricated.

Figure 59:
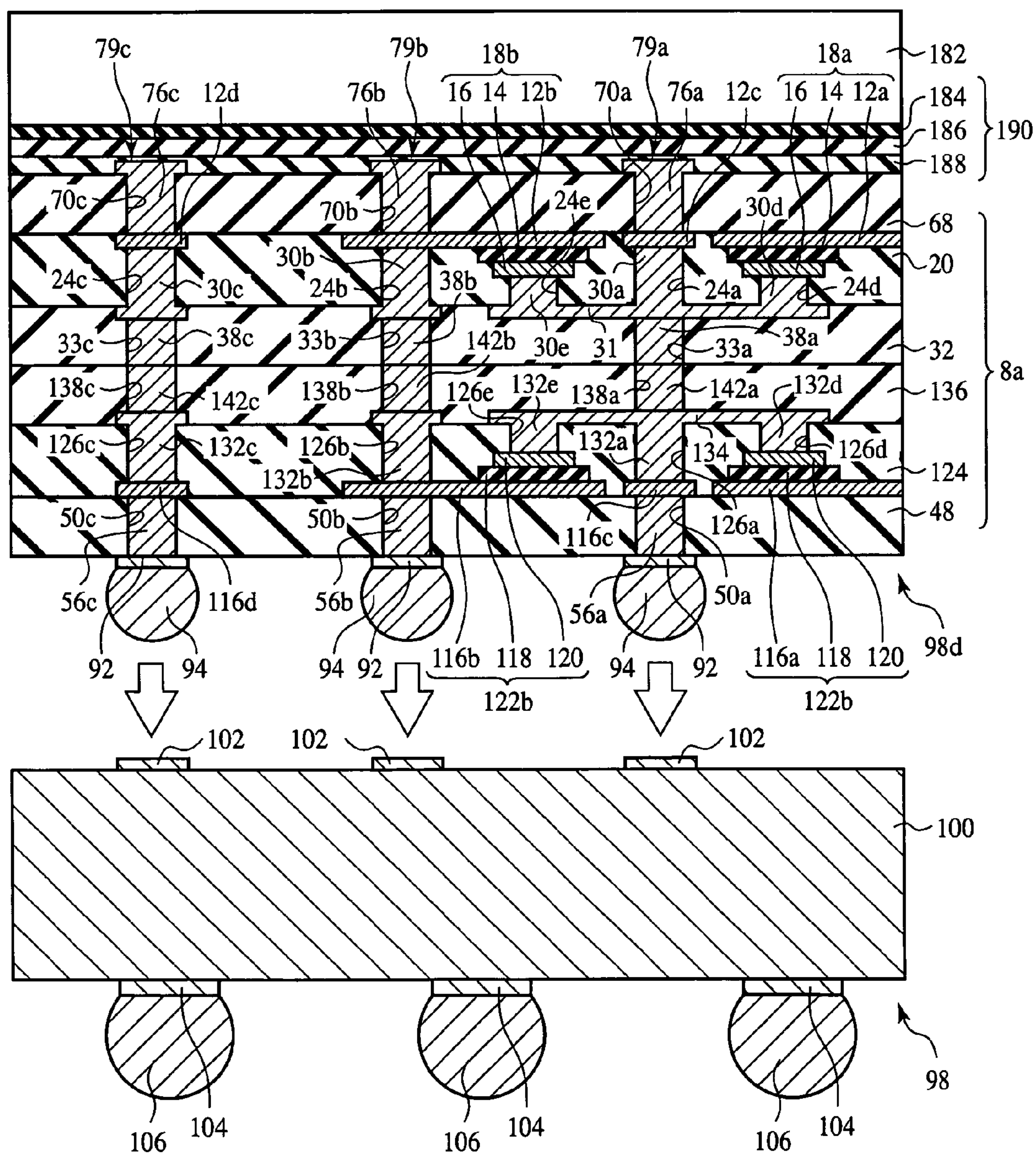
FIG. 59 is a sectional view of the interposer and the electronic device according to the second embodiment of the present invention in the steps of the method for fabricating the interposer and the electronic device, which illustrates the method (Part 21).

Next, the package substrate 98 is prepared (see FIG. 59).

Next, the supporting substrate 182 supporting the interposer 96*d* is reversed to oppose the interposer 96*d* supported by the supporting substrate 182 and the package substrate 98 to each other. At this time, the interposer 96*d* and the package substrate 98 are opposed to each other with the solder bumps 94 of the interposer 98 and the electrode pads 102 of the package substrate 98 positioned near each other.

Figure 60:
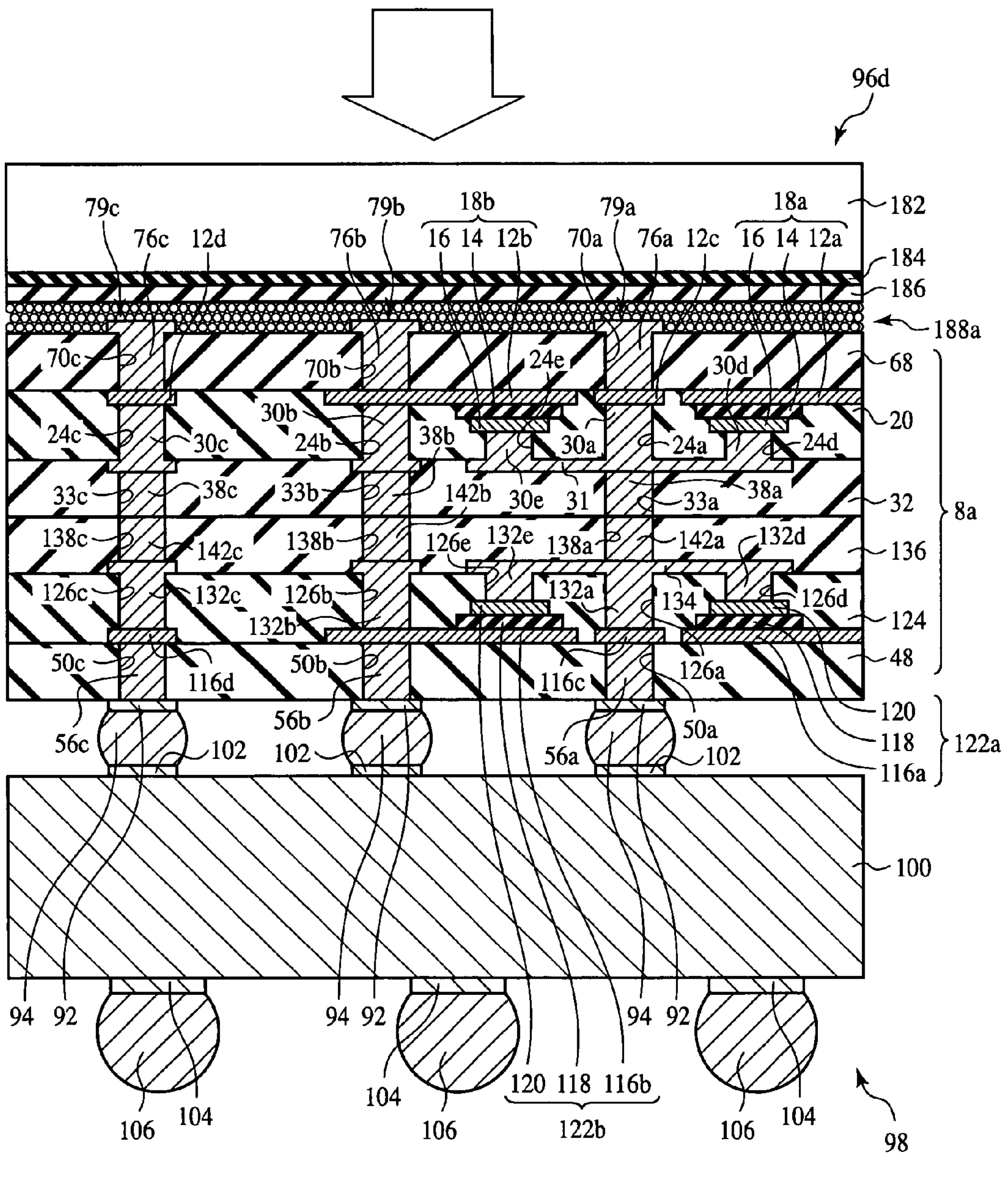
FIG. 60 is a sectional view of the interposer and the electronic device according to the second embodiment of the present invention in the steps of the method for fabricating the interposer and the electronic device, which illustrates the method (Part 22).

Next, the solder bumps 94 of the interposer 96*d* and the electrode pads 102 of the package substrate 98 are jointed to each other by flip-chip bonding (see FIG. 60). Thus, the interposer 96*d* is mounted on the package substrate 98. In the flip-chip bonding, the heat-releasable adhesive layer 188 of the heat foaming type double-sided tape 190 is expanded. When the heat-releasable adhesive layer 188 is expanded, the adhesion area between the expanded heat-releasable adhesive layer 188*a* and the resin layer 68 is lowered, and the adhesion between the heat-releasable adhesive layer 188*a* and the resin layer 68 is lowered. Accordingly, the heat-releasable adhesive layer 188*a* and the resin layer 68 can be easily released from each other.

Then, the supporting substrate 182 is removed from the interposer 96*d* (see FIG. 60). The heat foaming type double-sided tape 190 having the pressure-sensitive adhesive layer 184 adhered to the supporting substrate 182, is removed together with the supporting substrate 182 from the interposer 96*d*.

Figure 61:
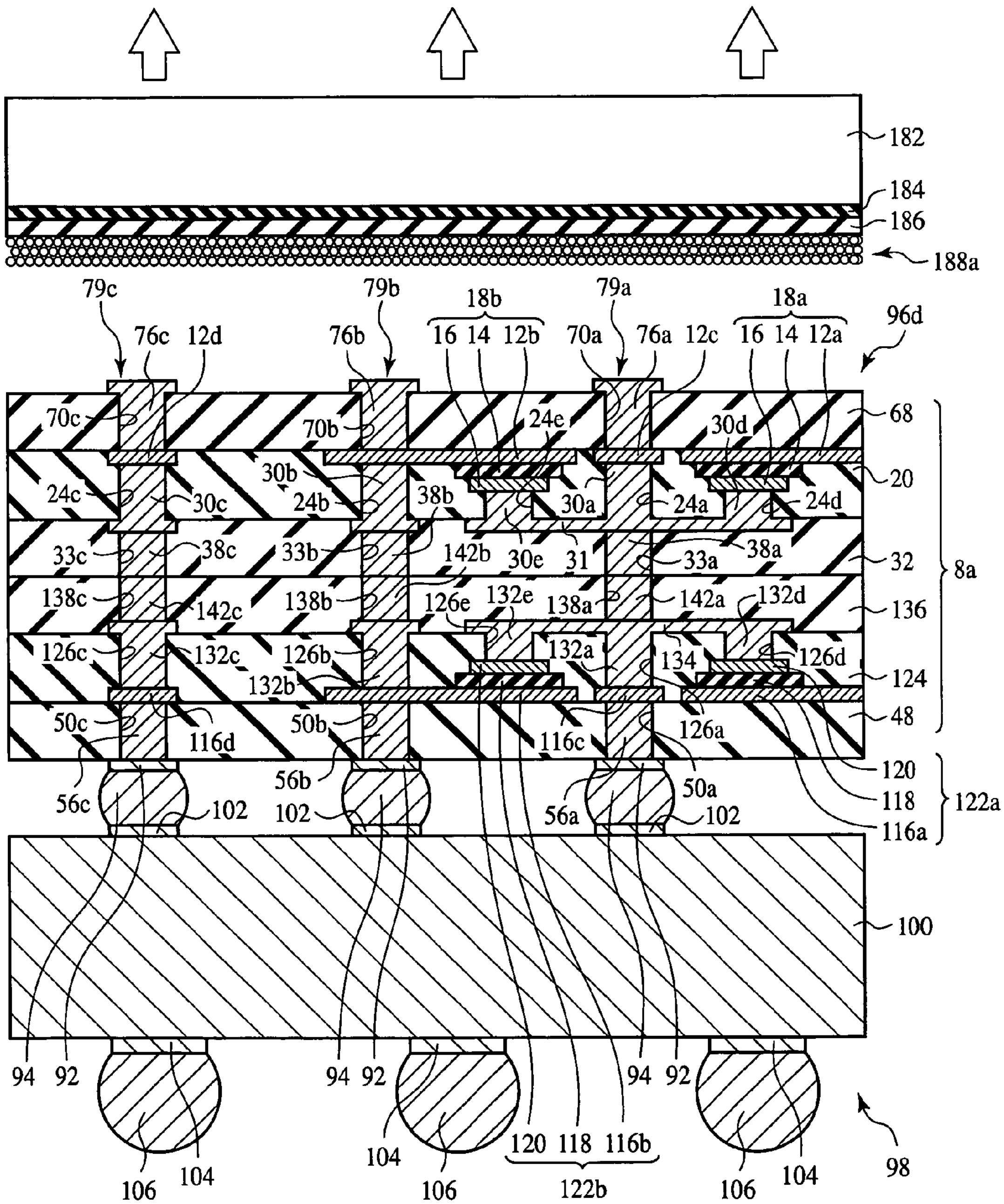
FIG. 61 is a sectional view of the interposer and the electronic device according to the second embodiment of the present invention in the steps of the method for fabricating the interposer and the electronic device, which illustrates the method (Part 23).

Next, the semiconductor integrated circuit devices 108 are prepared (see FIG. 61).

Figure 62:
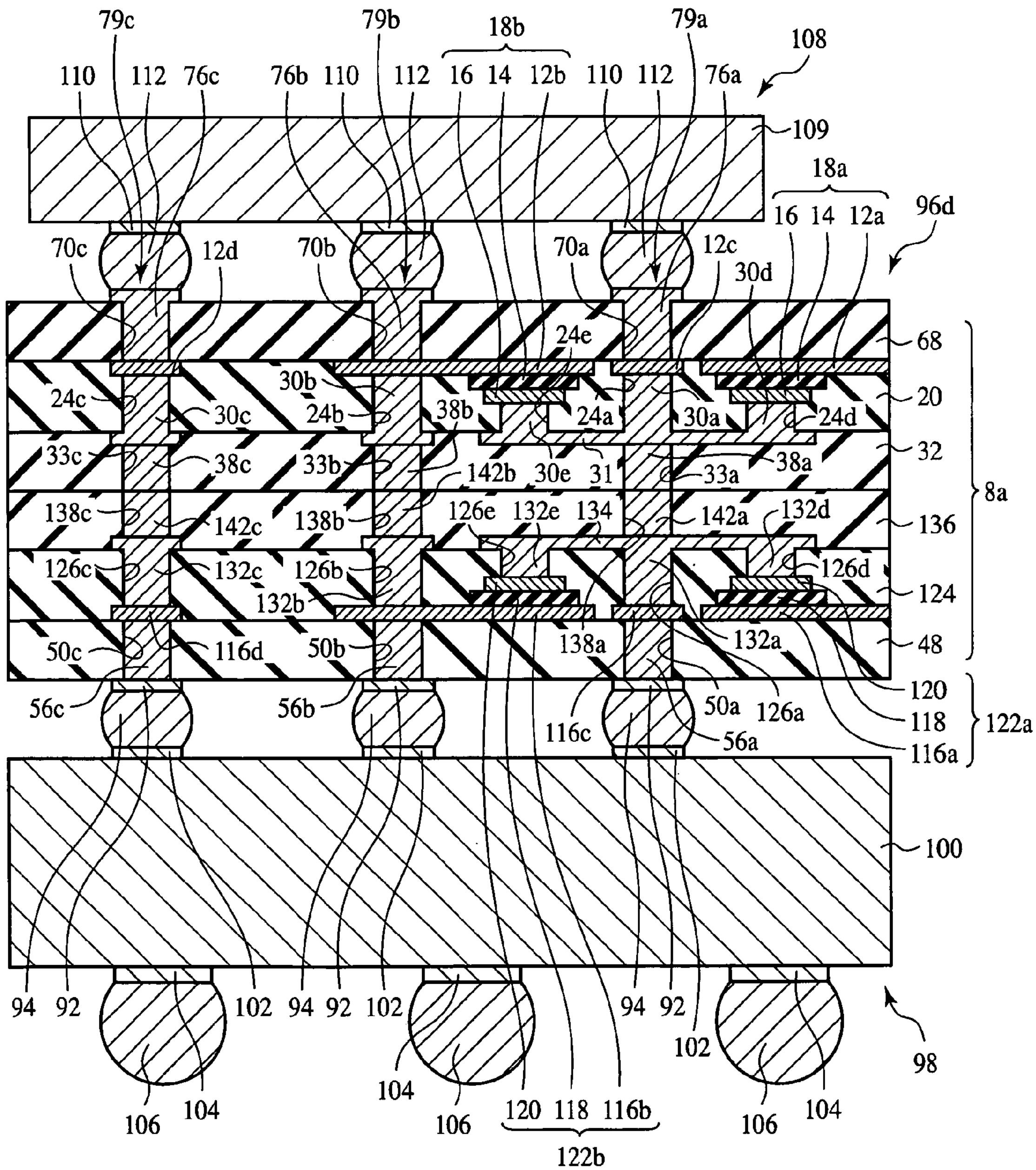
FIG. 62 is a sectional view of the interposer and the electronic device according to the second embodiment of the present invention in the steps of the method for fabricating the interposer and the electronic device, which illustrates the method (Part 24).

Next, the solder bumps 112 of the semiconductor integrated circuit devices 108 are jointed to the through electrodes 79*a*-79*c* of the interposer 96*d* by flip-chip bonding (see FIG. 62). Thus, the semiconductor integrated circuit devices 108 are mounted on the interposer 96*d*.

Thus, the electronic device using the interposer according to the present embodiment is fabricated.

A Third Embodiment

The interposer according to a third embodiment of the present invention and the method for fabricating the interposer, and the electronic device using the interposer and the method for fabricating the electronic device will be explained with references from FIGS. 63 to 87. The same members of the present embodiment as those of the interposer according to the first and the second embodiments and the method for fabricating the interposers, etc. illustrated in FIGS. 1 to 62 are represented by the same reference numbers not to repeat or to simplify their explanation.

(Interposer and Electronic Device)

Figure 63:
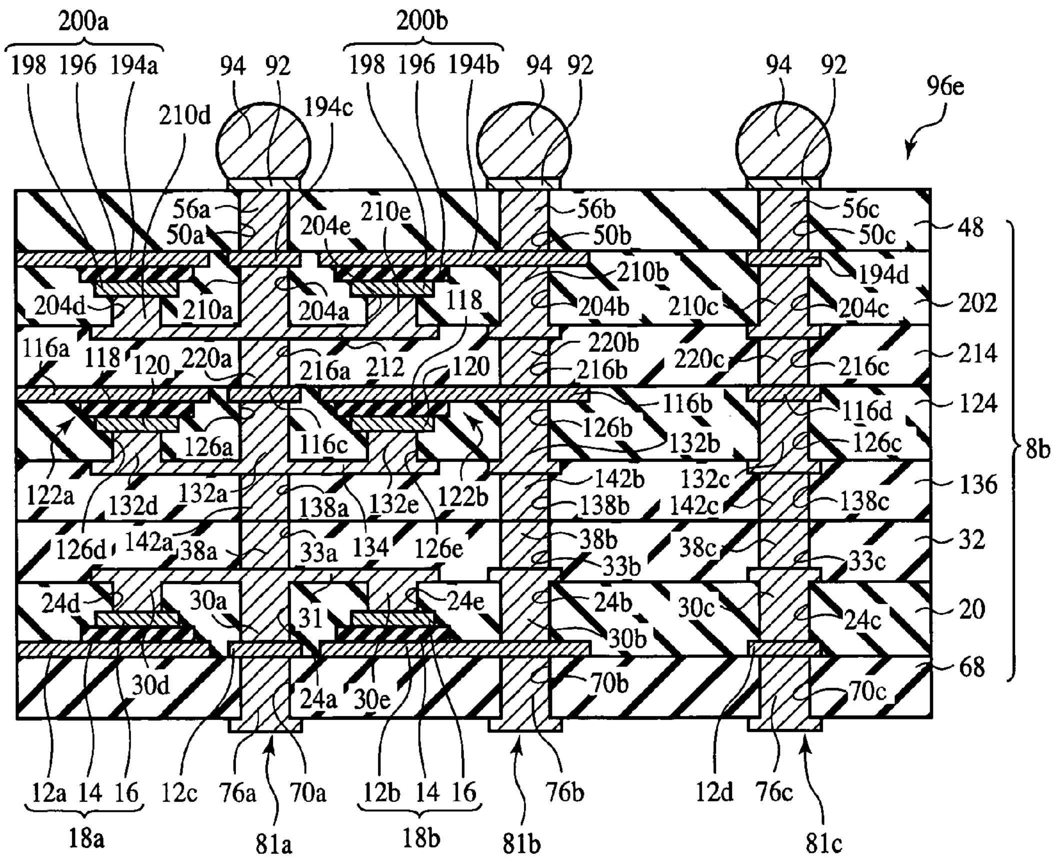
FIG. 63 is a sectional view of the interposer according to a third embodiment of the present invention (Part 1).
Figure 64:
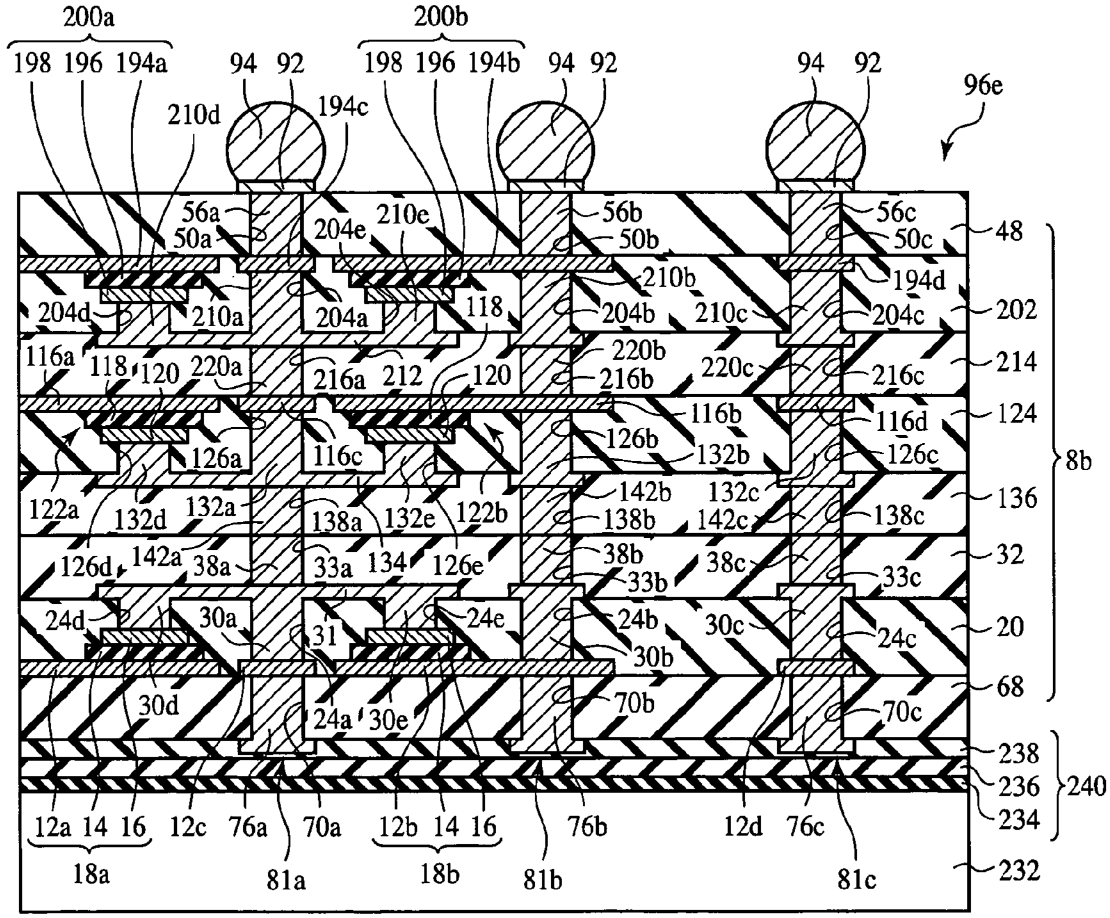
FIG. 64 is a sectional view of the interposer according to the third embodiment of the present invention (Part 2).
Figure 65:
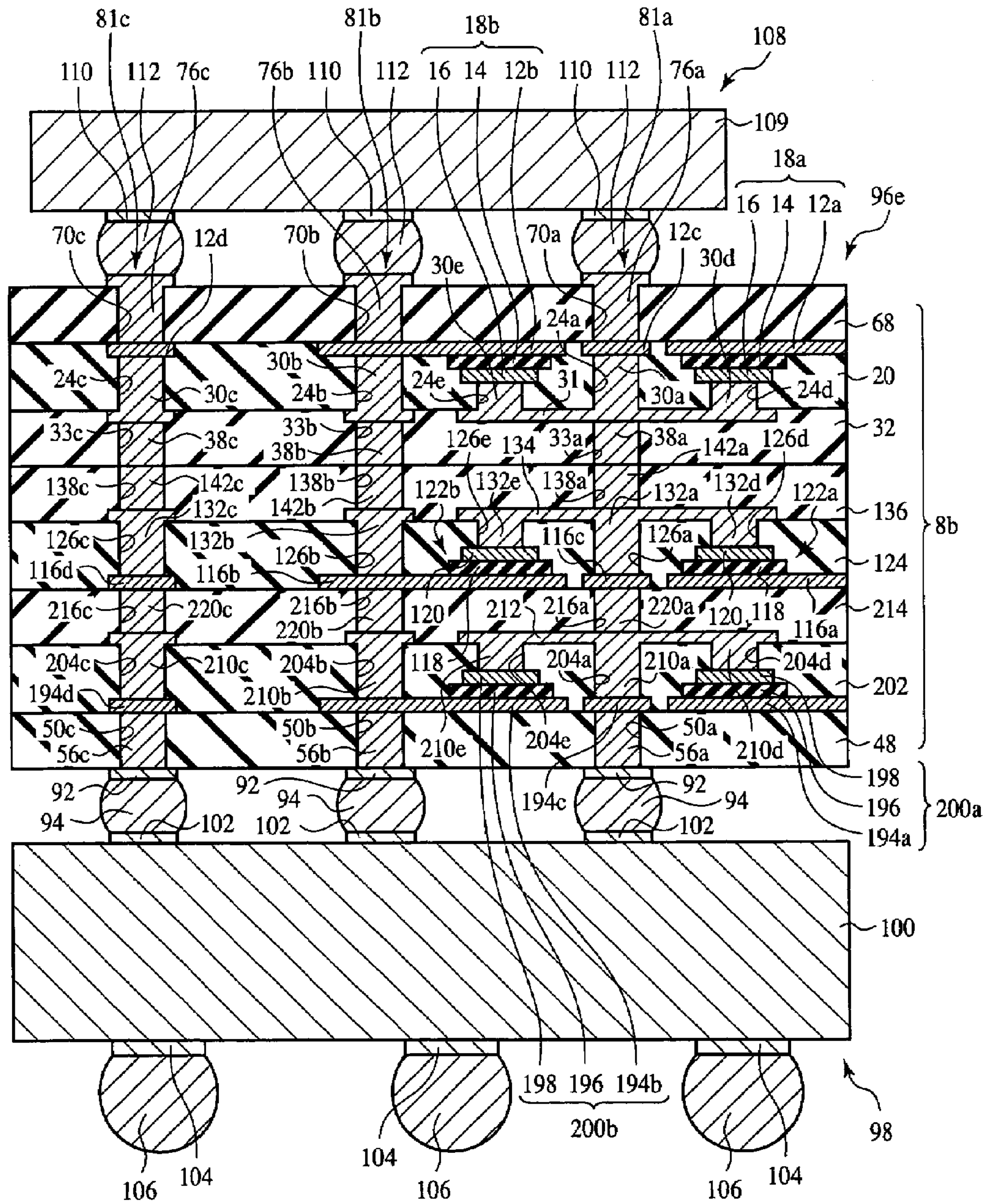
FIG. 65 is a sectional view of the electronic device according to the third embodiment of the present invention.

First, the interposer and the electronic device according to the present embodiment will be explained with reference to FIGS. 63 to 65. FIG. 63 is a sectional view of the interposer according to the present embodiment (Part 1). FIG. 64 is a sectional view of the interposer according to the present embodiment (Part 2). FIG. 65 is a sectional view of the electronic device according to the present embodiment.

The interposer according to the present embodiment is characterized mainly in that the interposer comprises a base 8*b* including a plurality of resin layers 68, 20, 32, 136, 124, 214, 202, 48 laid the latter on the former; thin-film capacitors 18*a*, 18*b* buried between the resin layer 124 and the resin layer 214; thin-film capacitors 122*a*, 122*b* buried between the resin layer 124 and the resin layer 214; thin-film capacitors 200*a*, 200*b* buried between the resin layer 48 and the resin layer 202; a through electrode 81*a* formed through the base 8*b* and electrically connected to the capacitor electrodes 16 of the thin-film capacitors 18*a*, 18*b*, the capacitor electrodes 120 of the thin-film capacitors 122*a*, 122*b* and the capacitor electrode 198 of the thin-film capacitors 200*a*, 200*b*; a through electrode 81*b* formed through the base 8*b* and electrically connected to the capacitor electrodes 12*a*, 12*b* of the thin-film capacitors 18*a*, 18*b*, the capacitor electrodes 116*a*, 116*b* of the thin-film capacitors 122*a*, 122*b* and the capacitor electrodes 194*a*, 194*b* of the thin-film capacitors 200*a*, 200*b*; and a through electrode 81*c* formed through the base 8*b* and insulated from the thin-film capacitors 18*a*, 18*b*, the thin-film capacitors 122*a*, 122*b* and the thin-film capacitors 200*a*, 200*b*.

That is, the interposer according to the present embodiment is characterized mainly in that the interposer 96*e* comprise the thin-film capacitors 200*a*, 200*b* buried between the resin layer 48 and the resin layer 202 in addition to the thin-film capacitors 18*a*, 18*b* buried between the resin layer 68 and the resin layer 20 and the thin-film capacitors 122*a*, 122*b* buried between the resin layer 214 and the resin layer 124, and the thin-film capacitors 18*a*, 18*b*, the thin-film capacitors 122*a*, 122*b*, and the thin-film capacitors 200*a*, 200*b* are connected in parallel with each other.

Capacitor electrodes (lower electrodes) 194*a*, 194*b* are formed on one surface of the resin layer 48 (opposite to the surface with electrode pads 92 formed on). The resin layer 48 is formed of, e.g., BCB resin, as described above. The capacitor electrodes 194*a*, 194*b* are formed of the layer film of, e.g., a 20 nm-thickness titanium oxide ($TiO_2$) film and a 150 nm-thickness platinum (Pt) film sequentially laid. The capacitor electrode 194*a* of the thin-film capacitor 200*a* and the capacitor electrode 194*b* of the thin-film capacitor 200*b* are electrically connected to each other.

A crystalline capacitor dielectric film 196 is formed on one surfaces of the capacitor electrodes 194*a*, 194*b* (opposite to the surfaces contacting the resin layers 48). That is, the polycrystalline capacitor dielectric film 196 or an epitaxially grown capacitor dielectric film 196 is formed. The capacitor dielectric film 196 is formed of a high dielectric constant material. Specifically, the capacitor dielectric film 196 is formed of BST film. The film thickness of the capacitor dielectric film 196 is, e.g., 100 nm. The capacitor dielectric film 196 is formed by high temperature process of, e.g., 500° C. or above. Accordingly, the capacitor dielectric film 196 is very well crystallized and has very high relative dielectric constant. Specifically, the relative dielectric constant of the capacitor dielectric film 196 is 200 or above.

In forming the capacitor dielectric film 196, as will be described later, the capacitor dielectric film 96 is formed on a semiconductor substrate 192 which is durable to high temperature process (see FIGS. 66B). As will be described later, the base 8*b* of the resin layers 68, 20, 32, 136, 124, 214, 202, 48 with the thin-film capacitors 18*a*, 18*b*, 122*a*, 122*b*, 200*a*, 200*b* buried in has not been subjected to the high temperature process for forming the capacitor dielectric film 196 and is free from large deformation, etc.

Capacitor electrodes (upper electrodes) 198 are formed on one surface of the capacitor dielectric film 196 (opposite to the surface contacting the capacitor electrodes 194*a*, 194*b*), opposed to the capacitor electrodes 194*a*, 194*b*. The capacitor electrodes 198 are formed of, e.g., a 200 nm-thickness Pt film.

Thus, the thin-film capacitor 200*a* including the capacitor electrode 194*a*, the capacitor dielectric film 196 and the capacitor electrode 198 is constituted. The thin-film capacitor 200*b* including the capacitor electrode 194*b*, the capacitor dielectric film 196 and the capacitor electrode 198 is constituted.

Conduction films 194*c*, 194*d* of one and the same conduction film as the capacitor electrodes 194*a*, 194*b* are formed on one surface of the resin layer 48 (contacting the capacitor electrodes 194*a*, 194*b*). The conduction film 194*c* forms a part of the through-electrode 81*a*. The conduction film 194*d* forms a part of the through-electrode 81*c*. The conduction films 194*c*, 194*d* are electrically insulated form the capacitor electrodes 194*a*, 194*b*.

The resin layer 202 is formed on one surface of the resin layer 48 (contacting the capacitor electrodes 194*a*, 194*b*), covering the thin-film capacitors 200*a*, 200*b* and the conduction films 194*c*, 194*d*. The conduction film 202 is formed of, e.g., epoxy resin.

In the resin layer 202, there are formed an opening 204*a* down to the conduction film 194*c*, an opening 204*b* down to the capacitor electrode 198 of the thin-film capacitor 200*b*, an opening 204*c* down to the conduction film 194*d*, an opening 204*d* down to the capacitor electrode 198 of the capacitor 200*a*, and an opening 204*e* down to the capacitor electrode 198 of the capacitor 200*b*.

A partial electrode 210*a* forming a part of the through-electrode 81*a* is formed in the opening 204*a*. The partial electrode 210 is electrically connected to the partial electrode 56*a* via the conduction film 194*c*. A partial electrode 210*a* forming a part of the through-electrode 81*b* is buried in the opening 204*b*. The partial electrode 210*b* is connected to the capacitor electrode 194*b*. A partial electrode 210*c* forming a part of the through-electrode 81*c* is buried in the opening 204*c*. The partial electrode 210*c* is connected to the partial electrode 56*c* via the conduction film 194*d*.

A conductor plug 210*d* connected to the capacitor electrode 198 of the thin-film capacitor 200*a* is buried in the opening 204*d*. A conductor plug 204*e* connected to the capacitor electrode 198 of the thin-film capacitor 200*b* is buried in the opening 204*e*. The partial electrode 210*a*, the conductor plug 210*d* and the conductor plug 210*e* are electrically interconnected with each other by an interconnection 212. The partial electrode 210*a*, the conduction plugs 210*d*, the conduction plug 210*e* and the interconnection 212 are integrally formed of one and the same conduction film.

A resin layer 214 is formed on one surface of the resin layer 202 (opposite to the surface contacting the resin layer 48), covering the interconnection 212. The resin layer 214 is formed on a thermosetting resin which is cured and shrunk without generating by-products, such as water, alcohol, organic acid, nitride, etc. The thermosetting resin can be, e.g., BCB resin. The BCB resin can be a BCB resin solution by, e.g., Dow Chemical Company (trade name: CYCLOTENE 4024-40), or others.

In the resin layer 214, there are formed an opening 216*a* down to the partial electrode 210*a*, an opening 216*b* down to the partial electrode 210*b* and an opening 216*c* down to the partial electrode 210*c*.

A partial electrode 220*a* forming a part of the through-electrode 81*a* is buried in the opening 216*a*. A partial electrode 220*b* forming a part of the through-electrode 81*b* is buried in the opening 216*b*. A partial electrode 220*c* forming a part of the through-electrode 81*c* is buried in the opening 216*c*.

Figure 69A:
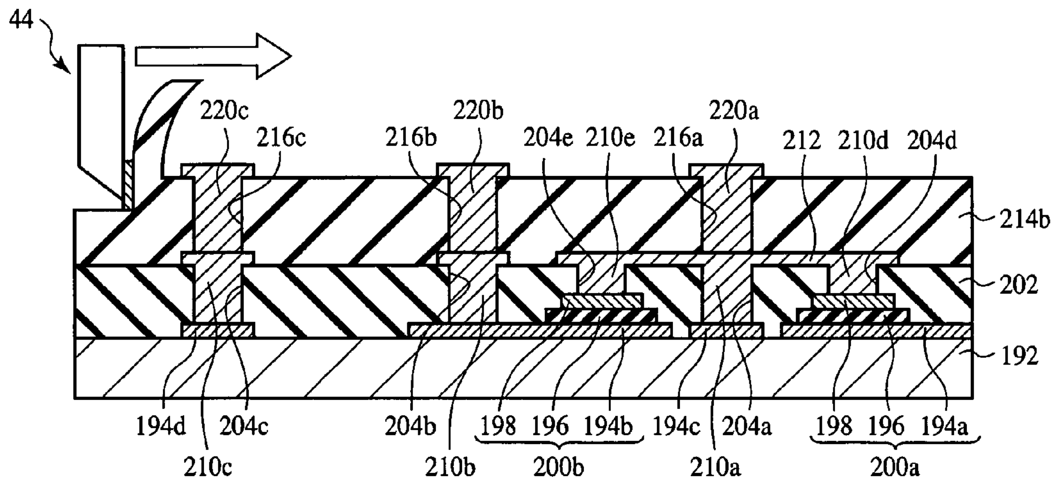
FIGS. 69A to 69C are sectional views of the interposer and the electronic device according to the third embodiment of the present invention in the steps of the method for fabricating the interposer and the electronic device, which illustrate the method (Part 4).

On surfaces of the partial electrodes 220*a*-220*c* (opposite to the surfaces contacting the partial electrodes 210*a*-210*c*) and one surface of the resin layer 214 (opposite to the surface contacting the resin layer 202) are cut with a cutting tool 44 of diamond or others (see FIG. 69A). One surfaces of the partial electrodes 220*a*-220*c* (opposite to the surfaces contacting the partial electrodes 210*a*-210*c*) and one surface of the resin layer 214 (opposite to the surface contacting the resin layer 202), which have been cut with the cutting tool 44 of diamond or others, are flat.

The resin layer 214 is adhered to the resin layer 124. The partial electrode 220*a* buried in the resin layer 214 and the conduction film 116*c* buried in the resin layer 124 are jointed to each other. The partial electrode 220*b* buried in the resin layer 214 and the capacitor electrode 116*b* buried in the resin layer 124 are jointed to each other. The partial electrode 220*c* buried in the resin layer 214 and the conduction film 116*d* buried in the resin layer 124 are jointed to each other. As will be described later, the resin layer 214 is subjected to thermal processing for shrinking the resin layer 214. The resin layer 214 is shrunk surely in contact with the resin layer 124, and due to the shrinkage of the resin layer 214, the partial electrode 220*a* and the conduction film 116*b* are firmly jointed to each other, the partial electrode 220*b* and the capacitor electrode 116*b* are firmly jointed to each other, and the partial electrode 220*c* and the conduction film 116*d* are firmly jointed to each other.

One surfaces of the partial electrodes 56*a*-56*c* (contacting the capacitor electrode 194*b* or the conduction films 194*c*, 194*d*) and one surface of the resin layer 48 (contacting the resin layer 202) are cut with the cutting tool 44 of diamond or others, as described above with reference to FIGS. 13A to 15B). One surfaces of the partial electrodes 56*a*-56*c* (contacting the capacitor electrode 194*b* or contacting the conduction films 194*c*, 194*d*) and one surface of the resin layer 48 (contacting the resin layer 202), which are cut with the cutting tool 44 of diamond or others, are flat.

The resin layer 48 is adhered to the resin layer 202. The partial electrode 56*a* buried in the resin layer 48 and the conduction film 194*c* buried in the resin layer 202 are jointed to each other. The partial electrode 56*b* buried in the resin layer 48 and the capacitor electrode 194*b* buried in the resin layer 202 are jointed to each other. The partial electrode 56*c* buried in the resin layer 48 and the conduction film 194*d* buried in the resin layer 202 are jointed to each other. The resin layer 48 is subjected to thermal processing for shrinking the resin layer 48 as will be described later. The resin layer 48 is shrunk surely in contact with the resin layer 202, and due to the shrinkage of the resin layer 48, the partial electrode 56*a* and the conduction film 194*c* are firmly jointed to each other, the partial electrode 56*b* and the capacitor electrode 194*b* are firmly jointed to each other, and the partial electrode 56*c* and the conduction film 194*d* are firmly jointed to each other.

The partial electrode 76*a*, the conduction film 12*c*, the partial electrode 30*a*, the partial electrode 38*a*, the partial electrode 142*a*, the partial electrode 132*a*, the conduction film 116*c* the partial electrode 220*a* the partial electrode 210*a*, the conduction film 194*c* and the partial electrode 56*a* form the through-electrode 81*a*. The partial electrode 76*b*, a part of the capacitor electrode 12*b*, the partial electrode 30*b*, the partial electrode 38*b*, the partial electrode 142*b*, the partial electrode 132*b*, a part of the capacitor electrode 116*b*, the partial electrode 220*b*, the partial electrode 210*b*, the conduction film 194*c* and the partial electrode 56*b* form the through-electrode 81*b*. The partial electrode 76*c*, the conduction film 12*d*, the partial electrode 30*c*, the partial electrode 38*c*, the partial electrode 142*c*, the partial electrode 132*c*, the conduction film 116*d*, the partial electrode 220*c*, the partial electrode 210*c*, the conduction film 194*c* and the partial electrode 56*c* form the through-electrode 81*c*.

Thus, the interposer 96*e* according to the present embodiment is constituted.

As illustrated in FIG. 64, the interposer 96*e* is supported by the supporting substrate 232.

That is, the supporting substrate 232 is adhered to the other surface of the resin layer 68 (opposite to the surface of the resin layer 20) by a heat foaming type double-sided tape 240. The supporting substrate 232 is, e.g., a glass supporting substrate. As does the heat foaming type double-sided tape 86 described above with reference to FIG. 2, the heat foaming type double-sided tape 240 includes a base 236 formed of, e.g., polyester film, a heat-releasable adhesive layer 234 formed on one surface of the base 236, and a pressure-sensitive adhesive layer 238 formed on the other surface of the base 236. The pressure-sensitive adhesive layer 234 of the heat foaming type double-sided tape 240 is adhered to the supporting substrate 232, and the pressure-sensitive adhesive layer 238 of the heat foaming type double-sided tape 240 is adhered to the resin layer 68.

In the present embodiment, the interposer 96*e* is supported by the supporting substrate 232, because the base 8*b* of the interposer 96*e* is formed only of the resin layers 68, 20, 32, 136, 124, 214, 202, 48, and unless the interposer 96*e* supported by some solid means, the interposer 96*e* will be deformed.

As will be described later, after the interposer 96*e* mounted on the substrate and others, since the inter-poser is supported by the substrate and others, the supporting substrate 232 supporting the interposer 96*e* becomes unnecessary. The supporting substrate 232 is adhered to the interposer 96*e* by the heat foaming type double-sided tape 240 so that when the interposer 96*e* does not have to be supported by the supporting substrate 232 any more, the supporting substrate 232 can be easily removed from the interposer 96*e*.

FIG. 65 is a sectional view of the electronic device using the interposer according to the present embodiment.

As illustrated in FIG. 65, as is the interposer 96 according to the first embodiment, the interposer 96*e* according to the present embodiment is disposed, e.g., between the package substrate 98 and the semiconductor integrated circuit devices 108.

The electrode pads 92 of the interposer 96_e_ and the electrode pads 102 of the package substrate 98 are electrically connected respectively to each other by the solder bumps 94.

The electrode pads 110 of the semiconductor integrated circuit devices 108 and the through-electrodes 81_a_-81_c_ of the interposer 96_e_ are electrically connected respectively to each other by the solder pumps 112.

Thus, the electronic device using the interposer according to the present embodiment is constituted.

As described above, the interposer according to the present embodiment is characterized mainly in that the interposer 96_e_ comprises the thin-film capacitors 200_a_, 200_b_ buried between the resin layer 48 and the resin layer 202 in addition to the thin-film capacitors 18_a_, 18_b_ buried between the resin layer 68 and the resin layer 20 and the thin-film capacitors 122_a_, 122_b_ buried between the resin layer 214 and the resin layer 124, and the thin-film capacitors 18_a_, 18_b_, the thin-film capacitors 122_a_, 122_b_ and the thin-film capacitors 200_a_, 200_b_ are connected in parallel with each other.

According to the present embodiment, the thin-film capacitors 18_a_, 18_b_ are buried between the resin layer 68 and the resin layer 20, the thin-film capacitors 122_a_, 122_b_ are buried between the resin layer 214 and the resin layer 124, and the thin-film capacitors 200_a_, 200_b_ are buried between the resin layer 48 and the resin layer 202, whereby the interposer can include the thin-film capacitors of very large relative dielectric constant.

(Method for Fabricating Interposer and Electronic Device)

Next, the method for fabricating the interposer and the electronic device according to the present embodiment will be explained with reference to FIGS. 66A to 87. FIGS. 66A to 87 are sectional views of the interposer in the steps of the method for fabricating the interposer.

First, the step of preparing the semiconductor substrate 10 up to the step of removing the semiconductor substrate 114 including this step are the same as those of the method for fabricating the interposer according to the second embodiment described above with reference to FIG. 39A to FIG. 52B are the same, ad their explanation will not be repeated.

Figure 66A:
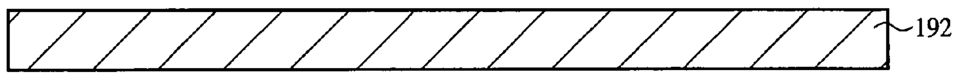
FIGS. 66A to 66E are sectional views of the interposer and the electronic device according to the third embodiment of the present invention in the steps of the method for fabricating the interposer and the electronic device, which illustrate the method (Part 1).

Then, as illustrated in FIG. 66A, the semiconductor substrate 192 is prepared. The semiconductor substrate 192 is a semiconductor substrate which is not cut in a chip size, i.e., a semiconductor substrate in a wafer. The semiconductor substrate 192 is, e.g., a silicon substrate. The thickness of the semiconductor substrate 192 is, e.g., 0.6 mm.

Next, silicon oxide film (not illustrated) is formed on the surface of the semiconductor substrate 192 by thermal oxidation. The film thickness of the silicon oxide film is, e.g., about 0.5 μm.

Figure 66B:
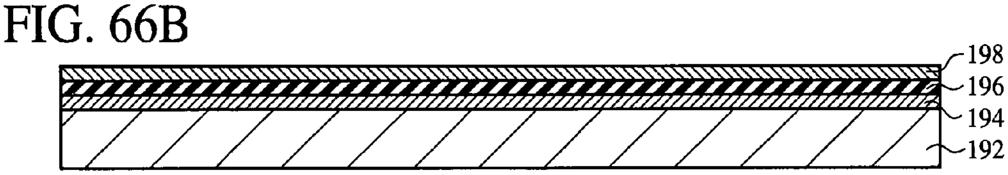
Figure 66C:
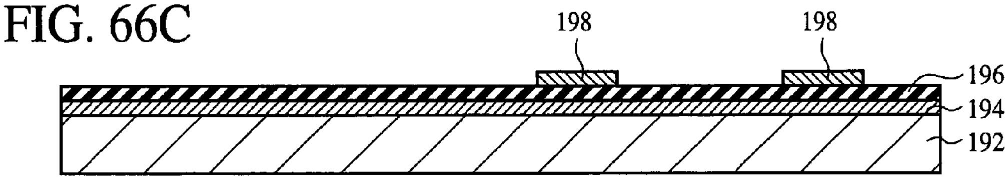

Next, as illustrated in FIG. 66B, the conduction film 194 of titanium oxide film and Pt film sequentially laid is formed on the semiconductor substrate 192 by, e.g., sputtering. The conduction film 194 is to be the lower electrodes (capacitor electrodes) 194_a_, 194_b_ of the thin-film capacitors 200_a_, 200_b_. The film thickness of the titanium oxide film is, e.g., 20 nm. The film thickness of the Pt film is, e.g., 150 nm.

Next, the crystalline capacitor dielectric film 196 is formed on the conduction film 194 by, e.g., sputtering. As the capacitor dielectric film 196, BST film, for example, is formed. More specifically, as the capacitor dielectric film 196, polycrystalline BST film is formed. The film thickness of the capacitor dielectric film 196 is, e.g., 100 nm.

Conditions for forming the capacitor dielectric film 196 are the same as, e.g., those for forming the capacitor dielectric film 14 described above with reference to FIG. 4B. Thus, the dielectric film 196 having good electric characteristics of an about 400 relative dielectric constant and a dielectric loss of 1% or below is obtained.

The capacitor dielectric film 196 is formed of BST film here. However, the material of the capacitor dielectric film 196 is not limited to BST. The capacitor dielectric film 196 is formed suitably of a high relative dielectric constant material.

The polycrystalline capacitor dielectric film 196 is formed here. However, the capacitor dielectric film 196 may be epitaxially grown.

The relative dielectric constant of the capacitor dielectric film 196 is not limited to about 400. However, to realize the required electric characteristics, it is preferable that the relative dielectric constant of the capacitor dielectric film 196 is sufficiently large. In the present embodiment, where the capacitor dielectric film 196 is formed on the highly heat resistant semiconductor substrate 192, the capacitor dielectric film 196 can be formed by high-temperature process of, e.g., 500° C. or above. The capacitor dielectric film 196 formed by the process of such high temperature can have a relative dielectric constant of 200 or above.

The capacitor dielectric film 196 is formed by sputtering here. The capacitor dielectric film 196 may be formed by sol-gel process. The capacitor dielectric film 196 is formed by sol-gel process as exemplified below.

That is, a starting solution consisting alkoxide is applied to the conduction film 194 by spin coating. The starting solution is for forming, e.g., BST film. Conditions for forming the film are, e.g., 2000 rpm and 30 seconds. Thus the capacitor dielectric film 196 of, e.g., an about 150 nm-thickness is formed.

Next, the capacitor dielectric film 196 is pre-baked. Conditions for the pre-bake are, e.g., 400° C. and 10 minutes.

Next, the capacitor dielectric film 196 is subjected to main bake. Conditions for the main bake are, e.g., 700° C. and 10 minutes. The film thickness of the capacitor dielectric film 196 after the main bake is, e.g., about 100 nm.

The dielectric film 196 of the BST formed under these conditions has good electric characteristics of an about 300 relative dielectric constant and a dielectric loss of 2% or below.

Next, the conduction film 198 of, e.g., Pt is formed on the capacitor dielectric film 196 by, e.g., sputtering. The conduction film 198 is to be the upper electrodes (capacitor electrodes) of the capacitors 200_a_, 200_b_. The film thickness of the conduction film 198 is, e.g., 200 nm.

Next, the conduction film 198 is patterned into a prescribed configuration by photolithography. Thus, the upper electrodes (capacitor electrode) 198 of the conduction film is formed (see FIG. 66C).

Figure 66D:
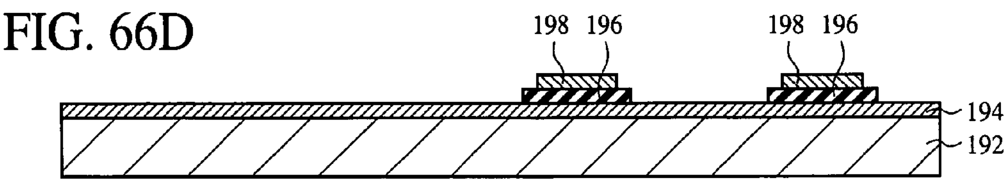
Figure 66E:
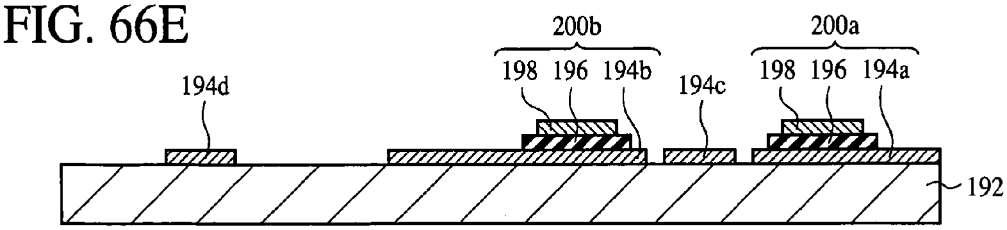

Next, the capacitor dielectric film 916 is patterned into a prescribed configuration by photolithography (see FIG. 66D).

The conduction film 194 is patterned into a prescribed configuration by photolithography. The capacitor electrodes 194_a_, 194_b_ and the conduction films 194_c_ 194_d_ are formed of the conduction film 194 (see FIG. 66E). In patterning the conduction film 194, the conduction film 194 is so patterned that the capacitor electrode 194_a_ and the capacitor electrode 194_b_ are electrically connected. In patterning the conduction film 194, the conduction film is so patterned that the conduction films 194*c*, 194*d* are electrically disconnected from the capacitor electrodes 194*a*, 194*b*. Thus, the thin-film capacitor 200*a* including the capacitor electrode 194*a*, the capacitor dielectric film 196 and the capacitor electrode 198 is formed. The thin-film capacitor 200*b* including the capacitor electrode 194*b*, the capacitor dielectric film 196 and the capacitor electrode 198 is formed.

Figure 67A:
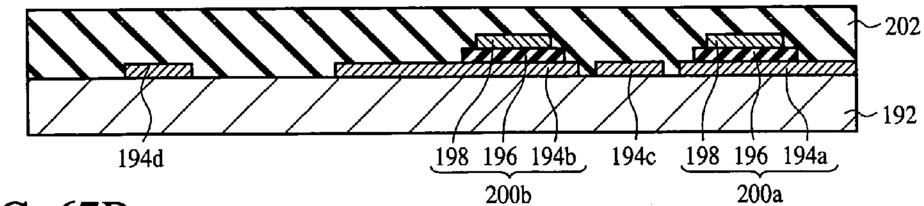
FIGS. 67A to 67E are sectional views of the interposer and the electronic device according to the third embodiment of the present invention in the steps of the method for fabricating the interposer and the electronic device, which illustrate the method (Part 2).

Next, the resin layer 202 is formed on the semiconductor substrate 192 with the thin-film capacitors 200*a*, 200*b* and the conduction films 194*a*, 194*b* formed on (see FIG. 67A). The resin layer 202 is formed of, e.g., photosensitive epoxy resin.

The resin layer 202 is formed as exemplified below. First, a photosensitive epoxy resin solution is applied to the semiconductor substrate 192 by spin coating. Conditions for the application of the epoxy resin solution are, e.g., 2000 rpm and 30 seconds. Thus, the resin layer 202 of, e.g., a 7 μm-thickness is formed. Then, the thermal processing (pre-bake) is made on the resin layer 202. The thermal processing temperature is, e.g., 60° C.

Figure 67B:
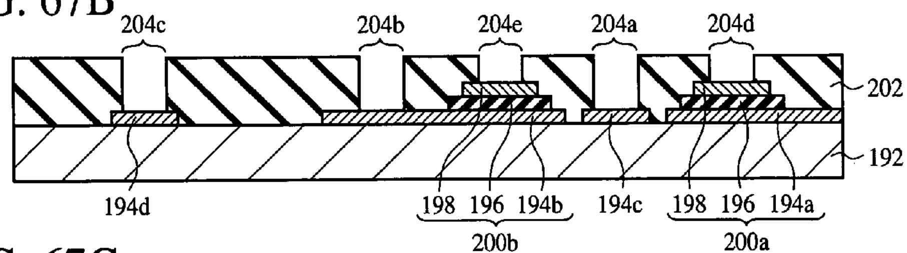

Next, the openings 204*a*-204*e* are formed in the resin layer 202 by photolithography (see FIG. 67B). In the openings 204*a*, the partial electrode 210*a* to be a part of the through-electrode 81*a* is to be buried in, and the openings 204*a* is formed down to the conduction film 194*c*. In the opening 204*b*, the partial electrode 210*b* to be a part of the through-electrode 81*b* is to be buried in, and the opening 204*b* is formed down to the capacitor electrode 194*b*. In the opening 204*c*, the partial electrode 210*c* to be a part of the through-electrode 81*c* is to be buried in, and the opening 204*c* is formed down to the conduction film 194*d*. The opening 204*d* is for the conductor plug 210*d* to be buried in and formed down to the capacitor electrode 198 of the capacitor 200*a*. The opening 204*e* is for the conductor plug 210*e* to be buried in and formed down to the capacitor electrode 198.

Then, the thermal processing (main bake) is made on the resin layer 202. The thermal processing temperature is, e.g., 200° C. The film thickness of the resin layer 202 after the thermal processing is, e.g., about 5 μm.

Next, a seed layer (not illustrated) of Cr film and Cu film sequentially laid is formed on the entire surface by, e.g., sputtering.

Next, a photoresist film 206 is formed on the entire surface by spin coating.

Figure 67C:
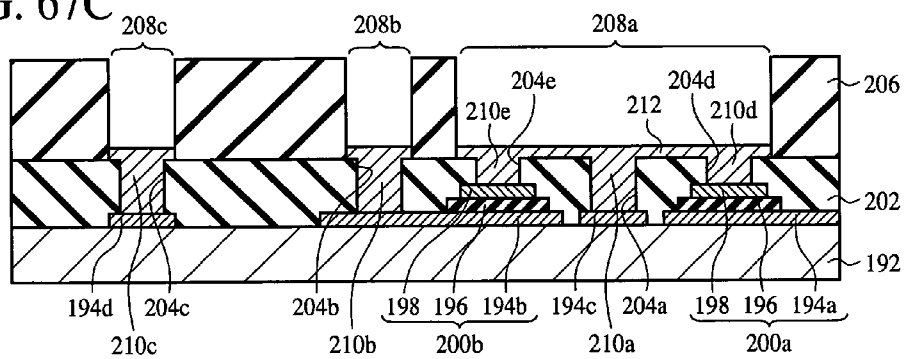

Next, the openings 208*a*-208*c* are formed in the photoresist film 206 by photolithography (see FIG. 67C). The opening 208*a* is for forming the partial electrode 210*a*, the conductor plug 210*d*, the conduction plug 210*e* and the interconnection 212. The opening 208*b* is for forming the partial electrode 210*b*. The opening 208*c* is for forming the partial electrode 210*c*.

Next, a plated film of, e.g., Cu is formed in the openings 204*a*-204*e* and the openings 208*a*-208*c* by electroplating. The thickness of the plated film, e.g., about 6 μm. Thus, the partial electrode 210*a*, the conductor plugs 210*d*, 210*e* and the interconnection 212 of the plated film are formed in the openings 204*a*, 204*d*, 204*e* and the opening 208*a*. The partial electrode 210*b* of the plated film is formed in the opening 204*b* and the opening 208*b*. The partial electrode 210*c* of the plated film is formed in the opening 204*c* and the opening 208*c* (see FIG. 67C).

Figure 67D:
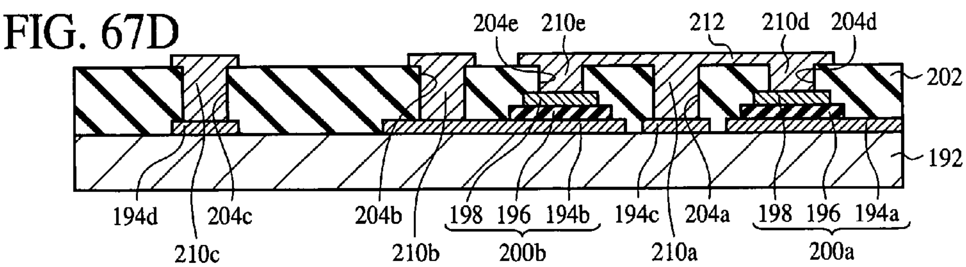

Next, the photoresist film 206 is removed (see FIG. 67D).

Next, the exposed seed layer (not illustrated) is removed by wet etching. The etchant is, e.g., a 1-10% ammonium persulfate aqueous solution. The etching period of time is, e.g., about 2 minutes. In etching the seed layer, the surfaces of the partial electrode 210*a*, the conductor plugs 210*d*, 210*e* and the interconnection 212 are a little etched, but because of the thickness of the seed layer which is sufficiently smaller than the size of the partial electrode 210*a*, the conductor plugs 210*d*, 210*e* and the interconnection 212, the seed layer can be etched in a short period of time, the partial electrode 210*a*, the conductor plugs 210*d*, 210*e* and the interconnection 212 are kept form being excessively etched.

Figure 67E:
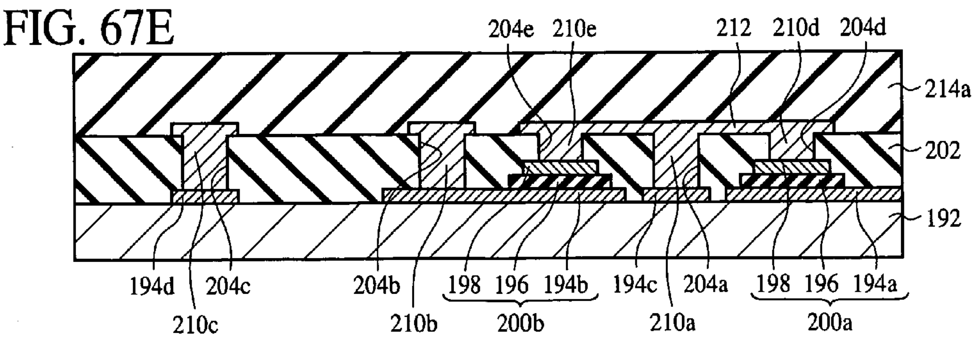

Then, the resin layer 214*a* is formed on the entire surface by, e.g., spin coating (FIG. 67E). The thickness of the resin layer 214*a* is, e.g., about 5 μm. The resin layer 214*a* is formed of, e.g., photosensitive BCB resin. The BCB resin can be a BCB resin solution by, e.g., Dow Chemical Company (trade name; CYCLOTENE 4024-40), or others. As described above, the BCB resin is a thermosetting resin having the curing characteristic that the BCB is liquid before the thermal process, is semi-cured as the cure is advanced by the thermal process and is completely cured as the cure is further advanced by the thermal process. As described above, conditions for the thermal process for semi-curing the BCB resin are 180° C. and about 1 hour, conditions for the thermal processing for completely curing the BCB resin are 250° C. and about 1 hour, and conditions for applying the resin 32*a* of the BCB resin are, e.g., 200 rpm and 30 seconds.

Thus, the resin layer 214*a* is formed on the resin layer 202 with the partial electrodes 210*a*-210*c*, the conductor plugs 210*d*, 210*e* and the interconnection 212 formed on. Immediately after the resin layer 214*a* has been applied, where the thermal process has not been done yet, the resin layer 214*a* is liquid.

Figure 68A:
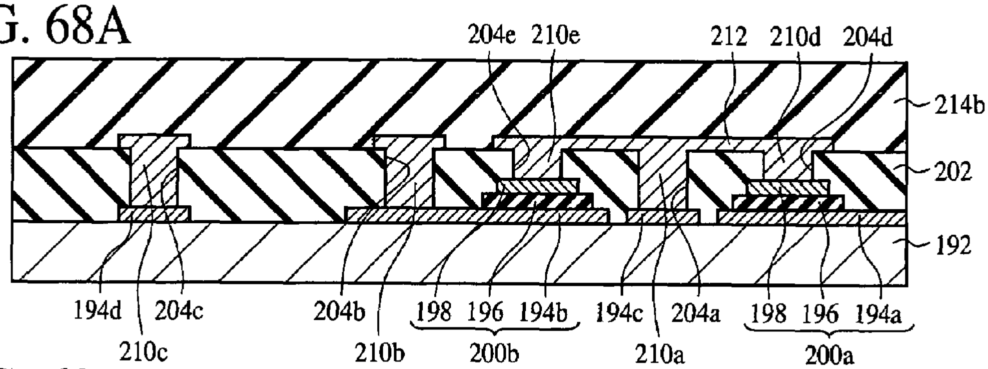
FIGS. 68A to 68D are sectional views of the interposer and the electronic device according to the third embodiment of the present invention in the steps of the method for fabricating the interposer and the electronic device, which illustrate the method (Part 3).

Next, the thermal processing is conducted under the conditions for semi-curing the resin layer 214*a* to thereby change the non-cured resin layer 214*a* into the semi-cured resin layer 214*b* (see FIG. 68A). The curing percentage of the resin layer 214*b* is preferably 40-80%. The curing percentage of the resin layer 214*b* is about 50-60% here. The thermal processing temperature is, e.g., about 180° C., and the thermal processing period of time is, e.g., about 1 hour. The surrounding atmosphere for the thermal process is, e.g., $N_2$ atmosphere.

The thermal processing conditions are not limited to the above and can be suitably set. However, the thermal processing temperature is set preferably higher than the boiling point of the solvent of the BCB resin solution.

Figure 68B:
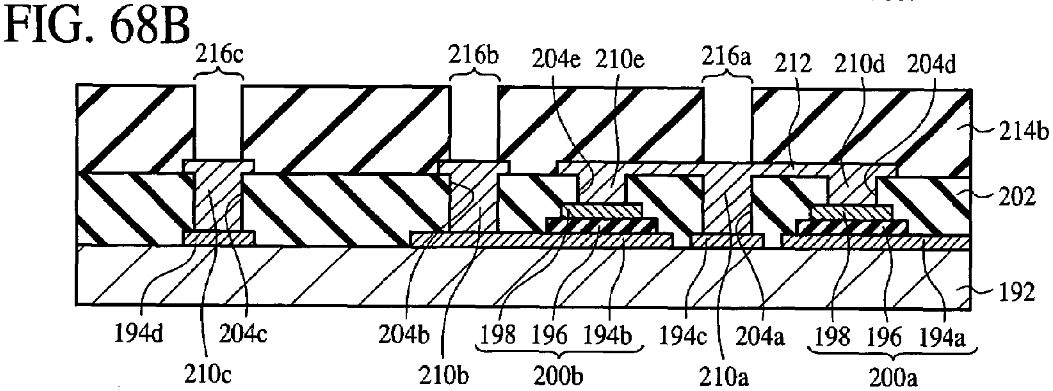

Next, the openings 216*a*-216*c* are formed in the resin layer 214*b* by photolithography (see FIG. 68B). In the opening 216*a* is for the partial electrode 220*a* to be a part of the through-electrode 81*a* is to be buried in, and the opening 216*a* is formed down to the partial electrode 210*a*. In the opening 216*b*, the partial electrode 220*b* to be a part of the through-electrode 81*b* is to be buried in, and the opening 216*b* is formed down to the partial electrode 210*b*. In the opening 216*c*, the partial electrode 220*c* to be a part of the through-electrode 81*c* is to be buried in, and the opening 216*c* is formed down to the partial electrode 210*c*.

Then, the seed layer (not illustrated) of Cr film and Cu film sequentially laid is formed on the entire surface by, e.g., sputtering.

Next, a photoresist film 218 is formed on the entire surface by spin coating.

Figure 68C:
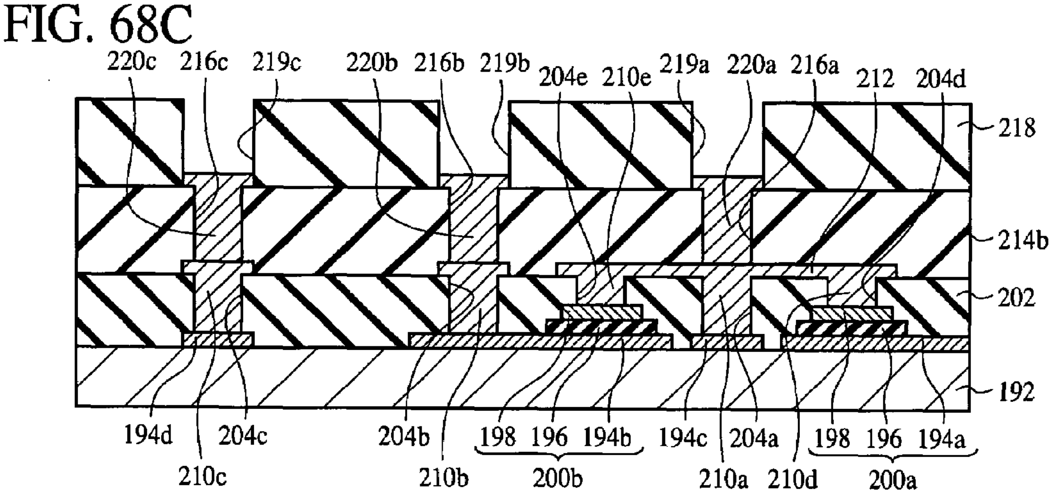

Next, the openings 219*a*-219*c* are formed in the photoresist film 218 by photolithography (see FIG. 68C). The openings 219*a*-219*c* are for the partial electrodes 220*a*-220*c* respectively to be formed in.

Next, a plated film of, e.g., Cu is formed in the openings 219*a*-219*c* and the openings 216*a*-216*c* by electroplating.

The thickness of the plated film is, e.g., about 6 μm. Thus, the partial electrodes 220*a*-220*c* of the plated film are formed in the openings 219*a*-219*c* and the openings 216*a*-216*c*.

Figure 68D:
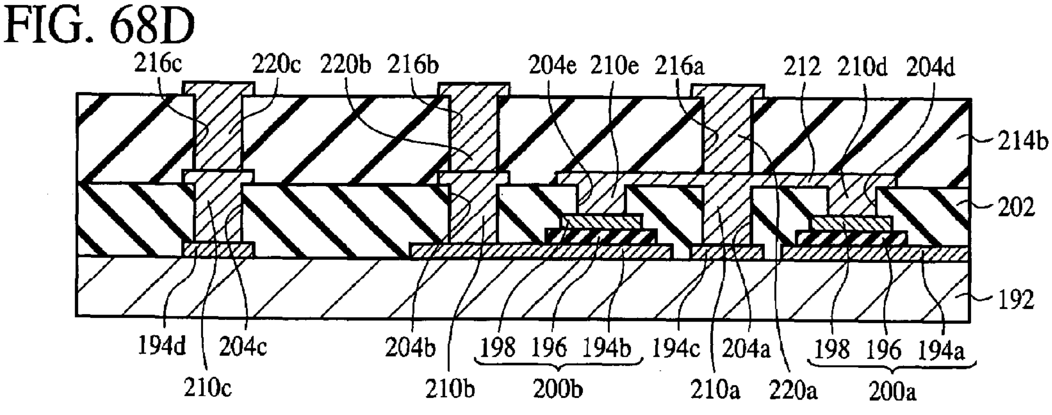

Then, the photoresist film 218 is removed (see FIG. 68D)

Then, the exposed seed layer (not illustrated) is removed by wet etching. The etchant is, e.g., an about 1-10% ammonium persulfate aqueous solution. The etching period of time is, e.g., about 2 minutes. In etching off the seed layer, the surfaces of the partial electrodes 220*a*-220*c* are a little etched, but because of the thickness of seed layer which is sufficiently smaller than the size of the partial electrodes 220*a*-220*c*, the seed layer can be etched in a short period of time, and partial electrodes 220*a*-220*c* are never excessively etched.

Then, the semiconductor substrate 192 is secured to the chuck table 42 (see FIG. 8A) of an ultra-precision lathe 40 (see FIG. 8A) by vacuum suction. The semiconductor substrate 192 has the underside, i.e., the surface where the partial electrodes 220*a*-220*c*, etc. are not formed secured to the chuck table 42.

Next, while the semiconductor substrate 192 is being rotated, the upper parts of the partial electrodes 220*a*-220*c* and the upper part of the resin layer 214*b* are cut with the cutting tool 44 of diamond (see FIG. 69A). At this time, rough cut is conducted until the thickness of the resin layer 214*b* becomes about 3 μm.

Conditions for the rough cut of the upper parts of the partial electrodes 220*a*-220*c* and the upper part of the resin layer 214*b* are as exemplified below. The rake angle of the bit 44 is 0 degree. The rotation number of the chuck table 42 is, e.g., about 2000 rpm. At this time, the cut speed is, e.g., about 20 m/second. The cut amount of the cutting tool 44 is, e.g., about 2-3 μm. The feed of the cutting tool 44 is, e.g., 20 μm/rotation.

The resin layer 214*b* which has been compression-deformed in the cut restores to some extent after the cut. On the hand, the partial electrodes 220*a*-220*c*, which are formed of metal, such as Cu or others, are not substantially compression-deformed in the cut. Accordingly, the height of one surface of the resin layer 214*b* (opposite to the surface contacting the resin layer 202) is larger than the height of one surfaces of the partial electrodes 220*a*-220*c* (opposite to the surfaces contacting the partial electrodes 210*a*-210*c*).

Figure 69B:
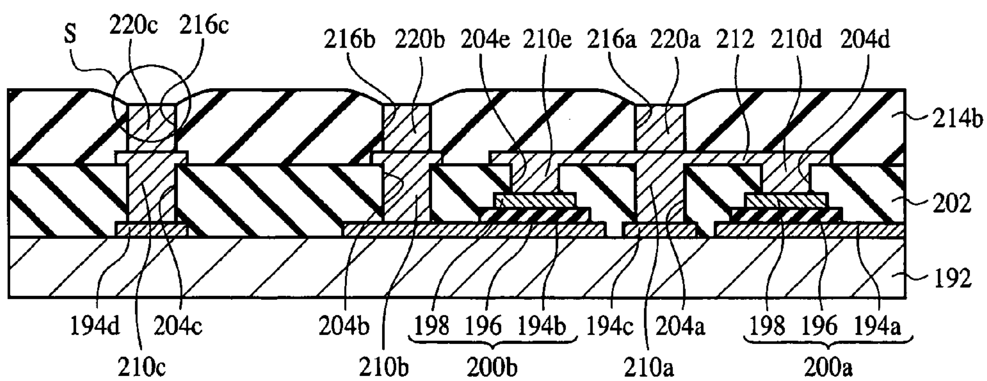
Figure 69C:
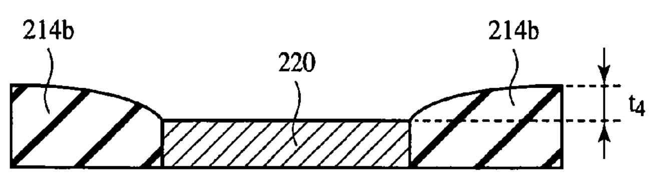

Immediately after the rough cut, as illustrated in FIGS. 69B and 69C, the difference $t_4$ between the height of one surface of the resin layer 214*b* (opposite to the surface contacting the resin layer 202) and the height of one surfaces of the partial electrodes 220*a*-220*c* (opposite to the surfaces contacting the partial electrodes 210*a*-210*c*) is about several hundred nanometer, which is relatively large. FIG. 69C is an enlarged sectional view of the part in the circle S in FIG. 69B.

When the difference $t_4$ between the height of one surface of the resin layer 214*b* (opposite to the surface contacting the resin layer 202) and the height of one surfaces of the partial electrodes 220*a*-220*c* (opposite to the surfaces of the partial electrodes 210*a*-210*c*) is such relatively large, the height of one surface of the resin layer 214*b* (opposite to the surface contacting the resin layer 202) remains larger than the height of one surfaces of the partial electrodes 220*a*-220*c* (opposite to the surfaces of the partial electrodes 210*a*-210*c*) even if the resin layer 214*b* is cured and shrunk by thermal processing in a later step. In such case, it is often that the partial electrodes 220*a* cannot be connected to the conduction film 116*c*, the partial electrode 220*b* cannot be connected to the capacitor electrode 116*b*, and the partial electrode 220*c* cannot be connected to the conduction film 116*c*.

Figure 70A:
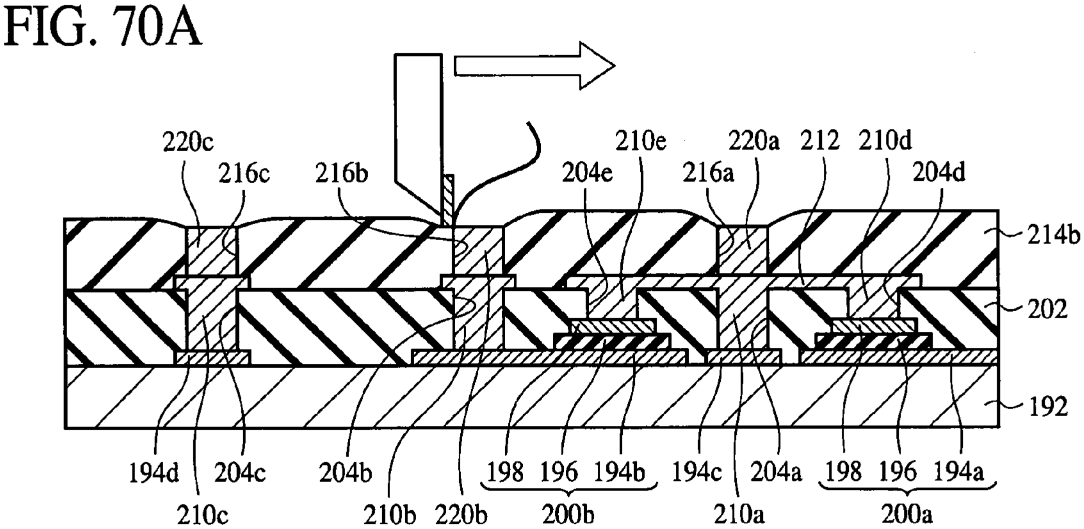
FIGS. 70A to 70C are sectional views of the interposer and the electronic device according to the third embodiment of the present invention in the steps of the method for fabricating the interposer and the electronic device, which illustrate the method (Part 5).

To prevent this, the rough cut is followed finish cut so that the difference $t_4$ between the height of one surface of the resin layer 214*b* (opposite to the surface contacting the resin layer 202) and the height of one surfaces of the partial electrodes 220*a*-220*c* (opposite to the surfaces contacting the partial electrodes 210*a*-210*c*) becomes a suitable value (see FIG. 70A).

Conditions for finish-cutting the upper parts of the partial electrodes 220*a*-220*c* and the upper part of the resin layer 214*b* are as exemplified below.

The rake angle of the cutting tool 44, the rotation number of the chuck table 42 and the feed of the cutting tool 44 for the finish cut are the same as those for the rough cut of the resin layer 214*b*. It is not necessary to intentionally change the setting for the finish cut following the rough cut.

The cut amount of the cutting tool 44 is, e.g., 500 nm. The cut amount of the cutting tool 44 is set so small, so that the difference $t_4$ between the height of one surface of the resin layer 214*b* (opposite to the surface contacting the resin layer 202) and the height of one surfaces of the partial electrodes 220*a*-220*c* (opposite to the surfaces contacting the partial electrodes 210*a*-210*c*) can be suitably small.

The cut amount of the cutting tool 44 is not essentially 500 nm. For example, the cut amount of the cutting tool 44 may be set at about 10-100 nm.

Even the finish cut cannot make the difference $t_4$ between the height of one surface of the resin layer 214*b* (opposite to the surface contacting the resin layer 202) and the height of one surfaces of the partial electrodes 220*a*-220*c* (opposite to the surfaces contacting the partial electrodes 210*a*-210*c*) zero. This is because the resin layer 214*b* is compression-deformed to some extent also in the finish cut, and after the finish cut, the resin layer 214*b*, which has been compression-deformed in the finish cut, restores to some extent. FIG. 70C is an enlarged sectional view of the part in the circle S in FIG. 70B.

It is preferable that the finish-cut is conducted so that the difference $t_4'$ between one surface of the resin layer 214*b* (opposite to the surface contacting the resin layer 202) and the height of one surfaces of the partial electrodes 220*a*-220*c* (opposite to the surfaces contacting the partial electrodes 210*a*-210*c*) becomes about 0-100 nm.

For the following reason, the difference $t_4'$ between the height of one surface of the resin layer 214*b* (opposite to the surface of the resin layer 202) and the height of one surfaces of the partial electrodes 220*a*-220*c* (opposite to the surfaces contacting the partial electrodes 210*a*-210*c*) is 0-100 nm.

That is, when the difference $t_4'$ between the height of one surface of the resin layer 214*b* (opposite to the surface contacting the resin layer 202) and the height of one surfaces of the partial electrodes 220*a*-220*c* (opposite to the surfaces contacting the partial electrodes 210*a*-210*c*) is 100 nm or above, the height of one surface of the resin layer 214*b* (opposite to the surface contacting the resin layer 202) often remains larger than the height of one surface of partial electrode 220*a*-220*c* (opposite to the surfaces contacting the partial electrodes 210*a*-210*c*) even if the resin layer 214*b* is cured and shrunk by the thermal process in a later step, as described above. In such case, the partial electrode 220*a* cannot be connected to the conduction film 116*c*, the partial electrode 220*b* cannot be connected to the capacitor electrode 116*b*, and the partial electrode 220*c* cannot be connected to the conduction film 116*c*.

On the other hand, when the height of one surface of the resin layer 214*b* (opposite to the surface contacting the resin layer 202) is smaller than the height of one surfaces of the partial electrodes 220*a*-220*c* (opposite to the surfaces contacting the partial electrodes 210*a*-210*c*), the resin layer 214*b* is shrunk without being surely adhered to the resin layer 124, and it is difficult to adhere the resin layer 214*b* to the resin layer 124.

For this reason, it is preferable that the difference $t_4'$ between the height of one surface of the resin layer 214*b* (opposite to the surface contacting the resin layer 202) and the height of one surfaces of the partial electrodes 220*a*-220*c* (opposite to the surfaces contacting the partial electrodes 210*a*-210*c*) is 0-100 nm.

When fins are formed on the partial electrodes 220*a*-220*c* in the cut, there is a risk that the neighboring or adjacent ones of the partial electrodes 220*a*-220*c* may be short-circuited by the fins. Accordingly, it is preferable to suitably set conditions for the cut so that no fins are formed on the partial electrodes 220*a*-220*c* in the cut.

Figure 70B:
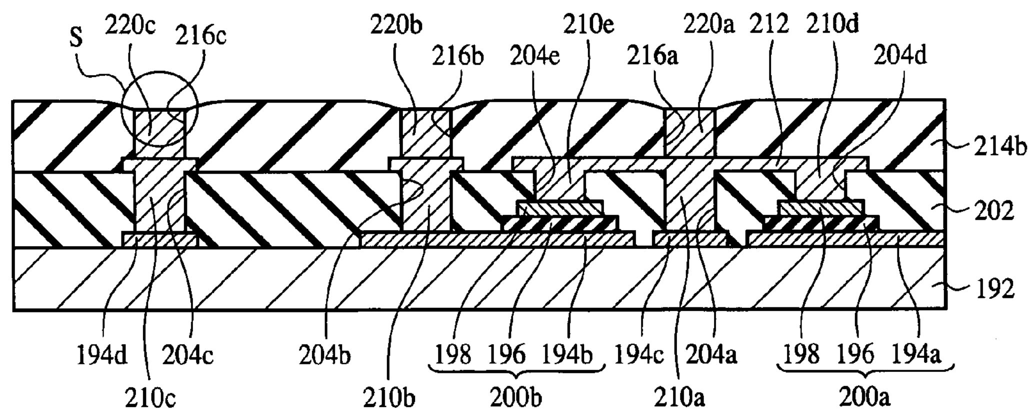
Figure 70C:
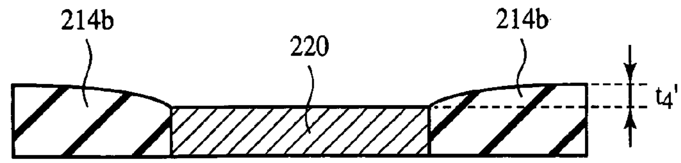
Figure 71:
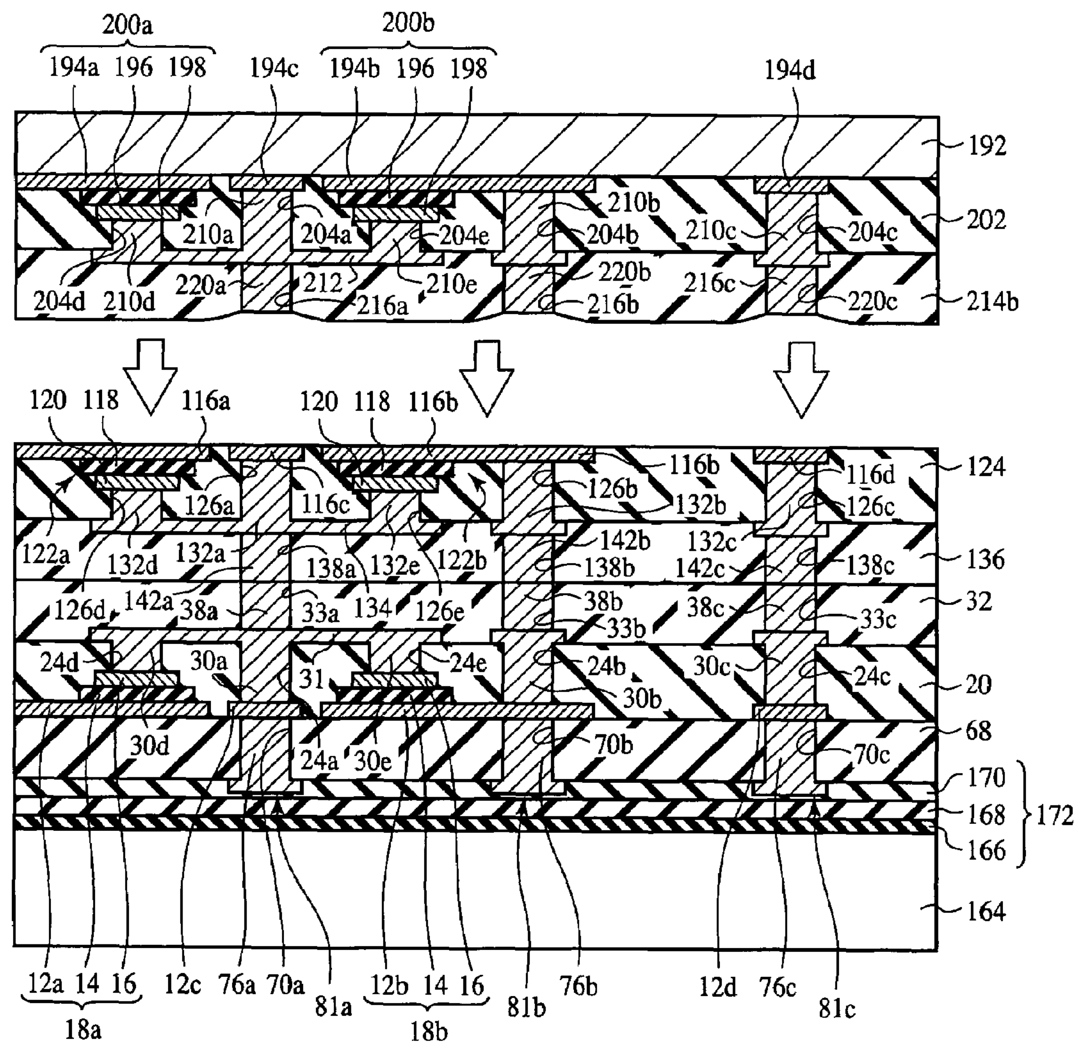
FIG. 71 is a sectional view of the interposer and the electronic device according to the third embodiment of the present invention in the steps of the method for fabricating the interposer and the electronic device, which illustrates the method (Part 6).

Thus, the upper parts of the partial electrodes 220*a*-220*c* and the upper part of the resin layer 214*b* are cut (see FIGS. 70B and 70C).

It is possible that the cutting processing can be made by rotating a wheel (not illustrated) with the cutting tool 44 mounted on with the semiconductor substrate 192 being secured (not illustrated).

Then, the semiconductor substrate 10 is cut into a prescribed size with a thin blade formed of diamond particles or others combined with a binder (not illustrated).

Similarly, the semiconductor substrate 192 is cut into a prescribed size with the thin blade (not illustrated).

Next, as illustrated in FIG. 71A, the supporting substrate 164 and the semiconductor substrate 192 are opposed to each other. At this time, the supporting substrate 164 and the semiconductor substrate 192 are opposed to each other with the resin layer 124 formed on the supporting substrate 164 and the resin layer 214*b* formed on the semiconductor substrate 192 positioned near each other.

Figure 72A:
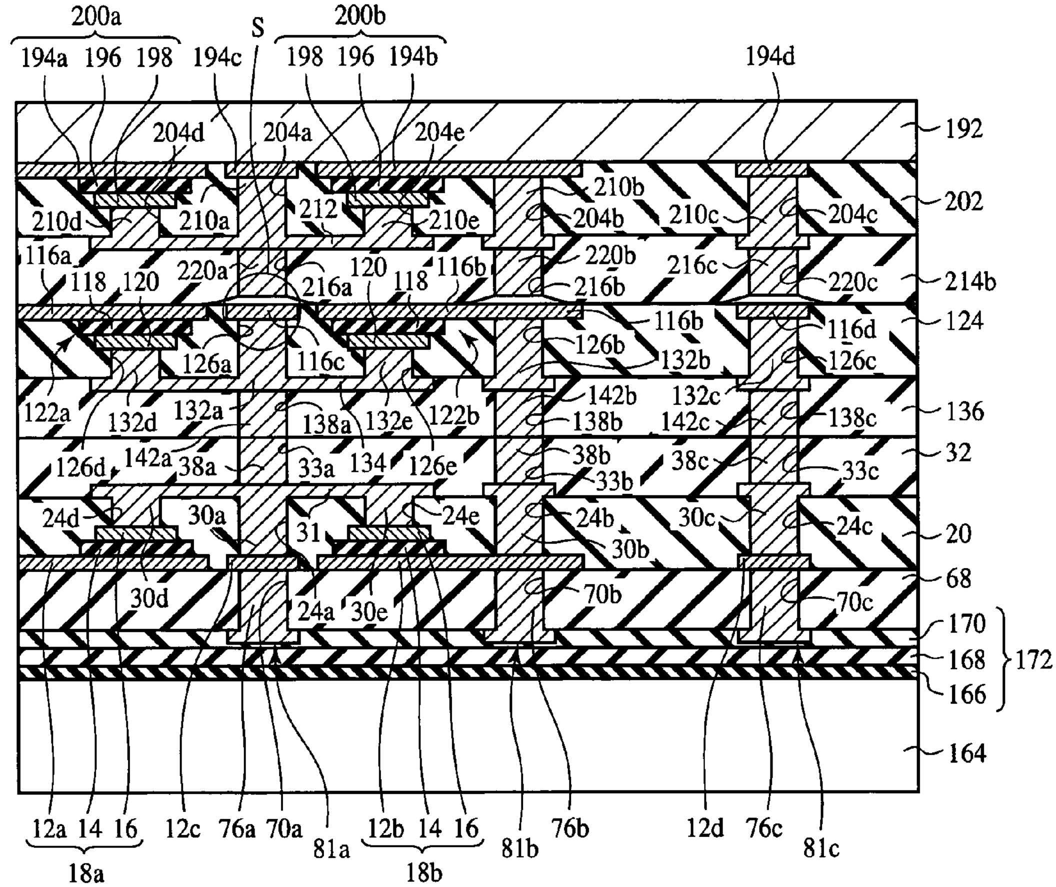
FIGS. 72A and 72B are sectional views of the interposer and the electronic device according to the third embodiment of the present invention in the steps of the method for fabricating the interposer and the electronic device, which illustrate the method (Part 7).
Figure 72B:
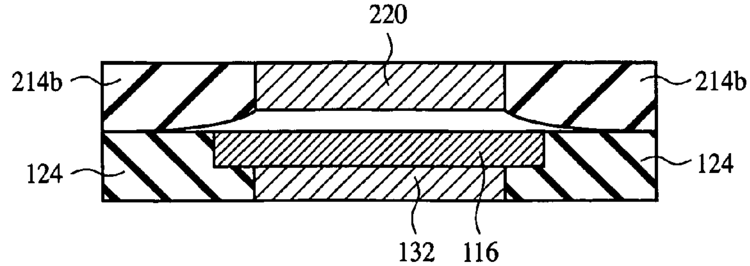

Next, the supporting substrate 164 and the semiconductor substrate 192 are positioned near each other. FIG. 72A is a sectional view of the resin layer 124 formed on the supporting substrate 164 and the resin layer 214*b* formed on the semiconductor substrate 192 positioned near each other. FIG. 72B is an enlarged sectional view of the part in the circle S in FIG. 72A.

Figure 73A:
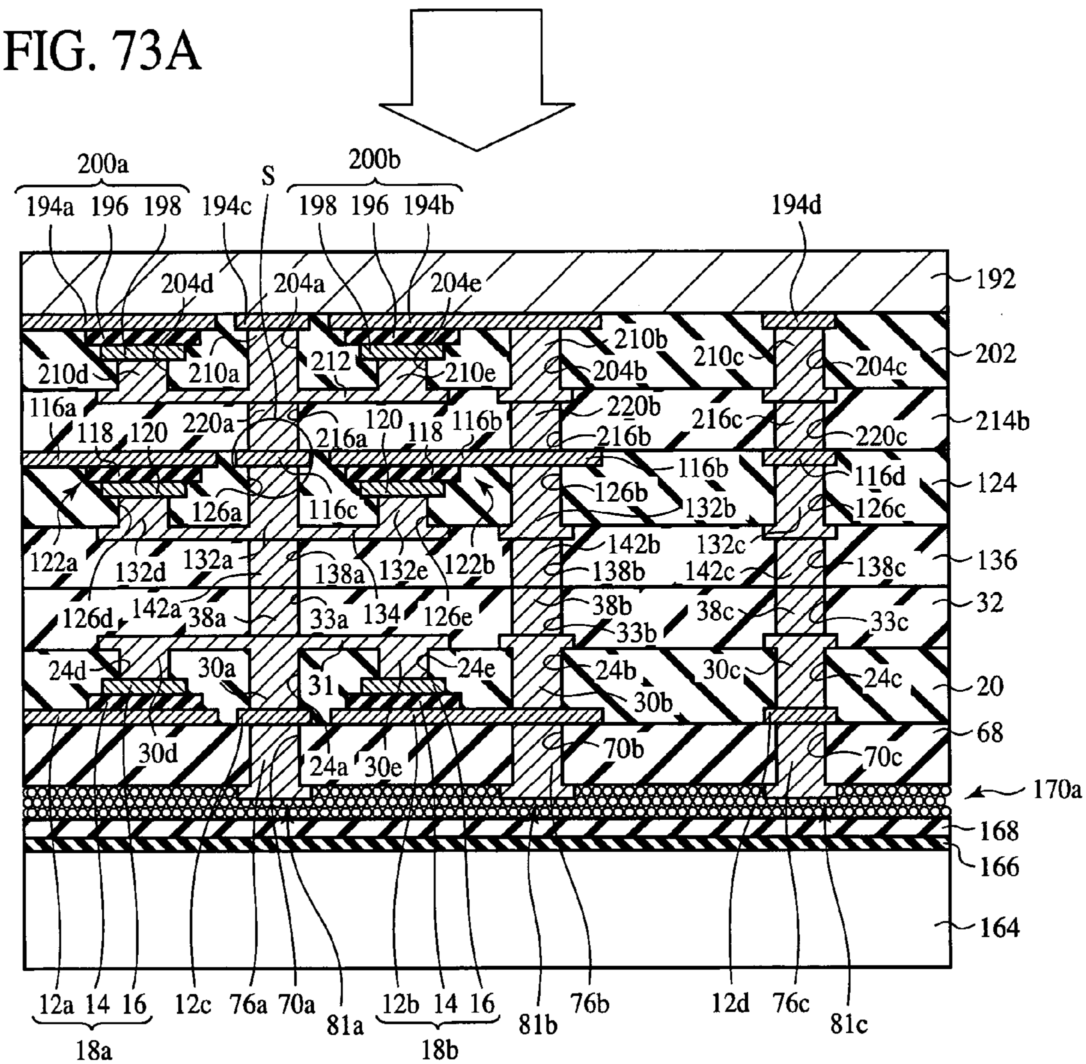
FIGS. 73A and 73B are sectional views of the interposer and the electronic device according to the third embodiment of the present invention in the steps of the method for fabricating the interposer and the electronic device, which illustrate the method (Part 8).
Figure 73B:
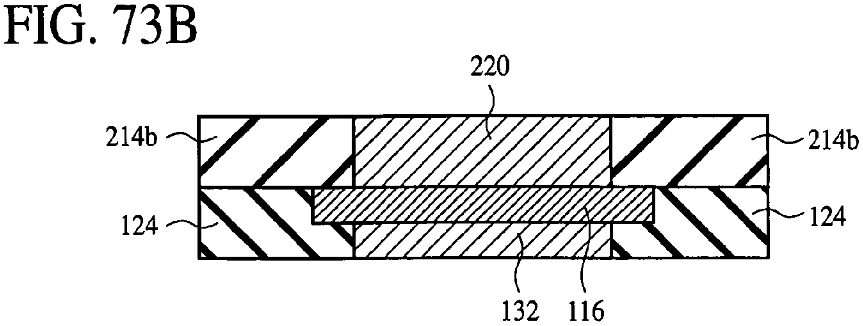

Next, thermal processing is conducted while a pressure is being applied from the outside to the supporting substrate 164 and the semiconductor substrate 192 to thereby close contact the capacitor electrode 116*c* on the supporting substrate 164 and the partial electrode 220*a* on the semiconductor substrate 192 with each other, the capacitor electrode 116*b* on the supporting substrate 164 and the partial electrode 220*b* on the semiconductor substrate 192 with each other, the conduction film 116*d* on the supporting substrate 164 and the partial electrode 220*c* on the semiconductor substrate 192, the resin layer 124 on the supporting substrate 164 and the resin layer 214*b* on the semiconductor substrate 192 with each other (see FIGS. 73A and 73B). FIG. 73B is an enlarged sectional view of the part in the circle S in FIG. 73A.

An oven (thermal processing apparatus), for example, is used for the thermal processing. The thermal processing temperature is, e.g., about 250° C. The thermal processing period of time is, e.g., about 1 hour. The pressure is, e.g., about 10 kPa. The thermal process under these conditions adheres the resin layer 214*b* to the resin layer 124 without failure. The thermal processing shrinks the resin layer 214*b*. The resin layer 214*b* is adhered to the resin layer 124 while being shrunk, whereby due to the shrinkage of the resin layer 214*b*, the conduction film 116*c* and the partial electrode 220*a* are jointed to each other, the capacitor electrode 116*b* and the partial electrode 220*b* are jointed to each other, and the conduction film 116*d* and the partial electrode 220*c* are jointed to each other. Due to the shrinkage of the resin layer 214, the conduction film 116*c* and the partial electrode 220*a* are jointed to each other, the capacitor electrode 116*b* and the partial electrode 220*b* are jointed to each other, and the conduction film 116*d* and the partial electrode 220*c* are jointed to each other, which makes it unnecessary to apply a large pressure from the outside to the supporting substrate 164 and the semiconductor substrate 192.

Figure 74A:
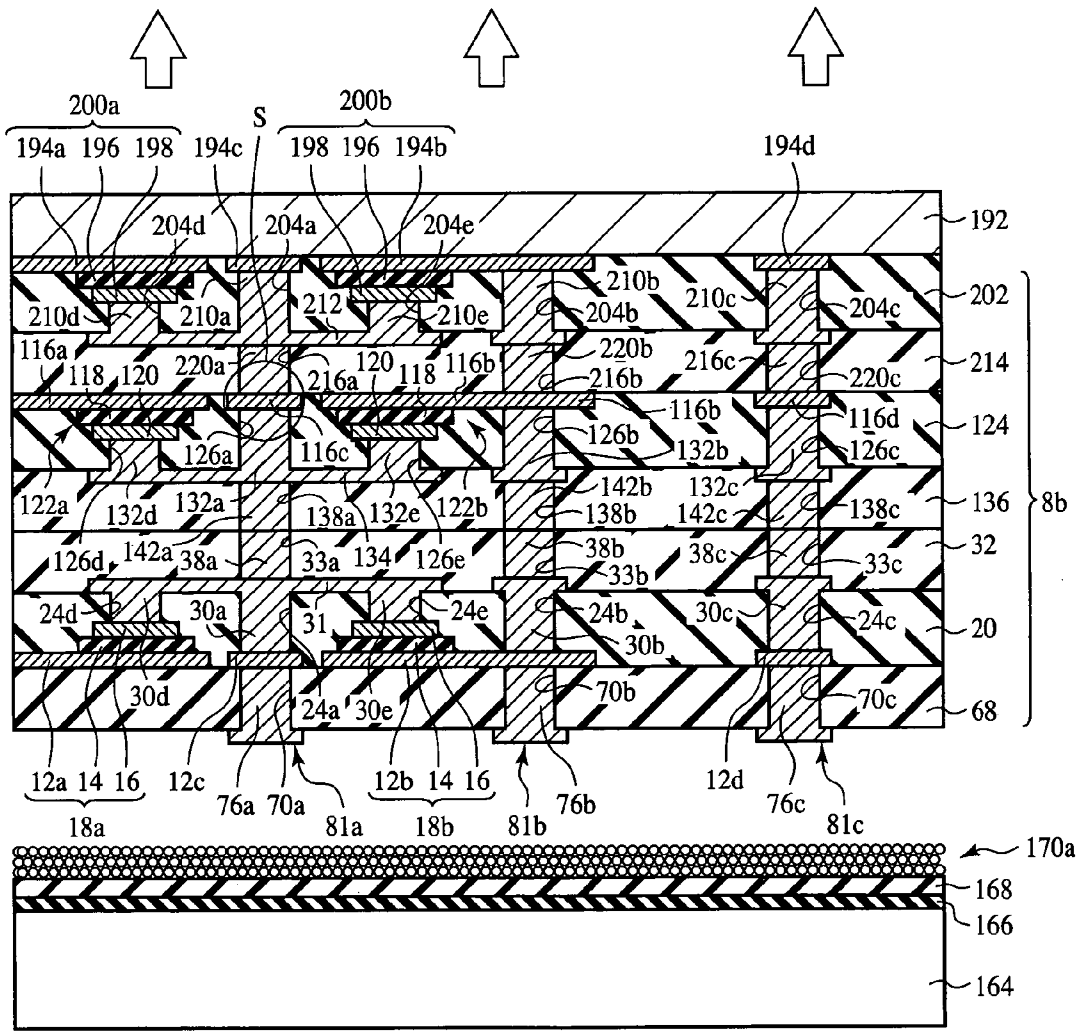
FIGS. 74A and 74B are sectional views of the interposer and the electronic device according to the third embodiment of the present invention in the steps of the method for fabricating the interposer and the electronic device, which illustrate the method (Part 9).
Figure 74B:
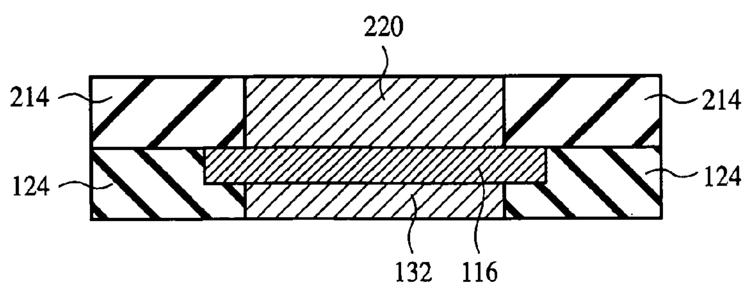

Thus, the semi-cured resin layer 214*b* becomes the completely cured resin layer 214 (see FIGS. 74A and 74B). FIG. 74B is an enlarged sectional view of the part in the circle S in FIG. 74A. Because of the resin layer 214, which has been completely cured, even when the application of the pressure is stopped, the conduction film 116*c* and the partial electrode 220*a* are never part from each other, the capacitor electrode 116*b* and the partial electrode 220*b* never part from each other, and the conduction film 116*d* and the partial electrode 220*c* never part from each other.

The thermal processing temperature is set 250° C., and the thermal processing period of time is set at 1 hour here. However, the thermal processing temperature and the thermal processing period of time are not limited to them. With the thermal processing temperature set higher, the thermal processing period of time may be shorter. For example, with the thermal processing temperature set at about 300° C., the thermal processing period of time may be about 3 minutes. With the thermal processing period of time set lower, the thermal processing period of time may be set longer. For example, with the thermal processing temperature set at about 200° C., the thermal processing period of time may be set at about 7-8 hours.

However, with the thermal processing temperature set higher, the film quality of the resin layer 214 is not always good. With the thermal processing temperature set lower, the thermal processing takes longer time. In view of the film quality of the resin layer 214, the throughput, etc., it is preferable to set the thermal processing temperature at about 250° C. and the thermal processing period of time at about 1 hours.

The pressure to be applied to the supporting substrate 164 and the semiconductor substrate 192 is set at about 10 kPa here. However, the pressure to be applied to the supporting substrate 164 and the semiconductor substrate 192 is not essentially about 10 kPa. The pressure may be set suitably in the range of, e.g., about 1-100 kPa.

Next, the supporting substrate 222 is prepared. The supporting substrate 222 is, e.g., a glass supporting substrate. The supporting substrate 222 is for supporting the base 8*b* of the resin layers 68, 20, 32, 136, 124, 202, etc. in removing the semiconductor substrate 192 by polish or others in a later step.

Then, a heat foaming type double-sided tape 230 is adhered to the supporting substrate 222. As is the heat foaming type double-sided tape 66 described above, the heat foaming type double-sided tape 120 includes a base 226 of, e.g., polyester film, a heat-releasable adhesive layer 224 formed on one primary surface of the base 226, and a pressure-sensitive adhesive layer 228 formed on the other primary surface of the base 226. As does the heat foaming type double-sided tape 66 described above, the heat foaming type double-sided tape 230 can be a heat foaming type double-sided tape by, e.g., NITTO DENKO CORPORA- TION (trade name: RIVA ALPHA) or others. When the heat foaming type double-sided tape 230 is adhered to the supporting substrate 222, the pressure-sensitive adhesive layer 224 of the heat foaming type double-sided tape 230 is adhered to the supporting substrate 222.

Figure 75:
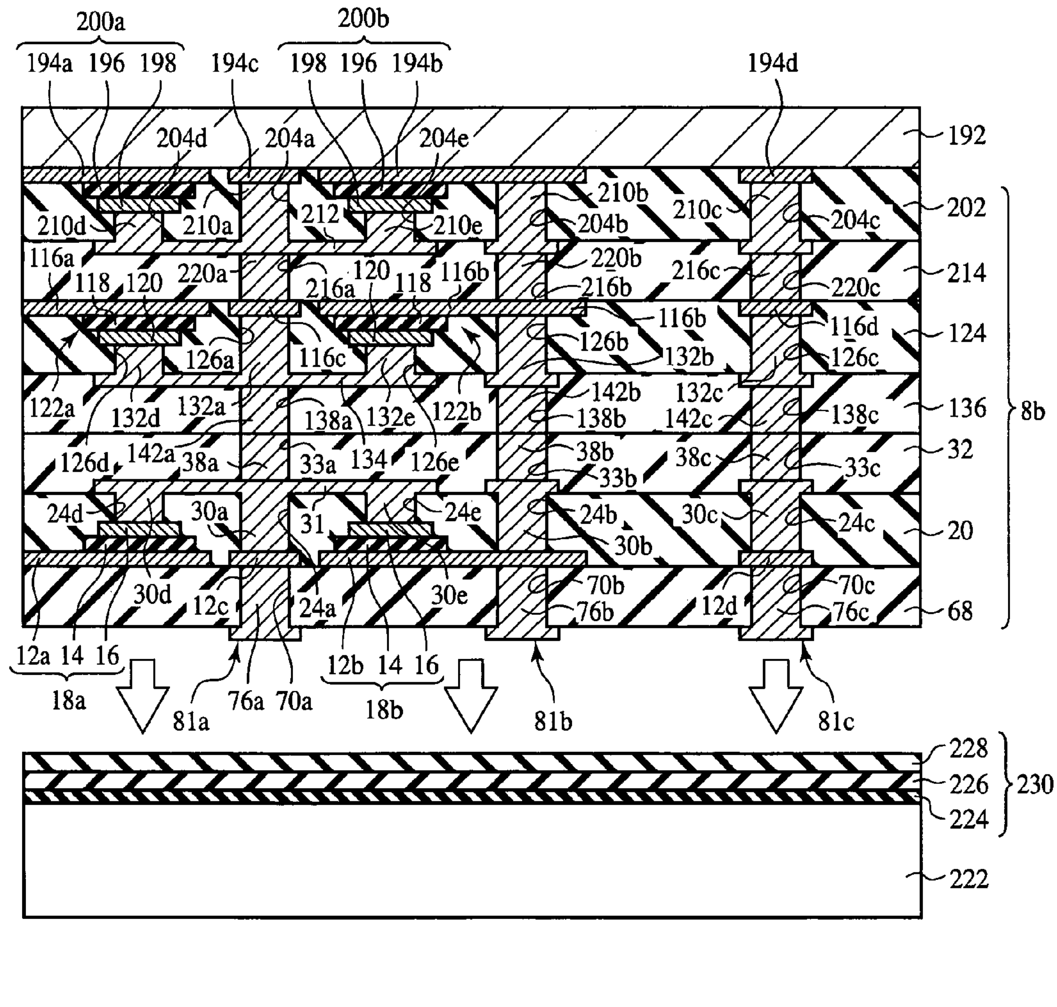
FIG. 75 is a sectional view of the interposer and the electronic device according to the third embodiment of the present invention in the steps of the method for fabricating the interposer and the electronic device, which illustrates the method (Part 10).

Next, as illustrated in FIG. 75, the semiconductor substrate 192 and the supporting substrate 222 are opposed to each other. At this time, the semiconductor substrate 192 and the supporting substrate 222 are opposed to each other with one surface of the resin layer 68 (opposite to the surface contacting the resin layer 20) and one surface of the heat-releasable adhesive layer 150 of the heat foaming type double-sided tape 230 (opposite to the surface contacting the base 148) positioned near each other.

Figure 76A:
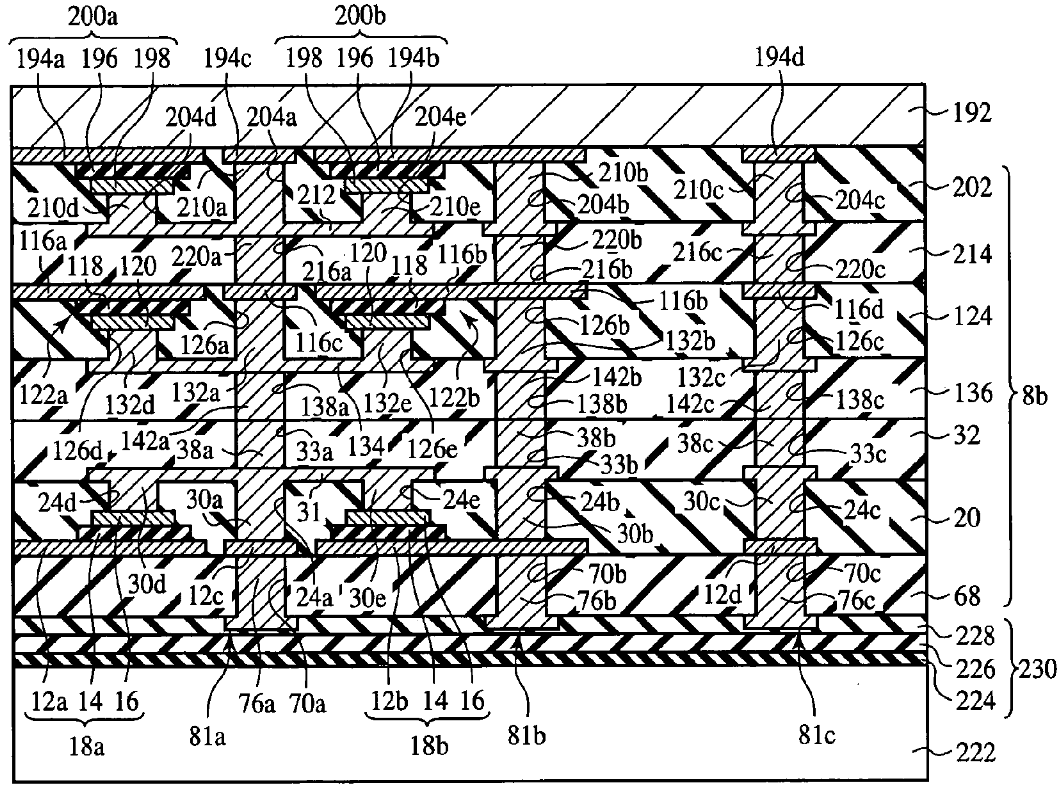
FIGS. 76A and 76B are sectional views of the interposer and the electronic device according to the third embodiment of the present invention in the steps of the method for fabricating the interposer and the electronic device, which illustrate the method (Part 11).
Figure 76B:
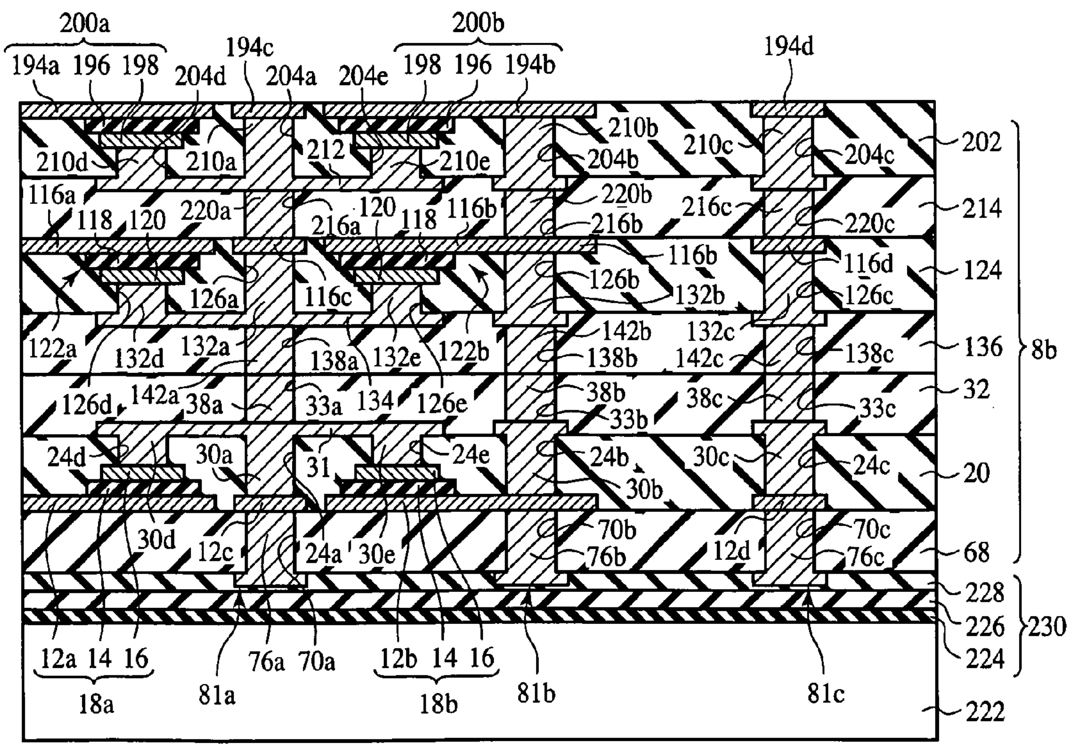

Then, as illustrated in FIG. 76A, one surface of the resin layer 68 (opposite to the surface contacting the resin layer 20) and the one surface of the heat-releasable adhesive layer 228 of the heat foaming type double-sided tape 230 (opposite to the surface contacting the base 226) are adhered to each other.

Next, the semiconductor substrate 192 is polished by, e.g., CMP until the thickness of the semiconductor substrate 192 becomes, e.g., about 100 μm. At this time, all the semiconductor substrate 192 is not removed so as to keep the capacitor electrodes 194*a*, 194*b*, the conduction films 194*c*, 194*d* and the resin layer 202 from being damaged by the polish, as described above.

Next, the semiconductor substrate 192 remaining on one surface of the resin layer 202 (opposite to the surface contacting the resin layer 214) is etched off with, e.g., hydrofluoric acid.

Thus, the semiconductor substrate 192 is removed while the capacitor electrodes 200*a*, 200*b* and the conduction films 194*c*, 194*d* are being kept from being damaged.

On the other hand, the semiconductor substrate 46 is prepared (see FIG. 11A).

Hereafter, the step of cutting the upper parts of the partial electrodes 56*a*-56*c* and the upper part of the resin layer 48*b* including this step are the same as those of the method for fabricating the interposer according to the first embodiment described above with reference to FIG. 11B to FIG. 15B, and their explanation will be not repeated.

Figure 77:
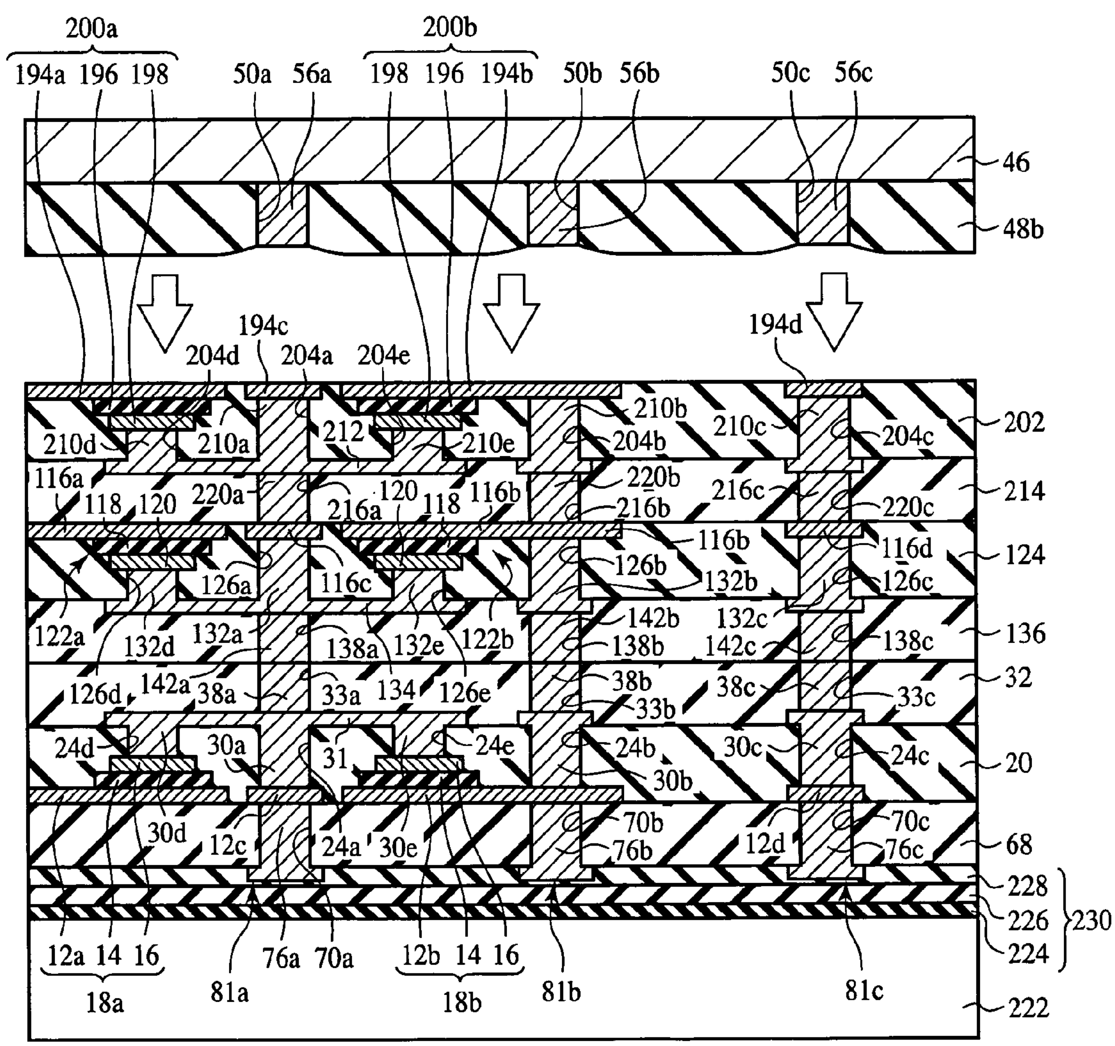
FIG. 77 is a sectional view of the interposer and the electronic device according to the third embodiment of the present invention in the steps of the method for fabricating the interposer and the electronic device, which illustrates the method (Part 12).

Next, as illustrated in FIG. 77, the supporting substrate 222 and the semiconductor substrate 46 are opposed to each other. At this time, the supporting substrate 222 and the semiconductor substrate 46 are opposed to each other with the resin layer 202 and the resin layer 48*b* positioned near each other and with the partial electrodes 210*a*-210*c* and the partial electrodes 56*a*-56*c* being in alignment with each other.

Figure 78A:
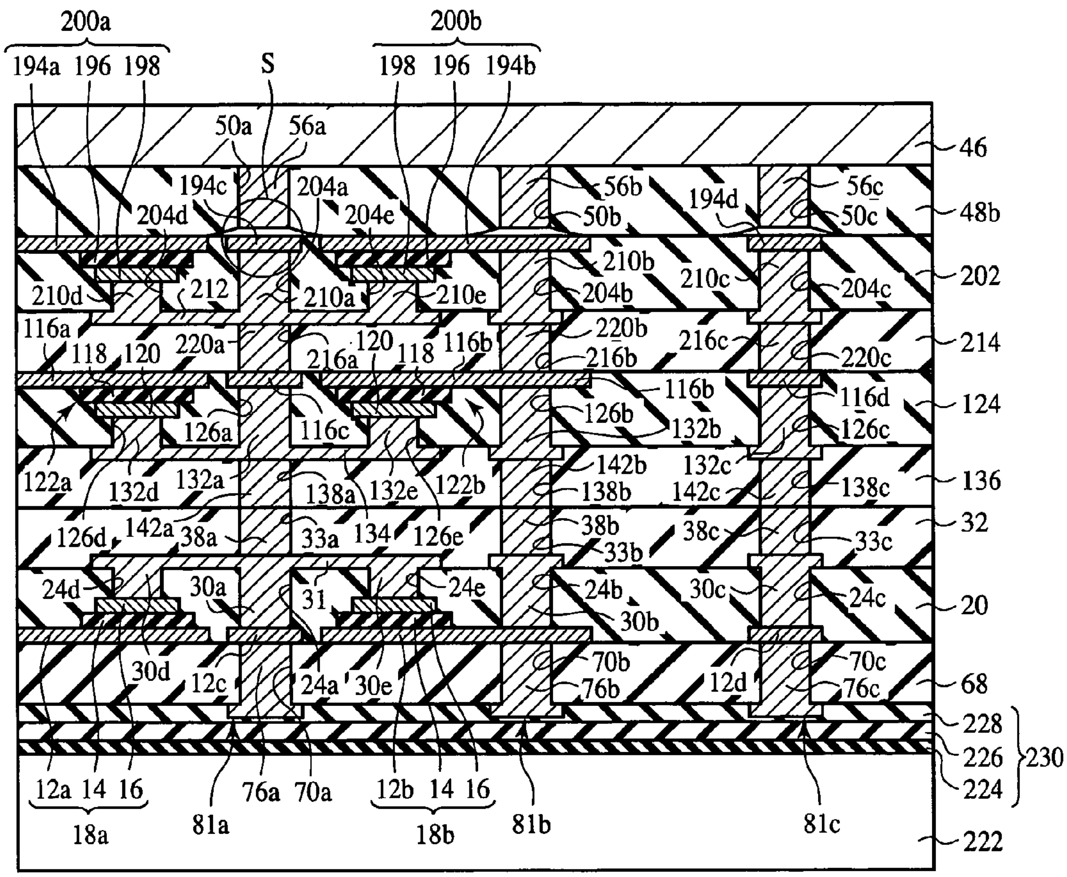
FIGS. 78A and 78B are sectional views of the interposer and the electronic device according to the third embodiment of the present invention in the steps of the method for fabricating the interposer and the electronic device, which illustrate the method (Part 13).
Figure 78B:
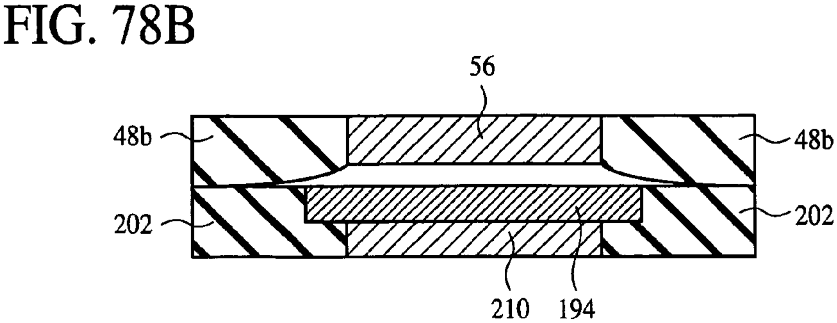

Next, as illustrated in FIGS. 78A and 78B, the semiconductor substrate 46 and the supporting substrate 222 are positioned near each other. FIG. 78B is a sectional view of the resin layer 202 and the resin layer 48*b* being in contact with each other. FIG. 78B is an enlarged sectional view of the part in the circle S in FIG. 78A.

Figure 79A:
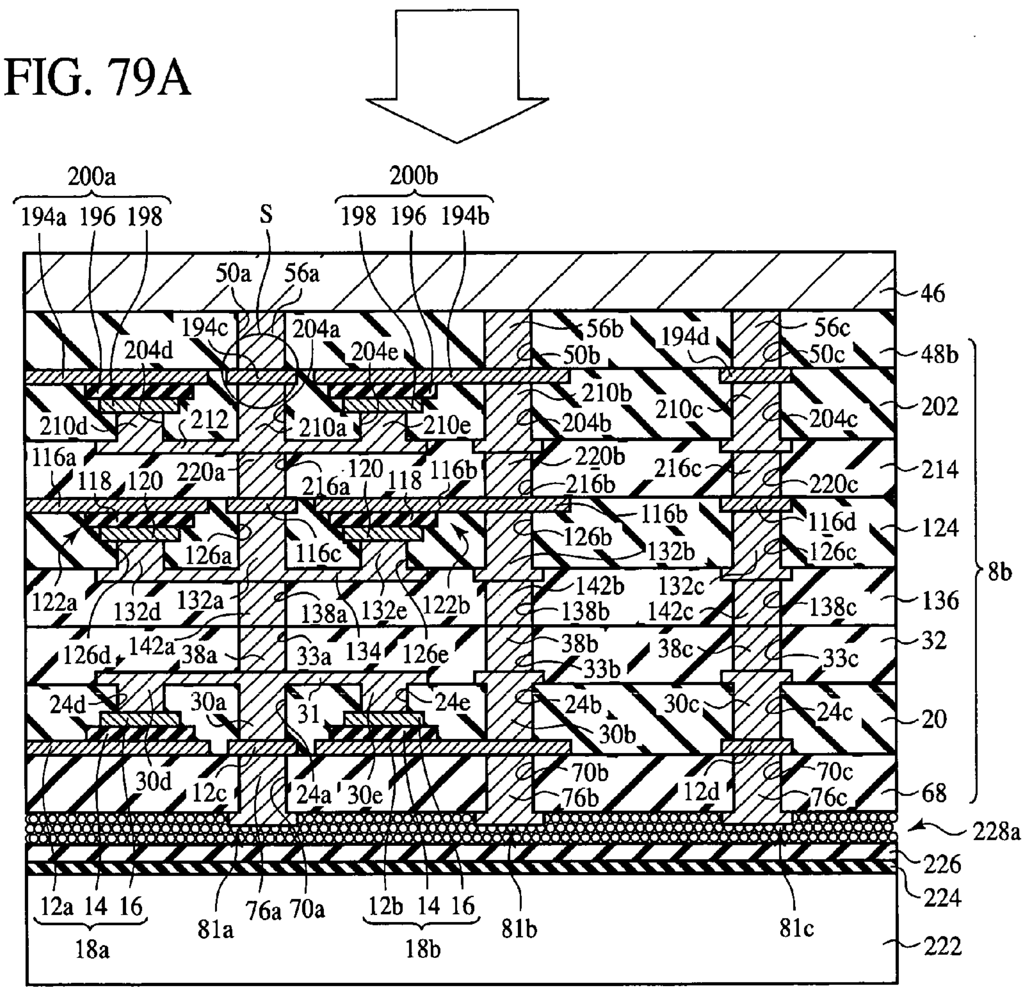
FIGS. 79A and 79B are sectional views of the interposer and the electronic device according to the third embodiment of the present invention in the steps of the method for fabricating the interposer and the electronic device, which illustrate the method (Part 14).
Figure 79B:
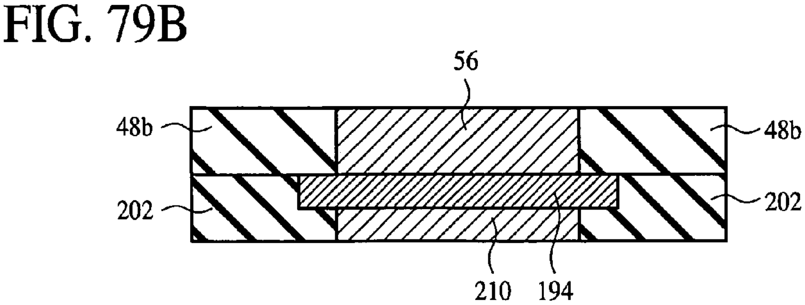

Next, thermal processing is conducted while a pressure is being applied from the outside to the supporting substrate 222 and to the semiconductor substrate 46 to thereby keep the conduction film 194*c* and the partial electrode 56*a* in close contact with each other, the capacitor electrode 194*b* and the partial electrode 56*b* in close contact with each other and the conduction film 194*d* and the partial electrode 56*c* in close contact with each other (see FIGS. 79A and 79B). FIG. 79B is an enlarged sectional view of the part in the circle S in FIG. 79A.

An oven (thermal processing apparatus), for example is used in the thermal processing. The thermal processing temperature is, e.g., about 250° C. The thermal processing period of time is, e.g., about 1 hour. The pressure is, e.g., about 10 kPa. The thermal processing conducted under these conditions surely adheres the resin layer 48*b* and the resin layer 202 to each other.

This thermal processing shrinks the resin layer 48*b*. The resin layer 48*b* is adhered to the resin layer 202 while being shrunk, whereby due to the shrinkage of the resin layer 48*b*, the partial electrode 56*a* and the conduction film 194*c* are jointed to each other, the partial electrode 56*b* and the capacitor electrode 194*b* are jointed to each other, the partial electrode 56*c* and the conduction film 194*d* are jointed to each other. Due to the shrinkage of the resin layer 48*b*, the partial electrode 56*a* and the conduction film 194*c* are jointed to each other, the partial electrode 56*b* and the capacitor 194*b* are jointed to each other, and the partial electrode 56*c* and the conduction film 194*d* are jointed to each other. Thus, it is not necessary to apply high pressure from the outside to the semiconductor substrate 46 and to the supporting substrate 222.

Figure 80A:
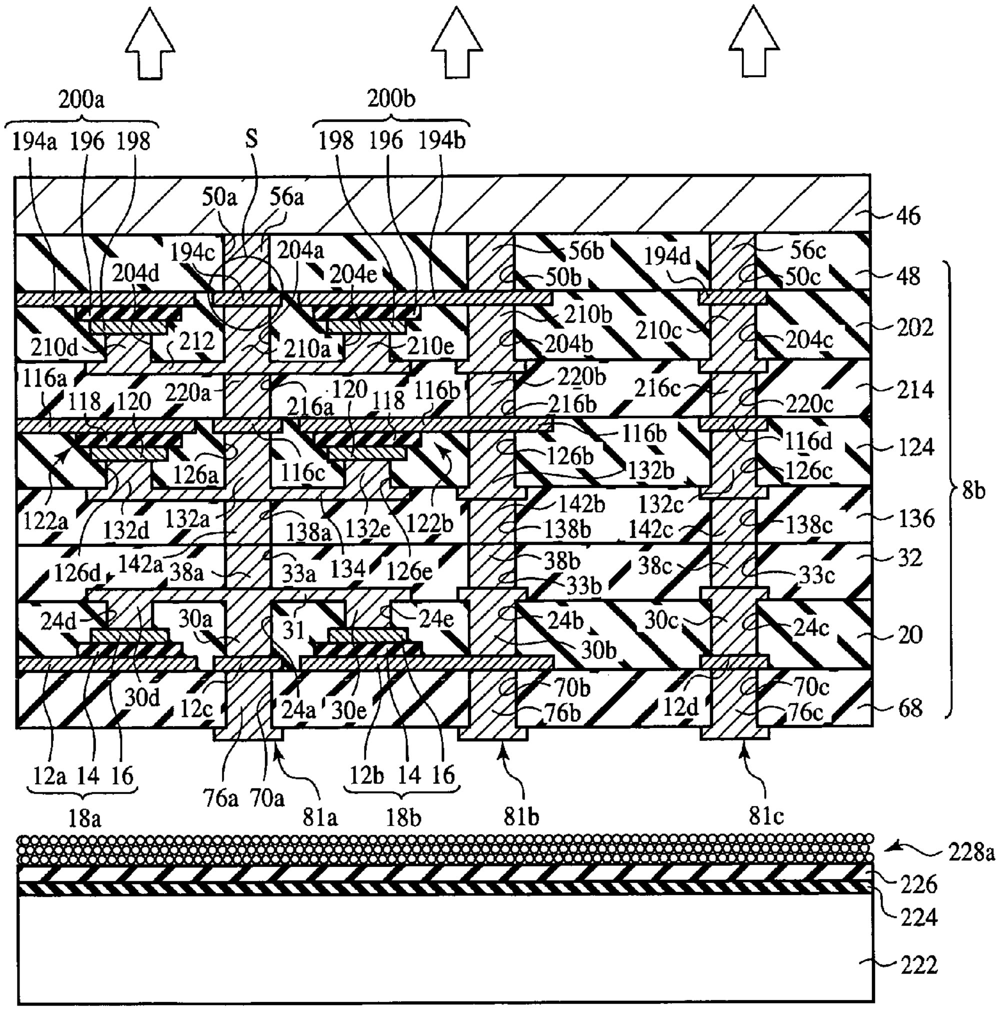
FIGS. 80A and 80B are sectional views of the interposer and the electronic device according to the third embodiment of the present invention in the steps of the method for fabricating the interposer and the electronic device, which illustrate the method (Part 15).
Figure 80B:
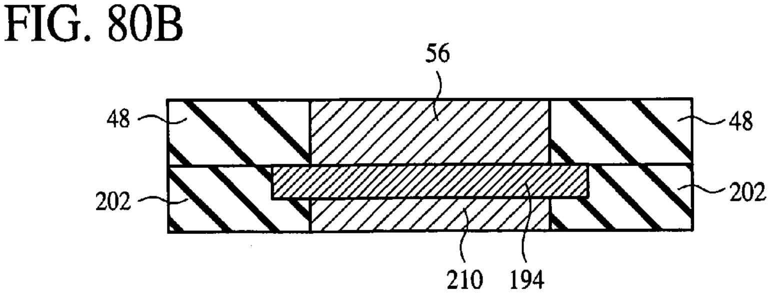

Then, the semi-cured resin layer 48*b* becomes the completely cured resin layer 48 (see FIGS. 80A and 80B). FIG. 80B is an enlarged sectional view of the part in the circle S in FIG. 80A. Because of the completely cured resin 48, which has been sufficiently shrunk, the partial electrode 56*a* and the conduction film 194*c* never part from each other, the partial electrode 56*b* and the capacitor electrode 194*b* never part from each other, and the partial electrode 56*c* and the conduction film 194*d* never part from each other.

In the thermal processing, the heat-releasable adhesive layer 228 of the heat foaming type double-sided tape 230 is expanded. When the heat-releasable adhesive layer 228 is expanded, the adhesion area between the expanded heat-releasable adhesive layer 228*a* and the resin layer 68 is decreased, and the adhesion between the heat-releasable adhesive layer 228*a* and the resin layer 68 is decreased.

Then, the supporting substrate 164 is removed from the semiconductor substrate 46. The heat foaming type double-sided tape 230 having the pressure-sensitive adhesive layer 224 adhered to the supporting substrate 222 is removed from the resin layer 68 together with the heat foaming type double-sided tape 230.

Figure 81:
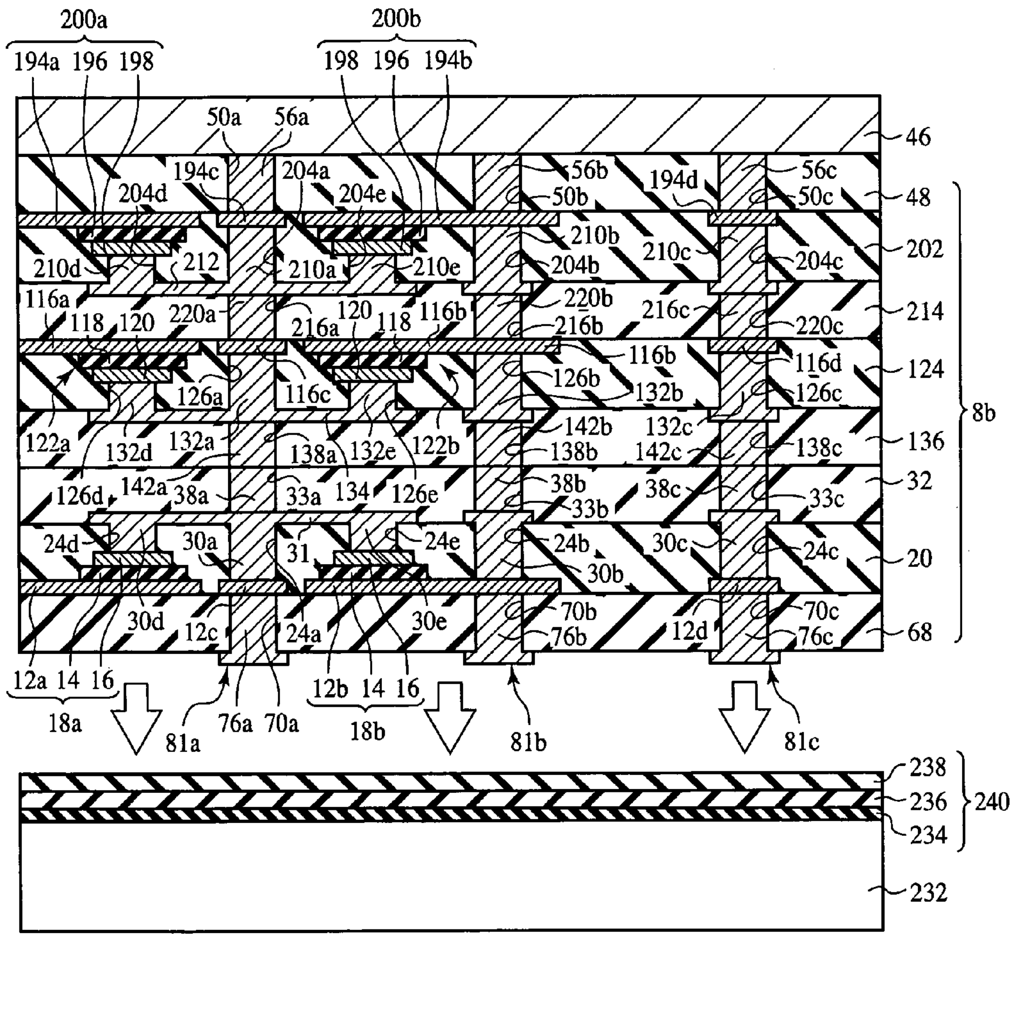
FIG. 81 is a sectional view of the interposer and the electronic device according to the third embodiment of the present invention in the steps of the method for fabricating the interposer and the electronic device, which illustrates the method (Part 16).

Next, the supporting substrate 232 is prepared (see FIG. 81). The supporting substrate 232 is, e.g., a glass supporting substrate. The supporting substrate 232 is for supporting the base 8*b*, etc. with the capacitors 18*a*, 18*b*, 122*a*, 122*b*, 200*a*, 200*b*, etc. buried in removing the semiconductor substrate 46 by polish or others in a later step.

Next, a heat foaming type double-sided tape 240 is adhered to the supporting substrate 232. As does the heat foaming type double-sided tape 66 described above, the heat foaming type double-sided tape 240 comprises a base 236 of, e.g., polyester film, a heat-releasable adhesive layer 238 formed on one primary surface of the base 236 and a pressure-sensitive adhesive layer 234 formed on the other primary surface of the base 236. As is the heat foaming type double-sided tape 66 described above, the heat foaming type double-sided tape 240 can be a heat forming type double-sided tape by, e.g., NITTO DENKO CORPORATION (trade name; RIVA ALPHA), or others. In adhering the heat foaming type double-sided tape 240 to the supporting substrate 232, the pressure-sensitive adhesive layer 234 of the heat foaming type double-sided tape 240 is adhered to the supporting substrate 232.

Next, the semiconductor substrate 46 and the supporting substrate 232 are opposed to each other. At this time, the supporting substrate 232 and the semiconductor substrate 46 are opposed to each other with one surface of the resin layer 68 (opposite to the surface contacting the resin layer 20) and one surface of the heat-releasable adhesive layer 238 of the heat foaming type double-sided tape 240 (opposite to the surface contacting the matrix 236) positioned near each other.

Figure 82:
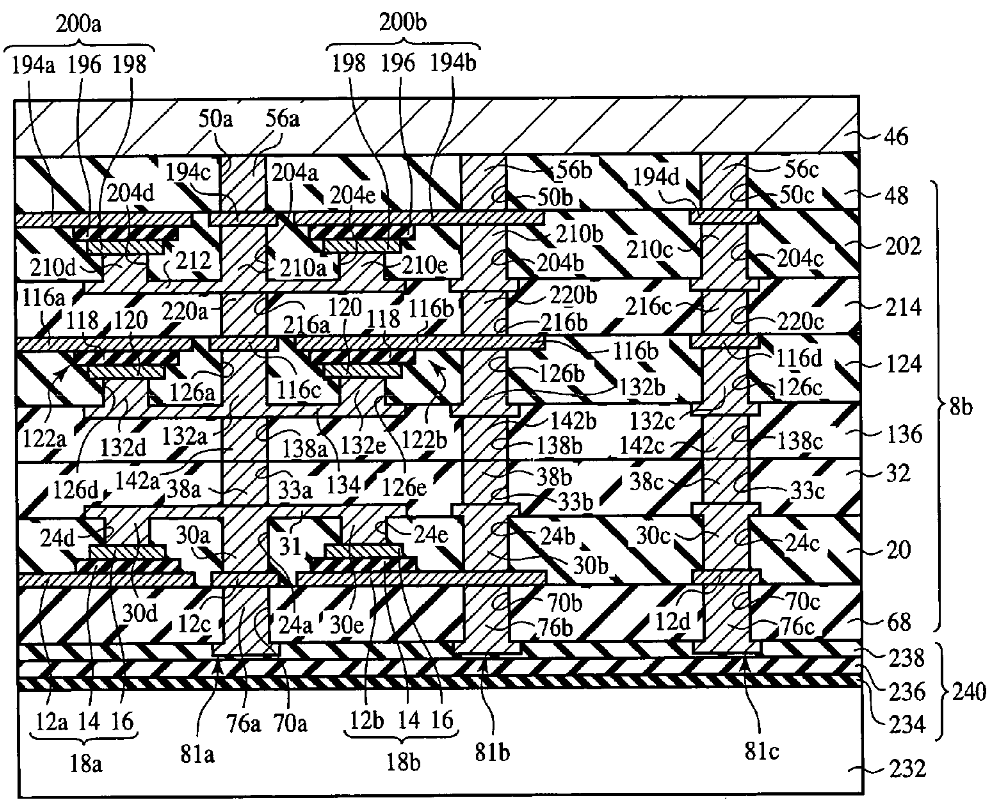
FIG. 82 is a sectional view of the interposer and the electronic device according to the third embodiment of the present invention in the steps of the method for fabricating the interposer and the electronic device, which illustrates the method (Part 17).

Then, as illustrated in FIG. 82, one surface of the resin layer 68 (opposite to the surface contacting the resin layer 20) and one surface of the heat-releasable adhesive layer 238 of the heat foaming type double-sided tape 240 (opposite to the surface contacting the base 236) adhered to each other.

Next, the semiconductor substrate 46 is polished by, e.g., CMP until the thickness of the semiconductor substrate 46 becomes, e.g., about 100 μm. At this time, all the semiconductor substrate 46 is not removed, so that the resin layer 48, etc. are kept from being damaged by the polish.

Next, the semiconductor substrate 46 remaining on one surface of the resin layer 48 (opposite to the surface contacting the resin layer 124) is etched off by, e.g., hydrofluoric acid.

Figure 83A:
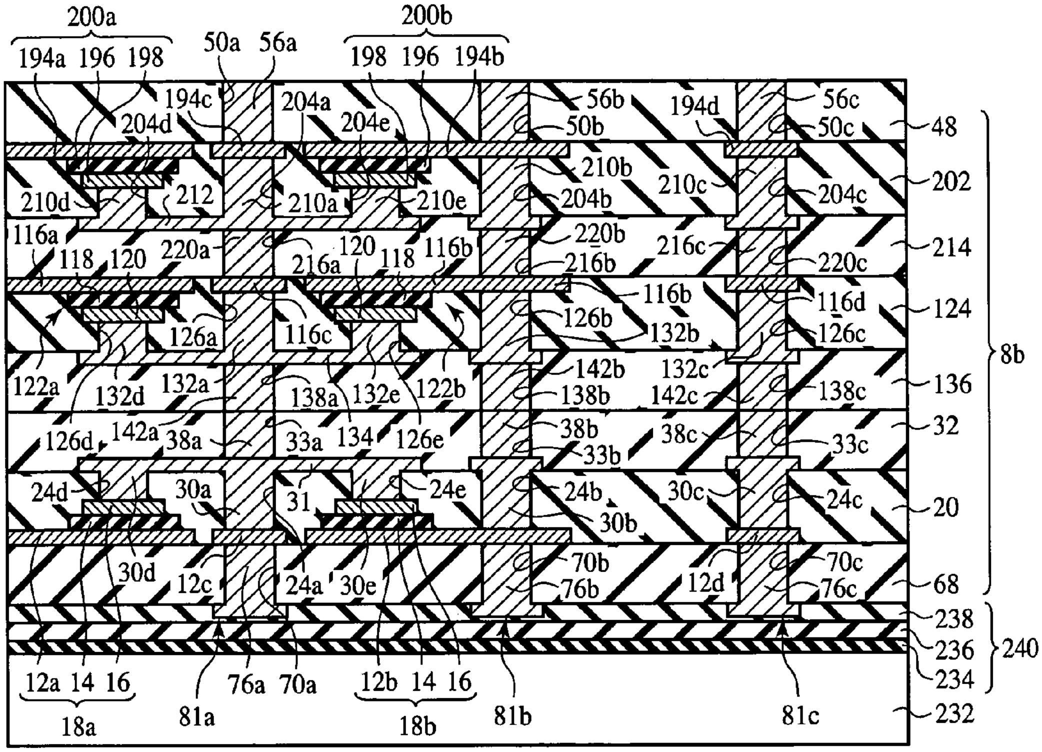
FIGS. 83A and 83B are sectional views of the interposer and the electronic device according to the third embodiment of the present invention in the steps of the method for fabricating the interposer and the electronic device, which illustrate the method (Part 18).

Thus, the semiconductor substrate 46 is removed while the resin layer 48, etc. are kept form being excessively damaged (see FIG. 83A).

Figure 83B:
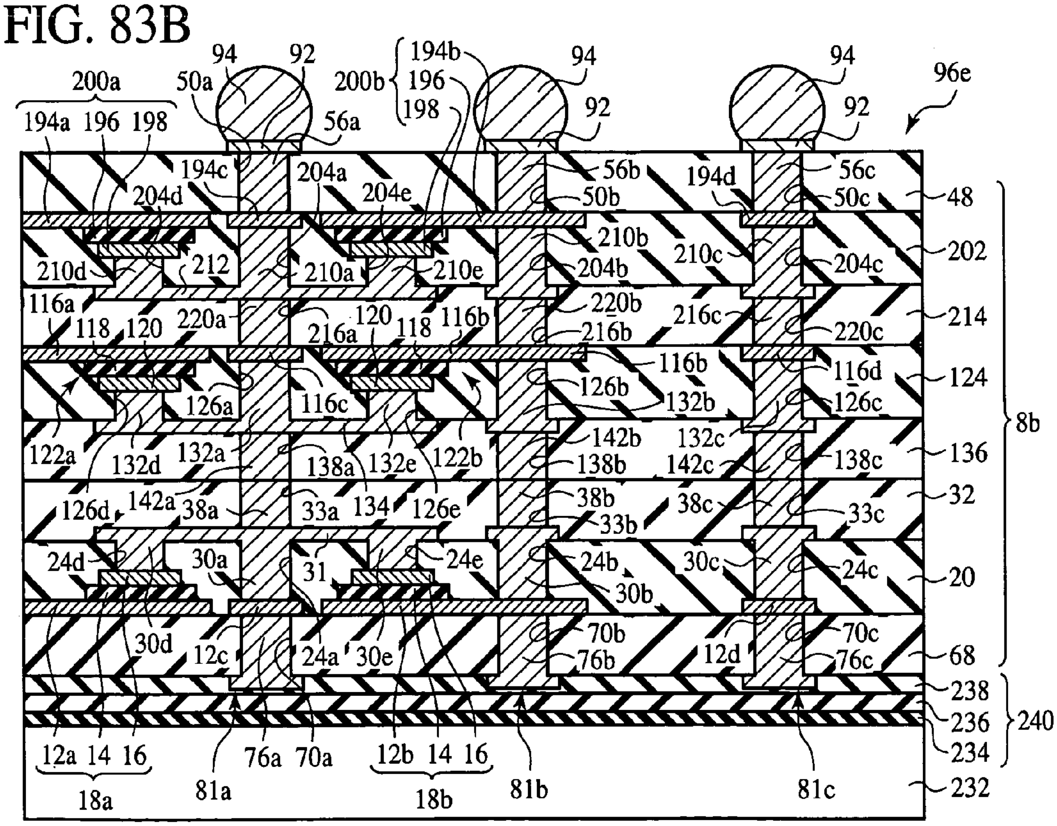

Then, in the same way as in the method for fabricating, the interposer described above with reference to FIGS. 25B to 26B, the electrode pads 92 and the solder bumps 94 are formed (see FIG. 83B).

Thus, the interposer **96*e*** according to the present embodiment is fabricated.

Figure 84:
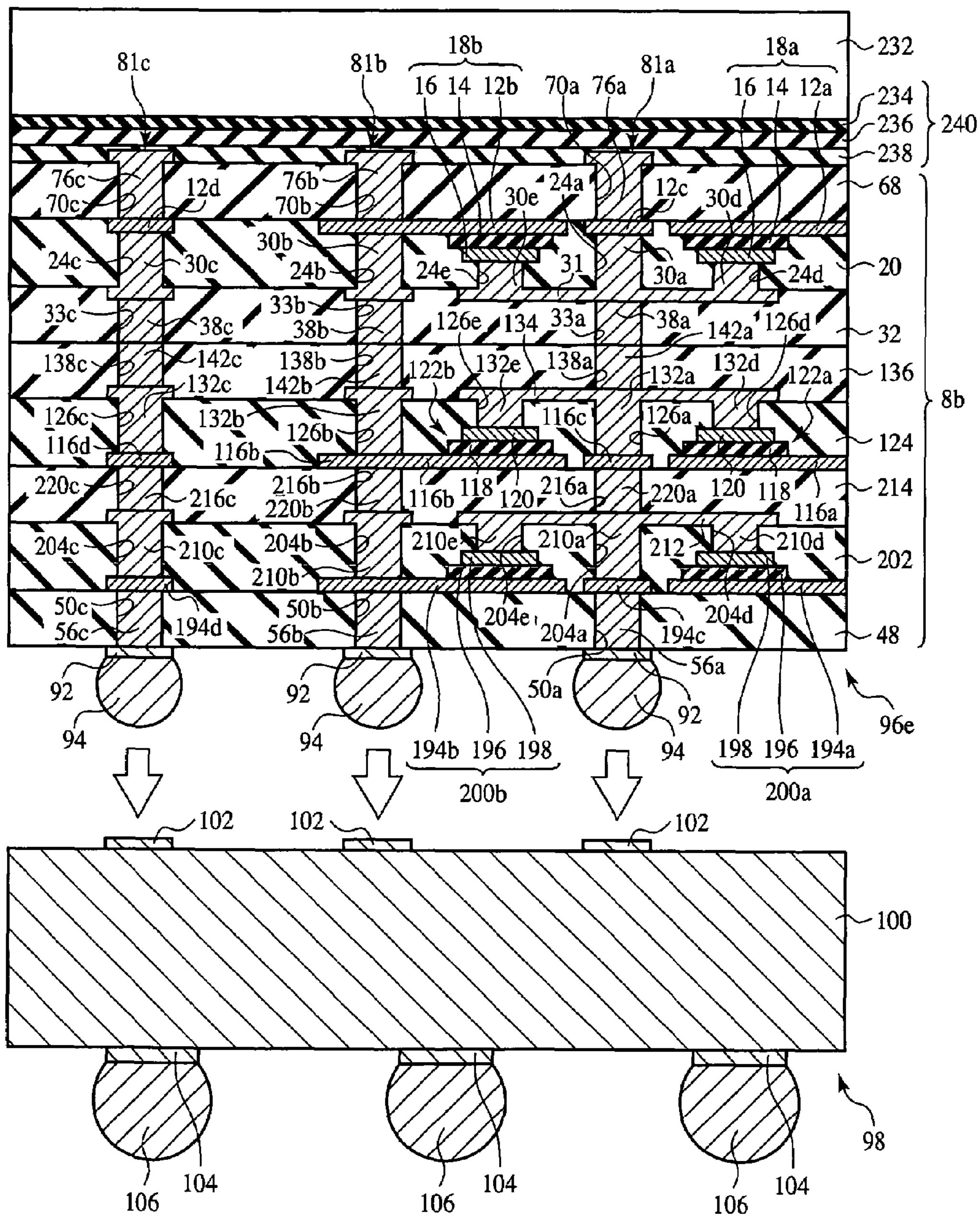
FIG. 84 is a sectional view of the interposer and the electronic device according to the third embodiment of the present invention in the steps of the method for fabricating the interposer and the electronic device, which illustrates the method (Part 19).

Next, the package substrate 98 is prepared (see FIG. 84).

Next, supporting substrate 232 supporting the interposer **96*e* is reversed to oppose the interposer 96*e* supported by the supporting substrate 232 and the package substrate 98 to each other. At this time, the interposer 96*e* and the package substrate 98 are opposed to each other with the solder bumps 94 of the interposer 96*e* and the electrode pads 102 of the package substrate 98** positioned near each other.

Figure 85:
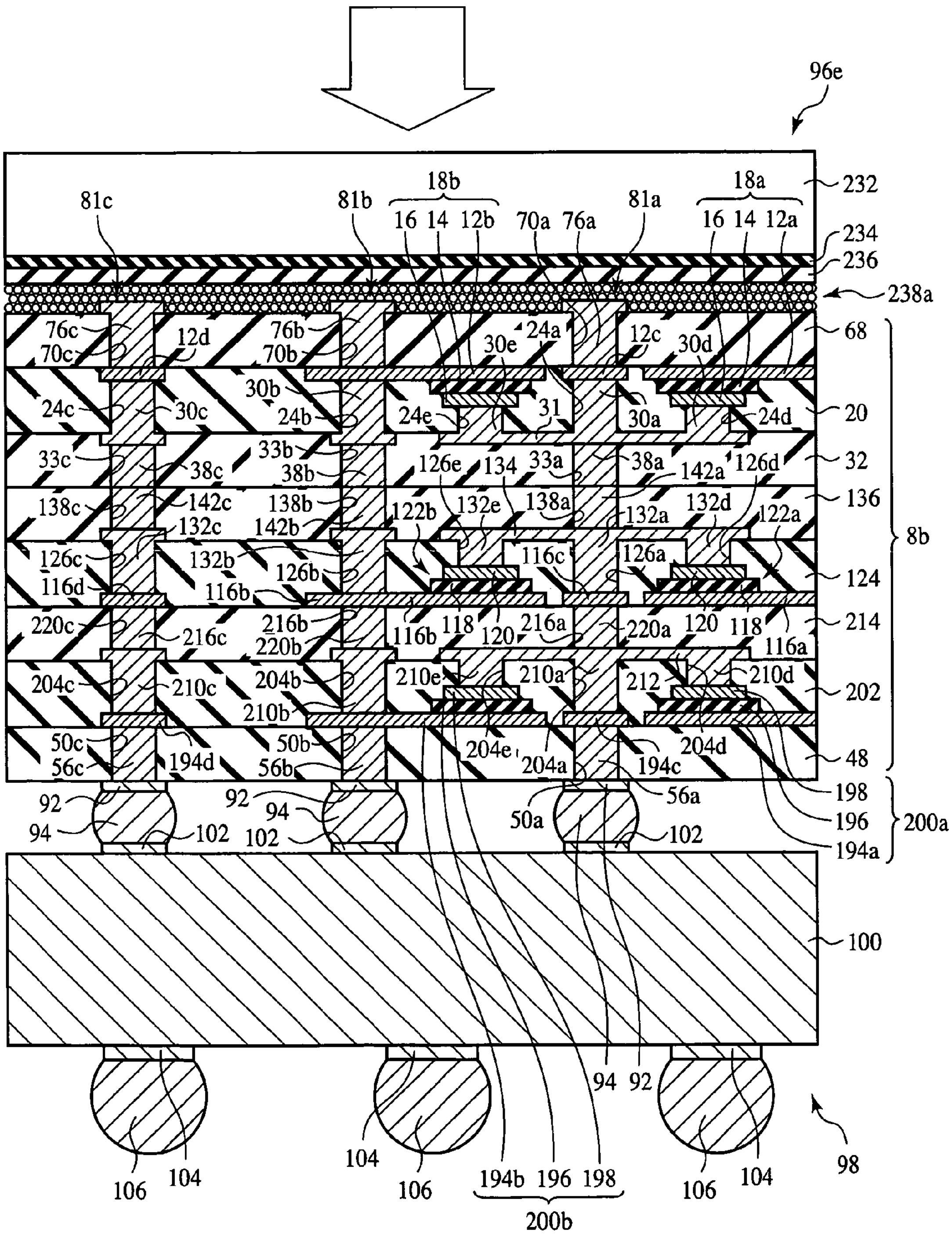
FIG. 85 is a sectional view of the interposer and the electronic device according to the third embodiment of the present invention in the steps of the method for fabricating the interposer and the electronic device, which illustrates the method (Part 20).

Then, the solder bumps 94 of the interposer **96*e* are jointed to the electrode pads 102 of the package substrate 98 by flip-chip bonding (see FIG. 85). Thus, the interposer 96*e* is mounted on the package substrate 98. In the flip-chip bonding, the heat-releasable adhesive layer 238 of the heat foaming type double-sided tape 240 is expanded. When the heat-releasable adhesive layer 238 is expanded, the adhesion area between the expanded heat-releasable adhesive layer 238*a* and the resin layer 68 is decreased, and the adhesion between the heat-releasable adhesive layer 238*a* and the resin layer 68 is lowered. Thus, the heat-releasable adhesive layer 238*a* and the resin layer 68** can be easily released from each other.

Figure 86:
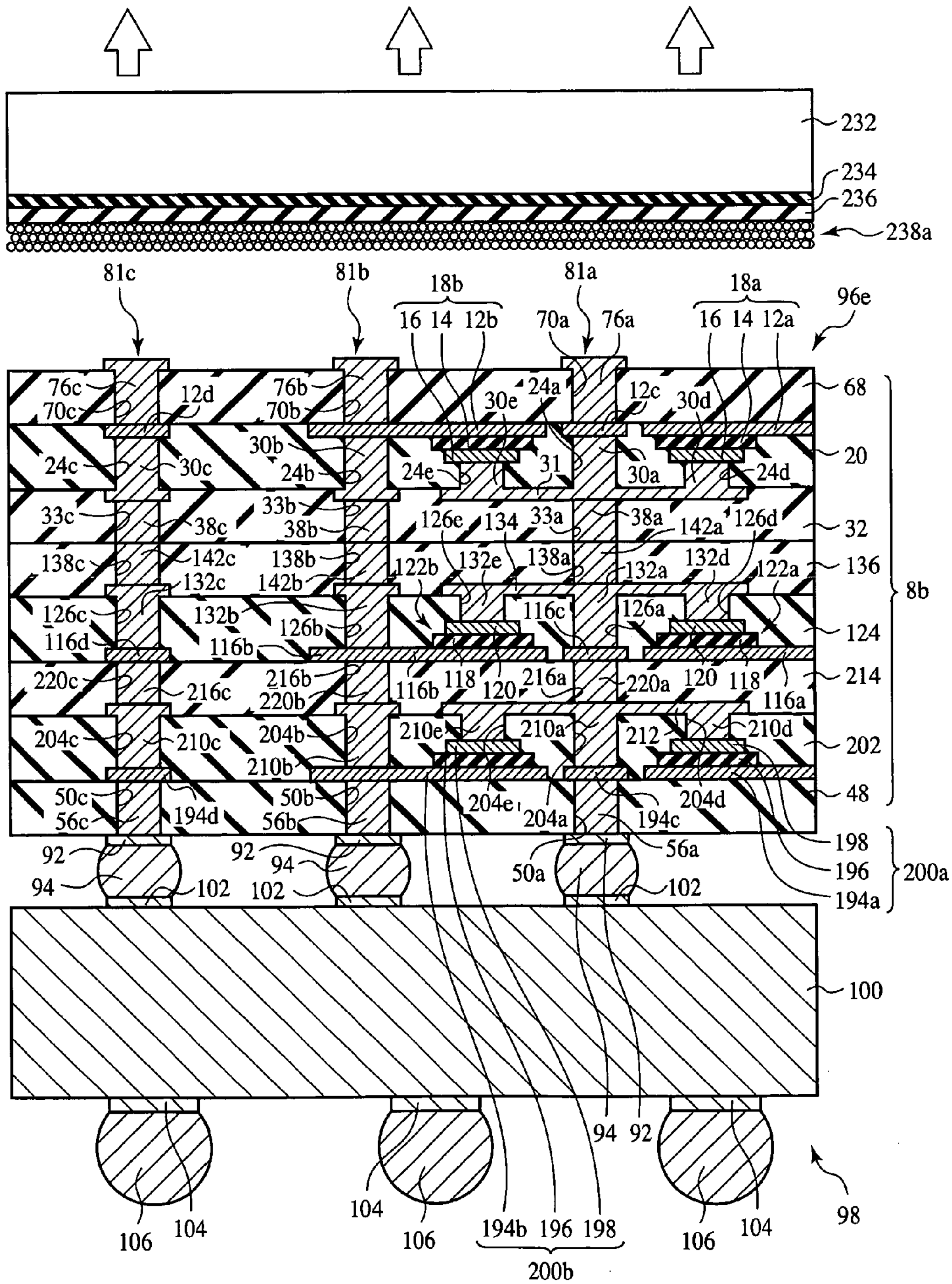
FIG. 86 is a sectional view of the interposer and the electronic device according to the third embodiment of the present invention in the steps of the method for fabricating the interposer and the electronic device, which illustrates the method (Part 21).

Next, the supporting substrate 232 is removed from the interposer **96*e* (see FIG. 86). The heat foaming type double-sided tape 240 having the pressure-sensitive adhesive layer 234 adhered to the supporting substrate 232 is removed from the interposer 96*e* together with the supporting substrate 232**.

Figure 87:
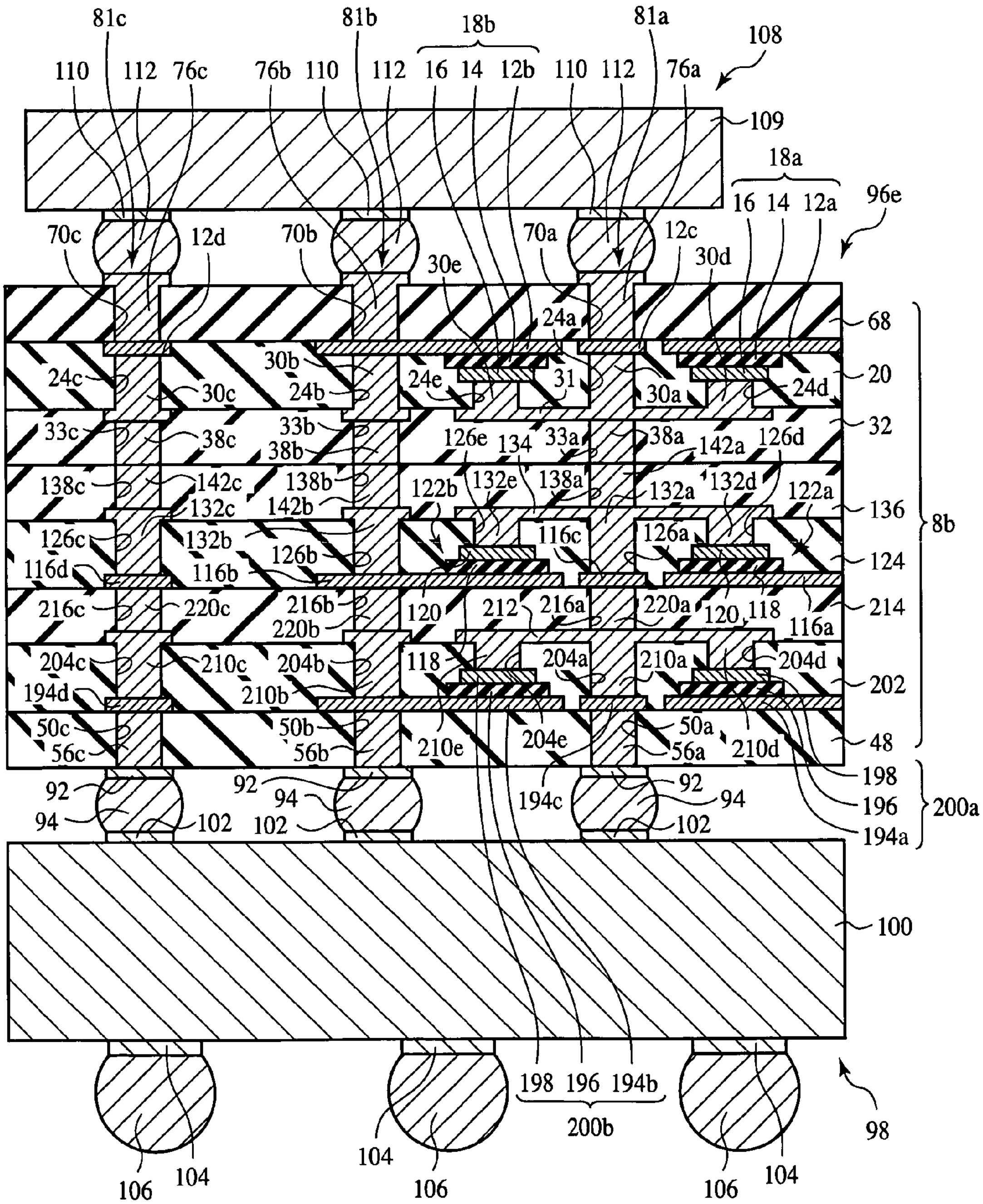
FIG. 87 is a sectional view of the interposer and the electronic device according to the third embodiment of the present invention in the steps of the method for fabricating the interposer and the electronic device, which illustrates the method (Part 22).

Next, the semiconductor integrated circuit devices 108 are prepared (see FIG. 87).

Next, the solder bumps 112 of the semiconductor integrated circuit devices 108 are jointed to the through-electrodes **81*a*-81*c* of the interposer 96 by flip-chip bonding (see FIG. 87). Thus, the semiconductor integrated circuit devices 108 are mounted on the interposer 96*e***.

Thus, the electronic device using interposer according to the present embodiment is fabricated.

Modified Embodiments

The present invention is not limited to the above-described embodiments and can cover other various modifications.

For example, in the above-described embodiments, the capacitor dielectric film 14, 118, 196 are formed of BST film. However, the material of the capacitor dielectric film 14, 118, 196 is not limited to BST film. For example, the capacitor dielectric film 14, 118, 196 may be formed of $PbZr_xTi_{1-x}O_3$ (PZT) film. Conditions for forming the capacitor dielectric film 14, 118, 196 of PZT are as exemplified below. The substrate temperature is, e.g., 600° C. The gas pressure inside the film forming chamber is, e.g., 0.5 Pa. The flow rate ratio between argon gas and oxygen gas is, e.g., 9:1. The applied electric power is, e.g., 120 W. The film forming period of time is, e.g., 60 minutes. The capacitor dielectric film 14, 118, 196 formed under these conditions can have an about 100 nm-thickness and good electric characteristics of an about 200 relative dielectric constant.

The capacitor dielectric film 14, 118, 196 are not essentially formed of BST film and PZT film. For example, the capacitor dielectric film 14, 118, 196 can be formed of a compound oxide containing at least one element of Sr, Ba, Pb, Zr, Bi, Ta, Ti, Mg and Nb.

In the above-described embodiments, the resin layer 20, 68, 124, 202 is formed of epoxy resin. The material of the resin layer 20, 68, 124, 202 is not limited to epoxy resin. For example, the resin layer 20, 68, 124, 202 may be formed of benzocyclobutene (BCB) resin, polyimide resin, bismaleimide-triazine resin, polytetrafluoroethylene resin, acrylic resin or diallyl phthalate resin or others.

The resin layer 20, 68, 124, 202 are formed of BCB resin under the conditions as exemplified below. Conditions for applying a BCB resin solution are, e.g., 2000 rpm and 30 seconds. The thickness of the applied resin layer 20, 68, 124, 202 is, e.g., about 4.5 μm. The pre-bake temperature is, e.g., about 150° C. The main bake temperature is, e.g., 260° C. The resin layer 20, 68, 124, 202 thus formed has an about 3 μm-thickness after the main bake.

In the above-described embodiments, the resin layer 32, 48, 136, 214 is formed of BCB resin. However, the resin layer 32, 48, 136, 214 is not essentially formed of BCB resin. For example, polyimide resin, epoxy resin, bismaleimide resin, maleimide resin, cyanate resin, polyphenylene ether resin, polyphenylene oxide resin. fluorine-content resin, liquid crystal polymer, polyetherimide resin, polyether ether ketone resin or others may be suitably used.

In the above-described embodiments, the capacitor electrodes **12*a*, 12*b*, 16, 116*a*, 116*b*, 120, 194*a*, 194*b*, 198 are formed of Pt, etc. However, the capacitor electrodes 12*a*, 12*b*, 16, 116*a*, 116*b*, 120, 194*a*, 194*b*, 198 are not essentially formed of Pt, etc. For example, the capacitor electrodes 12*a*, 12*b*, 16, 116*a*, 116*b*, 120, 194*a*, 194*b*, 198** may be formed suitably of Au, Cr, Cu, W, Pt, Pd, Ru, Ru oxide, Ir, Ir oxide, Pt oxide or others.

What is claimed is:

1. An interposer comprising:

a base formed of a plurality of resin layers;

a thin-film capacitor buried between a first resin layer of said plurality of resin layers and a second resin layer of said plurality of resin layers, the first thin-film capacitors including a first capacitor electrode, a second capacitor electrode opposed to the first capacitor electrode, and a capacitor dielectric film formed between the first capacitor electrode and the second capacitor electrode and having a relative dielectric constant of 200 or above;

a first through-electrode formed through the base and electrically connected to the first capacitor electrode; and a second through-electrode formed through the base and electrically connected to the second capacitor electrode, wherein both the first resin layer and the second resin layer are penetrated with the first through-electrode, and both the first resin layer and the second resin layer are penetrated with the second through-electrode.

2. An interposer according to claim 1, further comprising:

another thin-film capacitor buried between a third resin layer of said plurality of resin layers and a fourth resin layer of said plurality of resin layers, said another thin-film capacitor including a third capacitor electrode, a fourth capacitor electrode opposed to the third capacitor electrode, and another capacitor dielectric film formed between the third capacitor electrode and the fourth capacitor electrode and having a relative dielectric constant of 200 or above, the third capacitor electrode being electrically connected to the first through-electrode, and the fourth capacitor electrode being electrically connected to the second through-electrode.

3. An interposer according to claim 2, further comprising:

further another thin-film capacitor buried between a fifth resin layer of said plurality of resin layers and a sixth resin layer of said plurality of resin layers, said further another thin-film capacitor including a fifth capacitor electrode, a sixth capacitor electrode opposed to the fifth capacitor electrode, and further another capacitor dielectric film formed between the fifth capacitor electrode and the sixth capacitor electrode and having a relative dielectric constant of 200 or above, the fifth capacitor electrode being electrically connected to the first through-electrode, and the sixth capacitor electrode being electrically connected to the second through-electrode.

4. An interposer according to claim 1, wherein the first resin layer or the second resin layer is formed of epoxy resin, benzocyclobutene resin, polyimide resin, bismaleimide-triazine resin, polytetrafluoroethylene resin, acrylic resin, or diallylphthalate resin.

5. An interposer according to claim 1, further comprising:

an inductor electrically connected to the thin-film capacitor.

6. An interposer according to claim 1, wherein the capacitor dielectric film is formed of a compound oxide containing at least any one element of Sr, Ba, Pb, Zr, Ri, Ta, Ti, Mg and Nb.

7. An interposer according to claim 1, further comprising: p1 a passivation film formed of an inorganic material covering the thin-film capacitor.

8. An interposer according to claim 7, wherein the passivation film is an amorphous film formed of one and the same material as the capacitor dielectric film.

9. An interposer according to claim 1, wherein the capacitor electrodes are formed of Au, Cr, Cu, W, Pt, Pd, Ru, Ru oxide, Ir, Ir oxide or Pt oxide.

* * * * *